US006285039B1

(12) United States Patent
Kobori et al.

(10) Patent No.: US 6,285,039 B1
(45) Date of Patent: Sep. 4, 2001

(54) ORGANIC ELECTROLUMINESCENT DEVICE

(75) Inventors: Isamu Kobori, Chiba; Kazutoshi Ohisa, Ibaraki; Kenji Nakaya, Chiba; Tetsushi Inoue, Chiba, all of (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/051,479

(22) PCT Filed: Aug. 19, 1997

(86) PCT No.: PCT/JP97/02869

§ 371 Date: Jun. 3, 1998

§ 102(e) Date: Jun. 3, 1998

(87) PCT Pub. No.: WO98/08360

PCT Pub. Date: Feb. 26, 1998

(30) Foreign Application Priority Data

Aug. 19, 1996 (JP) ........................ 8-235898

(51) Int. Cl.[7] ........................ H01L 35/24; H01L 51/00

(52) U.S. Cl. ........................ 257/40; 257/103; 313/504

(58) Field of Search ........................ 257/40, 103; 313/504, 313/506

(56) References Cited

U.S. PATENT DOCUMENTS 4,769,292 9/1988 Tang et al. .
5,122,711 * 6/1992 Wakimoto et al. .................. 313/504
5,792,557 * 8/1998 Nakaya et al. .................. 428/411.1

FOREIGN PATENT DOCUMENTS 63-264692 11/1988 (JP) .
2-191694 7/1990 (JP) .
3-792 1/1991 (JP) .
5-202356 8/1993 (JP) .
6-9952 1/1994 (JP) .

* cited by examiner

*Primary Examiner*—Sara Crane
(74) *Attorney, Agent, or Firm*—Oblon, Spivak, McClelland, Maier & Neustadt, P.C.

(57) ABSTRACT

In an organic EL device, a light emitting layer contains a specific coumarin derivative, and a hole injecting and/or transporting layer contains a specific tetraaryldiamine derivative. Also a light emitting layer in the form of a mix layer contains a specific coumarin derivative, a specific quinacridone compound or a specific styryl amine compound. There are provided at least two light emitting layers including a light emitting layer of the mix layer type wherein at least two dopants are contained so that at least two luminescent species may emit light. There is obtained an organic EL device capable of high luminance and continuous light emission and ensuring reliability. Multi-color light emission becomes possible.

32 Claims, 8 Drawing Sheets

ORGANIC ELECTROLUMINESCENT DEVICE

FIELD OF THE INVENTION

This invention relates to an organic electroluminescent (EL) device and more particularly, to a device capable of emitting light from a thin film of an organic compound upon application of electric field.

BACKGROUND ART

Organic EL devices are light emitting devices comprising a thin film containing a fluorescent organic compound interleaved between a cathode and an anode. Electrons and holes are injected into the thin film where they are recombined to create excitons. Light is emitted by utilizing luminescence (phosphorescence or fluorescence) upon deactivation of excitons.

The organic EL devices are characterized by plane light emission at a high luminance of about 100 to 100,000 cd/m$^2$ with a low voltage of about 10 volts and light emission in a spectrum from blue to red color by a simple choice of the type of fluorescent material.

The organic EL devices, however, are undesirably short in emission life, less durable on storage and less reliable because of the following factors.

(1) Physical changes of organic compounds

Growth of crystal domains renders the interface non-uniform, which causes deterioration of electric charge injection ability, short-circuiting and dielectric breakdown of the device. Particularly when a low molecular weight compound having a molecular weight of less than 500 is used, crystal grains develop and grow, substantially detracting from film quality. Even when the interface with ITO is rough, significant development and growth of crystal grains occur to lower luminous efficiency and allow current leakage, ceasing to emit light. Dark spots which are local non-emitting areas are also formed.

(2) Oxidation and stripping of the cathode

Although metals having a low work function such as Na, Mg, Li, Ca, K, and Al are used as the cathode in order to facilitate electron injection, these metals are reactive with oxygen and moisture in air. As a result, the cathode can be stripped from the organic compound layer, prohibiting electric charge injection. Particularly when a polymer or the like is applied as by spin coating, the residual solvent and decomposed products resulting from film formation promote oxidative reaction of the electrodes which can be stripped to create local dark spots.

(3) Low luminous efficiency and increased heat build-up

Since electric current is conducted across an organic compound, the organic compound must be placed under an electric field of high strength and cannot help heating. The heat causes melting, crystallization or decomposition of the organic compound, leading to deterioration or failure of the device.

(4) Photochemical and electrochemical changes of organic compound layers.

Coumarin compounds were proposed as the fluorescent material for organic EL devices (see JP-A 264692/1988, 191694/1990, 792/1991, 202356/1993, 9952/1994, and 240243/1994). The coumarin compounds are used in the light emitting layer alone or as a guest compound or dopant in admixture with host compounds such as tris(8-quinolinolato)-aluminum. Such organic EL devices have combined with the light emitting layer a hole injecting layer, a hole transporting layer or a hole injecting and transporting layer which uses tetraphenyldiamine derivatives based on a 1,1'-biphenyl-4,4'-diamine skeleton and having phenyl or substituted phenyl groups attached to the two nitrogen atoms of the diamine, for example, N,N'-diphenyl-N,N'-bis(3-methylphenyl)-1,1'-biphenyl-4,4'-diamine. These organic EL devices, however, are unsatisfactory in emission life and reliability with respect to heat resistance. When these compounds are used as a host, high luminance devices are not available.

To meet the demand for organic EL devices of the multi-color light emission type, multilayer white light emitting organic EL devices were proposed (Yoshiharu Sato, Shingaku Giho, OME94-78 (1995-03)). The light emitting layer used therein is a lamination of a blue light emitting layer using a zinc oxazole complex, a green light emitting layer using tris(8-quinolinolato)aluminum, and a red light emitting layer of tris (8-quinolinolato)aluminum doped with a red fluorescent dye (P-660, DCM1).

The red light emitting layer is doped with a luminescent species to enable red light emission as mentioned above while the other layers are subject to no doping. For the green and blue light emitting layers, a choice is made such that light emission is possible with host materials alone. The choice of material and the freedom of adjustment of emission color are severely constrained.

In general, the emission color of an organic EL device is changed by adding a trace amount of a luminescent species, that is, doping. This is due to the advantage that the luminescent species can be readily changed by changing the type of dopant. Accordingly, multi-color light emission is possible in principle by doping a plurality of luminescent species. If a single host is evenly doped with all such luminescent species, however, only one of the luminescent species doped would contribute to light emission or some of the luminescent species dopes would not contribute to light emission. In summary, even when a single host is doped with a mixture of dopants, it is difficult for all the dopants to contribute to light emission. This is because of the tendency that energy is transferred to only a particular luminescent species.

For this and other reasons, there are known until now no examples of doping two or more luminescent species so that stable light emission may be derived from them.

In general, the luminance half-life of organic EL devices is in a trade-off to the luminescence intensity. It was reported (Tetsuo Tsutsui, Applied Physics, vol. 66, No. 2 (1997)) that the life can be prolonged by doping tris(8-quinolinolato) aluminum or N,N'-diphenyl-N,N'-bis(3-methylphenyl)-1,1'-biphenyl-4,4'-diamine with rubrene. A device having an initial luminance of about 500 cd/m$^2$ and a luminance half-life of about 3,500 hours was available. The emission color of this device is, however, limited to yellow (in proximity to 560 nm). A longer life is desired.

DISCLOSURE OF THE INVENTION

An object of the present invention is to provide an organic EL device using a photoelectric functional material experiencing minimal physical changes, photochemical changes or electrochemical changes and capable of light emission of plural colors at a high luminous efficiency in a highly reliable manner. Another object is especially to provide a high luminance light emitting device using an organic thin film formed from a high molecular weight compound by evaporation, the device being highly reliable in that a rise of drive voltage, a drop of luminance, current leakage, and the appearance and development of local dark spots during operation of the device are restrained. A further object is to provide an organic EL device adapted for multi-color light emission and capable of adjustment of an emission spectrum. A still further object is to provide an organic EL device featuring a high luminance and a long lifetime.

These and other objects are attained by the present invention which is defined below as (1) to (18).

(1) An organic electroluminescent device comprising a light emitting layer containing a coumarin derivative of the following formula (I), and a hole injecting and/or transporting layer containing a tetraaryldiamine derivative of the following formula (II), (I)

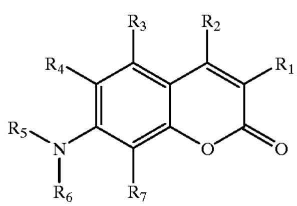

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl or aryl group; each of $R_5$ and $R_6$ is an alkyl or aryl group; or $R_4$ and R $_5$ $R_5$ and $R_6$, and $R_6$ and $R_7$, taken together, may form a ring, and (II)

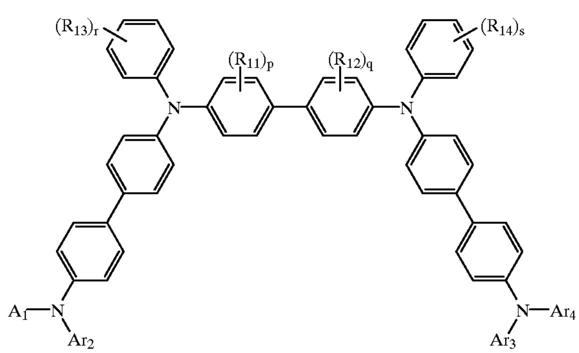

wherein each of $Ar_1$, $Ar_2$, $Ar_3$, and $Ar_4$ is an aryl group, at least one of $Ar_1$ to $Ar_4$ is a polycyclic aryl group derived from a fused ring or ring cluster having at least two benzene rings; each of $R_{11}$ and $R_{12}$ is an alkyl group; each of p and q is 0 or an integer of 1 to 4; each of $R_{13}$ and $R_{14}$ is an aryl group; and each of r and s is 0 or an integer of 1 to 5.

(2) The organic electroluminescent device of (1) wherein said light emitting layer containing a coumarin derivative is formed of a host material doped with the coumarin derivative as a dopant.

(3) The organic electroluminescent device of (2) wherein said host material is a quinolinolato metal complex.

(4) An organic electroluminescent device comprising a light emitting layer in the form of a mix layer containing a hole injecting and transporting compound and an electron injecting and transporting compound, the mix layer being further doped with a coumarin derivative of the following formula (I), a quinacridone compound of the following formula (III) or a styryl amine compound of the following formula (IV) as a dopant, (I)

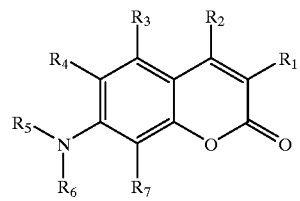

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl or aryl group; each of $R_5$ and $R_6$ is an alkyl or aryl group; or $R_4$ and $R_5$, $R_5$ and $R_6$, and $R_6$ and $R_7$, taken together, may form a ring, (III)

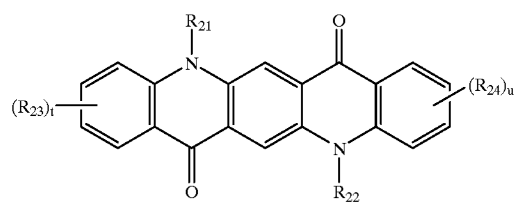

wherein each of $R_{21}$ and $R_{22}$, which may be identical or different, is a hydrogen atom, alkyl or aryl group; each of $R_{23}$ and $R_{24}$ is an alkyl or aryl group; each of t and u is 0 or an integer of 1 to 4; or adjacent $R_{23}$ groups or $R_{24}$ groups, taken together, may form a ring when t or u is at least 2, (IV)

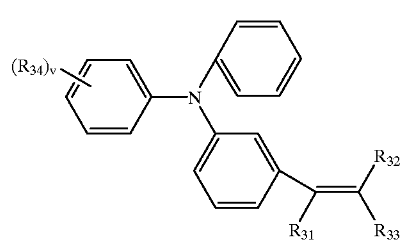

wherein $R_{31}$ is a hydrogen atom or aryl group; each of $R_{32}$ and $R_{33}$, which may be identical or different, is a hydrogen atom, aryl or alkenyl group; $R_{34}$ is an arylamino or arylaminoaryl group; and v is 0 or an integer of 1 to 5.

(5) The organic electroluminescent device of (4) wherein said hole injecting and transporting compound is an aromatic tertiary amine, and said electron injecting and transporting compound is a quinolinolato metal complex.

(6) The organic electroluminescent device of (5) wherein said aromatic tertiary amine is a tetraaryldiamine derivative of the following formula (II):

(II)

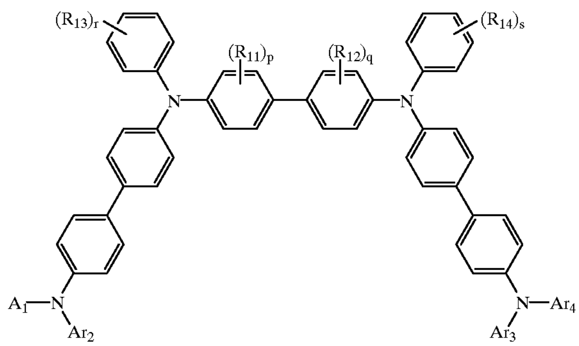

wherein each of $Ar_1$, $Ar_2$, $Ar_3$, and $Ar_4$ is an aryl group, at least one of $Ar_1$ to $Ar_4$ is a polycyclic aryl group derived from a fused ring or ring cluster having at least two benzene rings; each of $R_{11}$ and $R_{12}$ is an alkyl group; each of p and q is 0 or an integer of 1 to 4; each of $R_{13}$ and $R_{14}$ is an aryl group; and each of r and s is 0 or an integer of 1 to 5.

(7) The organic electroluminescent device of any one of (1) to (6) wherein said light emitting layer is interleaved between at least one hole injecting and/or transporting layer and at least one electron injecting and/or transporting layer.

(8) The organic electroluminescent device of (1), (2), (3) or (7) wherein said hole injecting and/or transporting layer is further doped with a rubrene as a dopant.

(9) The organic electroluminescent device of any one of (1) to (8) wherein a color filter and/or a fluorescence conversion filter is disposed on a light output side so that light is emitted through the color filter and/or fluorescence conversion filter.

(10) An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer.

(11) The organic electroluminescent device of (10) wherein said bipolar light emitting layer is a mix layer containing a hole injecting and transporting compound and an electron injecting and transporting compound.

(12) The organic electroluminescent device of (11) wherein all said at least two light emitting layers are mix layers as defined above.

(13) The organic electroluminescent device of any one of (10) to (12) wherein at least one of said at least two light emitting layers is doped with a dopant.

(14) The organic electroluminescent device of any one of (10) to (13) wherein all said at least two light emitting layers are doped with dopants.

(15) The organic electroluminescent device of any one of (10) to (14) wherein said at least two light emitting layers have different luminescent characteristics, a light emitting layer having an emission maximum wavelength on a longer wavelength side is disposed near the anode.

(16) The organic electroluminescent device of any one of (13) to (15) wherein said dopant is a compound having a naphthacene skeleton.

(17) The organic electroluminescent device of any one of (13) to (16) wherein said dopant is a coumarin of the following formula (I):

(I)

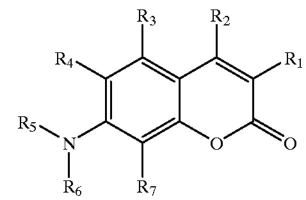

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl or aryl group; each of $R_5$ and $R_6$ is an alkyl or aryl group; or $R_4$ and $R_5$, $R_5$ and $R_6$, and $R_6$ and $R_7$, taken together, may form a ring.

(18) The organic electroluminescent device of any one of (11) to (17) wherein said hole injecting and transporting compound is an aromatic tertiary amine, and said electron injecting and transporting compound is a quinolinolato metal complex.

The organic EL device of the invention can achieve a high luminance of about 100,000 cd/$m^2$ or higher in a stable manner since it uses a coumarin derivative of formula (I) in a light emitting layer and a tetraaryldiamine derivative of formula (II) in a hole injecting and/or transporting layer, or a light emitting layer is formed by doping a mix layer of a hole injecting and transporting compound and an electron injecting and transporting compound with a coumarin derivative of formula (I), a quinacridone compound of formula (II) or a styryl amine compound of formula (III). A choice of a highly durable host material for the coumarin derivative of formula (I) allows for stable driving of the device for a prolonged period even at a current density of about 30 mA/$cm^2$.

Since evaporated films of the above-mentioned compounds are all in a stable amorphous state, thin film properties are good enough to enable uniform light emission free of local variations. The films remain stable and undergo no crystallization over one year in the air.

Also the organic EL device of the invention is capable of efficient light emission under low drive voltage and low drive current conditions. The organic EL device of the invention has a maximum wavelength of light emission in the range of about 480 nm to about 640 nm. For example, JP-A 240243/1994 discloses an organic EL device comprising a light emitting layer using tris(8-quinolinolato) aluminum as a host material and a compound embraced within the coumarin derivatives of formula (I) according to the present invention as a guest material. However, the compound used in the hole transporting layer is N,N'-diphenyl-N,N'-bis(3-methylphenyl)-1,1'-biphenyl-4,4'-diamine and thus different from the compounds of formula (II) according to the present invention. There are known no examples of doping a light emitting layer of the mix layer type with a coumarin derivative of formula (I), a quinacridone compound of formula (II) or a styryl amine compound of formula (III).

Furthermore, in order to enable light emission of two or more colors by altering the carrier transporting capability of respective light emitting layers, the present invention employs two or more light emitting layers, at least one of which is a layer of the bipolar type, preferably of the mix layer type, and which are a combination of bipolar light emitting layers, preferably of the mix layer type or a combination of a bipolar light emitting layer, preferably of the mix layer type with a hole transporting/light emitting layer disposed nearer to the anode than the bipolar light emitting layer, preferably of the mix layer type and/or an electron transporting/light emitting layer disposed nearer to the cathode than the bipolar light emitting layer. Further preferably, the light emitting layers are doped with respective dopants.

Among the foregoing embodiments, the especially preferred embodiment wherein a mix layer is doped is discussed below. By providing a mix layer and doping it, the recombination region is spread throughout the mix layer and to the vicinity of the interface between the mix layer and the hole transporting/light emitting layer or the interface between the mix layer and the electron transporting/light emitting layer to create excitons whereupon energy is transferred from the hosts of the respective light emitting layers to the nearest luminescent species to enable light emission of two or more luminescent species (or dopants). Also in the embodiment using the mix layer, by selecting for the mix layer a compound which is stable to the injection of holes and electrons, the electron and hole resistance of the mix layer itself can be outstandingly improved. In contrast, a combination of a hole transporting/light emitting layer with an electron transporting/light emitting layer rather in the absence of a mix layer which is a bipolar light emitting layer enables light emission from two or more luminescent species, but is so difficult to control the light emitting layers that the ratio of two luminescence intensities will readily change, and is short in life and practically unacceptable because these light emitting layers are less resistant to both holes and electrons. Also it becomes possible to adjust the carrier (electron and hole) providing capability by adjusting the combination of host materials for light emitting layers, the combination and quantity ratio of host materials for mix layers which are bipolar light emitting layers, or the ratio of film thicknesses. This enables adjustment of a light emission spectrum. The present invention is thus applicable to an organic EL device of the multi-color light emission type. In the embodiment wherein a light emitting layer (especially a mix layer) doped with a naphthacene skeleton bearing compound such as rubrene is provided, owing to the function of the rubrene-doped layer as a carrier trapping layer, the carrier injection into an adjacent layer (e.g., an electron transporting layer or a hole transporting layer) is reduced to prohibit deterioration of these layers, leading to a high luminance of about 1,000 cd/m$^2$ and a long lifetime as expressed by a luminance half-life of about 50,000 hours. In the further embodiment wherein a light emitting layer having a maximum wavelength of light emission on a longer wavelength side is disposed near the anode, a higher luminance is achievable because the optical interference effect can be utilized and the efficiency of taking out emission from the respective layers is improved.

Although an organic EL device capable of white light emission is proposed in Shingaku Giho, OME94-78 (1995-03), no reference is made therein to the doping of two or more light emitting layers including a bipolar light emitting layer, especially a mix layer as in the present invention.

THE BEST MODE FOR CARRYING OUT THE INVENTION

Figure 1:
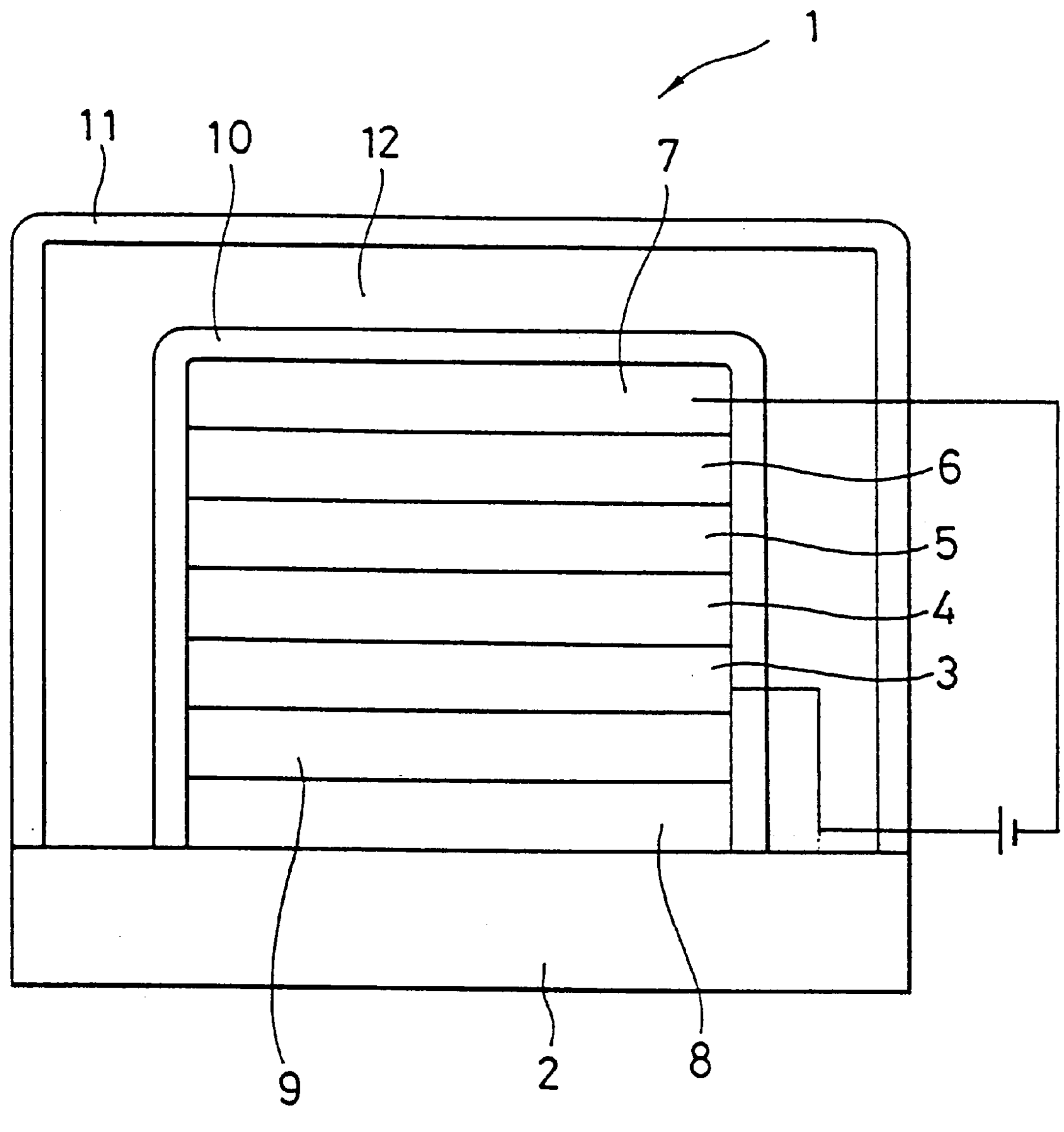
FIG. 1 is a schematic view showing an organic EL device according to one embodiment of the invention.

Now, several embodiments of the present invention are described in detail.

The organic EL device of the invention includes a light emitting layer containing a coumarin derivative of formula (I) and a hole injecting and/or transporting layer containing a tetraaryldiamine derivative of formula (II).

Referring to formula (I), each of $R_1$ to R3 represents a hydrogen atom, cyano group, carboxyl group, alkyl group, aryl group, acyl group, ester group or heterocyclic group, and they may be identical or different.

The alkyl groups represented by $R_1$ to $R_3$ are preferably those having 1 to 5 carbon atoms and may be either normal or branched and have substituents such as halogen atoms. Examples of the alkyl group include methyl, ethyl, n- and i-propyl, n-, i-, s- and t-butyl, n-pentyl, isopentyl, t-pentyl, and trifluoromethyl.

The aryl groups represented by $R_1$ to $R_3$ are preferably monocyclic and have 6 to 24 carbon atoms and may have substituents such as halogen atoms and alkyl groups. One exemplary group is phenyl.

The acyl groups represented by $R_1$ to $R_3$ are preferably those having 2 to 10 carbon atoms, for example, acetyl, propionyl, and butyryl.

The ester groups represented by $R_1$ to $R_3$ are preferably those having 2 to 10 carbon atoms, for example, methoxycarbonyl, ethoxycarbonyl, and butoxycarbonyl.

The heterocyclic groups represented by $R_1$ to $R_3$ are preferably those having a nitrogen atom (N), oxygen atom (O) or sulfur atom (S) as a hetero atom, more preferably those derived from a 5-membered heterocycle fused to a benzene ring or naphthalene ring. Also preferred are those groups derived from a nitrogenous 6-membered heterocycle having a benzene ring as a fused ring. Illustrative examples include benzothiazolyl, benzoxazolyl, benzimidazolyl, and naphthothiazolyl groups, preferably in 2-yl form, as well as 2-pyridyl, 3-pyridyl, 4-pyridyl, 2-pyrazinyl, 2-quinolyl, and 7-quinolyl groups. They may have substituents, examples of which include alkyl, aryl, alkoxy, and aryloxy groups.

Preferred examples of the heterocyclic group represented by $R_1$ to $R_3$ are given below.

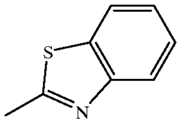

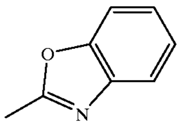

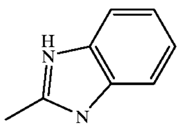

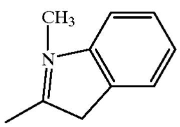

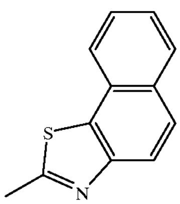

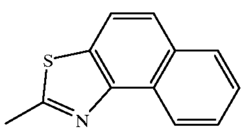

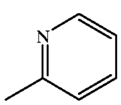

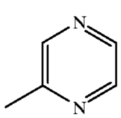

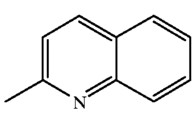

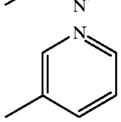

-continued

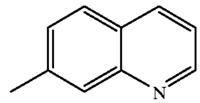

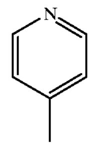

In formula (I), $R_1$ to $R_3$, taken together, may form a ring. Examples of the ring formed thereby include carbocycles such as cyclopentene.

It is preferred that $R_1$ to $R_3$ are not hydrogen atoms at the same time, and more preferably $R_1$ is a heterocyclic group as mentioned above.

In formula (I), each of $R_4$ and $R_7$ represents a hydrogen atom, alkyl group (methyl, etc.) or aryl group (phenyl, naphthyl, etc.). Each of $R_5$ and $R_6$ is an alkyl group or aryl group, and they may be identical or different, often identical, with the alkyl group being especially preferred.

Examples of the alkyl group represented by $R_4$ to $R_7$ are as exemplified for $R_1$ to $R_3$.

Each pair of $R_4$ and $R_5$, $R_5$ and $R_6$, and $R_6$ and $R_7$, taken together, may form a ring. Preferably, each pair of $R_4$ and $R_5$, and $R_6$ and $R_7$, taken together, form a 6-membered ring with the carbon atoms (C) and nitrogen atom (N) at the same time. When a partially hydrogenated quinolizine ring is formed in this way, the structural formula is preferably the following formula (Ia). This formula is especially effective for preventing fluorescence density extinction by the interaction between coumarin compounds themselves, leading to improved fluorescence quantum yields.

(Ia)

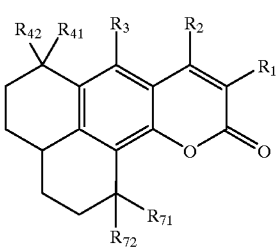

In formula (Ia) , $R_1$ to $R_3$ are as defined in formula (I) Each of $R_{41}$, $R_{42}$, $R_{71}$, and $R_{72}$ represents a hydrogen atom or alkyl group, examples of the alkyl group being as exemplified for $R_1$ to $R_3$.

Illustrative examples of the coumarin derivative of formula (I) are given below although the invention is not limited thereto. The following examples are expressed by a combination of R's in formula (I) or (Ia). Ph represents a phenyl group.

| Compound | $R_1$ | $R_2$ | $R_3$ | $R_4$ | $R_5$ | $R_6$ | $R_7$ |
|---|---|---|---|---|---|---|---|
| I-101 | 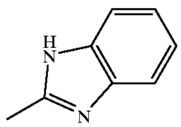 | H | H | H | $—C_2H_5$ | $—C_2H_5$ | H |
| I-102 | 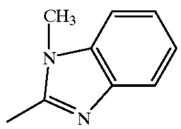 | H | H | H | $—C_2H_5$ | $—C_2H_5$ | H |
| I-103 | 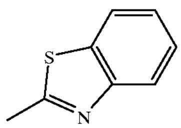 | H | H | H | $—C_2H_5$ | $—C_2H_5$ | H |
| I-104 | 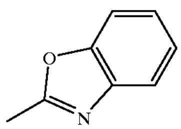 | H | H | H | $—C_2H_5$ | $—C_2H_5$ | H |
| I-105 | 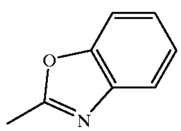 | H | H | H | $—CH_3$ | $—CH_3$ | H |
| I-106 | 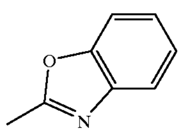 | H | H | H | —Ph | —Ph | H |
(I)
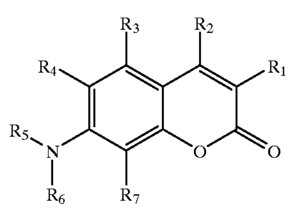
| | | | | | | | |
|---|---|---|---|---|---|---|---|
| I-107 | 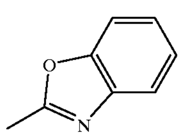 | H | H | H | o-tolyl | o-tolyl | H |
| I-108 | 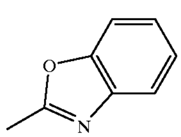 | H | H | H | m-tolyl | m-tolyl | H |
| I-109 | 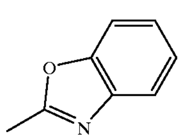 | H | H | H | p-tolyl | p-tolyl | H |

-continued
| | | | | | | | |
|---|---|---|---|---|---|---|---|
| I-110 | 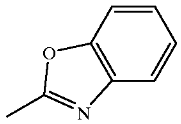 | H | H | H | 1-naphthyl | 1-naphthyl | H |
| I-111 | 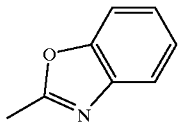 | H | H | H | 2-naphthyl | 2-naphthyl | H |
| I-112 | 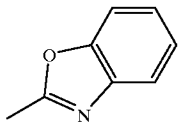 | H | H | H | m-biphenylyl | m-biphenylyl | H |
| I-113 | 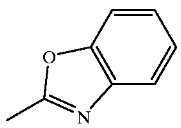 | H | H | H | p-biphenylyl | p-biphenylyl | H |
| I-114 | 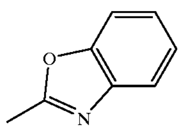 | H | H | H | Ph | $CH_3$ | H |
| I-115 | 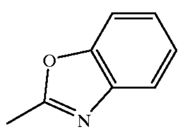 | H | H | H | 1-naphthyl | $CH_3$ | H |
| I-116 | 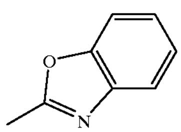 | H | H | H | 2-naphthyl | $CH_3$ | H |
| I-117 | 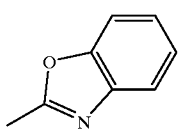 | H | H | H | $CH_3$ | $CH_3$ | $CH_3$ |
(I)
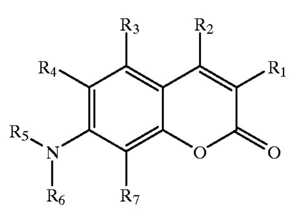
| Compound | $R_1$ | $R_2$ | $R_3$ | $R_{41}$ | $R_{42}$ | $R_{71}$ | $R_{72}$ |
|---|---|---|---|---|---|---|---|
| I-201 | 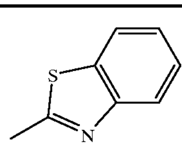 | H | H | $CH_3$ | $CH_3$ | $CH_3$ | $CH_3$ |

-continued
| | | | | | | | |
|---|---|---|---|---|---|---|---|
| I-202 | 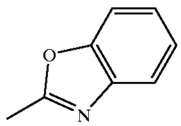 | H | H | $CH_3$ | $CH_3$ | $CH_3$ | $CH_3$ |
| I-203 | 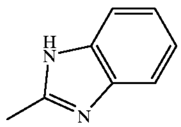 | H | H | $CH_3$ | $CH_3$ | $CH_3$ | $CH_3$ |
| I-204 | 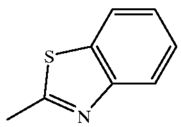 | H | H | H | H | H | H |
| I-205 | 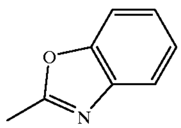 | H | H | H | H | H | H |
| I-206 | 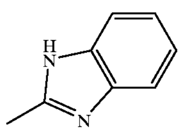 | H | H | H | H | H | H |
| I-207 | 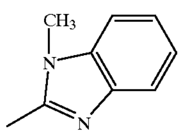 | H | H | $CH_3$ | $CH_3$ | $CH_3$ | $CH_3$ |
(Ia)
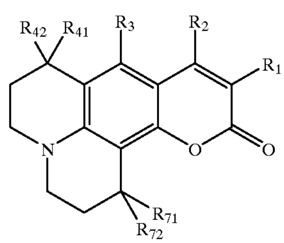
| | | | | | | | |
|---|---|---|---|---|---|---|---|
| I-208 | 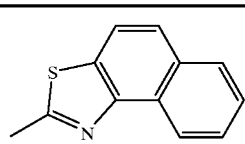 | H | H | $CH_3$ | $CH_3$ | $CH_3$ | $CH_3$ |
| I-209 | 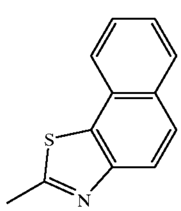 | H | H | $CH_3$ | $CH_3$ | $CH_3$ | $CH_3$ |
| I-210 | 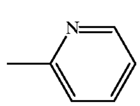 | H | H | $CH_3$ | $CH_3$ | $CH_3$ | $CH_3$ |

-continued (Ia)

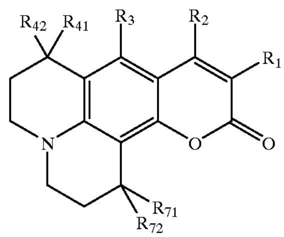

| | | | | | | | |
|---|---|---|---|---|---|---|---|
| I-211 | —$CO_2C_2H_5$ | H | H | $CH_3$ | $CH_3$ | $CH_3$ | $CH_3$ |
| I-212 | H | $CH_3$ | H | $CH_3$ | $CH_3$ | $CH_3$ | $CH_3$ |
| I-213 | $R_1$ and $R_2$ together form a fused cyclopentene ring | | H | $CH_3$ | $CH_3$ | $CH_3$ | $CH_3$ |
| I-214 | H | $CF_3$ | H | $CH_3$ | $CH_3$ | $CH_3$ | $CH_3$ |
| I-215 | $COCH_3$ | H | H | $CH_3$ | $CH_3$ | $CH_3$ | $CH_3$ |
| I-216 | CN | H | H | $CH_3$ | $CH_3$ | $CH_3$ | $CH_3$ |
| I-217 | $CO_2H$ | H | H | $CH_3$ | $CH_3$ | $CH_3$ | $CH_3$ |
| I-218 | —$CO_2C_4H_9$(t) | H | H | $CH_3$ | $CH_3$ | $CH_3$ | $CH_3$ |
| I-219 | —Ph | H | H | $CH_3$ | $CH_3$ | $CH_3$ | $CH_3$ |

(Ia)

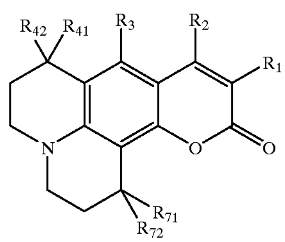

These compounds can be synthesized by the methods described in JP-A 9952/1994, Ger. Offen. 1098125, etc.

The coumarin derivatives of formula (I) may be used alone or in admixture of two or more.

Next, the tetraaryldiamine derivative of formula (II) used in the hole injecting and/or transporting layer is described.

In formula (II), each of $Ar_1$, $Ar_2$, $Ar_3$, and $Ar_4$ is an aryl group, and at least one of $Ar_1$, to $Ar_4$ is a polycyclic aryl group derived from a fused ring or ring cluster having at least two benzene rings.

The aryl groups represented by $Ar_1$ to $Ar_4$ may have substituents and preferably have 6 to 24 carbon atoms in total. Examples of the monocyclic aryl group include phenyl and tolyl; and examples of the polycyclic aryl group include 2-biphenylyl, 3-biphenylyl, 4-biphenylyl, 1-naphthyl, 2-naphthyl, anthryl, phenanthryl, pyrenyl, and perylenyl.

It is preferred in formula (II) that the amino moiety resulting from the attachment of $Ar_1$ and $Ar_2$ be identical with the amino moiety resulting from the attachment of $Ar_3$ and $Ar_4$.

In formula (II), each of $R_{11}$ and $R_{12}$ represents an alkyl group, and each of p and q is 0 or an integer of 1 to 4.

Examples of the alkyl group represented by $R_{11}$ and $R_{12}$ are as exemplified for $R_1$ to $R_3$ in formula (I), with methyl being preferred. Letters p and q are preferably 0 or 1.

In formula (II), each of $R_{13}$ and $R_{14}$ is an aryl group, and each of r and s is 0 or an integer of 1 to 5.

Examples of the aryl group represented by $R_{13}$ and $R_{14}$ are as exemplified for $R_1$ to $R_3$ in formula (I), with phenyl being preferred. Letters r and s are preferably 0 or 1.

Illustrative examples of the tetraaryldiamine derivative of formula (II) are given below although the invention is not limited thereto. The following examples are expressed by a combination of Ar's in formula (IIa). With respect to $R_{51}$ to $R_{58}$ and $R_{59}$ to $R_{68}$, H is shown when they are all hydrogen atoms, and only a substituent is shown if any.

(II)

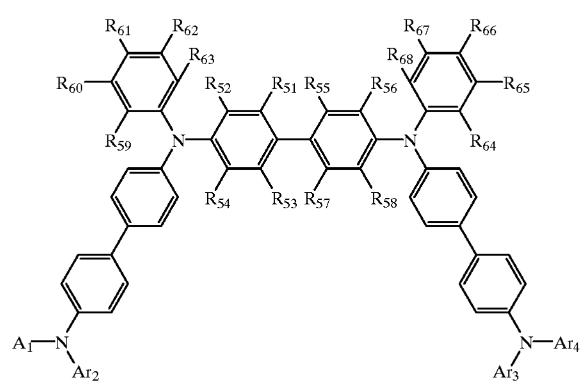

| Compound | $Ar_1$ | $Ar_2$ | $Ar_3$ | $Ar_4$ | $R_{51}$–$R_{58}$ | $R_{59}$–$R_{68}$ |
|---|---|---|---|---|---|---|
| II-101 | 3-biphenylyl | 3-biphenylyl | 3-biphenylyl | 3-biphenylyl | H | H |
| II-102 | Ph | 3-biphenylyl | Ph | 3-biphenylyl | H | H |
| II-103 | 4-biphenylyl | 4-biphenylyl | 4-biphenylyl | 4-biphenylyl | H | H |
| II-104 | Ph | 4-biphenylyl | Ph | 4-biphenylyl | H | H |
| II-105 | Ph | 2-naphthyl | Ph | 2-naphthyl | H | H |
| II-106 | Ph | pyrenyl | Ph | pyrenyl | H | H |
| II-107 | Ph | 1-naphthyl | Ph | 1-naphthyl | H | H |
| II-108 | 2-naphthyl | 2-naphthyl | 2-naphthyl | 2-naphthyl | H | H |
| II-109 | 3-biphenylyl | 3-biphenylyl | 3-biphenylyl | 3-biphenylyl | $R_{52}$=$R_{56}$=$CH_3$ | H |
| II-110 | 3-biphenylyl | 3-biphenylyl | 3-biphenylyl | 3-biphenylyl | H | $R_{61}$=$R_{66}$=Ph |
| II-111 | 3-biphenylyl | 3-biphenylyl | 3-biphenylyl | 3-biphenylyl | H | $R_{60}$=$R_{65}$=Ph |
| II-112 | 3-biphenylyl | 3-biphenylyl | 3-biphenylyl | 3-biphenylyl | H | $R_{59}$=$R_{64}$=Ph |

These compounds can be synthesized by the method described in EP 0650955Al (corresponding to Japanese Patent Application No. 43564/1995), etc.

These compounds have a molecular weight of about 1,000 to about 2,000, a melting point of about 200° C. to about 400° C., and a glass transition temperature of about 130° C. to about 200° C. Due to these characteristics, they form satisfactory, smooth, transparent films as by conventional vacuum evaporation, and the films exhibit a stable amorphous state even above room temperature and maintain that state over an extended period of time. Also, the compounds can be formed into thin films by themselves without a need for binder resins.

The tetraaryldiamine derivatives of formula (II) may be used alone or in admixture of two or more.

The organic EL device of the invention uses the coumarin derivative of formula (I) in a light emitting layer and the tetraaryldiamine derivative of formula (II) in a hole injecting and/or transporting layer, typically a hole injecting and transporting layer.

FIG. 1 illustrates one exemplary construction of the organic EL device of the invention. The organic EL device 1 is illustrated in FIG. 1 as comprising an anode 3, a hole injecting and transporting layer 4, a light emitting layer 5, an electron injecting and transporting layer 6, and a cathode 7 stacked on a substrate 2 in the described order. Light emission exits from the substrate 2 side. A color filter film 8 (adjacent to the substrate 2) and a fluorescence conversion filter film 9 are disposed between the substrate 2 and the anode 3 for controlling the color of light emission. The organic EL device 1 further includes a sealing layer 10 covering these layers 4, 5, 6, 8, 9 and electrodes 3, 7. The entirety of these components is disposed within a casing 11 which is integrally attached to the glass substrate 2. A gas or liquid 12 is contained between the sealing layer 10 and the casing 11. The sealing layer 10 is formed of a resin such as Teflon and the casing 11 may be formed of such a material as glass or aluminum and joined to the substrate 2 with a photo-curable resin adhesive or the like. The gas or liquid 12 used herein may be dry air, an inert gas such as $N_2$ and Ar, an inert liquid such as fluorinated compounds, or a dehumidifying agent.

The light emitting layer has functions of injecting holes and electrons, transporting them, and recombining holes and electrons to create excitons. Those compounds which are bipolarly (to electrons and holes) stable and produce a high fluorescence intensity are preferably used in the light emitting layer. The hole injecting and transporting layer has functions of facilitating injection of holes from the anode, transporting holes in a stable manner, and obstructing electron transportation. The electron injecting and transporting layer has functions of facilitating injection of electrons from the cathode, transporting electrons in a stable manner, and obstructing hole transportation. These layers are effective for confining holes and electrons injected into the light emitting layer to increase the density of holes and electrons therein for establishing a full chance of recombination, thereby optimizing the recombination region to improve light emission efficiency. The hole injecting and transporting layer and the electron injecting and transporting layer are provided if necessary in consideration of the height of the hole injecting, hole transporting, electron injecting, and electron transporting functions of the compound used in the light emitting layer. For example, if the compound used in the light emitting layer has a high hole injecting and transporting function or a high electron injecting and transporting function, then it is possible to construct such that the light emitting layer may also serve as the hole injecting and transporting layer or electron injecting and transporting layer while the hole injecting and transporting layer or electron injecting and transporting layer is omitted. In some embodiments, both the hole injecting and transporting layer and the electron injecting and transporting layer may be omitted. Each of the hole injecting and transporting layer and the electron injecting and transporting layer may be provided as separate layers, a layer having an injecting function and a layer having a transporting function.

The thickness of the light emitting layer, the thickness of the hole injecting and transporting layer, and the thickness of the electron injecting and transporting layer are not critical and vary with a particular formation technique although their preferred thickness is usually from about 5 nm to about 1,000 nm, especially from 10 nm to 200 nm.

The thickness of the hole injecting and transporting layer and the thickness of the electron injecting and transporting layer, which depend on the design of the recombination/light emitting region, may be approximately equal to or range from about 1/10 to about 10 times the thickness of the light emitting layer. In the embodiment wherein the hole or electron injecting and transporting layer is divided into an injecting layer and a transporting layer, it is preferred that the injecting layer be at least 1 nm thick and the transporting layer be at least 20 nm thick. The upper limit of the thickness of the injecting layer and the transporting layer in this embodiment is usually about 1,000 nm for the injecting layer and about 100 nm for the transporting layer. These film thickness ranges are also applicable where two injecting and transporting layers are provided.

The control of the thicknesses of a light emitting layer, an electron injecting and transporting layer, and a hole injecting and transporting layer to be combined in consideration of the carrier mobility and carrier density (which is dictated by the ionization potential and electron affinity) of the respective layers allows for the free design of the recombination/light emitting region, the design of emission color, the control of luminescence intensity and emission spectrum by means of the optical interference between the electrodes, and the control of the space distribution of light emission, enabling the manufacture of a desired color purity device or high efficiency device.

The coumarin derivative of formula (I) is best suited for use in the light emitting layer since it is a compound having a high fluorescence intensity. The content of the compound in the light emitting layer is preferably at least 0.01% by weight, more preferably at least 1.0% by weight.

In the practice of the invention, the light emitting layer may further contain a fluorescent material in addition to the coumarin derivative of formula (I). The fluorescent material may be at least one member selected from compounds as disclosed in JP-A 264692/1988, for example, quinacridone, rubrene, and styryl dyes. Also included are quinoline derivatives, for example, metal complex dyes having 8-quinolinol or a derivative thereof as a ligand such as tris(8-quinolinolato)aluminum, tetraphenylbutadiene, anthracene, perylene, coronene, and 12-phthaloperinone derivatives. Further included are phenylanthracene derivatives of JP-A 12600/1996 and tetraarylethene derivatives of JP-A 12969/1996.

It is preferred to use the coumarin derivative of formula (I) in combination with a host material, especially a host material capable of light emission by itself, that is, to use the coumarin derivative as a dopant. In this embodiment, the content of the coumarin derivative in the light emitting layer is preferably 0.01 to 10% by weight, especially 0.1 to 5% by weight. By using the coumarin derivative in combination with the host material, the light emission wavelength of the host material can be altered, allowing light emission to be shifted to a longer wavelength and improving the luminous efficacy and stability of the device.

In practice, the doping concentration may be determined in accordance with the required luminance, lifetime, and drive voltage. Doping concentrations of 1% by weight or higher ensure high luminance devices, and doping concentrations between 1.5 to 6% by weight ensure devices featuring a high luminance, minimized drive voltage increase, and long luminescent lifetime.

Preferred host materials which are doped with the coumarin derivative of formula (I) are quinoline derivatives, more preferably quinolinolato metal complexes having 8-quinolinol or a derivative thereof as a ligand, especially aluminum complexes. The derivatives of 8-quinolinol are 8-quinolinol having substituents such as halogen atoms and alkyl groups and 8-quinolinol having a benzene ring fused thereto. Examples of the aluminum complex are disclosed in JP-A 264692/1988, 255190/1991, 70733/1993, 258859/1993, and 215874/1994. These compounds are electron transporting host materials.

Illustrative examples include tris(8-quinolinolato) aluminum, bis(8-quinolinolato)magnesium, bis(benzo {f}-8-quinolinolato)zinc, bis(2-methyl-8-quinolinolato) aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato) aluminum(III), bis(2-methyl-8-quinolinolato)(ortho-cresolato)aluminum(III), bis(2-methyl-8-quinolinolato)(meta-cresolato)aluminum(III), bis(2-methyl-8-quinolinolato)(para-cresolato)aluminum(III), bis(2-methyl-8-quinolinolato)(ortho-phenylphenolato)aluminum(III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminum(III), bis( 2-methyl-8-quinolinolato)(3,5-dimethylphenolato)aluminum(III), bis(2-methyl-8-quinolinolato)(3,5-di-tert-butylphenolato)aluminum(III), bis(2-methyl-8-quinolinolato)(2,6-diphenylphenolato) aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis(2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato)(2-naphtholato)aluminum(III), bis(2,4-dimethyl-8-quinolinolato)(ortho-phenylphenolato)aluminum(III), bis(2,4-dimethyl-8-quinolinolato)(para-phenylphenolato) aluminum(III), bis(2,4-dimethyl-8-quinolinolato)(meta-phenylphenolato)aluminum(III), bis(2,4-dimethyl-8-quinolinolato)(3,5-dimethylphenolato)aluminum(III), bis(2,4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(para-phenylphenolato)aluminum(III), bis(2-methyl-5-cyano-8-quinolinolato)(ortho-cresolato)aluminum (III), and bis(2-methyl-6-trifluoromethyl-8-quinolinolato)(2-naphtholato)aluminum(III).

Also acceptable are bis(2-methyl-8-quinolinolato) aluminum(III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum (III).

In the practice of the invention, tris(8-quinolinolato) aluminum is most preferred among these.

Other useful host materials are phenylanthracene derivatives as described in JP-A 12600/1996 and tetraarylethene derivatives as described in JP-A 12969/1996.

The phenylanthracene derivatives are of the following formula (V).

$$A^1—L^1—A^2 \qquad (V)$$

In formula (V), $A^1$ and $A^2$ each are a monophenylanthryl or diphenylanthryl group, and they may be identical or different.

The monophenylanthryl or diphenylanthryl group represented by $A^1$ and $A^2$ may be a substituted or unsubstituted one. Where substituted, exemplary substituents include alkyl, aryl, alkoxy, aryloxy, and amino groups, which may be further substituted. Although the position of such substituents on the phenylanthryl group is not critical, the substituents are preferably positioned on the phenyl group bonded to the anthracene ring rather than on the anthracene ring. Preferably the phenyl group is bonded to the anthracene ring at its 9- and 10-positions.

In formula (V), $L^1$ is a valence bond or an arylene group. The arylene group represented by $L^1$ is preferably an unsubstituted one. Examples include ordinary arylene groups such as phenylene, biphenylene, and anthrylene while two or more directly bonded arylene groups are also included. Preferably $L^1$ is a valence bond, p-phenylene group, and 4,4'-biphenylene group.

The arylene group represented by $L^1$ may be a group having two arylene groups separated by an alkylene group, —O—, —S— or —NR—. R is an alkyl or aryl group. Exemplary alkyl groups are methyl and ethyl and an exemplary aryl group is phenyl. Preferably R is an aryl group which is typically phenyl as just mentioned while it may be $A^1$ or $A^2$ or phenyl having $A^1$ or $A^2$ substituted thereon. Preferred alkylene groups are methylene and ethylene groups.

The tetraarylethene derivatives are represented by the following formula (VI).

(VI)

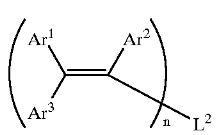

In formula (VI), $Ar^1$, $Ar^2$, and $Ar^3$ each are an aromatic residue and they may be identical or different.

The aromatic residues represented by $Ar^1$ to $Ar^3$ include aromatic hydrocarbon groups (aryl groups) and aromatic heterocyclic groups. The aromatic hydrocarbon groups may be monocyclic or polycyclic aromatic hydrocarbon groups inclusive of fused rings and ring clusters. The aromatic hydrocarbon groups preferably have 6 to 30 carbon atoms in total and may have a substituent. The substituents, if any, include alkyl groups, aryl groups, alkoxy groups, aryloxy groups, and amino groups. Examples of the aromatic hydrocarbon group include phenyl, alkylphenyl, alkoxyphenyl, arylphenyl, aryloxyphenyl, aminophenyl, biphenyl, naphthyl, anthryl, pyrenyl, and perylenyl groups.

Preferred aromatic heterocyclic groups are those containing O, N or S as a hetero-atom and may be either five or six-membered. Examples are thienyl, furyl, pyrrolyl, and pyridyl groups.

Phenyl groups are especially preferred among the aromatic groups represented by $Ar^1$ to $Ar^3$.

Letter n is an integer of 2 to 6, preferably an integer of 2 to 4.

$L^2$ represents an n-valent aromatic residue, preferably divalent to hexavalent, especially divalent to tetravalent residues derived from aromatic hydrocarbons, aromatic heterocycles, aromatic ethers or aromatic amines. These aromatic residues may further have a substituent although unsubstituted ones are preferred.

The compounds of formulae (V) and (VI) become either electron or hole transporting host materials depending on a combination of groups therein.

Preferably, the light emitting layer using the coumarin derivative of formula (I) is not only a layer in which the coumarin derivative is combined with a host material as mentioned above, but also a layer of a mixture of at least one hole injecting and transporting compound and at least one electron injecting and transporting compound in which the compound of formula (I) is preferably contained as a dopant. In such a mix layer, the content of the coumarin derivative of formula (I) is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited. If the compounds to be mixed are stable to carriers, then the organic compound is less susceptible to damage, resulting in the advantage of an extended device life. By incorporating the coumarin derivative of formula (I) in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole injecting and transporting layer and compounds for the electron injecting and transporting layer to be described later, respectively. Inter alia, the hole injecting and transporting compound is preferably selected from aromatic tertiary amines, specifically the tetraaryldiamine derivatives of formula (II), N,N'-bis(3-methylphenyl)-N,N'-diphenyl-4,4'-diaminobiphenyl, N,N'-bis(3-biphenyl) -N, N'-diphenyl-4,4'-diaminobiphenyl, N,N'-bis(4-t-butylphenyl)-N,N'-diphenyl-1,1'-biphenyl-4,4'-diamine, N,N,N',N'-tetrakis(3-biphenyl)-1,11-biphenyl-4,4'-diamine, N,N'-diphenyl-N,N'-bis(4'-(N-3(methylphenyl)-N-phenyl)amino-biphenyl-4-yl) benzidine, etc. as well as the compounds described in JP-A 295695/1988, JP-A 234681/1994, and EP 0650955A1 (corresponding to Japanese Patent Application No. 43564/1995). Preferred among others are the tetraaryldiamine derivatives of formula (II). Also, the electron injecting and transporting compound used is selected from quinoline derivatives and metal complexes having 8-quinolinol or a derivative thereof as a ligand, especially tris(8-quinolinolato)aluminum.

The mix ratio is preferably determined in accordance with the carrier density and carrier mobility. It is preferred that the weight ratio of the hole injecting and transporting compound to the electron injecting and transporting compound range from about 1/99 to about 99/1, more preferably from about 20/80 to about 80/20, especially from about 30/70 to about 70/30. This limitation is not imposed on some devices with particular combinations of materials.

The hole injecting and transporting compound is such that when current densities of holes and electrons are measured using a monolayer film device having a monolayer film of this compound of about 1 $\mu$m thick interposed between a cathode and an anode, the hole current density is greater than the electron current density by a multiplicative factor of more than 2, preferably by a factor of at least 6, more preferably by a factor of at least 10. On the other hand, the electron injecting and transporting compound is such that when current densities of holes and electrons are measured using a monolayer film device of the same construction, the electron current density is greater than the hole current density by a multiplicative factor of more than 2, preferably by a factor of at least 6, more preferably by a factor of at least 10. It is noted that the cathode and anode used herein are the same as actually used ones.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

In the mix layer mentioned above, a quinacridone compound of formula (III) or a styryl amine compound of formula (IV) may be used as the dopant as well as the coumarin derivative of formula (I). The amounts of these dopants are the same as the coumarin derivative of formula (I).

Illustrative examples of the quinacridone compound of formula (III) are given below. The following examples are expressed by a combination of R's in the following formula (IIIa). The fused benzene ring at each end is given 1- to 5-positions so that the positions where a benzene ring is further fused thereto are realized.

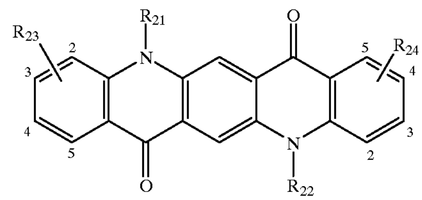

(IIIa)

| Compound No. | $R_{21}$ | $R_{22}$ | $R_{23}$ | $R_{24}$ |
|---|---|---|---|---|
| III-1 | H | H | H | H |
| III-2 | —$CH_3$ | —$CH_3$ | H | H |
| III-3 | —$C_2H_5$ | —$C_2H_5$ | H | H |
| III-4 | —$C_3H_7$ | —$C_3H_7$ | H | H |
| III-5 | —$C_4H_9$ | —$C_4H_9$ | H | H |
| III-6 | —Ph | —Ph | H | H |
| III-7 | o-tolyl | o-tolyl | H | H |
| III-8 | m-tolyl | m-tolyl | H | H |
| III-9 | p-tolyl | p-tolyl | H | H |
| III-10 | 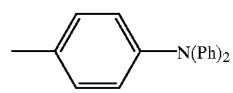 | 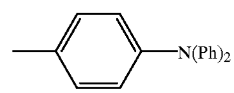 | H | H |
| III-11 | —$CH_3$ | —$CH_3$ | 2,3-fused benzo | 2,3-fused benzo |
| III-12 | H | H | 2,3-fused benzo | 2,3-fused benzo |

(III)

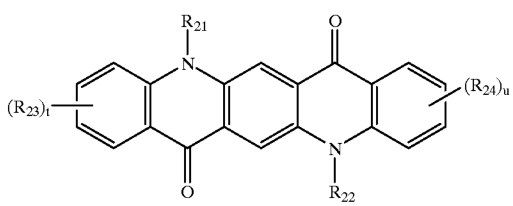

Referring to formula (III), each of $R_{21}$ and $R_{22}$ is a hydrogen atom, alkyl or aryl group, and they may be identical or different. The alkyl groups represented by Ri and $R_{22}$ are preferably those of 1 to 5 carbon atoms and may have substituents. Exemplary are methyl, ethyl, propyl, and butyl.

The aryl groups represented by $R_{21}$ and $R_{22}$ may have substituents and are preferably those having 1 to 30 carbon atoms in total. Exemplary are phenyl, tolyl, and diphenylaminophenyl.

Each of $R_{23}$ and $R_{24}$ is an alkyl or aryl group, illustrative examples of which are as described for $R_{21}$ and $R_{22}$. Each of t and u is 0 or an integer of 1 to 4, preferably 0. Adjacent $R_{23}$ groups or $R_{24}$ groups, taken together, may form a ring when t or u is at least 2, exemplary rings being carbocycles such as benzene and naphthalene rings.

These compounds can be synthesized by well-known methods described, for example, in U.S. Pat. Nos. 2,821,529, 2,821,530, 2, 44,484, and 2,844,485 while commercially available products are useful.

(IV)

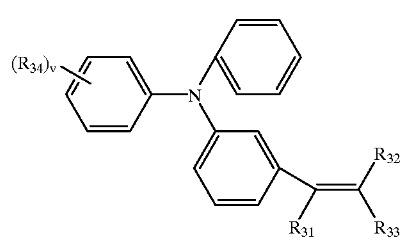

Referring to formula (IV), $R_{31}$ is a hydrogen atom or aryl group. The aryl groups represented by $R_{31}$ may have substituents and are preferably those having 6 to 30 carbon atoms in total, for example, phenyl.

Each of $R_{32}$ and $R_{33}$ is a hydrogen atom, aryl or alkenyl group, and they may be identical or different.

The aryl groups represented by $R_{32}$ and $R_{33}$ may have substituents and are preferably those having 6 to 70 carbon atoms in total. Exemplary aryl groups are phenyl, naphthyl, and anthryl while preferred substituents are arylamino and arylaminoaryl groups. Styryl groups are also included in the substituents and in such cases, a structure wherein monovalent groups derived from the compound of formula (IV) are bonded directly or through a coupling group is also favorable.

The alkenyl groups represented by $R_{32}$ and $R_{34}$ may have substituents and are preferably those having 2 to 50 carbon atoms in total, for example, vinyl groups. It is preferred that the vinyl groups form styryl groups and in such cases, a structure wherein monovalent groups derived from the compound of formula (IV) are bonded directly or through a coupling group is also favorable.

$R_{34}$ is an arylamino or arylaminoaryl group. A styryl group may be contained in these groups and in such cases, a structure wherein monovalent groups derived from the compound of formula (IV) are bonded directly or through a coupling group is also favorable.

Illustrative examples of the styryl amine compound of formula (IV) are given below.

IV-1

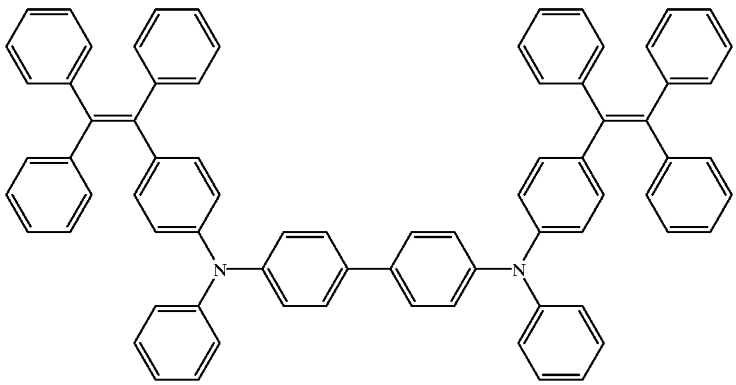

IV-2

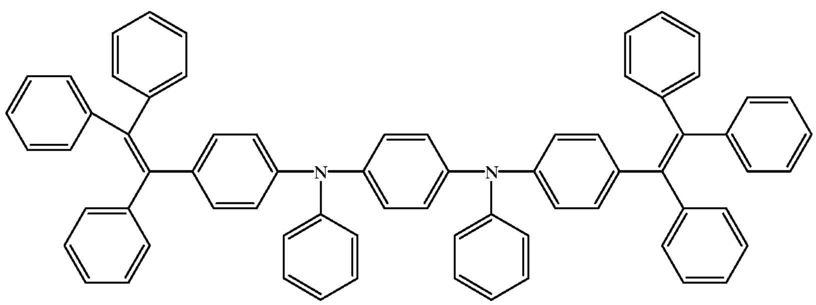

IV-3

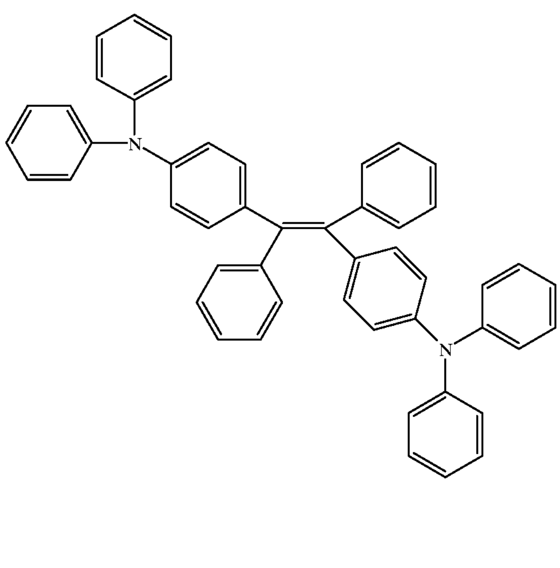

-continued
IV-4
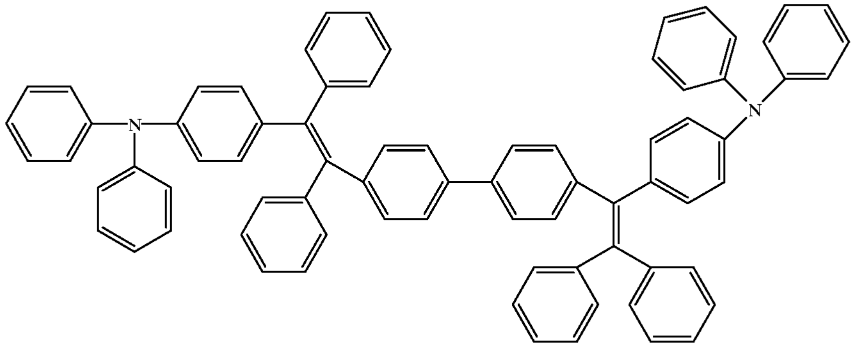
IV-5
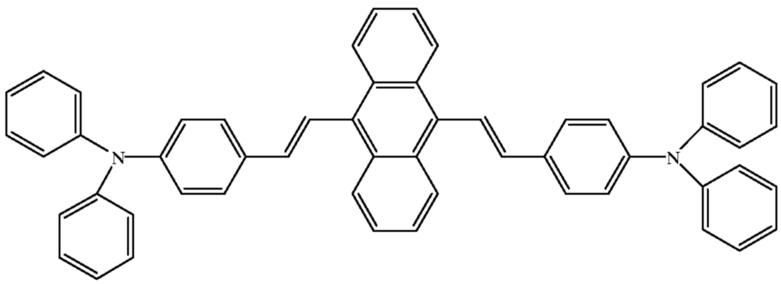
IV-6
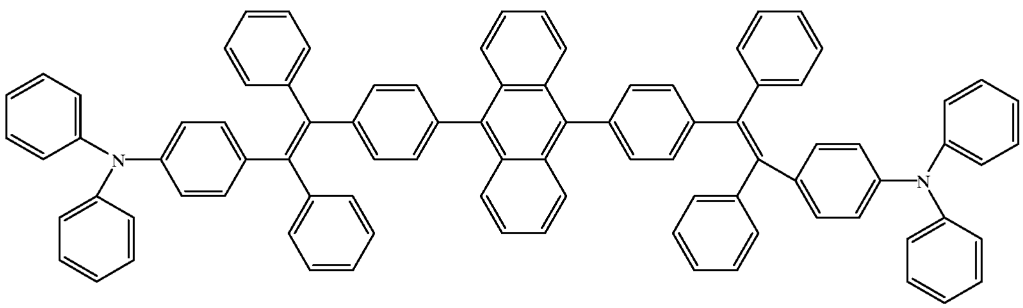
IV-7
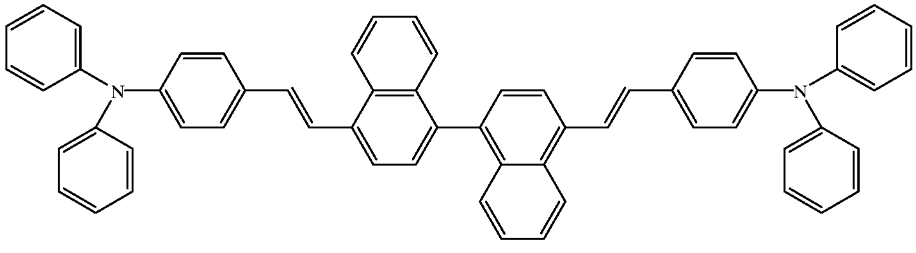
IV-8
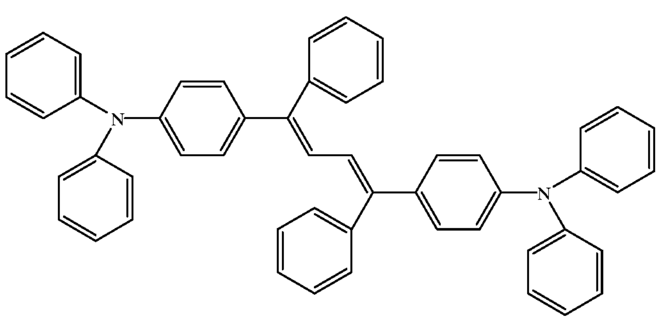

These compounds can be synthesized by well-known methods, for example, by effecting Wittig reaction of triphenylamine derivatives or (homo or hetero) coupling of halogenated triphenylamine derivatives in the presence of Ni(O) complexes while commercially available products are useful.

Understandably, in the mix layer, the dopants may be used alone or in admixture of two or more.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material, or spin coating a solution thereof directly, or coating a dispersion thereof in a resin binder.

According to the invention, there is formed at least one hole injecting and/or transporting layer, that is, at least one layer of a hole injecting and transporting layer, hole injecting layer, and a hole transporting layer, and the at least one layer contains the tetraaryldiamine derivative of formula (II) especially when the light emitting layer is not of the mix layer type. The content of the tetraaryldiamine derivative of formula (II) in such a layer is preferably at least 10% by weight. The compounds for hole injecting and/or transporting layers which can be used along with the tetraaryldiamine derivative of formula (II) in the same layer or in another layer include various organic compounds described in JP-A 295695/1988, 191694/1990 and 792/1991, for example, aromatic tertiary amines, hydrazone derivatives, carbazole derivatives, triazole derivatives, imidazole derivatives, oxadiazole derivatives having an amino group, and polythiophenes. These compounds may be used in admixture of two or more or in multilayer form. Understandably, the relevant compound is not limited to the tetraaryldiamine derivative of formula (II), but may selected from a wider variety of compounds when a light emitting layer of the mix layer type is combined. For devices of a particular design, it is sometimes advisable that the hole injecting and transporting compound used in the mix layer is used in a hole injecting and transporting layer or a hole transporting layer disposed adjacent to the light emitting layer.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the anode (tin-doped indium oxide ITO etc.) and to dispose the hole injecting layer close to the anode and the hole transporting layer close to the light emitting layer. It is also preferred to use a compound having good thin film forming ability at the anode surface. The relationship of the order of lamination to ionization potential also applies where a plurality of hole injecting and transporting layers are provided. Such an order of lamination is effective for lowering drive voltage and preventing current leakage and development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer.

It is generally advisable to use the tetraaryldiamine derivative of formula (II) in a layer on the light emitting layer side.

In the practice of the invention, an electron injecting and transporting layer may be provided as the electron injecting and/or transporting layer. For the electron injecting and transporting layer, there may be used quinoline derivatives including organic metal complexes having 8-quinolinol or a derivative thereof as a ligand such as tris(8-quinolinolato) aluminum, oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as a light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to laminate layers in such an order that a layer of a compound having a greater electron affinity may be disposed adjacent the cathode and to dispose the electron injecting layer close to the cathode and the electron transporting layer close to the light emitting layer. The relationship of the order of lamination to electron affinity also applies where a plurality of electron injecting and transporting layers are provided.

In the practice of the invention, the organic compound layers including the light emitting layer, the hole injecting and transporting layer, and the electron injecting and transporting layer may further contain a compound known as the singlet oxygen quencher. Exemplary quenchers include rubrene, nickel complexes, diphenylisobenzofuran, and tertiary amines.

Especially in the hole injecting and transporting layer, the hole injecting layer and the hole transporting layer, the combined use of an aromatic tertiary amine such as the tetraaryldiamine derivative of formula (II) and rubrene is preferred. The amount of rubrene used in this embodiment is preferably 0.1 to 20% by weight of the aromatic tertiary amine such as the tetraaryldiamine derivative of formula (II). With respect to rubrene, reference may be made to EP 065095A1 (corresponding to Japanese Patent Application No. 43564/1995). The inclusion of rubrene in the hole transporting layer or the like is effective for protecting the compounds therein from electron injection. Furthermore, by shifting the recombination region from the proximity to the interface in a layer containing an electron injecting and transporting compound such as tris(8-quinolinolato) aluminum to the proximity to the interface in a layer containing a hole injecting and transporting compound such as an aromatic tertiary amine, the tris(8-quinolinolato) aluminum or analogues can be protected from hole injection. The invention is not limited to rubrene, and any of compounds having lower electron affinity than the hole injecting and transporting compound and stable against electron injection and hole injection may be equally employed.

In the practice of the invention, the cathode is preferably made of a material having a low work function, for example, Li, Na, Mg, Al, Ag, In and alloys containing at least one of these metals. The cathode should preferably be of fine grains, especially amorphous. The cathode is preferably about 10 to 1,000 nm thick. An improved sealing effect is accomplished by evaporating or sputtering aluminum or a fluorine compound at the end of electrode formation.

In order that the organic EL device produce plane light emission, at least one of the electrodes should be transparent or translucent. Since the material of the cathode is limited as mentioned just above, it is preferred to select the material and thickness of the anode so as to provide a transmittance of at least 80% to the emitted radiation. For example, tin-doped indium oxide (ITO), zinc-doped indium oxide (IZO), $SnO_2$, Ni, Au, Pt, Pd, and doped polypyrrole are preferably used in the anode. The anode preferably has a thickness of about 10 to 500 nm. In order that the device be more reliable, the drive voltage should be low. In this regard, the preferred anode material is ITO (with a thickness of 20 to 300 nm) having 10 to 30 $\Omega/cm^2$ or less than 10 $\Omega/cm^2$ (commonly about 0.1 to 10 $\Omega/cm^2$). In practice, the thickness and optical constants of ITO are designed such that the optical interference effect due to the multiple reflection of light at the opposite interfaces of ITO and the cathode surface may meet a high light output efficiency and high color purity. Also, wiring of aluminum is acceptable in large-size devices such as displays because the ITO would have a high resistance.

The substrate material is not critical although a transparent or translucent material such as glass or resins is used in the illustrated embodiment wherein light exits from the substrate side. The substrate may be provided with a color filter film and a fluorescent material-containing fluorescence conversion filter film as illustrated in the figure or a dielectric reflecting film for controlling the color of light emission.

It is noted that where the substrate is made of an opaque material, the layer stacking order may be reversed from that shown in FIG. 1.

According to the invention, using various coumarin derivatives of formula (I) in the light emitting layer, light emission of green (λmax 490–550 nm), blue (λmax 440–490 nm) or red (λmax 580–660 nm), especially light emission of λmax 480–640 nm can be produced.

In this regard, the CIE chromaticity coordinates of green, blue and red light emissions are preferably at least equal to the color purity of the current CRT or may be equal to the color purity of NTSC Standards.

The chromaticity coordinates can be determined by conventional chromaticity meters. Measurements were made herein using calorimeters BM-7 and SR-1 of Topcon K. K.

In the practice of the invention, light emission having the preferred λmax and x and y values of CIE chromaticity coordinates can also be obtained by disposing a color filter film and a fluorescence conversion filter film.

The color filter film used herein may be a color filter as used in liquid crystal displays. The properties of a color filter may be adjusted in accordance with the light emission of the organic EL device so as to optimize the extraction efficiency and color purity. It is also preferred to use a color filter capable of cutting light of short wavelength which is otherwise absorbed by the EL device materials and fluorescence conversion layer, because the light resistance of the device and the contrast of display are improved. The light to be cut is light of wavelengths of 560 nm and longer and light of wavelengths of 480 nm and shorter in the case of green, light of wavelength of 490 nm and longer in the case of blue, and light of wavelengths of 580 nm and shorter in the case of red. Using such a color filter, desirable x and y values in the CIE chromaticity coordinates are obtainable. The color filter film may have a thickness of about 0.5 to 20 $\mu$m.

An optical thin film such as a multilayer dielectric film may be used instead of the color filter.

The fluorescence conversion filter film is to covert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. More particularly, the preferred fluorescent material has an emission maximum wavelength λmax of its fluorescent spectrum in the range of 490 to 550 nm for green, 440 to 480 nm for blue, and 580 to 640 nm for red and a half-value width of its spectrum near λmax in the range of 10 to 100 nm for any color. In practice, dyes for lasers are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, and styryl compounds.

The binder is selected from materials which do not cause extinction of fluorescence, preferably those materials which can be finely patterned by photolithography or printing technique. Also, those materials which are not damaged upon deposition of ITO are preferred.

The light absorbing material is used when the light absorption of the fluorescent material is short and may be omitted if unnecessary. The light absorbing material may also be selected from materials which do not cause extinction of fluorescence of the fluorescent material.

Using such a fluorescence conversion filter film, desirable x and y values in the CIE chromaticity coordinates are obtained. The fluorescence conversion filter film may have a thickness of 0.5 to 20 $\mu$m.

In the practice of the invention, the color filter film and the fluorescence conversion filter film may be used in combination as in the illustrated embodiment. Preferably, the color filter film adapted to cut light of a specific wavelength range is disposed on the side where light emission exits.

Further preferably, a protective film is provided over the color filter film and the fluorescence conversion filter film. The protective film may be made of glass or resins and selected from those materials which prevent any damage to the filter film and invite no problems in the subsequent steps. The protective film has a thickness of about 1 to 10 $\mu$m. The provision of the protective film prevents any damage to the filter film, provides a flat surface, and enables the adjustment of an index of refraction and a film thickness and the improvement of a light extraction efficiency.

The materials for the color filter film, fluorescence conversion filter film, and protective film may be used in commercially available state. These films can be formed by techniques such as coating, electrolytic polymerization, and gas phase deposition (evaporation, sputtering, and CVD).

Next, it is described how to prepare the organic EL device of the present invention.

The cathode and anode are preferably formed by gas phase deposition techniques such as evaporation and sputtering.

The hole injecting and transporting layer, the light emitting layer, and the electron injecting and transporting layer are preferably formed by vacuum evaporation because homogeneous thin films are available. By utilizing vacuum evaporation, there is obtained a homogeneous thin film which is amorphous or has a grain size of less than 0.1 $\mu$m (usually the lower limit is about 0.001 $\mu$m). If the grain size is more than 0.1 μm, uneven light emission would take place and the drive voltage of the device must be increased with a substantial lowering of electric charge injection efficiency.

The conditions for vacuum evaporation are not critical although a vacuum of $10^{-3}$ Pa ($10^{-5}$ Torr) or lower and an evaporation rate of about 0.001 to 1 nm/sec. are preferred. It is preferred to successively form layers in vacuum because the successive formation in vacuum can avoid adsorption of impurities on the interface between the layers, thus ensuring better performance. The drive voltage of a device can also be reduced.

In the embodiment wherein the respective layers are formed by vacuum evaporation, where it is desired for a single layer to contain two or more compounds, boats having the compounds received therein are individually temperature controlled to achieve co-deposition although the compounds may be previously mixed before evaporation. Besides, solution coating techniques (such as spin coating, dipping, and casting) and Langmuir-Blodgett (LB) technique may also be utilized. In the solution coating techniques, the compounds may be dispersed in matrix materials such as polymers.

There have been described organic EL devices of the monochromatic emission type although the invention is also applicable to organic EL devices capable of light emission from two or more luminescent species. In such organic EL devices, at least two light emitting layers including a bipolar light emitting layer are provided, which are constructed as a combination of bipolar light emitting layers, a combination of a bipolar light emitting layer with a hole transporting/light emitting layer disposed nearer to the anode than the bipolar light emitting layer, or a combination of a bipolar light emitting layer with an electron transporting/light emitting layer disposed nearer to the cathode than the bipolar light emitting layer.

The bipolar light emitting layer is a light emitting layer in which the injection and transport of electrons and the injection and transport of holes take place to an approximately equal extent so that electrons and holes are distributed throughout the light emitting layer whereby recombination points and luminescent points are spread throughout the light emitting layer.

More particularly, the bipolar light emitting layer is a light emitting layer in which the current density by electrons injected from the electron transporting layer and the current density by holes injected from the hole transporting layer are of an approximately equal order, that is, the ratio of current density between both carriers ranges from 1/10 to 10/1, preferably from 1/6 to 6/1, more preferably from 1/2 to 2/1.

In this regard, the ratio of current density between both carriers may be determined by using the same electrodes as the actually used ones, forming a monolayer film of the light emitting layer to a thickness of about 1 μm, and measuring a current density in the film.

On the other hand, the hole transporting light emitting layer has a higher hole current density than the bipolar type, and the electron transporting light emitting layer has a higher electron current density than the bipolar type.

Further description mainly refers to the bipolar light emitting layer.

In general, the current density is given by a product of a carrier density multiplied by a carrier mobility.

More specifically, the carrier density in a light emitting layer is determined by a barrier at the relevant interface. For example, the electron density is determined by the magnitude of an electron barrier (difference between electron affinities) at the interface of the light emitting layer where electrons are injected, and the hole density is determined by the magnitude of a hole barrier (difference between ionization potentials) at the interface of the light emitting layer where holes are injected. Also the carrier mobility is determined by the type of material used in the light emitting layer.

From these values, the distribution of electrons and holes in the light emitting layer is determined and hence, the luminescent region is determined.

Actually, if the carrier density and carrier mobility in the electrodes, electron transporting layer and hole transporting layer are fully high, a solution is derived from only the interfacial barrier as mentioned above. Where organic compounds are used in the electron transporting layer and the hole transporting layer, the transporting ability of the carrier transporting layers relative to the light emitting layer becomes insufficient. Then the carrier density of the light emitting layer is also dependent on the energy level of the carrier injecting electrodes and the carrier transporting properties (carrier mobility and energy level) of the carrier transporting layers. Therefore, the current density of each carrier in the light emitting layer largely depends on the properties of the organic compound in each layer.

Further description is made by referring to a relatively simple situation.

For example, consideration is made on the situation that the carrier density of each carrier transporting layer at its interface with the light emitting layer is constant in the anode/hole transporting layer/light emitting layer/electron transporting layer/cathode construction.

In this situation, if the barrier to holes moving from the hole transporting layer to the light emitting layer and the barrier to electrons moving from the electron transporting layer to the light emitting layer are equal to each other or have very close values (<0.2 V), the quantities of carriers injected into the light emitting layer become approximately equal, and the electron density and the hole density in the vicinity of the respective interfaces of the light emitting layer become equal or very close to each other. At this point, if the mobilities of the respective carriers in the light emitting layer are equal to each other, effective recombination takes place within the light emitting layer (where no punch-through of carriers occurs), leading to a high luminance, high efficiency device. However, if recombination occurs in local regions due to highly probable collision between electrons and holes, or if a high carrier barrier (>0.2 eV) exists within the light emitting layer, such a situation is not adequate for the light emitting layer because the luminescent region does not spread and it is then impossible to help a plurality of luminescent molecules having different luminescent wavelengths emit light at the same time. For the bipolar light emitting layer, it is essential to form a light emitting layer that has an appropriate electron-hole collision probability, but not such a high carrier barrier as to narrow the recombination region.

To prevent the punch-through of the respective carriers from the light emitting layer, the electron blocking function of the hole transporting layer and the hole blocking function of the electron transporting layer are also effective for efficiency improvement. Furthermore, since the respective blocking layers become recombination and luminescent points in a construction having a plurality of light emitting layers, these functions are important in designing bipolar light emitting layers so that a plurality of light emitting layers may emit light.

Next in a situation where the mobilities of the respective carriers are different in the light emitting layer, a state similar to the bipolar light emitting layer in the above-mentioned simple situation can be established by adjusting the carrier density of the respective carrier transporting layers at their interface with the light emitting layer. Naturally, the carrier density at the interface of the carrier injecting layer having a lower carrier mobility in the light emitting layer must be increased.

Moreover, if the carrier densities in the respective carrier transporting layers at their interfaces with the light emitting layer are different, a state similar to the bipolar light emitting layer in the above-mentioned simple situation can be established by adjusting the respective carrier mobilities in the light emitting layer.

However, such adjustment has a certain limit. It is thus desirable that ideally, the respective carrier mobilities and the respective carrier densities of the light emitting layer are equal or approximately equal to each other.

By providing bipolar light emitting layers as mentioned above, a light emitting device having a plurality of light emitting layers is obtained. In order that the respective light emitting layers have emission stability, the light emitting layers must be stabilized physically, chemically, electrochemically, and photochemically.

In particular, while the light emitting layer is required to have electron injection/transport, hole injection/transport, recombination, and luminescent functions, a state of injecting and transporting electrons or holes corresponds to anion radicals or cation radicals or an equivalent state. The organic solid thin film material is required to be stable in such an electrochemical state.

The principle of organic electroluminescence relies on the deactivation from an electrically excited molecular state by light emission, that is, electrically induced fluorescent light emission. More specifically, if a deleterious substance causing deactivation of fluorescence is formed in a solid thin film even in a trace amount, the emission lifetime is fatally shortened below the practically acceptable level.

In order that the device produce stable light emission, it is necessary to have a compound having stability as mentioned above and a device construction using the same, especially a compound having electrochemical stability and a device construction using the same.

Although it suffices that the light emitting layer is formed using a compound satisfying all of the above-mentioned requirements, it is difficult to form a bipolar light emitting layer with a single compound. One easier method is to establish a stable bipolar light emitting layer by providing a mix layer of a hole transporting compound and an electron transporting compound which are stable to the respective carriers. Also, the mix layer may be doped with a highly fluorescent dopant in order to enhance fluorescence to provide a high luminance.

Therefore, the bipolar light emitting layer according to the invention is preferably of the mix layer type. Most preferably, two or more light emitting layers are all mix layers. Also preferably, at least one of two or more light emitting layers is doped with a dopant and more preferably all the light emitting layers are doped with dopants.

One preferred construction of the device of the invention is described below. Two or more doped light emitting layers are provided by forming a light emitting layer doped with a dopant as well as a light emitting layer of the mix layer type doped with a dopant. The combinations of doped light emitting layers include a combination of mix layers and a combination of a mix layer with a hole transporting/light emitting layer disposed nearer to the anode than the mix layer and/or an electron transporting/light emitting layer disposed nearer to the cathode than the mix layer. The combination of mix layers is especially preferred for a prolonged lifetime.

The mix layer used herein is a layer containing a hole injecting and transporting compound and an electron injecting and transporting compound wherein the mixture of these compound is used as a host material, as described previously. The hole transporting/light emitting layer uses the hole injecting and transporting compound as the host material, and the electron transporting/light emitting layer uses the electron injecting and transporting compound as the host material.

Next, the light emission process in the especially preferred organic EL device is described.

i) First, a combination of mix layers, for example, two mix layers is described. The mix layer disposed on the side of the hole injecting and/or transporting layer (abbreviated as a hole layer) is designated a first mix layer, and the mix layer disposed on the side of the electron injecting and/or transporting layer (abbreviated as an electron layer) is designated a second mix layer. Holes injected from the hole layer can pass through the first mix layer to the second mix layer while electrons injected from the electron layer can pass through the second mix layer to the first nix layer. The probability of recombination is dictated by the electron density, hole density, and electron-hole collision probability, but the recombination region disperses widely due to the absence of barriers such as the first mix layer, second mix layer and interfaces. Consequently, excitons are created in the first and second mix layers and energy is transferred from the respective hosts to the closest luminescent species. Those excitons created in the first mix layer transfer their energy to the luminescent species (dopant) in the same layer and those excitons created in the second mix layer transfer their energy to the luminescent species (dopant) in the same layer, which mechanism enables the light emission of two luminescent species.

A similar phenomenon occurs where there are three or more mix layers.

It is noted that where the dopant acts as a carrier trap, the depth of trap must be taken into account.

ii) Next, a combination of a hole transporting/light emitting layer with a mixed light emitting layer, for example, a dual layer arrangement including a hole transporting/light emitting layer and a mixed light emitting layer arranged in order from the hole layer side is described. Holes injected from the hole layer pass through the hole transporting/light emitting layer, electrons injected from the electron layer pass through the mixed light emitting layer, and they recombine with each other in the vicinity of the interface between the hole transporting/light emitting layer and the mixed light emitting layer and throughout the mixed light emitting layer. Excitons are then created both in the vicinity of the interface of the hole transporting/light emitting layer and within the mixed light emitting layer, and they transfer their energy from their host to the luminescent species having the least energy gap within the migratable range of the excitons. At this point, those excitons created in the vicinity of the interface of the hole transporting layer transfer their energy to the luminescent species (dopant) in the same layer and those excitons created within the mix layer transfer their energy to the luminescent species (dopant) in the same layer, which mechanism enables the light emission of two luminescent species. Also, electrons are carried at the dopant's LUMO level of the hole transporting layer and recombined in the hole transporting/light emitting layer to emit light, enabling the light emission of two species.

iii) Further, a combination of an electron transporting/light emitting layer with a mixed light emitting layer, for example, a dual layer arrangement including an electron transporting/light emitting layer and a mixed light emitting layer arranged in order from the electron layer side is described. Electrons injected from the electron layer pass through the electron transporting/light emitting layer into the mix layer, and holes injected from the hole layer enter the mix layer. They recombine with each other in the vicinity of the interface between the mix layer and the electron transporting/light emitting layer and throughout the mixed light emitting layer. Excitons are then created both in the vicinity of the interface of the electron transporting/light emitting layer and within the mixed light emitting layer, and they transfer their energy from their host to the luminescent species having the least exciton migration gap. At this point, those excitons created in the vicinity of the interface of the electron transporting/light emitting layer transfer their energy to the luminescent species (dopant) in the same layer, those excitons created within the mixed light emitting layer transfer their energy to the luminescent species (dopant) in the same layer, and holes are carried at the dopant's HOMO level of the electron transporting layer and recombined in the electron transporting/light emitting layer, which mechanisms enable the light emission of two species.

With respect to ii) and iii), a similar phenomenon occurs when these combinations are combined or three or more light emitting layers are formed in each of these combinations.

The mix ratio of the hole injecting and transporting compound to the electron injecting and transporting compound as the host materials in the mix layer may be changed in accordance with the desired carrier transport property of the host and usually selected from the range between 5/95 and 95/5 in volume ratio. A higher proportion of the hole injecting and transporting compound leads to a more hole transport quantity so that the recombination region may be shifted toward the anode whereas a higher proportion of the electron injecting and transporting compound leads to a more electron transport quantity so that the recombination region may be shifted toward the cathode. The balance of luminescence intensity of the mix layer changes in accordance with such a shift. In this way, the luminescence intensity of each light emitting layer can be controlled by changing the carrier transport property of the mix layer type host.

In the practice of the invention, the carrier transport property can also be changed by changing the type of host material.

As described above, the invention permits the luminescent characteristics of two or more light emitting layers to be adjusted for each of the layers. This, in turn, permits a light emitting layer to optimize its carrier transport property and construction. At this point, one layer may contain two or more luminescent species.

The light emitting layers adapted for multi-color light emission preferably have a thickness of 5 to 100 nm, more preferably 10 to 80 nm per layer. The total thickness of the light emitting layers is preferably 60 to 400 nm. It is noted that the mix layers preferably have a thickness of 5 to 100 nm, more preferably 10 to 60 nm per layer.

Where a plurality of light emitting layers having different luminescent characteristics are provided as above, that light emitting layer having an emission maximum wavelength on a longer wavelength side is preferably disposed nearer to the anode. In an attempt to extend the lifetime, the light emitting layer, especially the mix layer is preferably doped with a compound having a naphthacene skeleton such as rubrene as a dopant.

Next, the host material and dopant used in such organic EL devices adapted for multi-color light emission are described. The dopants which can be used herein include coumarin derivatives of formula (I), quinacridone compounds of formula (III), styryl amine compounds of formula (IV), and compounds having a naphthacene skeleton such as rubrene. Besides, the compounds which can be the aforementioned luminescent materials are also useful. Further, fused polycyclic compounds of formula (VII) are useful. Formula (VII) is described below. The aforementioned rubrene is embraced within formula (VII).

$$(Ar)_m\text{—}L \qquad \text{(VII)}$$

In formula (VII), Ar is an aromatic residue, m is an integer of 2 to 8, and the Ar groups may be identical or different.

The aromatic residues include aromatic hydrocarbon residues and aromatic heterocyclic residues. The aromatic hydrocarbon residue may be any of hydrocarbon groups containing a benzene ring, for example, monocyclic or polycyclic aromatic hydrocarbon residues inclusive of fused rings and ring clusters.

The aromatic hydrocarbon residues are preferably those having 6 to 30 carbon atoms in total, which may have substituents. Examples of the substituent, if any, include alkyl groups, alkoxy groups, aryl groups, aryloxy groups, amino groups, and heterocyclic groups. Examples of the aromatic hydrocarbon residue include phenyl, alkylphenyl, alkoxyphenyl, arylphenyl, aryloxyphenyl, alkenylphenyl, aminophenyl, naphthyl, anthryl, pyrenyl, and perylenyl groups. Arylalkynyl groups derived from alkynylarenes (arylalkynes) are also useful.

The aromatic heterocyclic residues are preferably those containing oxygen, nitrogen or sulfur as a hetero atom and may be either 5- or 6-membered rings. Exemplary are thienyl, furyl, pyrrolyl, and pyridyl groups.

Ar is preferably selected from aromatic hydrocarbon residues, especially phenyl, alkylphenyl, arylphenyl, alkenylphenyl, aminophenyl, naphthyl and arylalkynyl groups.

The alkylphenyl groups are preferably those whose alkyl moiety has 1 to 10 carbon atoms and may be normal or branched, for example, methyl, ethyl, n- and i-propyl, n-, i-, sec- and tert-butyl, n-, i-, neo- and tert-pentyl, n-, i- and neo-hexyl groups. These alkyl groups may be attached to the phenyl group at its o-, m- or p-position. Examples of the alkylphenyl group include o-, m- and p-tolyl, 4-n-butylphenyl and 4-t-butylphenyl groups.

The arylphenyl groups are preferably those whose aryl moiety is a phenyl group which may be a substituted one, with the substituents being preferably alkyl groups, for example, those alkyl groups exemplified above for the alkylphenyl groups. The aryl moiety may also be a phenyl group having an aryl substituent such as a phenyl substituent. Examples of the arylphenyl group include o-, m- and p-biphenylyl, 4-tolylphenyl, 3-tolylphenyl, and terephenylyl groups.

The alkenylphenyl groups are preferably those whose alkenyl moiety has 2 to 20 carbon atoms in total. Preferred alkenyl groups are triarylalkenyl groups, for example, triphenylvinyl, tritolylvinyl, and tribiphenylvinyl groups. Exemplary of the alkenylphenyl group is a triphenylvinylphenyl group.

The aminophenyl groups are preferably those whose amino moiety is a diarylamino group such as diphenylamino and phenyltolylamino. Examples of the aminophenyl group include diphenylaminophenyl and phenyltolylaminophenyl groups.

The naphthyl groups include 1-naphthyl and 2-naphthyl groups.

The arylalkynyl groups include those having 8 to 20 carbon atoms in total, for example, phenylethynyl, tolylethynyl, biphenylylethynyl, naphthylethynyl, diphenylaminophenylethynyl, N-phenyltolylaminophenylethynyl, and phenylpropynyl groups.

L in formula (VII) is a m-valent fused polycyclic aromatic residue having 3 to 10 rings, preferably 3 to 6 rings wherein m is 2 to 8. By the term fused ring is meant a cyclic structure formed by carbocyclic and/or heterocyclic rings wherein one ring is attached to another ring with the one ring shearing at least two atoms of the member atoms of the other ring. The fused polycyclic aromatic residues include fused polycyclic aromatic hydrocarbons and fused polycyclic aromatic heterocycles.

The fused polycyclic aromatic hydrocarbons include anthracene, phenanthrene, naphthacene, pyrene, chrysene, triphenylene, benzo[c]phenanthrene, benzo[a]anthracene, pentacene, perylene, dibenzo[a,j]anthracene, dibenzo[a,h] anthracene, benzo[a]naphthacene, hexacene, and anthanthrene.

The fused polycyclic aromatic heterocycles include naphtho[2,1-f]isoquinoline, α-naphthaphenanthridine, phenanthroxazole, quinolino[6,5-f]quinoline, benzo[b] thiophanthrene, benzo[g]thiophanthrene, benzo[i] thiophanthrene, and benzo[b]thiophanthraquinone.

The fused polycyclic aromatic hydrocarbons are especially preferred. L is preferably selected from divalent to octavalent, more preferably divalent to hexavalent residues derived from these fused polycyclic aromatic hydrocarbons.

Illustrative examples of the divalent to octavalent fused polycyclic aromatic residue L are given below.

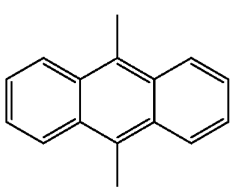

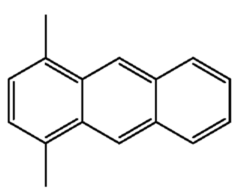

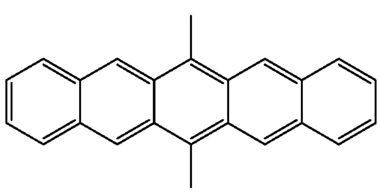

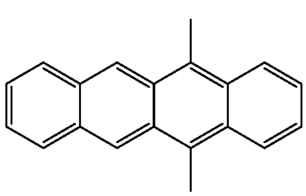

-continued

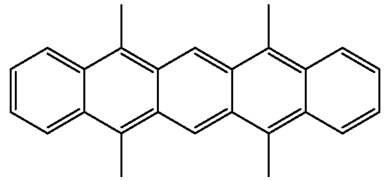

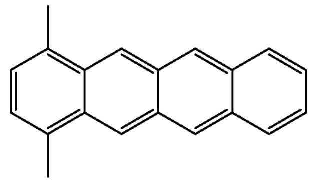

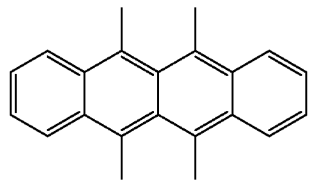

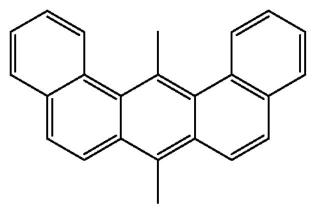

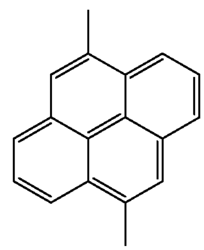

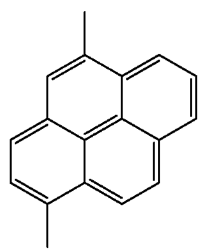

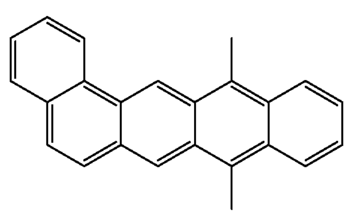

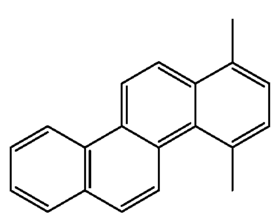

-continued
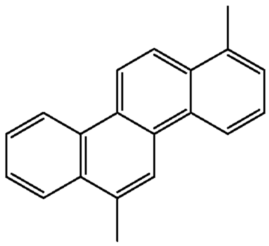
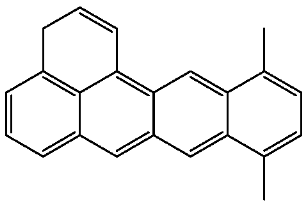
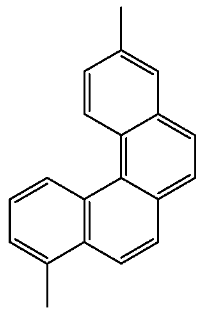
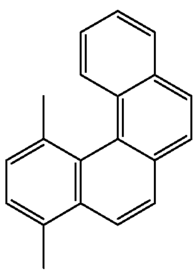
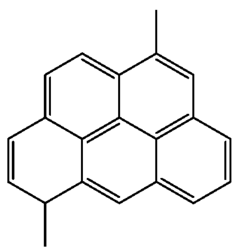
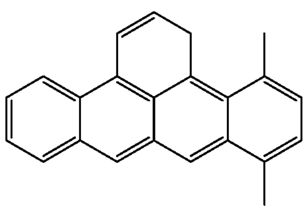
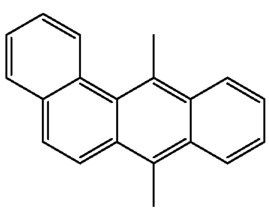
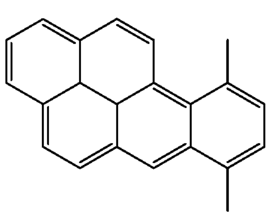
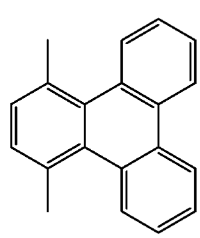
-continued
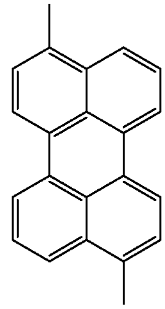
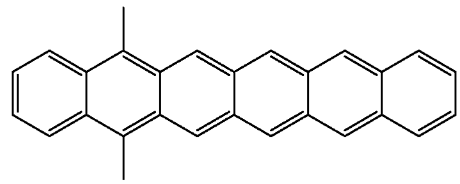
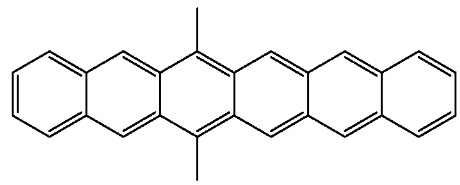
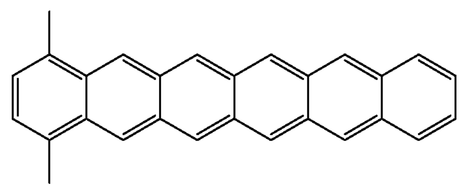
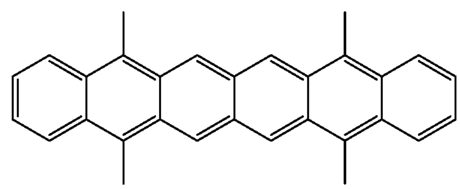
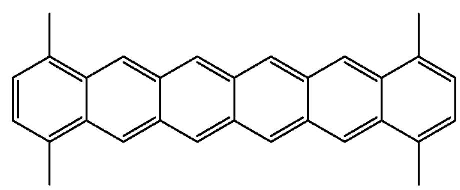
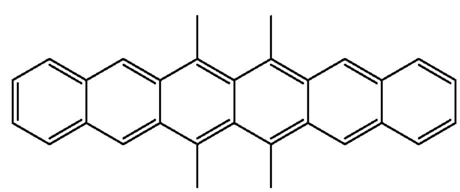
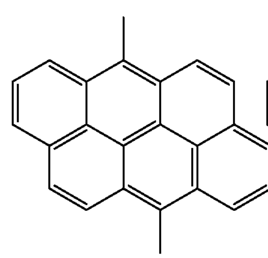
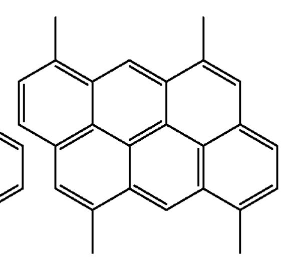

-continued
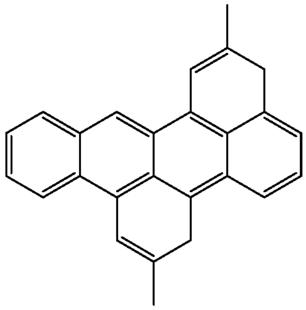
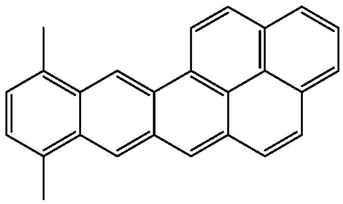
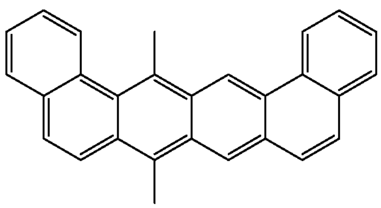
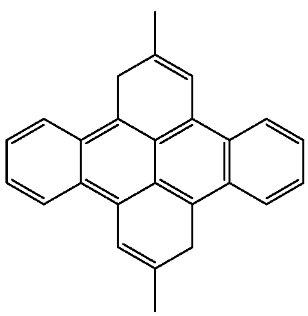
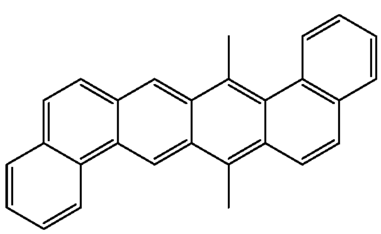
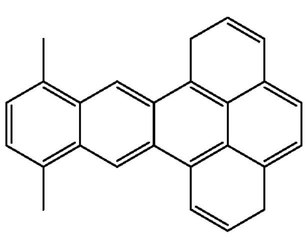
-continued
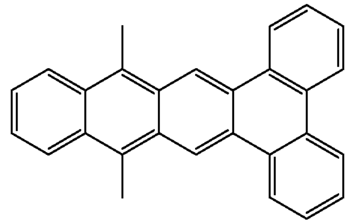
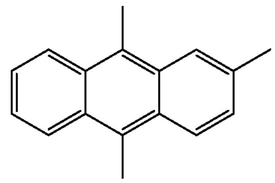
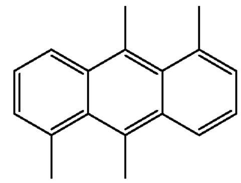
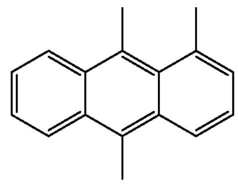
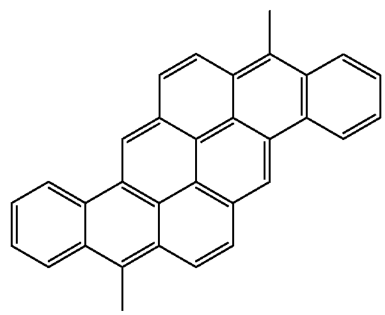
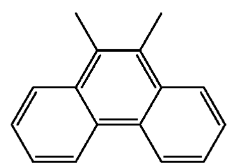
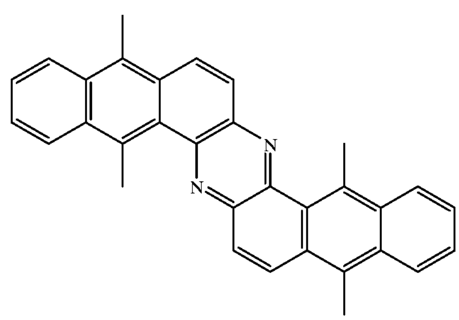
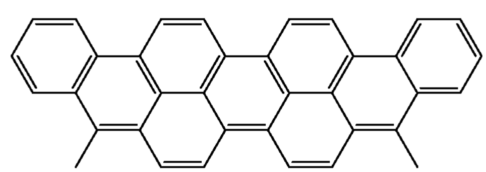

-continued

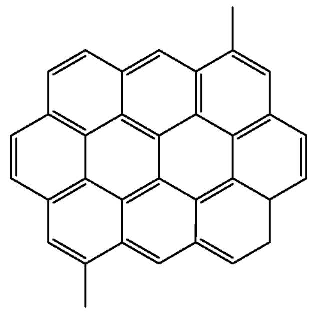

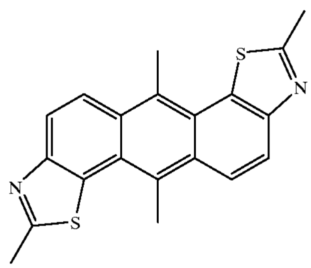

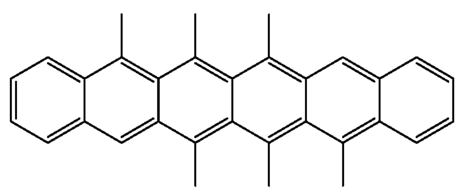

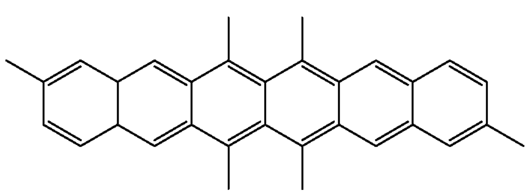

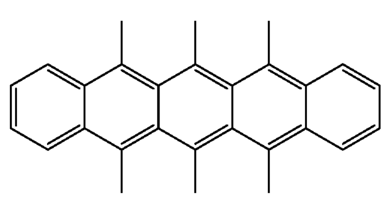

-continued

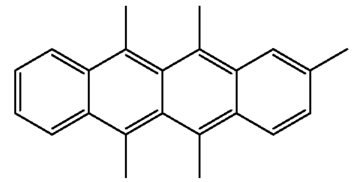

The divalent to octavalent fused polycyclic aromatic residues represented by L may further have substituents.

More preferred as L are divalent to octavalent, especially divalent to hexavalent residues derived from naphthacene, pentacene and hexacene having a benzene ring linearly fused thereto. Most preferred are residues derived from naphthacene, that is, compounds having a naphthacene skeleton.

L is also preferably selected from divalent to hexavalent, especially divalent to tetravalent residues derived from anthracene. Where L is a divalent or trivalent residue derived from anthracene, at least one of two or three Ar groups is a residue derived from an alkynylarene (or arylalkyne). More preferably at least two of the Ar groups are such residues. Most preferably L is a trivalent residue derived from anthracene. The compounds of formula (VII) are preferably those wherein L is as just defined, two Ar's are arylalkynyl groups, and one Ar is a bis(arylalkynyl)anthryl group. Compounds of the following formula (VII-A) are especially preferred.

$$(Ar_{11})_2—L_1—L_2—(Ar12)_2 \qquad \text{(VII-A)}$$

In formula (VII-A), $L_1$ and $L_2$ each are a trivalent residue derived from anthracene and they are usually identical, but may be different. $Ar_{11}$ and $Ar_{12}$ each are an arylalkynyl group and they are usually identical, but may be different. It is noted that the arylalkynyl group is preferably attached to anthracene at its 9- and 10-positions while the anthracenes are preferably bonded to each other at their 1- or 2-position. Examples of the arylalkynyl group are as exemplified above.

Illustrative, non-limiting examples of the compound of formula (VIII) are given below. The following examples are expressed by a combination of R's in formulae (VII-1) to (VII-8). When R's are shown in a gathered form like $R_{01}$ to $R_{04}$, they represent H unless otherwise stated. H is shown when they are all hydrogen atoms.

(VII-1)
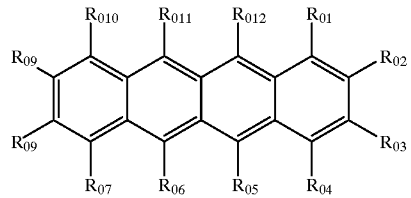
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-1 | H | m-biphenylyl | H | H | H | m-biphenylyl |
| 1-2 | H | O-biphenylyl | H | H | H | o-biphenylyl |
| 1-3 | H | 4-n-butylphenyl | H | H | H | 4-n-butylphenyl |
| 1-4 | H | 4-t-butylphenyl | H | H | H | 4-t-butylphenyl |
| 1-5 | H | p-biphenylyl | H | H | H | p-biphenylyl |
| 1-6 | H | 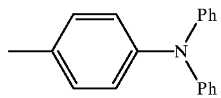 | H | H | H | 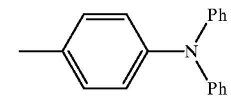 |
| 1-7 | H | 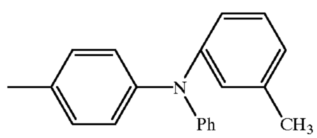 | H | H | H | 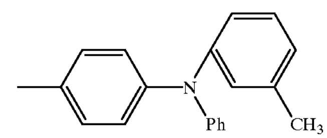 |
| 1-8 | H | Ph | H | H | H | Ph |
| 1-9 | H | 2-naphthyl | H | H | H | 2-naphthyl |
| 1-10 | H | 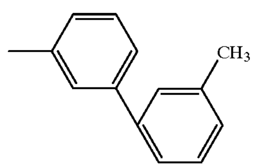 | H | H | H | 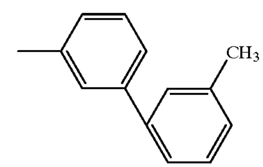 |
| 1-11 | H | 1-naphthyl | H | H | H | 1-naphthyl |
| 1-12 | H | m-tolyl | H | H | H | m-tolyl |
| 1-13 | H | o-tolyl | H | H | H | o-tolyl |
| 1-14 | H | p-tolyl | H | H | H | p-tolyl |

-continued
(VII-1)
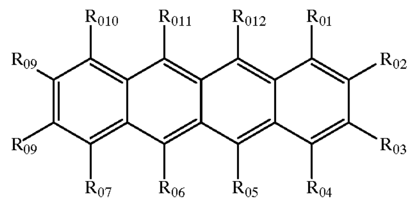
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-15 | H | 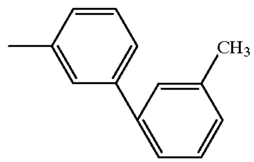 | H | H | H | 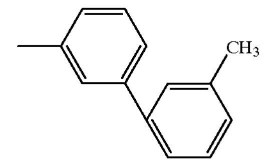 |
| 1-16 | H | —C≡C—Ph | H | H | H | —C≡C—Ph |
| 1-17 | H | —C≡C—Ph | —C≡C—Ph | H | —C≡C—Ph | —C≡C—Ph |
| 1-18 | H | 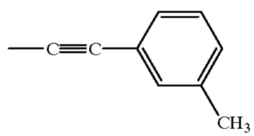 | H | H | H | 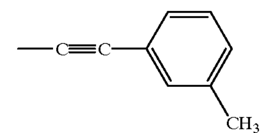 |
| 1-19 | H | 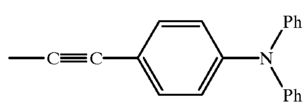 | H | H | H | 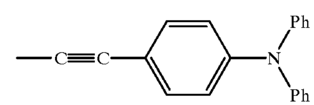 |
| 1-20 | H | 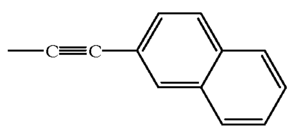 | H | H | H | 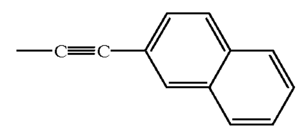 |

-continued
(VII-1)
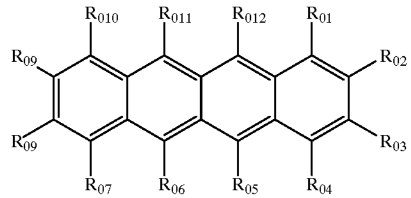
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-21 | H | 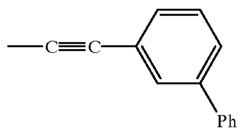 | H | H | H | 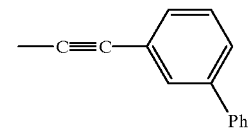 |
| 1-22 | H | Ph | Ph | H | Ph | Ph |
| 1-23 | H | 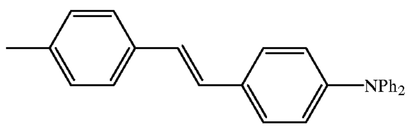 | H | H | H | 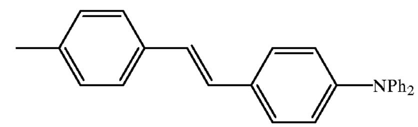 |
| 1-24 | H | 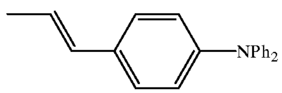 | H | H | H | 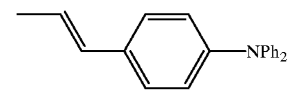 |
| 1-25 | H | 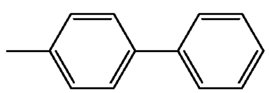 | 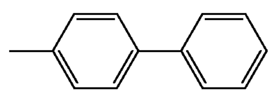 | H | 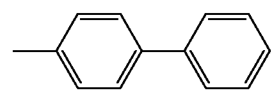 | 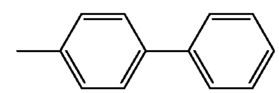 |

-continued
(VII-1)
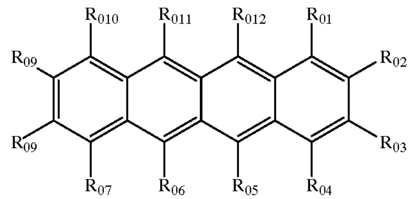
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-26 | H | 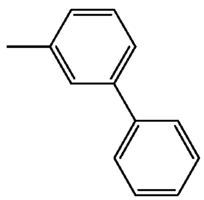 | 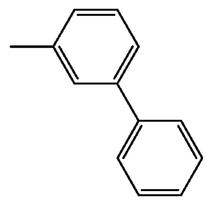 | H | 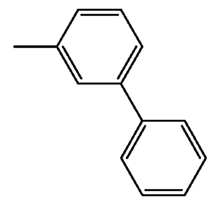 | 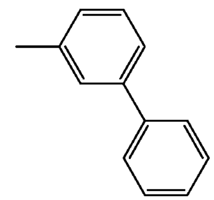 |
| 1-27 | H | 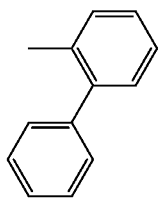 | 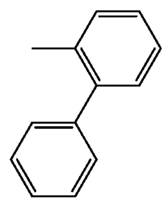 | H | 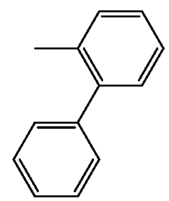 | 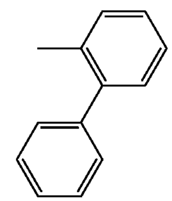 |
| 1-28 | $R_{02} = R_{03} = CH_3$ | 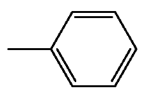 | 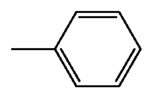 | H | 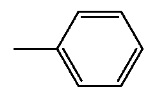 | 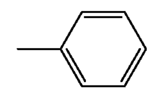 |
| 1-29 | $R_{02} = R_{03} = CH_3$ | 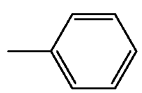 | 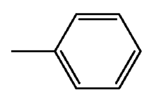 | $R_{08} = R_{09} = CH_3$ | 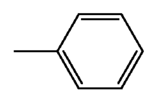 | 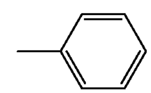 |
| 1-30 | $R_{02} = R_{03} = CH_3$ | 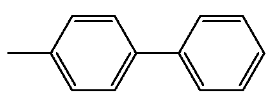 | 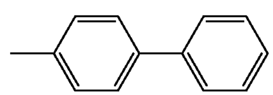 | $R_{08} = R_{09} = CH_3$ | 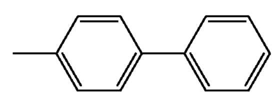 | 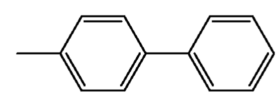 |

-continued
(VII-1)
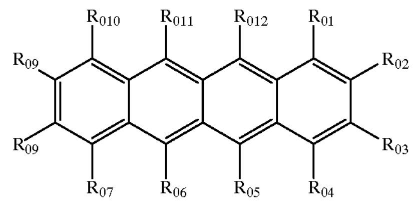
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-31 | H | 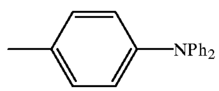 | 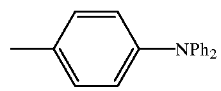 | H | 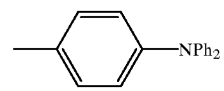 | 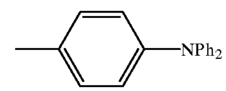 |
| 1-32 | H | 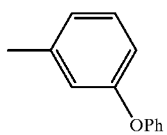 | 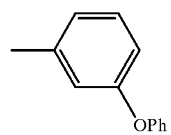 | H | 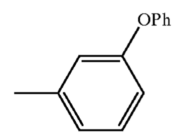 | 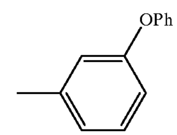 |
| 1-33 | H | 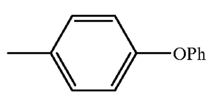 | 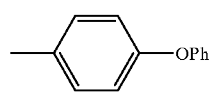 | H | 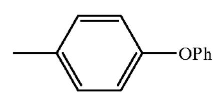 | 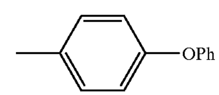 |

-continued
(VII-1)
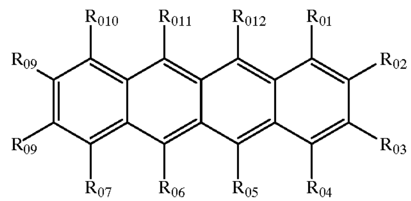
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-34 | H | 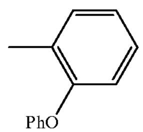  | 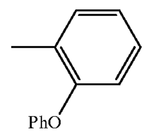  | H | 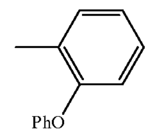  | 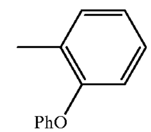  |
| 1-35 | H | Ph | 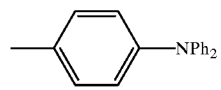  | H | 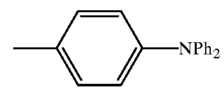  | Ph |
| 1-36 | H | Ph | 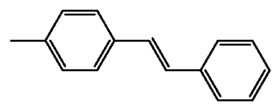 | H | 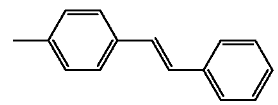 | Ph |
| 1-37 | H | Ph | 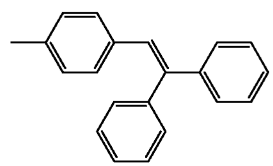 | H | 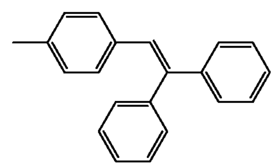 | Ph |

-continued
(VII-1)
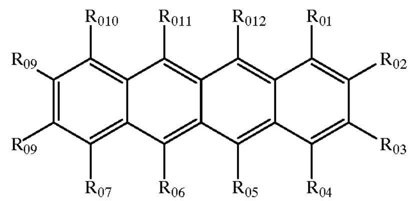
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-38 | H | Ph | 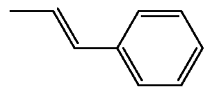 | H | 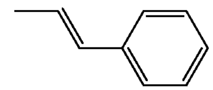 | Ph |
| 1-39 | H | 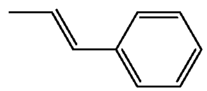 | 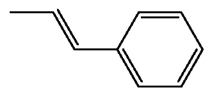 | H | 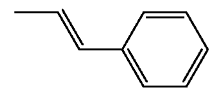 | 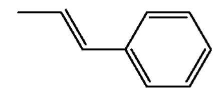 |
| 1-40 | H | 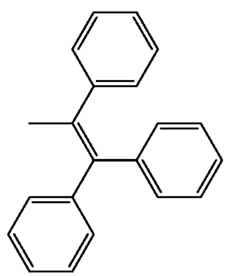 | 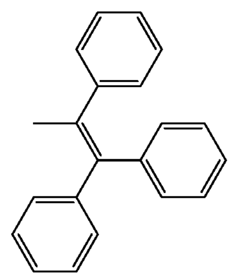 | H | 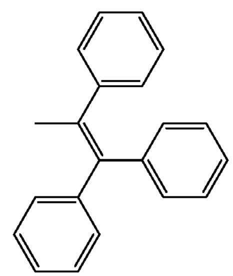 | 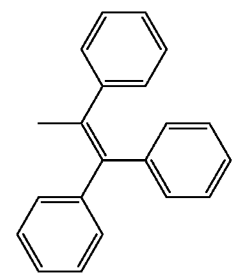 |

-continued
(VII-1)
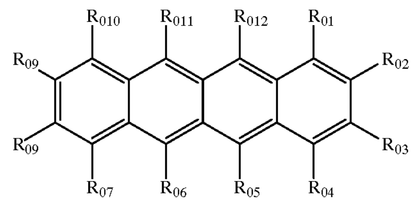
| Compound No. | $R_{01}$–$R_{04}$ | $R_{05}$ | $R_{06}$ | $R_{07}$–$R_{010}$ | $R_{011}$ | $R_{012}$ |
|---|---|---|---|---|---|---|
| 1-41 | H | 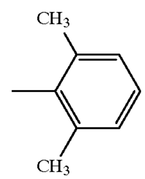 | 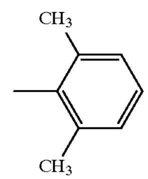 | H | 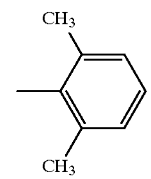 | 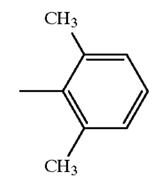 |
| 1-42 | $R_{01} = R_{04}$ = Ph | H | H | H | H | H |
| 1-43 | $R_{01} = R_{04}$ = Ph | H | H | $R_{07} = R_{010}$ = Ph | H | H |
| 1-44 | $R_{02} = R_{03}$ = 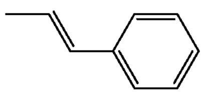 | Ph | Ph | H | Ph | Ph |
| 1-45 | $R_{02} = R_{03}$ = 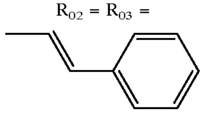 | Ph | H | H | H | Ph |

(VII-2)

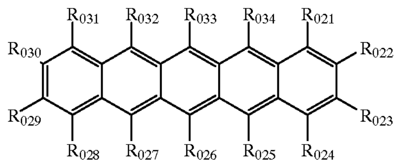

| Compound No. | $R_{021}$–$R_{024}$ | $R_{025}$ ~ $R_{027}$ | $R_{028}$–$R_{031}$ | $R_{032}$–$R_{034}$ |
|---|---|---|---|---|
| 2-1 | H | $R_{026}$ = o-biphenylyl | H | $R_{033}$ = o-biphenylyl |
| 2-2 | H | $R_{026}$ = m-biphenylyl | H | $R_{033}$ = m-biphenylyl |
| 2-3 | H | $R_{026}$ = 4-n-butylphenyl | H | $R_{033}$ = 4-n-butylphenyl |
| 2-4 | H | $R_{026}$ = m-tolyl | H | $R_{033}$ = m-tolyl |
| 2-5 | H | $R_{025}$ = $R_{027}$ = m-biphenylyl | H | $R_{032}$ = $R_{034}$ = m-biphenylyl |
| 2-6 | H | $R_{025}$ = $R_{027}$ = 4-n-butylphenyl | H | $R_{032}$ = $R_{034}$ = -n-butylphenyl |
| 2-7 | H | $R_{026}$ = p-biphenylyl | H | $R_{033}$ = p-biphenylyl |
| 2-8 | H | $R_{025}$ = $R_{027}$ = p-biphenylyl | H | $R_{032}$ = $R_{034}$ = p-biphenylyl |
| 2-9 | H | $R_{025}$ = $R_{027}$ = Ph | H | $R_{032}$ = $R_{034}$ = Ph |
| 2-10 | H | $R_{025}$ = $R_{027}$ = m-tolyl | H | $R_{032}$ = $R_{034}$ = m-tolyl |
| 2-11 | H | $R_{025}$ = $R_{027}$ = 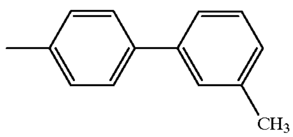  | H | $R_{032}$ = $R_{034}$ = 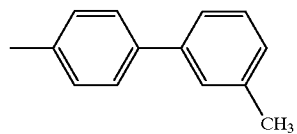  |
| 2-12 | H | $R_{025}$ = $R_{027}$ = 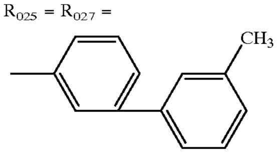  | H | $R_{032}$ = $R_{034}$ = 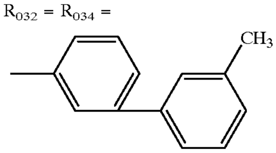  |
| 2-13 | H | $R_{026}$ = 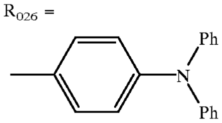  | H | $R_{033}$ = 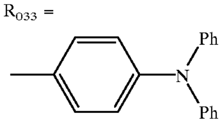  |
| 2-14 | H | $R_{026}$ = 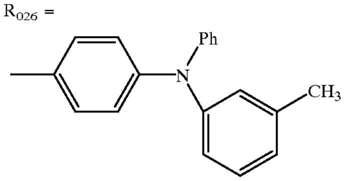  | H | $R_{033}$ = 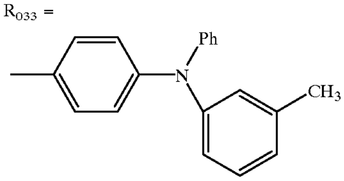  |
| 2-15 | H | $R_{026}$ = 1-naphthyl | H | $R_{033}$ = 1-naphthyl |
| 2-16 | H | $R_{026}$ = 2-naphthyl | H | $R_{033}$ = 2-naphthyl |
| 2-17 | H | $R_{026}$ = —C≡C—Ph | H | $R_{033}$ = —C≡C—Ph |
| 2-18 | H | $R_{026}$ = 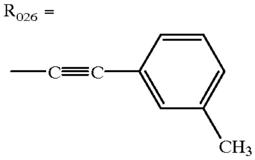  | H | $R_{033}$ = 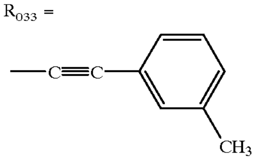  |
| 2-19 | H | $R_{026}$ = 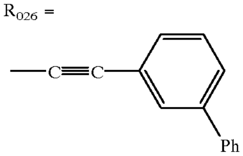  | H | $R_{033}$ = 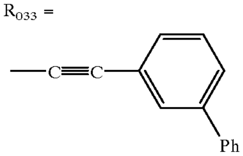  |

-continued
(VII-2)
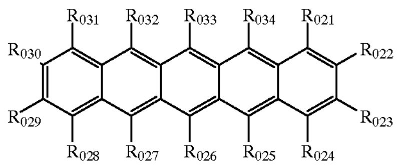
| Compound No. | $R_{021}$–$R_{024}$ | $R_{025}$ ~ $R_{027}$ | $R_{028}$–$R_{031}$ | $R_{032}$–$R_{034}$ |
|---|---|---|---|---|
| 2-20 | H | $R_{026}$ = 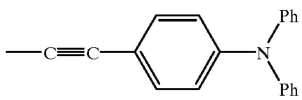 | H | $R_{033}$ = 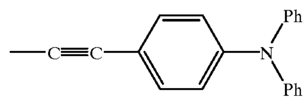 |
| 2-21 | H | $R_{026}$ = 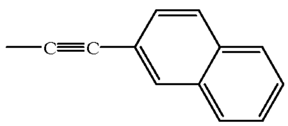 | H | $R_{033}$ = 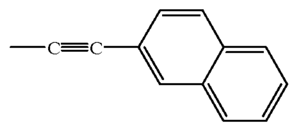 |
| 2-22 | H | $R_{025}$ = $R_{027}$ = 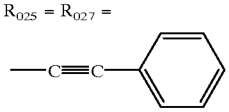 | H | $R_{032}$ = $R_{034}$ = 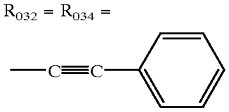 |
| 2-23 | H | $R_{025}$ = $R_{027}$ = 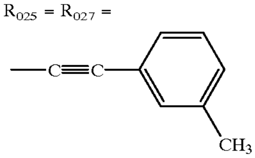 | H | $R_{032}$ = $R_{034}$ = 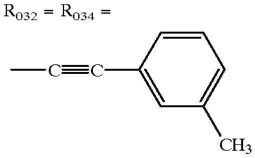 |
| 2-24 | H | $R_{025}$ = $R_{027}$ = 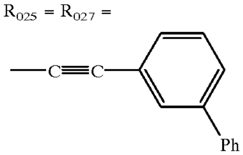 | H | $R_{032}$ = $R_{034}$ = 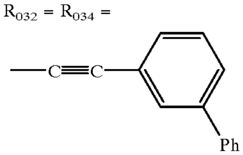 |
| 2-25 | H | $R_{025}$ = $R_{027}$ = 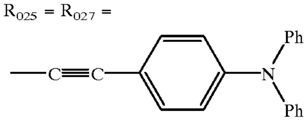 | H | $R_{032}$ = $R_{034}$ = 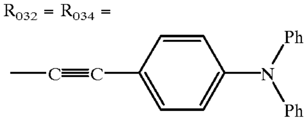 |
| 2-26 | H | $R_{025}$ = $R_{027}$ = 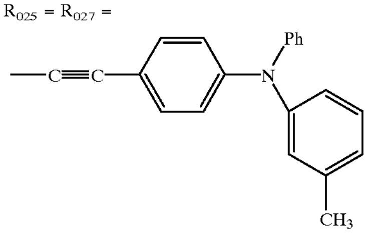 | H | $R_{032}$ = $R_{034}$ = 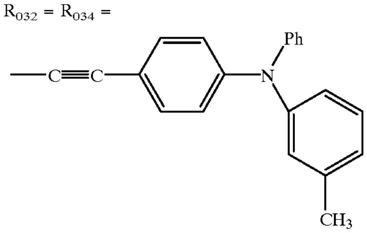 |
| 2-27 | H | $R_{025}$ = $R_{027}$ = 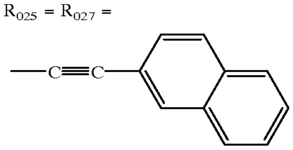 | H | $R_{032}$ = $R_{034}$ = 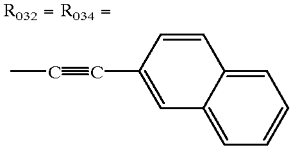 |

(VII-3)

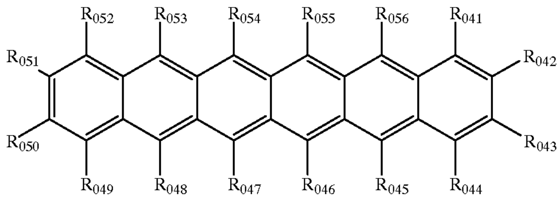

| Compound No. | $R_{041}$–$R_{044}$ | $R_{045}$–$R_{048}$ | $R_{049}$–$R_{052}$ | $R_{053}$–$R_{056}$ |
|---|---|---|---|---|
| 3-1 | H | $R_{046}$ = o-biphenylyl | H | $R_{055}$ = o-biphenylyl |
| 3-2 | H | $R_{046}$ = m-biphenylyl | H | $R_{055}$ = m-biphenylyl |
| 3-3 | H | $R_{046}$ = p-biphenylyl | H | $R_{055}$ = p-biphenylyl |
| 3-4 | H | $R_{046}$ = 4-n-butylphenyl | H | $R_{055}$ = 4-n-butylphenyl |
| 3-5 | H | $R_{046}$ = m-tolyl | H | $R_{055}$ = m-tolyl |
| 3-6 | H | $R_{046}$ = 1-naphthyl | H | $R_{055}$ = 1-naphthyl |
| 3-7 | H | $R_{046}$ = 2-naphthyl | H | $R_{055}$ = 2-naphthyl |
| 3-8 | H | $R_{046}$ = 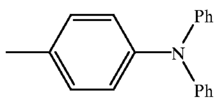 | H | $R_{055}$ = 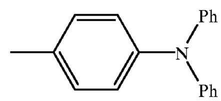 |
| 3-9 | H | $R_{046}$ = 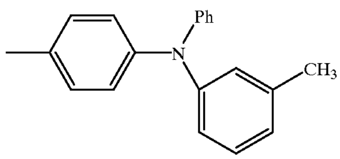 | H | $R_{055}$ = 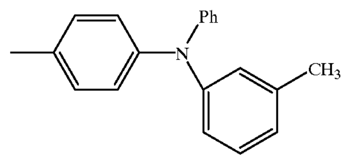 |
| 3-10 | H | $R_{045}$ = $R_{048}$ = m-biphenylyl | H | $R_{053}$ = $R_{056}$ = m-biphenylyl |
| 3-11 | H | $R_{045}$ = $R_{048}$ = p-biphenylyl | H | $R_{053}$ = $R_{056}$ = p-biphenylyl |
| 3-12 | H | $R_{045}$ = $R_{048}$ = Ph | H | $R_{053}$ = $R_{056}$ = Ph |
| 3-13 | H | $R_{045}$ = $R_{048}$ = m-tolyl | H | $R_{053}$ = $R_{056}$ = m-tolyl |
| 3-14 | H | $R_{045}$ = $R_{048}$ = 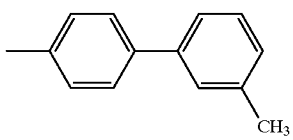 | H | $R_{053}$ = $R_{056}$ = 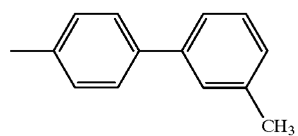 |
| 3-15 | H | $R_{045}$ = $R_{048}$ = 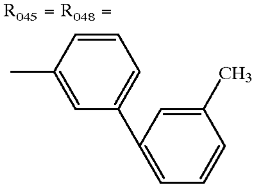 | H | $R_{053}$ = $R_{056}$ = 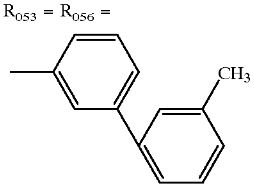 |
| 3-16 | H | $R_{046}$ = 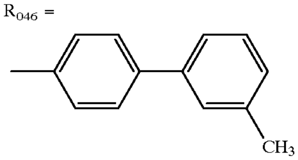 | H | $R_{055}$ = 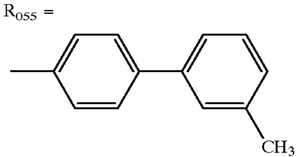 |
| 3-17 | H | $R_{046}$ = 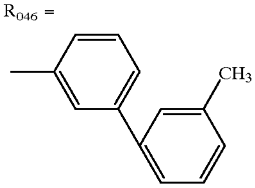 | | $R_{055}$ = 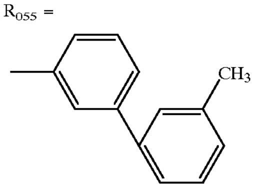 |

-continued
(VII-3)
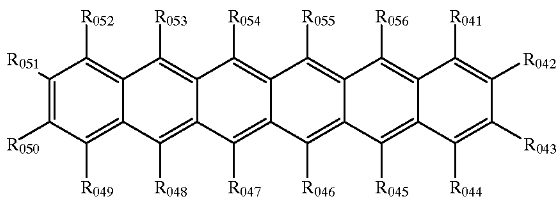
| Compound No. | $R_{041}$–$R_{044}$ | $R_{045}$–$R_{048}$ | $R_{049}$–$R_{052}$ | $R_{053}$–$R_{056}$ |
|---|---|---|---|---|
| 3-18 | H | $R_{046}$ = —C≡C—Ph | H | $R_{055}$ = —C≡C—Ph |
| 3-19 | H | $R_{045}$ = $R_{048}$ = —C≡C—Ph | H | $R_{053}$ = $R_{056}$ = —C≡C—Ph |
| 3-20 | H | $R_{045}$ = $R_{047}$ = —C≡C—Ph | H | $R_{053}$ = $R_{055}$ = —C≡C—Ph |
(VII-4)
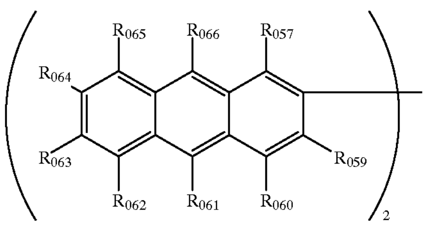
| Compound No. | $R_{57}$ | $R_{059}$–$R_{066}$ |
|---|---|---|
| 4-1 | H | $R_{061}$ = $R_{066}$ = —C≡C—Ph |
| 4-2 | H | $R_{061}$ = $R_{066}$ = 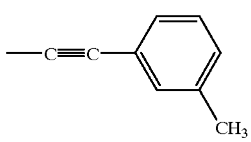 |
| 4-3 | H | $R_{061}$ = $R_{066}$ = 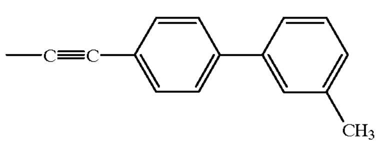 |
| 4-4 | H | $R_{061}$ = $R_{066}$ = 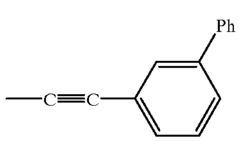 |
| 4-5 | H | $R_{061}$ = $R_{066}$ = 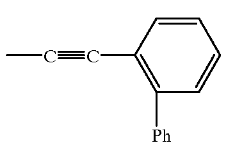 |
| 4-6 | H | $R_{061}$ = $R_{066}$ = 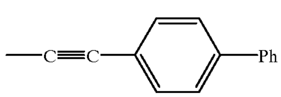 |

-continued
(VII-4)
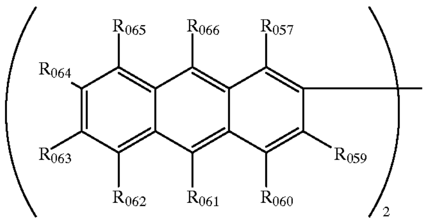
| Compound No. | $R_{57}$ | $R_{059}$–$R_{066}$ |
| --- | --- | --- |
| 4-7 | H | $R_{061} = R_{066} =$ 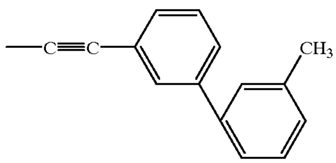 |
| 4-8 | H | $R_{061} = R_{066} =$ 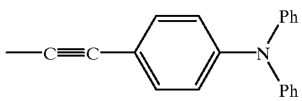 |
| 4-9 | H | $R_{061} = R_{066} =$ 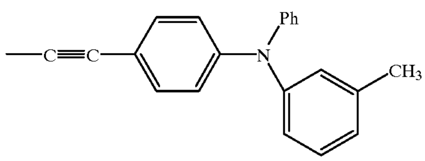 |
| 4-10 | H | $R_{061} = R_{066} =$ 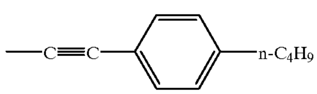 |
| 4-11 | H | $R_{061} = R_{066} =$ 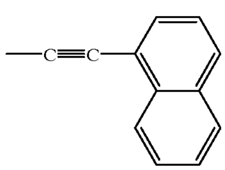 |
| 4-12 | H | $R_{061} = R_{066} =$ 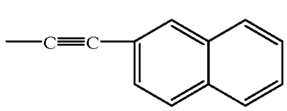 |

(VII-5)
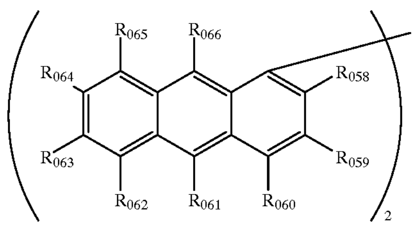
| Compound No. | $R_{058}$–$R_{066}$ |
|---|---|
| 5-1 | $R_{061} = R_{066} =$ —C≡C—Ph |
| 5-2 | $R_{061} = R_{066} =$ 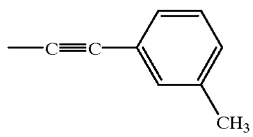 |
| 5-3 | $R_{061} = R_{066} =$ 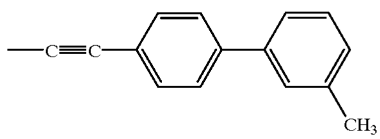 |
| 5-4 | $R_{061} = R_{066} =$ 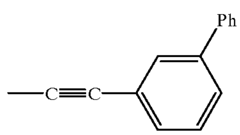 |
| 5-5 | $R_{061} = R_{066} =$ 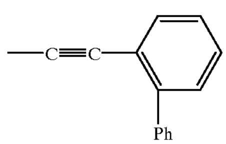 |
| 5-6 | $R_{061} = R_{066} =$ 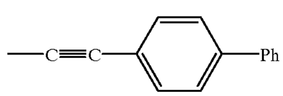 |
| 5-7 | $R_{061} = R_{066} =$ 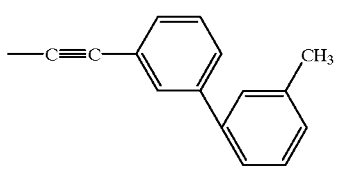 |
| 5-8 | $R_{061} = R_{066} =$ 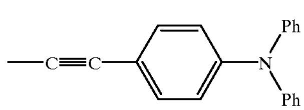 |
| 5-9 | $R_{061} = R_{066} =$ 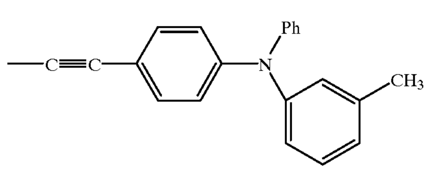 |

-continued
| | | |
|---|---|---|
| 5-10 | $R_{061} = R_{066} =$ | 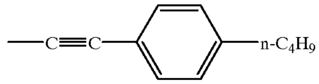 |
| 5-11 | $R_{061} = R_{066} =$ | 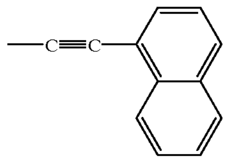 |
| 5-12 | $R_{061} = R_{066} =$ | 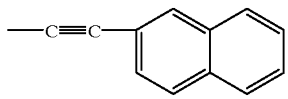 |
(VII-6)
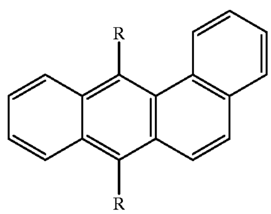
| Compound No. | | $R_{058}$–$R_{066}$ |
|---|---|---|
| 6-1 | R = | Ph |
| 6-2 | R = | —C≡C—Ph |
| 6-3 | R = | 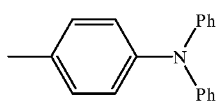 |
| 6-4 | R = | 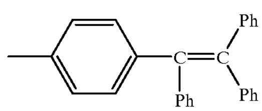 |
(VII-7)
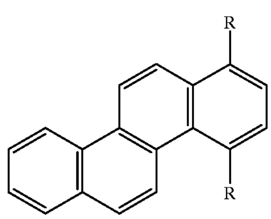
| Compound No. | | $R_{058}$–$R_{066}$ |
|---|---|---|
| 7-1 | R = | Ph |
| 7-2 | R= | —C≡C—Ph |
| 7-3 | R = | 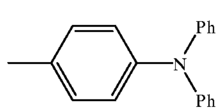 |

-continued
| | | |
|---|---|---|
| 7-4 | R = | 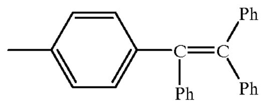 |
(VII-8)
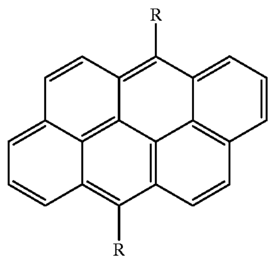
| Compound No. | | $R_{058}$–$R_{066}$ |
|---|---|---|
| 8-1 | R = | Ph |
| 8-2 | R = | —C≡C—Ph |
| 8-3 | R = | 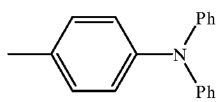 |
| 8-4 | R = | 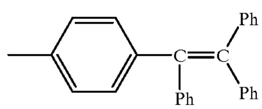 |
(VII-9)
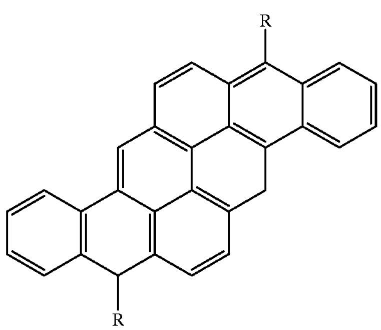
| Compound No. | | $R_{058}$–$R_{066}$ |
|---|---|---|
| 9-1 | R = | Ph |
| 9-2 | R = | —C≡C—Ph |
| 9-3 | R = | 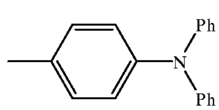 |
| 9-4 | R = | 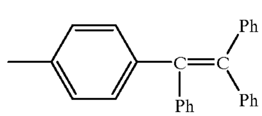 |

-continued (VII-10)

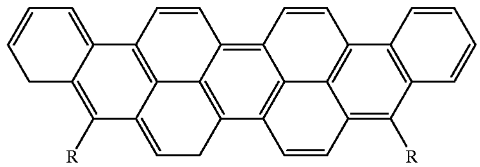

| Compound No. | | $R_{058}$–$R_{066}$ |
|---|---|---|
| 10-1 | R = | Ph |
| 10-2 | R = | —C≡C—Ph |
| 10-3 | R = | 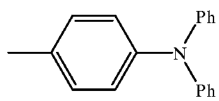 |
| 10-4 | R = | 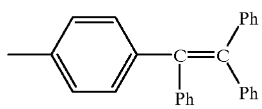 |

The amount of the dopant is preferably 0.01 to 10% by volume of the light emitting layer.

On the other hand, the host material used in the light emitting layer may be selected from those compounds previously illustrated as the host materials, hole injecting and transporting compounds, and electron injecting and transporting compounds.

The hole transporting host materials which are hole injecting and transporting compounds are preferably aromatic tertiary amines including the tetraaryldiamine derivatives of formula (II).

Exemplary hole transporting host materials are given below although some are embraced in or overlap with the aforementioned compounds. The following examples are expressed by a combination of Φ's in formulae (H-1) to (H-12). It is noted that since the combination is common in formulae (H-6a) to (H-6c) and formulae (H-7a) to (H-7e), they are commonly represented by H-6 and H-7.

(H-1)

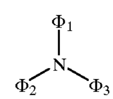

| (H-1) Compound | $\Phi_1$ | $\Phi_2$ | $\Phi_3$ |
|---|---|---|---|
| H-1-1 | Ph | same | same |
| H-1-2 | o-biphenylyl | same | same |
| H-1-3 | m-biphenylyl | same | same |
| H-1-4 | p-biphenylyl | same | same |
| H-1-5 | 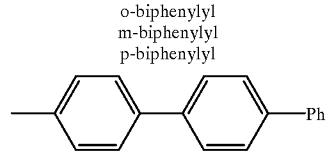 | same | same |
| H-1-6 | 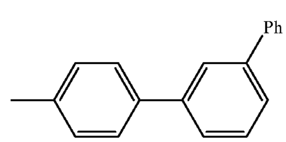 | same | same |
| H-1-7 | 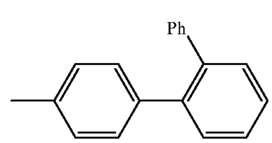 | same | same |

-continued
(H-1)
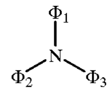
| (H-1) Compound | $\Phi_1$ | $\Phi_2$ | $\Phi_3$ |
|---|---|---|---|
| H-1-8 | 2-naphthyl | same | same |
| H-1-9 | 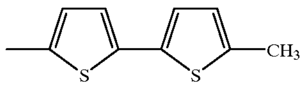 | same | same |
| H-1-10 | 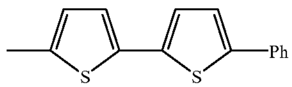 | same | same |
| H-1-11 | 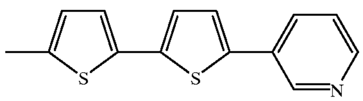 | same | same |
| H-1-12 | 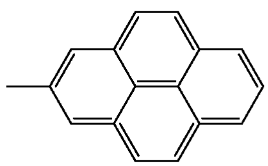 | same | same |
| H-1-13 | 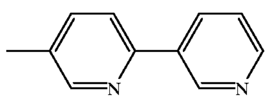 | same | same |
| H-1-14 | 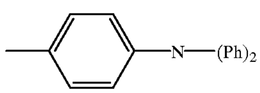 | same | same |
| H-1-15 | 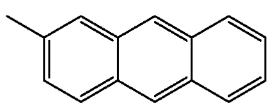 | same | same |
| H-1-16 | 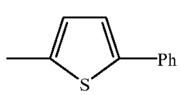 | same | same |
| H-1-17 | 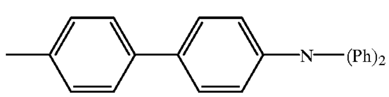 | same | same |
| H-1-18 | 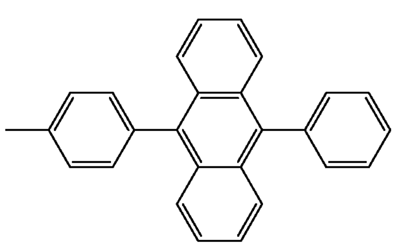 | same | same |
| H-1-19 | m-biphenylyl | m-biphenylyl | H |

-continued
(H-1)
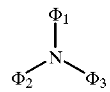
| (H-1) Compound | $\Phi_1$ | $\Phi_2$ | $\Phi_3$ |
|---|---|---|---|
| H-1-20 | 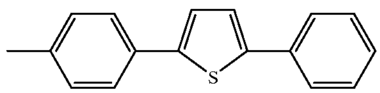 | same | same |
| H-1-21 | 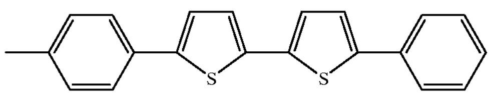 | same | same |
| H-1-22 | 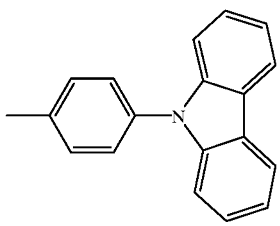 | same | same |
| H-1-23 | 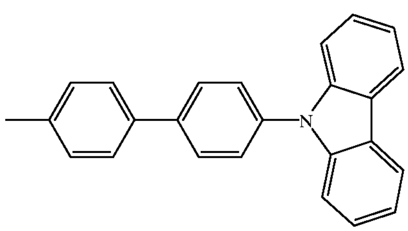 | same | same |
| H-1-24 | 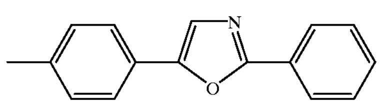 | same | same |
| H-1-25 | 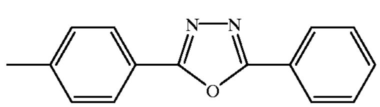 | same | same |
| H-1-26 | 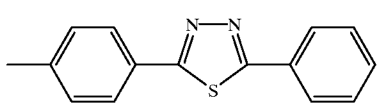 | same | same |
| H-1-27 | 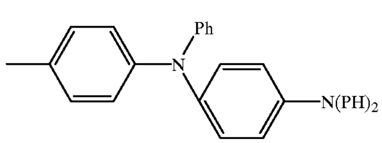 | same | same |

(H-2)
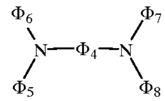
| (H-2) Compound | $\Phi_4$ | $\Phi_5$ |
|---|---|---|
| H-2-1 | 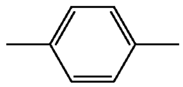 | Ph |
| H-2-2 | ditto | o-biphenylyl |
| H-2-3 | ditto | m-biphenylyl |
| H-2-4 | ditto | p-biphenylyl |
| H-2-5 | ditto | 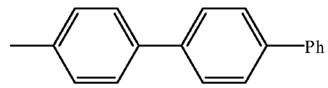 |
| H-2-6 | ditto | 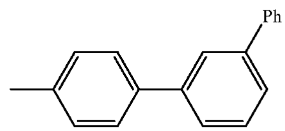 |
| H-2-7 | ditto | 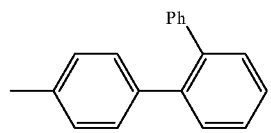 |
| H-2-8 | ditto | 1-naphthyl |
| H-2-9 | ditto | 2-naphthyl |
| H-2-10 | ditto | 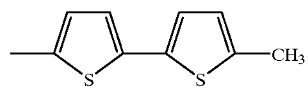 |
| H-2-11 | ditto | 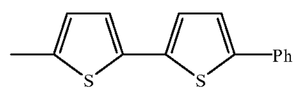 |
| H-2-12 | ditto | 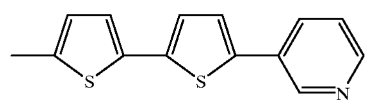 |
| H-2-13 | ditto | 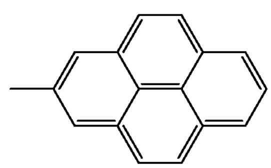 |
| H-2-14 | ditto | 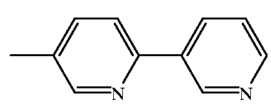 |
| H-2-15 | 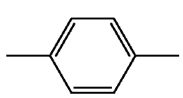 | 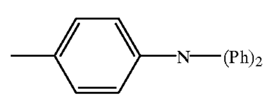 |

-continued
(H-2)
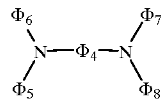
| | | |
|---|---|---|
| H-2-16 | ditto | 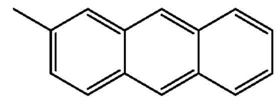 |
| H-2-17 | ditto | 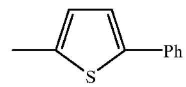  |
| H-2-18 | ditto | 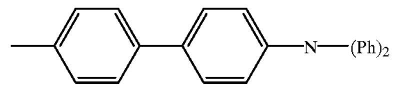  |
| H-2-19 | ditto | 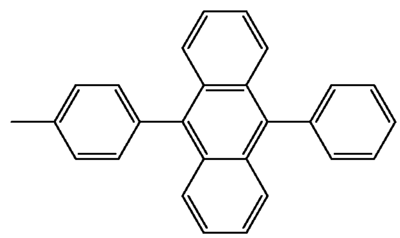 |
| H-2-20 | ditto | Ph |
| H-2-21 | ditto | o-biphenylyl |
| H-2-22 | ditto | m-biphenylyl |
| H-2-23 | ditto | p-biphenylyl |
| H-2-24 | ditto | 1-naphthyl |
| H-2-25 | ditto | 2-naphthyl |
| H-2-26 | 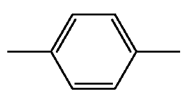 | 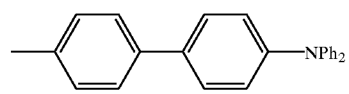  |
| H-2-27 | 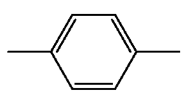 | 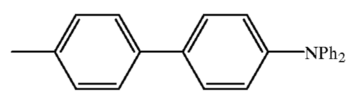  |
| H-2-101 | 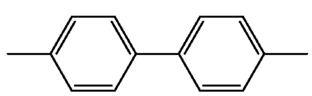 | Ph |
| H-2-102 | ditto | o-biphenylyl |
| H-2-103 | ditto | m-biphenylyl |
| H-2-104 | ditto | p-biphenylyl |
| H-2-105 | ditto | 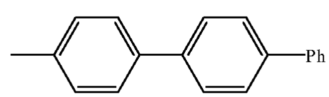  |
| H-2-106 | ditto | 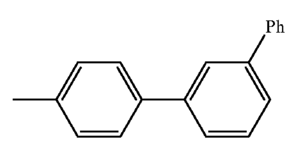  |

-continued
| | | |
|---|---|---|
| | 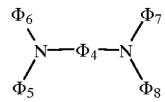 | (H-2) |
| H-2-107 | ditto | 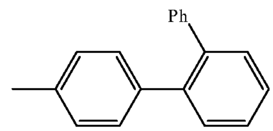 |
| H-2-108 | ditto | 1-naphthyl |
| H-2-109 | ditto | 2-naphthyl |
| H-2-110 | ditto | 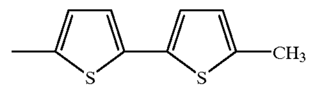 |
| H-2-111 | ditto | 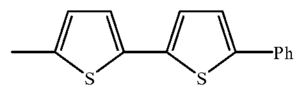 |
| H-2-112 | ditto | 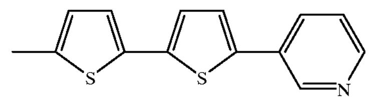 |
| H-2-113 | ditto | 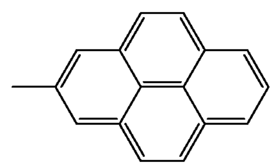 |
| H-2-114 | ditto | 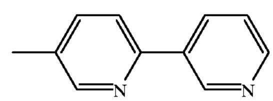 |
| H-2-115 | 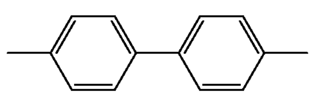 | 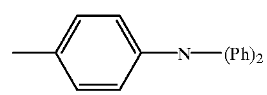 |
| H-2-116 | ditto | 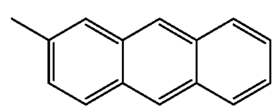 |
| H-2-117 | ditto | 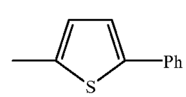 |
| H-2-118 | ditto | 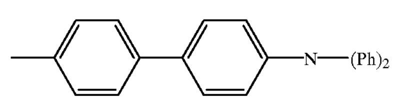 |

-continued
| | | (H-2) |
|---|---|---|
| | 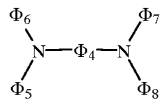 | |
| H-2-119 | ditto | 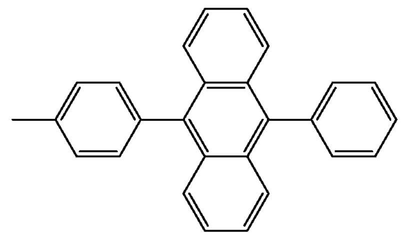 |
| H-2-120 | ditto | Ph |
| H-2-121 | ditto | Ph |
| H-2-122 | ditto | Ph |
| H-2-123 | ditto | 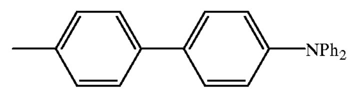 |
| H-2-201 | 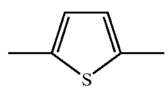 | Ph |
| H-2-202 | ditto | o-biphenyly |
| H-2-203 | ditto | m-biphenyly |
| H-2-204 | ditto | p-biphenyly |
| H-2-205 | ditto | 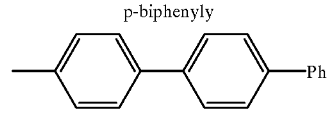 |
| H-2-206 | ditto | 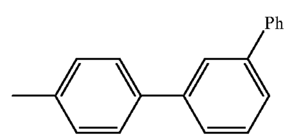 |
| H-2-207 | ditto | 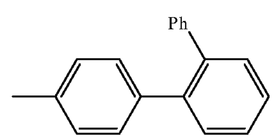 |
| H-2-208 | ditto | 2-naphthyl |
| H-2-209 | ditto | 1-naphthyl |
| H-2-210 | ditto | 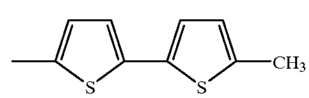 |
| H-2-211 | ditto | 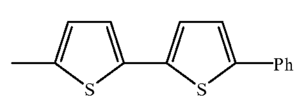 |
| H-2-212 | ditto | 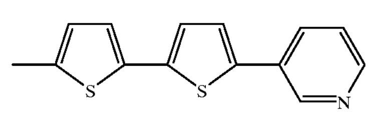 |

-continued
(H-2)
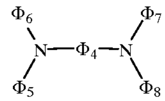
| | | |
|---|---|---|
| H-2-213 | ditto | 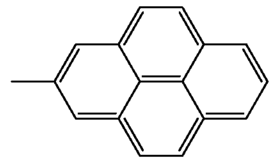 |
| H-2-214 | ditto | 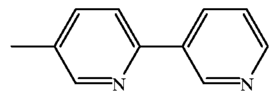 |
| H-2-215 | 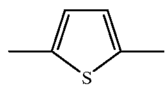 | 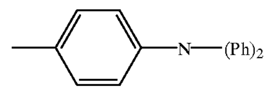 |
| H-2-216 | ditto | 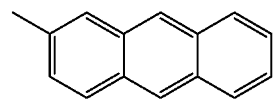 |
| H-2-217 | ditto | 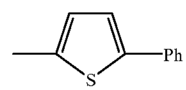 |
| H-2-218 | ditto | 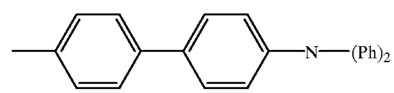 |
| H-2-219 | ditto | 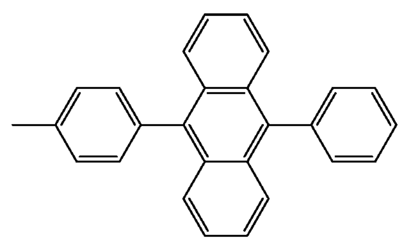 |
| H-2-220 | ditto | Ph |
| H-2-301 | 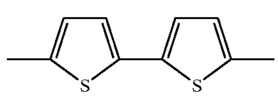 | Ph |
| H-2-302 | ditto | o-biphenylyl |
| H-2-303 | ditto | m-biphenylyl |
| H-2-304 | ditto | p-biphenylyl |
| H-2-305 | ditto | 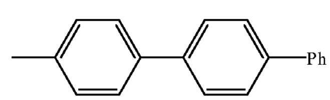 |
| H-2-306 | ditto | 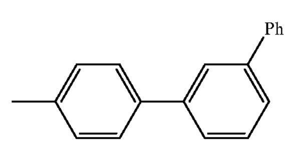 |

-continued
(H-2)
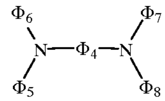
| | | |
|---|---|---|
| H-2-307 | ditto | 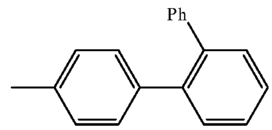 |
| H-2-308 | ditto | 2-naphthyl |
| H-2-309 | ditto | 1-naphthyl |
| H-2-310 | ditto | 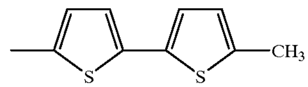 |
| H-2-311 | ditto | 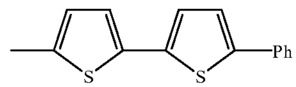 |
| H-2-312 | ditto | 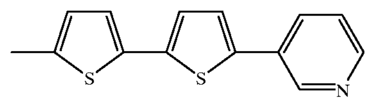 |
| H-2-313 | ditto | 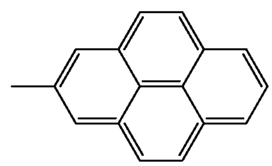 |
| H-2-314 | ditto | 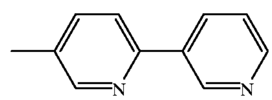 |
| H-2-315 | 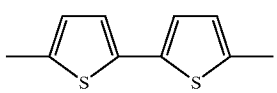 | 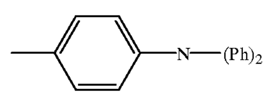 |
| H-2-316 | ditto | 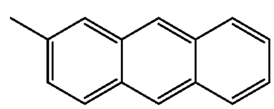 |
| H-2-317 | ditto | 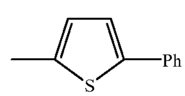 |
| H-2-318 | ditto | 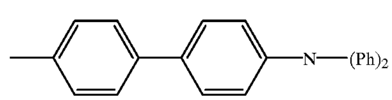 |

-continued
(H-2)
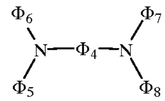
| | | |
|---|---|---|
| H-2-319 | ditto | 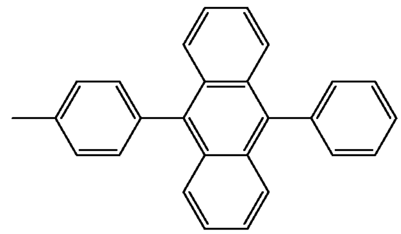 |
| H-2-320 | ditto | Ph |
| H-2-321 | ditto | 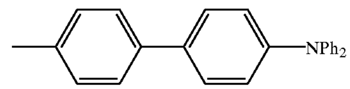 |
| H-2-322 | 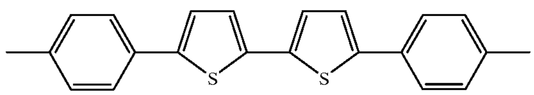 | Ph |
| H-2-323 | 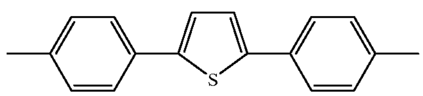 | Ph |
| H-2-324 | 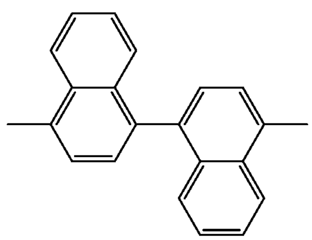 | Ph |
| H-2-401 | 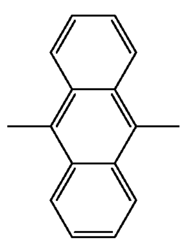 | Ph |
| H-2-402 | ditto | o-biphenyly |
| H-2-403 | ditto | m-biphenyly |
| H-2-404 | ditto | p-biphenyly |
| H-2-405 | ditto | 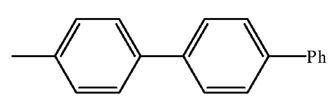 |
| H-2-406 | ditto | 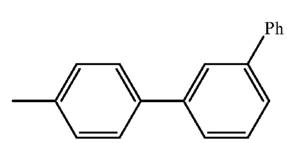 |

-continued
(H-2)
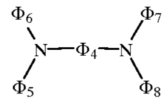
| | | |
|---|---|---|
| H-2-407 | ditto | 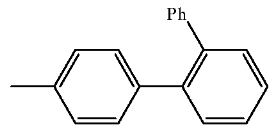 |
| H-2-408 | ditto | 2-naphthyl |
| H-2-409 | ditto | 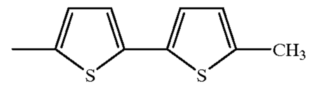 |
| H-2-410 | ditto | 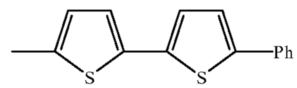 |
| H-2-411 | ditto | 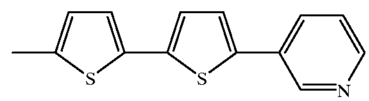 |
| H-2-412 | ditto | 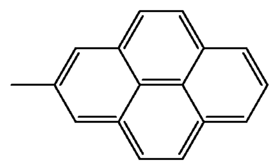 |
| H-2-413 | ditto | 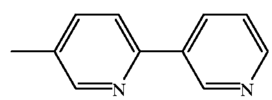 |
| H-2-414 | 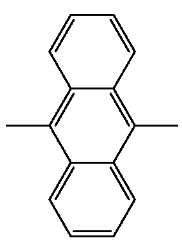 | 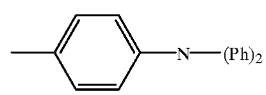 |
| H-2-415 | ditto | 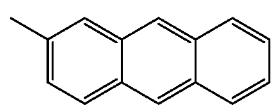 |
| H-2-416 | ditto | 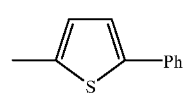 |
| H-2-417 | ditto | 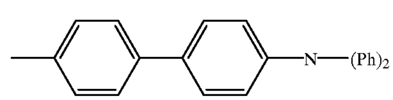 |

-continued
| (H-2) 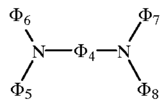 | | |
|---|---|---|
| H-2-418 | ditto | 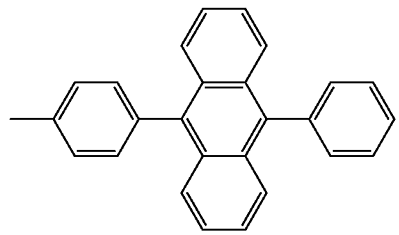 |
| H-2-419 | ditto | Ph |
| H-2-501 | 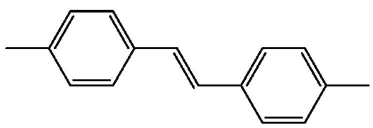 | Ph |
| H-2-502 | ditto | o-biphenylyl |
| H-2-503 | ditto | m-biphenylyl |
| H-2-504 | ditto | p-biphenylyl |
| H-2-505 | ditto | 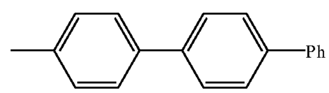 |
| H-2-506 | ditto | 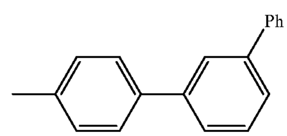 |
| H-2-507 | ditto | 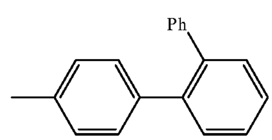 |
| H-2-508 | ditto | 2-naphthyl |
| H-2-509 | ditto | 1-naphthyl |
| H-2-510 | ditto | 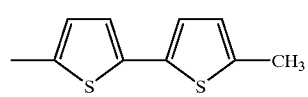 |
| H-2-511 | ditto | 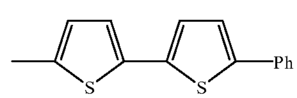 |
| H-2-512 | ditto | 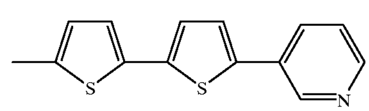 |

-continued
| | (H-2) | |
|---|---|---|
| | 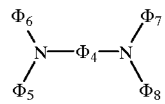 | |
| H-2-513 | ditto | 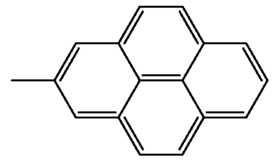 |
| H-2-514 | ditto | 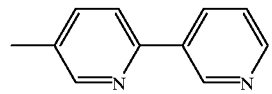 |
| H-2-515 | 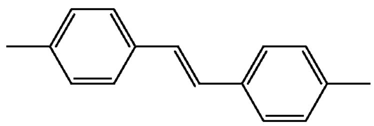 | 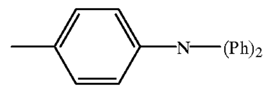 |
| H-2-516 | ditto | 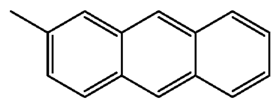 |
| H-2-517 | ditto | 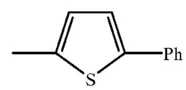 |
| H-2-518 | ditto | 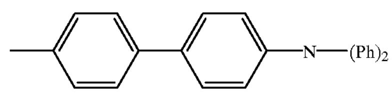 |
| H-2-519 | ditto | 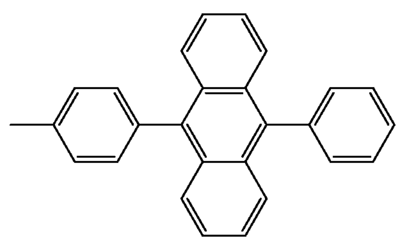 |
| H-2-520 | ditto | Ph |
| H-2-521 | 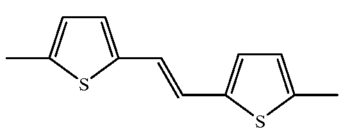 | Ph |
| H-2-522 | 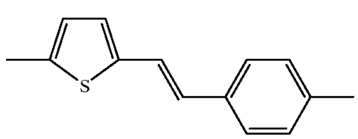 | Ph |

-continued
(H-2)
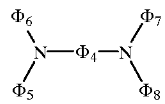
| | | |
|---|---|---|
| H-2-601 | 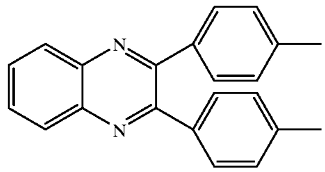 | Ph |
| H-2-602 | ditto | o-biphenylyl |
| H-2-603 | ditto | m-biphenylyl |
| H-2-604 | ditto | p-biphenylyl |
| H-2-605 | ditto | 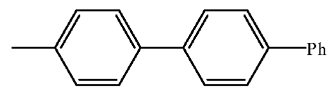 |
| H-2-606 | ditto | 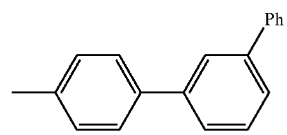 |
| H-2-607 | ditto | 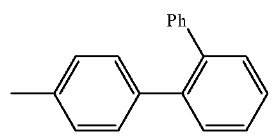 |
| H-2-608 | ditto | 2-naphthyl |
| H-2-609 | ditto | 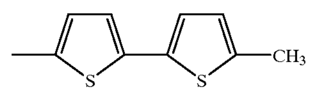 |
| H-2-610 | ditto | 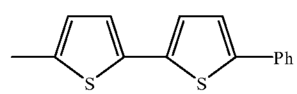 |
| H-2-611 | ditto | 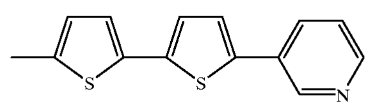 |
| H-2-612 | ditto | 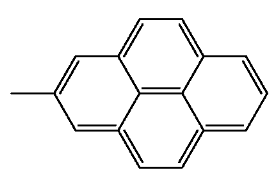 |
| H-2-613 | ditto | 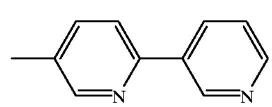 |

-continued
| | | |
|---|---|---|
| (H-2) | 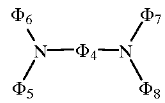 | |
| H-2-614 | 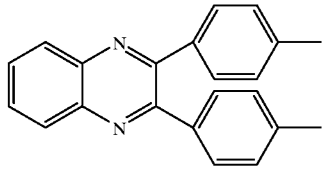 | 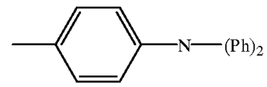 |
| H-2-615 | ditto | 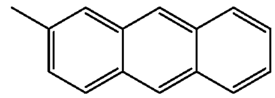 |
| H-2-616 | ditto | 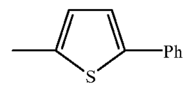 |
| H-2-617 | ditto | 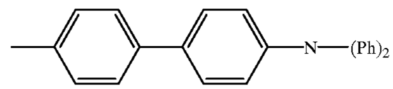 |
| H-2-618 | ditto | 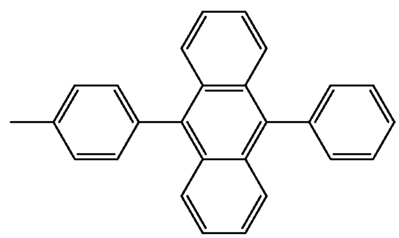 |
| H-2-619 | ditto | Ph |
| H-2-701 | 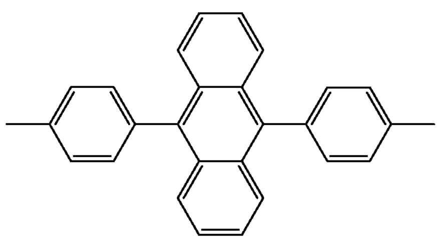 | Ph |
| H-2-702 | ditto | o-biphenylyl |
| H-2-703 | ditto | m-biphenylyl |
| H-2-704 | ditto | p-biphenylyl |
| H-2-705 | ditto | 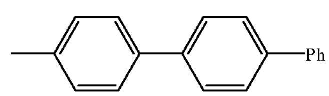 |
| H-2-706 | ditto | 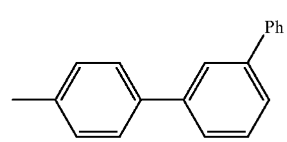 |

-continued
(H-2)
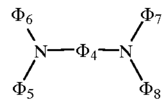
| | | |
|---|---|---|
| H-2-707 | ditto | 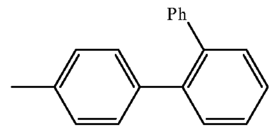 |
| H-2-708 | ditto | 2-naphthyl |
| H-2-709 | ditto | 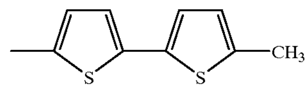 |
| H-2-710 | ditto | 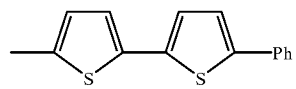 |
| H-2-711 | diffo | 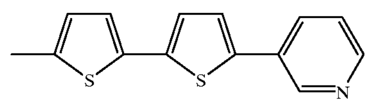 |
| H-2-712 | ditto | 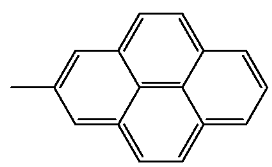 |
| H-2-713 | ditto | 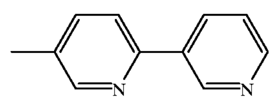 |
| H-2-714 | 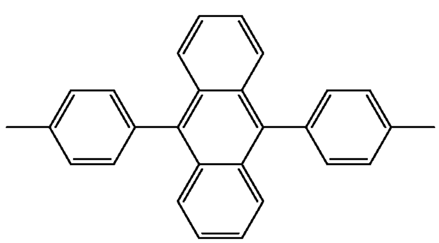 | 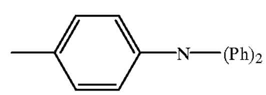 |
| H-2-715 | ditto | 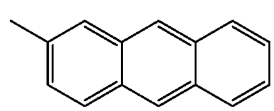 |
| H-2-716 | ditto | 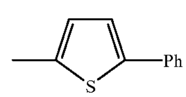 |
| H-2-717 | ditto | 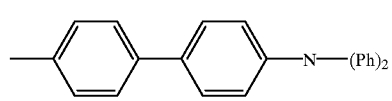 |

-continued
(H-2)
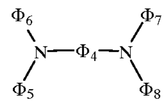
| | | |
|---|---|---|
| H-2-718 | ditto | 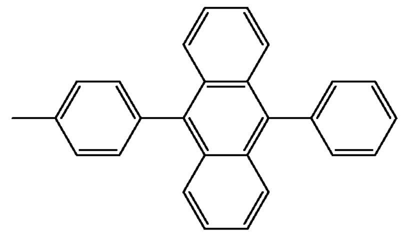 |
| H-2-719 | ditto | Ph |
| H-2-720 | 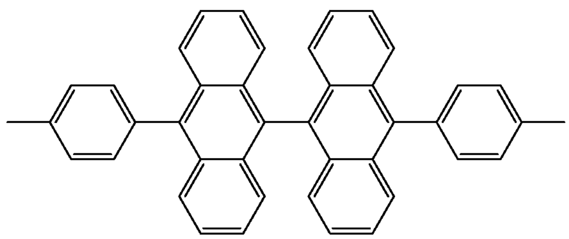 | Ph |
| H-2-801 | 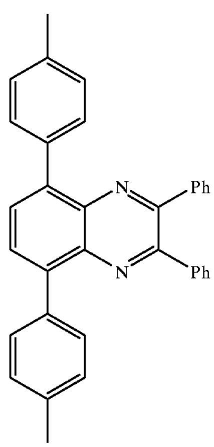 | Ph |
| H-2-802 | ditto | o-biphenylyl |
| H-2-803 | ditto | m-biphenylyl |
| H-2-804 | ditto | p-biphenylyl |
| H-2-805 | ditto | 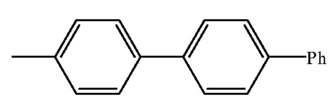 |
| H-2-806 | ditto | 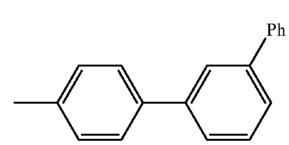 |
| H-2-807 | ditto | 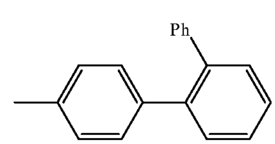 |

-continued
(H-2)
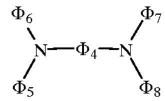
| | | |
|---|---|---|
| H-2-808 | ditto | 2-naphthyl |
| H-2-809 | ditto | 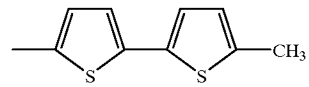 |
| H-2-810 | ditto | 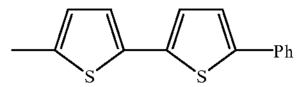 |
| H-2-811 | ditto | 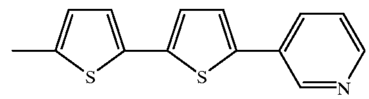 |
| H-2-812 | ditto | 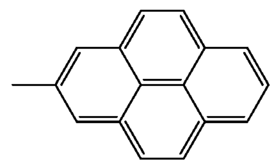 |
| H-2-813 | ditto | 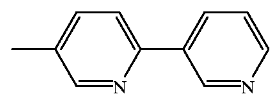 |
| H-2-814 | 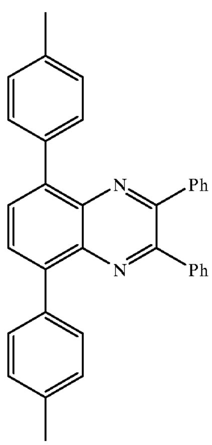 | 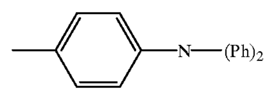 |
| H-2-815 | ditto | 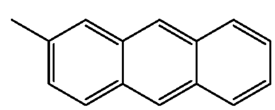 |
| H-2-816 | ditto | 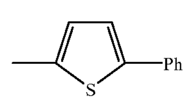 |
| H-2-817 | ditto | 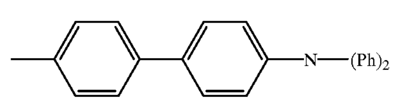 |

-continued (H-2)

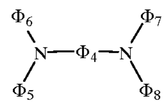

| | | |
|---|---|---|
| H-2-818 | ditto | 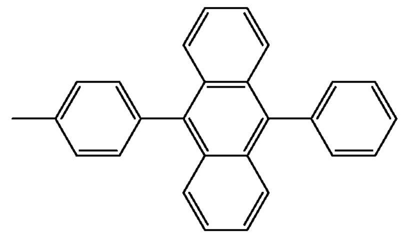 |
| H-2-819 | ditto | Ph |
| H-2-820 | 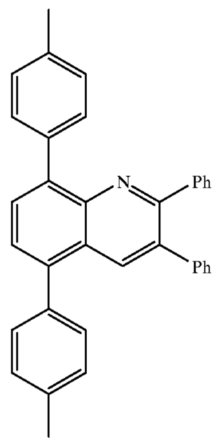 | Ph |

| (H-2) Compound | $\Phi_6$ | $\Phi_7$ | $\Phi_8$ |
|---|---|---|---|
| H-2-1 | same | same | same |
| H-2-2 | same | same | same |
| H-2-3 | same | same | same |
| H-2-4 | same | same | same |
| H-2-5 | same | same | same |
| H-2-6 | same | same | same |
| H-2-7 | same | same | same |
| H-2-8 | same | same | same |
| H-2-9 | same | same | same |
| H-2-10 | same | same | same |
| H-2-11 | same | same | same |
| H-2-12 | same | same | same |
| H-2-13 | same | same | same |
| H-2-14 | same | same | same |
| H-2-15 | same | same | same |
| H-2-16 | same | same | same |
| H-2-17 | same | same | same |
| H-2-18 | same | same | same |
| H-2-19 | same | same | same |
| H-2-20 | H | Ph | H |
| H-2-21 | H | o-biphenylyl | H |
| H-2-22 | H | m-biphenylyl | H |
| H-2-23 | H | p-biphenylyl | H |
| H-2-24 | H | 1-naphthyl | H |
| H-2-25 | H | 2-naphthyl | H |
| H-2-26 | H | 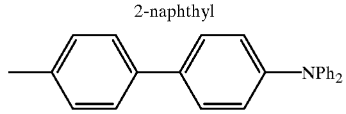 | H |

-continued (H-2)

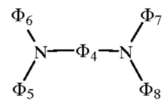

| | | | |
|---|---|---|---|
| H-2-27 | 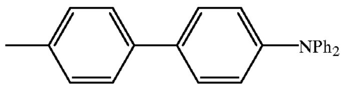 | 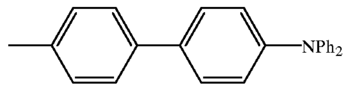 | H |
| H-2-101 | same | same | same |
| H-2-102 | same | same | same |
| H-2-103 | same | same | same |
| H-2-104 | same | same | same |
| H-2-105 | same | same | same |
| H-2-106 | same | same | same |
| H-2-107 | same | same | same |
| H-2-108 | same | same | same |
| H-2-109 | same | same | same |
| H-2-110 | same | same | same |
| H-2-111 | same | same | same |
| H-2-112 | same | same | same |
| H-2-113 | same | same | same |
| H-2-114 | same | same | same |
| H-2-115 | same | same | same |
| H-2-116 | same | same | same |
| H-2-117 | same | same | same |
| H-2-118 | same | same | same |
| H-2-119 | same | same | same |
| H-2-120 | H | Ph | H |
| H-2-121 | 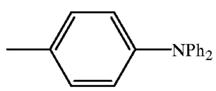 | Ph | 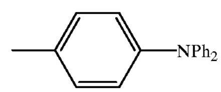 |
| H-2-122 | 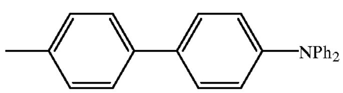 | Ph | 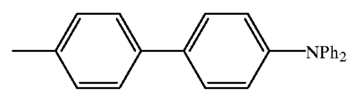 |
| H-2-123 | same | Ph | Ph |
| H-2-201 | same | same | same |
| H-2-202 | same | same | same |
| H-2-203 | same | same | same |
| H-2-204 | same | same | same |
| H-2-205 | same | same | same |
| H-2-206 | same | same | same |
| H-2-207 | same | same | same |
| H-2-208 | same | same | same |
| H-2-209 | same | same | same |
| H-2-210 | same | same | same |
| H-2-211 | same | same | same |
| H-2-212 | same | same | same |
| H-2-213 | same | same | same |
| H-2-214 | same | same | same |
| H-2-215 | same | same | same |
| H-2-216 | same | same | same |
| H-2-217 | same | same | same |
| H-2-218 | same | same | same |
| H-2-219 | same | same | same |
| H-2-220 | H | Ph | H |
| H-2-301 | same | same | same |
| H-2-302 | same | same | same |
| H-2-303 | same | same | same |
| H-2-304 | same | same | same |
| H-2-305 | same | same | same |
| H-2-306 | same | same | same |
| H-2-307 | same | same | same |
| H-2-308 | same | same | same |
| H-2-309 | same | same | same |
| H-2-310 | same | same | same |
| H-2-311 | same | same | same |
| H-2-312 | same | same | same |

-continued (H-2)

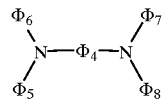

| | | | |
|---|---|---|---|
| H-2-313 | same | same | same |
| H-2-314 | same | same | same |
| H-2-315 | same | same | same |
| H-2-316 | same | same | same |
| H-2-317 | same | same | same |
| H-2-318 | same | same | same |
| H-2-319 | same | same | same |
| H-2-320 | H | Ph | H |
| H-2-321 | Ph | 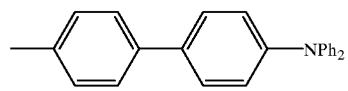 | Ph |
| H-2-322 | same | same | same |
| H-2-323 | same | same | same |
| H-2-324 | same | same | same |
| H-2-401 | same | same | same |
| H-2-402 | same | same | same |
| H-2-403 | same | same | same |
| H-2-404 | same | same | same |
| H-2-405 | same | same | same |
| H-2-406 | same | same | same |
| H-2-407 | same | same | same |
| H-2-408 | same | same | same |
| H-2-409 | same | same | same |
| H-2-410 | same | same | same |
| H-2-411 | same | same | same |
| H-2-412 | same | same | same |
| H-2-413 | same | same | same |
| H-2-414 | same | same | same |
| H-2-415 | same | same | same |
| H-2-416 | same | same | same |
| H-2-417 | same | same | same |
| H-2-418 | same | same | same |
| H-2-419 | H | Ph | H |
| H-2-501 | same | same | same |
| H-2-502 | same | same | same |
| H-2-503 | same | same | same |
| H-2-504 | same | same | same |
| H-2-505 | same | same | same |
| H-2-506 | same | same | same |
| H-2-507 | same | same | same |
| H-2-508 | same | same | same |
| H-2-509 | same | same | same |
| H-2-510 | same | same | same |
| H-2-511 | same | same | same |
| H-2-512 | same | same | same |
| H-2-513 | same | same | same |
| H-2-514 | same | same | same |
| H-2-515 | same | same | same |
| H-2-516 | same | same | same |
| H-2-517 | same | same | same |
| H-2-518 | same | same | same |
| H-2-519 | same | same | same |
| H-2-520 | H | Ph | H |
| H-2-521 | same | same | same |
| H-2-522 | same | same | same |
| H-2-601 | same | same | same |
| H-2-602 | same | same | same |
| H-2-603 | same | same | same |
| H-2-604 | same | same | same |
| H-2-605 | same | same | same |
| H-2-606 | same | same | same |
| H-2-607 | same | same | same |
| H-2-608 | same | same | same |
| H-2-609 | same | same | same |
| H-2-610 | same | same | same |
| H-2-611 | same | same | same |
| H-2-612 | same | same | same |
| H-2-613 | same | same | same |

-continued (H-2)

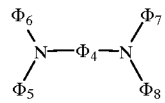

| | | | |
|---|---|---|---|
| H-2-614 | same | same | same |
| H-2-615 | same | same | same |
| H-2-616 | same | same | same |
| H-2-617 | same | same | same |
| H-2-618 | same | same | same |
| H-2-619 | H | Ph | H |
| H-2-701 | same | same | same |
| H-2-702 | same | same | same |
| H-2-703 | same | same | same |
| H-2-704 | same | same | same |
| H-2-705 | same | same | same |
| H-2-706 | same | same | same |
| H-2-707 | same | same | same |
| H-2-708 | same | same | same |
| H-2-709 | same | same | same |
| H-2-710 | same | same | same |
| H-2-711 | same | same | same |
| H-2-712 | same | same | same |
| H-2-713 | same | same | same |
| H-2-714 | same | same | same |
| H-2-715 | same | same | same |
| H-2-716 | same | same | same |
| H-2-717 | same | same | same |
| H-2-718 | same | same | same |
| H-2-719 | H | Ph | H |
| H-2-720 | Ph | Ph | Ph |
| H-2-801 | same | same | same |
| H-2-802 | same | same | same |
| H-2-803 | same | same | same |
| H-2-804 | same | same | same |
| H-2-805 | same | same | same |
| H-2-806 | same | same | same |
| H-2-807 | same | same | same |
| H-2-808 | same | same | same |
| H-2-809 | same | same | same |
| H-2-810 | same | same | same |
| H-2-811 | same | same | same |
| H-2-812 | same | same | same |
| H-2-813 | same | same | same |
| H-2-814 | same | same | same |
| H-2-815 | same | same | same |
| H-2-816 | same | same | same |
| H-2-817 | same | same | same |
| H-2-818 | same | same | same |
| H-2-819 | H | Ph | H |
| H-2-820 | same | same | same |

(H-3)
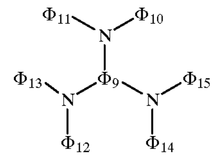
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-1 | 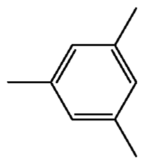 | Ph | same | same | same | same | same |
| H-3-2 | " | o-biphenylyl | same | same | same | same | same |
| H-3-3 | " | m-biphenylyl | same | same | same | same | same |
| H-3-4 | " | p-biphenylyl | same | same | same | same | same |
| H-3-5 | " | 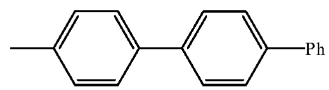  | same | same | same | same | same |
| H-3-6 | " | 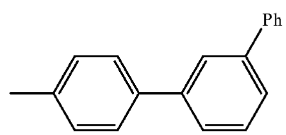  | same | same | same | same | same |
| [001b] H-3-7 | " | 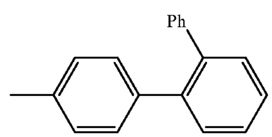  | same | same | same | same | same |
| H-3-8 | " | 2-naphthyl | same | same | same | same | same |

-continued
(H-3)
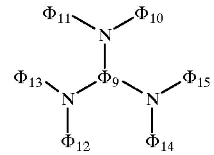
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-9 | " | 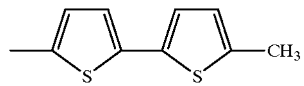 | same | same | same | same | same |
| H-3-10 | " | 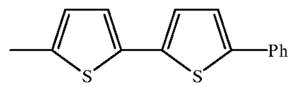 | same | same | same | same | same |
| H-3-11 | " | 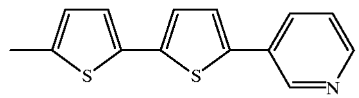 | same | same | same | same | same |
| H-3-12 | " | 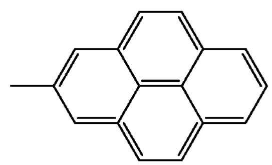 | same | same | same | same | same |
| H-3-13 | " | 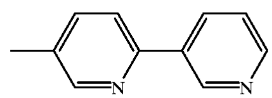 | same | same | same | same | same |
| H-3-14 | " | 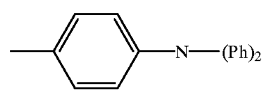 | same | same | same | same | same |

-continued
(H-3)
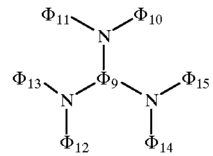
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-15 | " | 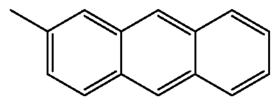 | same | same | same | same | same |
| H-3-16 | " | 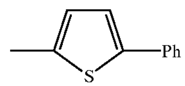 | same | same | same | same | same |
| H-3-17 | " | 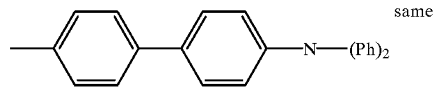 | same | same | same | same | same |
| H-3-18 | " | 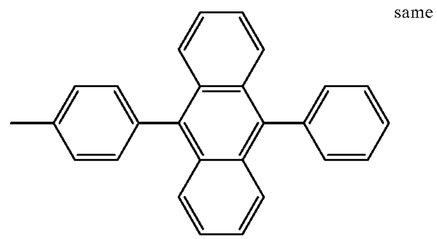 | same | same | same | same | same |
| H-3-19 | " | Ph | H | Ph | H | Ph | H |
| H-3-20 | " | 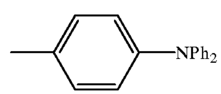 | H | 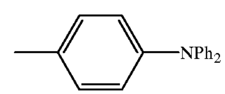 | H | 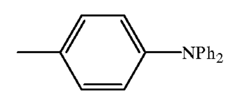 | H |

-continued
(H-3)
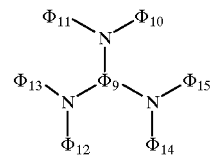
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-101 | 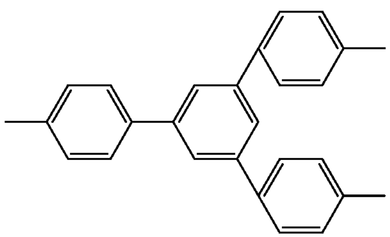 | Ph | same | same | same | same | same |
| H-3-102 | " | o-biphenylyl | same | same | same | same | same |
| H-3-103 | " | m-biphenylyl | same | same | same | same | same |
| H-3-104 | " | p-biphenylyl | same | same | same | same | same |
| H-3-105 | " | 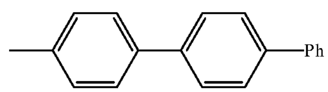 | same | same | same | same | same |
| H-3-106 | " | 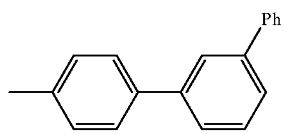 | same | same | same | same | same |
| H-3-107 | " | 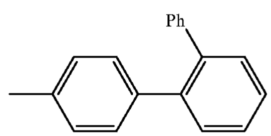 | same | same | same | same | same |
| H-3-108 | " | 2-naphthyl | same | same | same | same | same |

-continued
(H-3)
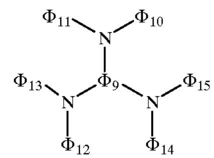
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-109 | " | 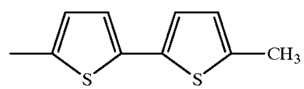  | same | same | same | same | same |
| H-3-110 | " | 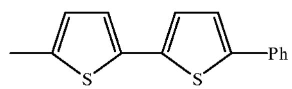  | same | same | same | same | same |
| H-3-111 | " | 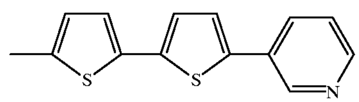  | same | same | same | same | same |
| H-3-112 | " | 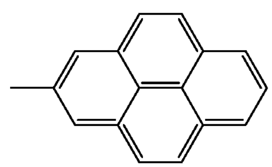 | same | same | same | same | same |
| H-3-113 | " | 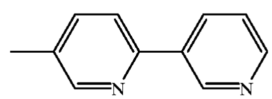  | same | same | same | same | same |
| H-3-114 | " | 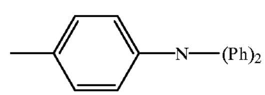  | same | same | same | same | same |

-continued
(H-3)
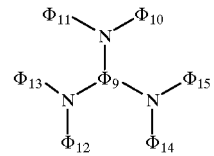
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-115 | " | 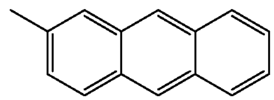 | same | same | same | same | same |
| H-3-116 | " | 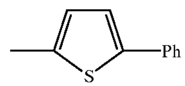 | same | same | same | same | same |
| H-3-117 | " | 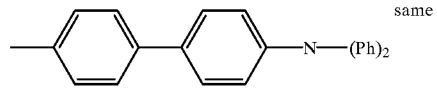 | same | same | same | same | same |
| H-3-118 | " | 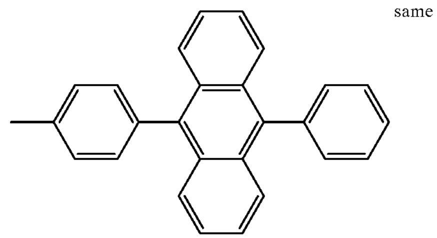 | same | same | same | same | same |
| H-3-119 | " | Ph | H | Ph | H | Ph | H |
| H-3-201 | 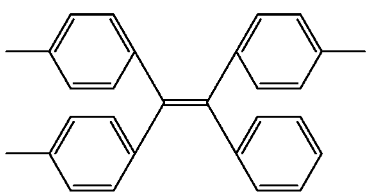 | Ph | same | same | same | same | same |

-continued (H-3)

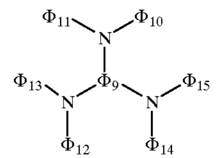

(H-3)

| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-202 | " | o-biphenylyl | same | same | same | same | same |
| H-3-203 | " | m-biphenylyl | same | same | same | same | same |
| H-3-204 | " | p-biphenylyl | same | same | same | same | same |
| H-3-205 | " | 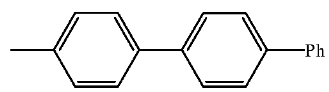  | same | same | same | same | same |
| H-3-206 | " | 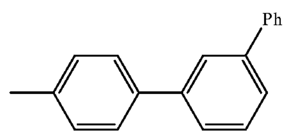  | same | same | same | same | same |
| H-3-207 | " | 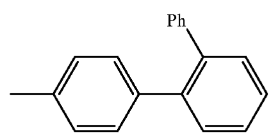  | same | same | same | same | same |
| H-3-208 | " | 2-naphthyl | same | same | same | same | same |
| H-3-209 | " | 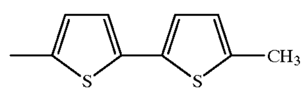  | same | same | same | same | same |
| H-3-210 | " | 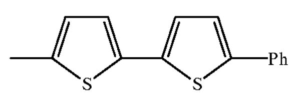  | same | same | same | same | same |

-continued
(H-3)
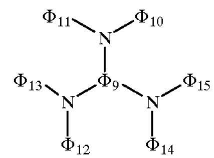
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-211 | " | 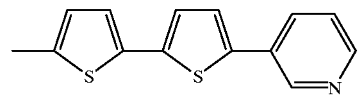 | same | same | same | same | same |
| H-3-212 | " | 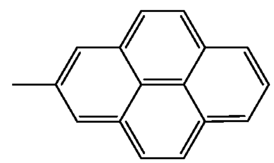 | same | same | same | same | same |
| H-3-213 | " | 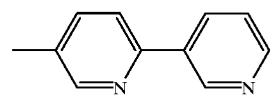 | same | same | same | same | same |
| H-3-214 | " | 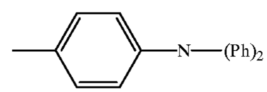 | same | same | same | same | same |
| H-3-215 | " | 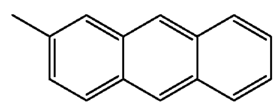 | same | same | same | same | same |
| H-3-216 | " | 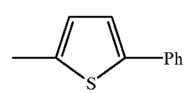 | same | same | same | same | same |

-continued
(H-3)
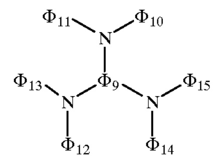
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-217 | " | 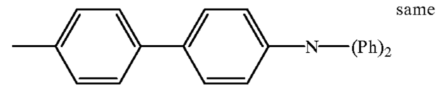 | same | same | same | same | same |
| H-3-218 | " | 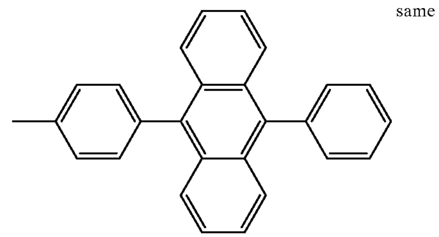 | same | same | same | same | same |
| H-3-219 | " | Ph | H | Ph | H | Ph | H |
| H-3-301 | 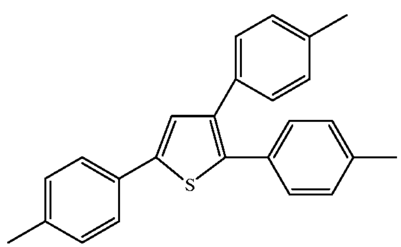 | Ph | same | same | same | same | same |
| H-3-302 | " | o-biphenylyl | same | same | same | same | same |
| H-3-303 | " | m-biphenylyl | same | same | same | same | same |
| H-3-304 | " | p-biphenylyl | same | same | same | same | same |

-continued
(H-3)
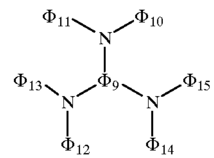
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-305 | " | 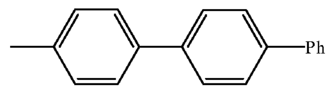 | same | same | same | same | same |
| H-3-306 | " | 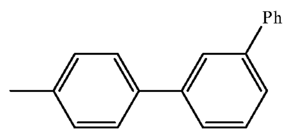 | same | same | same | same | same |
| H-3-307 | " | 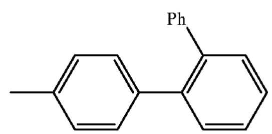 | same | same | same | same | same |
| H-3-308 | " | 2-naphthyl | same | same | same | same | same |
| H-3-309 | " | 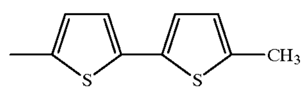 | same | same | same | same | same |
| H-3-310 | " | 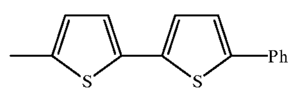 | same | same | same | same | same |
| H-3-311 | " | 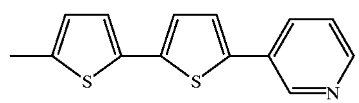 | same | same | same | same | same |

-continued
(H-3)
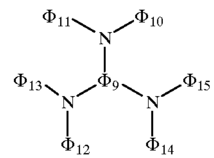
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-312 | " | 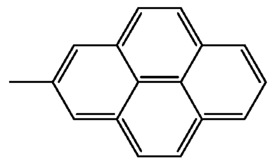 | same | same | same | same | same |
| H-3-313 | " | 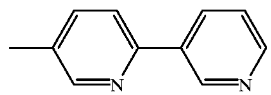 | same | same | same | same | same |
| H-3-314 | " | 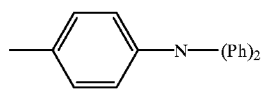 | same | same | same | same | same |
| H-3-315 | " | 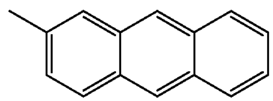 | same | same | same | same | same |
| H-3-316 | " | 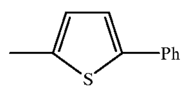 | same | same | same | same | same |
| H-3-317 | " | 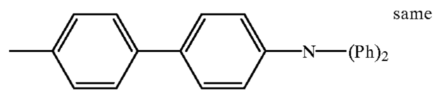 | same | same | same | same | same |

-continued
(H-3)
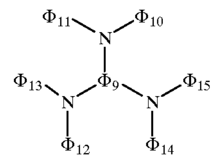
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-318 | " | 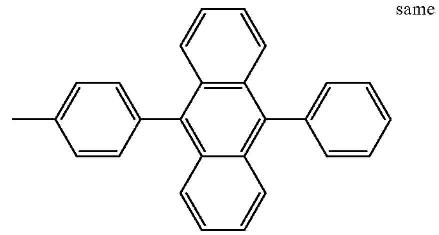 | same | same | same | same | same |
| H-3-319 | " | Ph | H | Ph | H | Ph | H |
| H-3-401 | 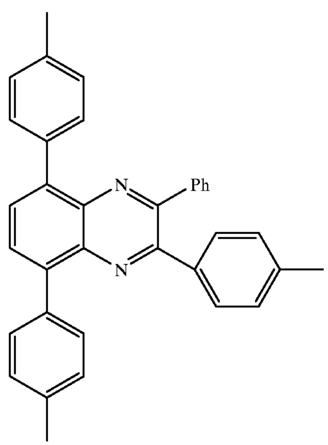 | Ph | same | same | same | same | same |
| H-3-402 | " | o-biphenylyl | same | same | same | same | same |
| H-3-403 | " | m-biphenylyl | same | same | same | same | same |

-continued
(H-3)
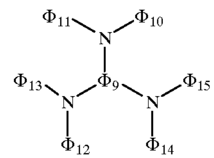
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
| --- | --- | --- | --- | --- | --- | --- | --- |
| H-3-404 | " | p-biphenylyl | same | same | same | same | same |
| H-3-405 | " | 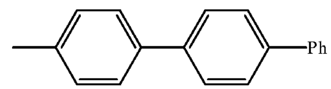 | same | same | same | same | same |
| H-3-406 | " | 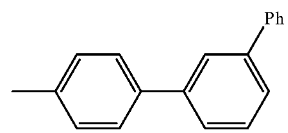 | same | same | same | same | same |
| H-3-407 | " | 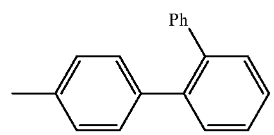 | same | same | same | same | same |
| H-3-408 | " | 2-naphthyl | same | same | same | same | same |
| H-3-409 | " | 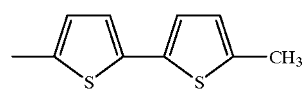 | same | same | same | same | same |
| H-3-410 | " | 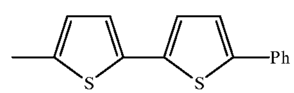 | same | same | same | same | same |
| H-3-411 | " | 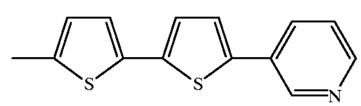 | same | same | same | same | same |

-continued
(H-3)
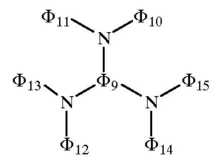 (H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
| --- | --- | --- | --- | --- | --- | --- | --- |
| H-3-412 | " | 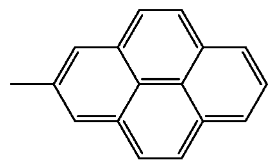 | same | same | same | same | same |
| H-3-413 | " | 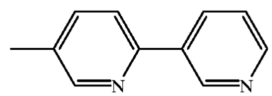 | same | same | same | same | same |
| H-3-414 | " | 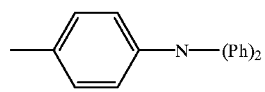 | same | same | same | same | same |
| H-3-415 | " | 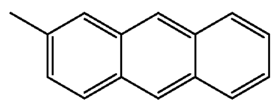 | same | same | same | same | same |
| H-3-416 | " | 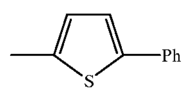 | same | same | same | same | same |
| H-3-417 | " | 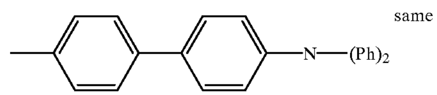 | same | same | same | same | same |

-continued
(H-3)
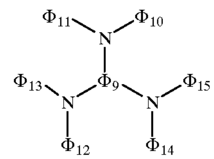
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-418 | " | 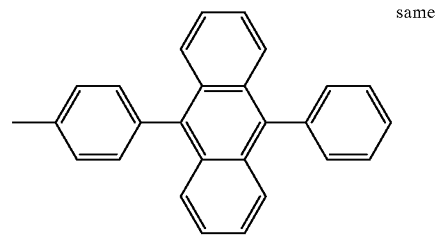 | same | same | same | same | same |
| H-3-419 | " | Ph | H | Ph | H | Ph | H |
| H-3-501 | 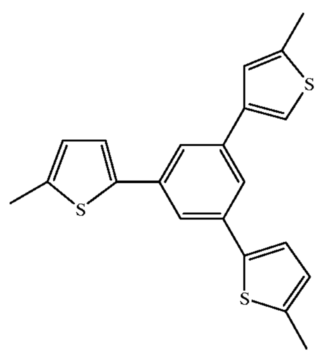 | Ph | same | same | same | same | same |
| H-3-502 | " | o-biphenylyl | same | same | same | same | same |
| H-3-503 | " | m-biphenylyl | same | same | same | same | same |
| H-3-504 | " | p-biphenylyl | same | same | same | same | same |

-continued
(H-3)
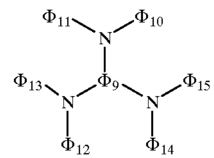
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-505 | " | 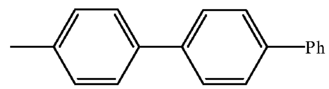 | same | same | same | same | same |
| H-3-506 | " | 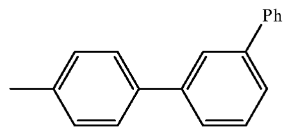 | same | same | same | same | same |
| H-3-507 | " | 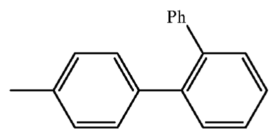 | same | same | same | same | same |
| H-3-508 | " | 2-naphthyl | same | same | same | same | same |
| H-3-509 | " | 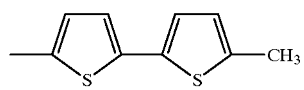 | same | same | same | same | same |
| H-3-510 | " | 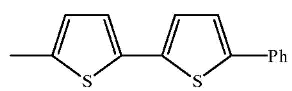 | same | same | same | same | same |
| H-3-511 | " | 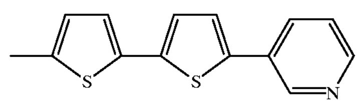 | same | same | same | same | same |

-continued
(H-3)
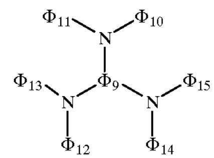
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-512 | " | 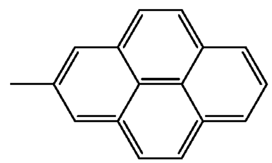 | same | same | same | same | same |
| H-3-513 | " | 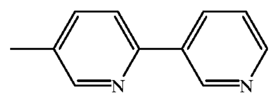 | same | same | same | same | same |
| H-3-514 | " | 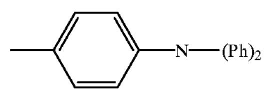 | same | same | same | same | same |
| H-3-515 | " | 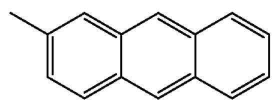 | same | same | same | same | same |
| H-3-516 | " | 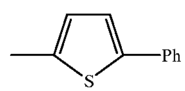 | same | same | same | same | same |
| H-3-517 | " | 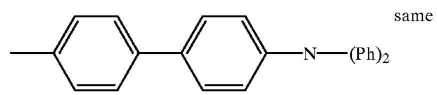 | same | same | same | same | same |

-continued
(H-3)
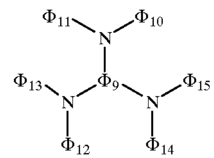
(H-3)
| Compound | $\Phi_9$ | $\Phi_{10}$ | $\Phi_{11}$ | $\Phi_{12}$ | $\Phi_{13}$ | $\Phi_{14}$ | $\Phi_{15}$ |
|---|---|---|---|---|---|---|---|
| H-3-518 | " | 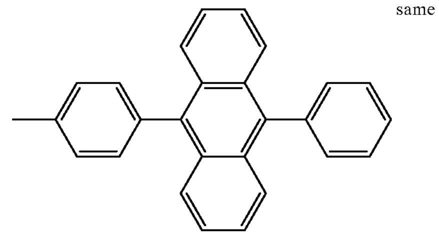 | same | same | same | same | same |
| H-3-519 | " | Ph | H | Ph | H | Ph | H |
| H-3-520 | 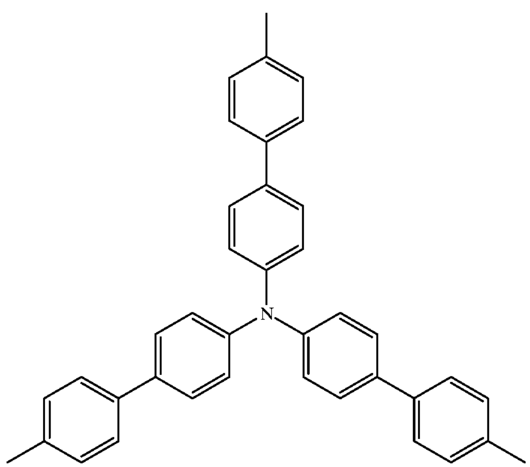 | PH | Ph | Ph | Ph | Ph | Ph |

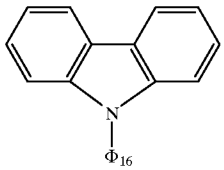
| (H-4) Compound | $\Phi_{16}$ |
|---|---|
| H-4-1 | Ph |
| H-4-2 | o-biphenylyl |
| H-4-3 | m-biphenylyl |
| H-4-4 | p-biphenylyl |
| H-4-5 | 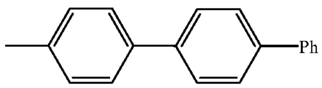 |
| H-4-6 | 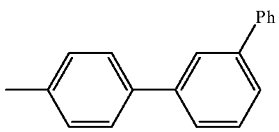 |
| H-4-7 | 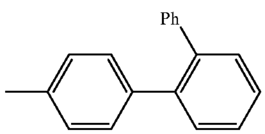 |
| H-4-8 | 2-naphthyl |
| H-4-9 | 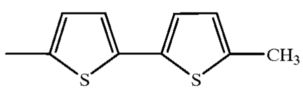 |
| H-4-10 | 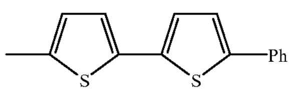 |
| H-4-11 | 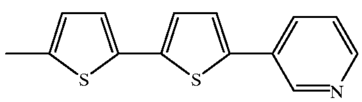 |
| H-4-12 | 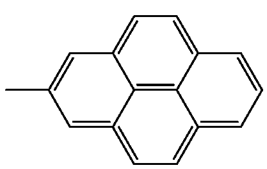 |
| H-4-13 | 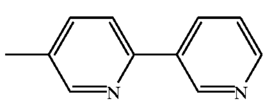 |
| H-4-14 | 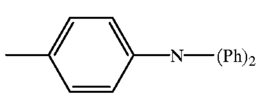 |
-continued
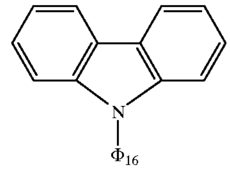
| (H-4) Compound | $\Phi_{16}$ |
|---|---|
| H-4-15 | 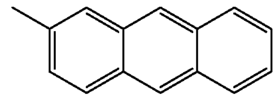 |
| H-4-16 | 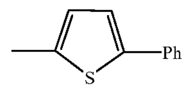 |
| H-4-17 | 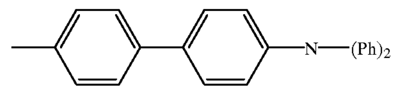 |
| H-4-18 | 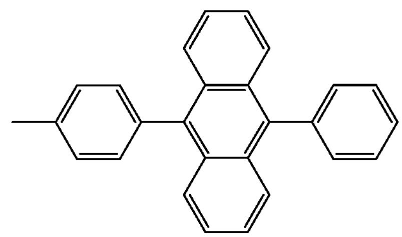 |
| H-4-20 | H |
| H-4-21 | —$CH_3$ |
| H-4-22 | —$C_2H_5$ |
| H-4-23 | —$C_3H_7$ |
| H-4-24 | —$C_4H_9$ |
| H-4-25 | 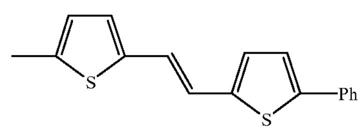 |
| H-4-26 | 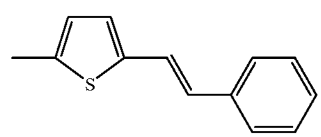 |
| H-4-27 | 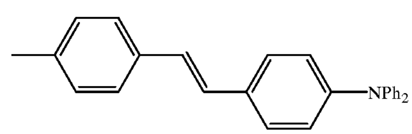 |

-continued
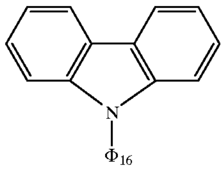
(H-4)
| Compound | $\Phi_{16}$ |
| --- | --- |
| H-4-28 | 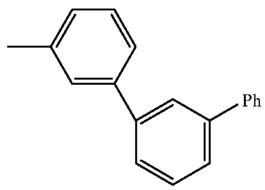 |
-continued
(H-5)
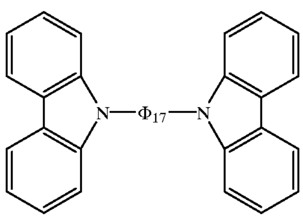
| Compound | $\Phi_{17}$ |
| --- | --- |
| H-5-1 | 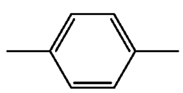 |
| H-5-2 | 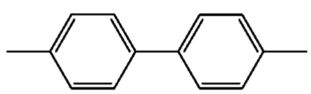 |
| H-5-3 | 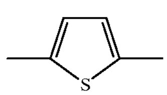 |
| H-5-4 | 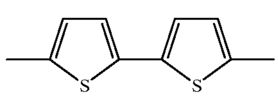 |
| H-5-5 | 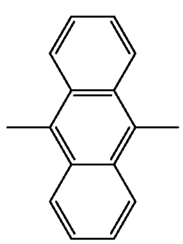 |
-continued
(H-5)
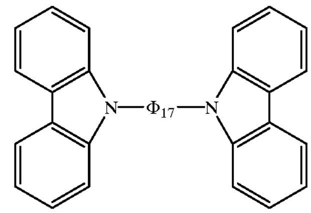
| Compound | $\Phi_{17}$ |
| --- | --- |
| H-5-6 | 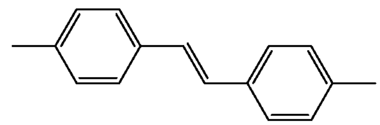 |
| H-5-7 | 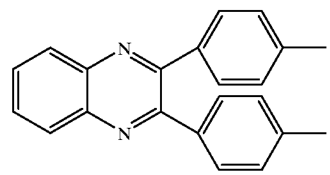 |
| H-5-8 | 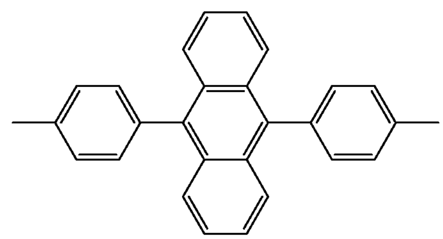 |
| H-5-9 | 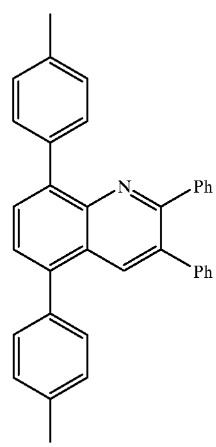 |
| H-5-10 | 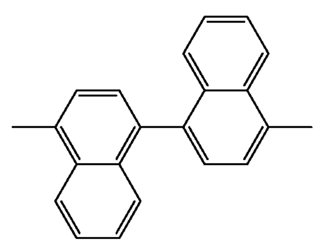 |

-continued
(H-5)
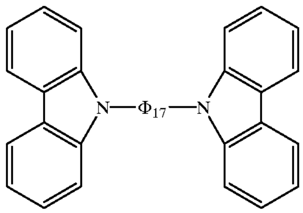
| Compound | $\Phi_{17}$ |
| --- | --- |
| H-5-11 | 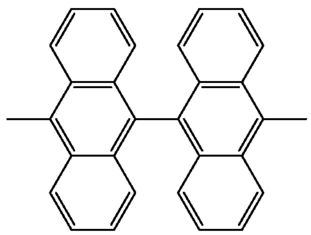 |
| H-5-12 | 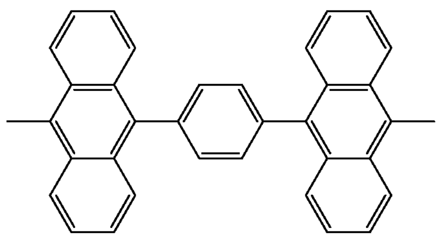 |
| H-5-13 | 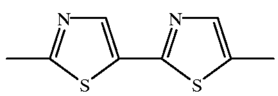 |
| H-5-14 | 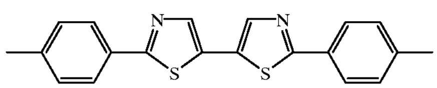 |
| H-5-15 | 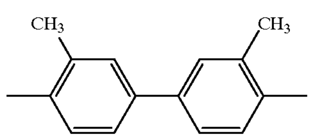 |
| H-5-16 | 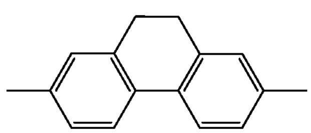 |
| H-5-17 | 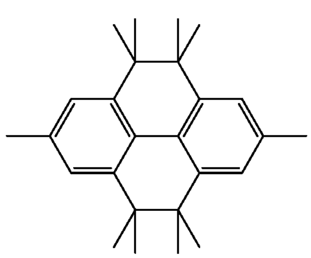 |
-continued
(H-5)
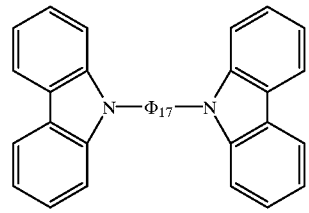
| Compound | $\Phi_{17}$ |
| --- | --- |
| H-5-18 | 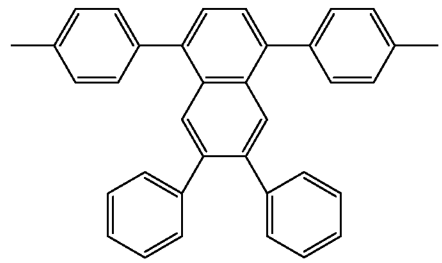 |
(H-6a)
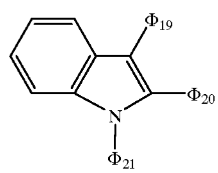
(H-6a)
(H-6b)
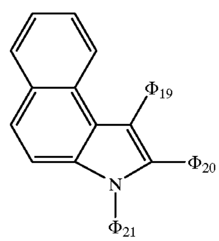
(H-6b)
(H-6c)
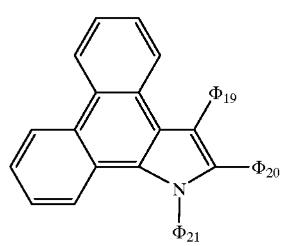
(H-6c)

| (H-6) (combination common in H-6a to H-6c; same in the following (H-6)) | | | |
|---|---|---|---|
| Compound | $\Phi_{19}$ | $\Phi_{20}$ | $\Phi_{21}$ |
| H-6-1 | Ph | same | 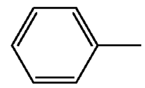 |
| H-6-2 | o-biphenylyl | same | " |
| H-6-3 | m-biphenylyl | same | " |
| H-6-4 | p-biphenylyl | same | " |
| H-6-5 | 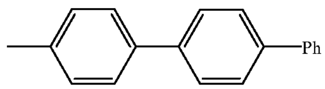 | same | " |
| H-6-6 | 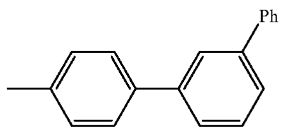 | same | " |
| H-6-7 | 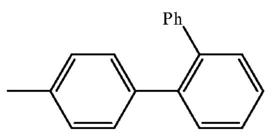 | same | " |
| H-6-8 | 2-naphthyl | same | " |
| H-6-9 | 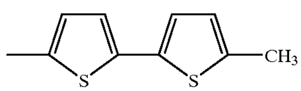 | same | " |
| H-6-10 | 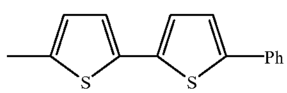 | same | " |
| H-6-11 | 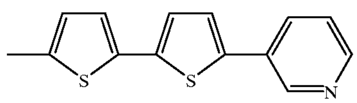 | same | " |
| H-6-12 | 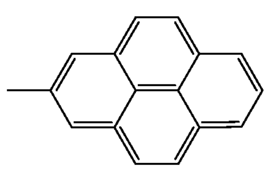 | same | " |
| H-6-13 | 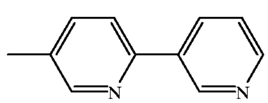 | same | " |
| H-6-14 | 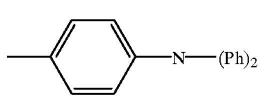 | same | " |
| H-6-15 | 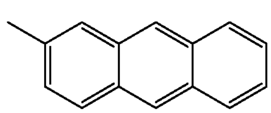 | same | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-16 | 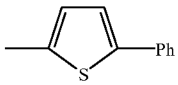 | same | " |
| H-6-17 | 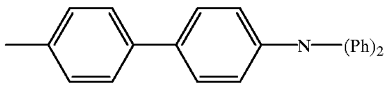 | same | " |
| H-6-18 | 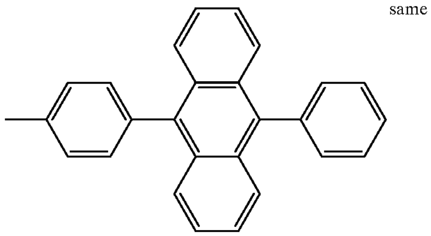 | same | " |
| H-6-19 | Ph | H | " |
| H-6-101 | Ph | same | 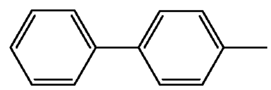 |
| H-6-102 | o-biphenylyl | same | " |
| H-6-103 | m-biphenylyl | same | " |
| H-6-104 | p-biphenylyl | same | " |
| H-6-105 | 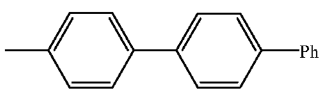 | same | " |
| H-6-106 | 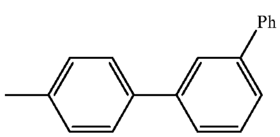 | same | " |
| H-6-107 | 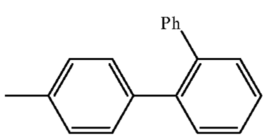 | same | " |
| H-6-108 | 2-naphthyl | same | " |
| H-6-109 | 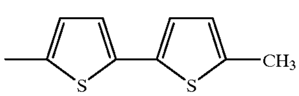 | same | " |
| H-6-110 | 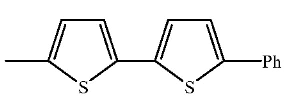 | same | " |
| H-6-111 | 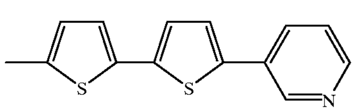 | same | " |

-continued
| (H-6) (combination common in H-6a to H-6c; same in the following (H-6)) | | | |
|---|---|---|---|
| Compound | $\Phi_{19}$ | $\Phi_{20}$ | $\Phi_{21}$ |
| H-6-112 | 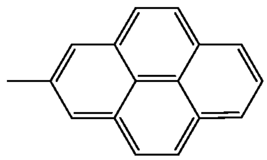 | same | " |
| H-6-113 | 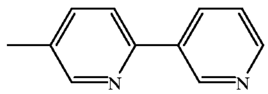 | same | " |
| H-6-114 | 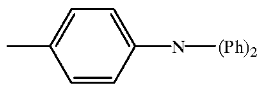 | same | " |
| H-6-115 | 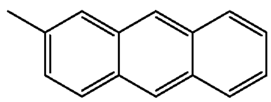 | same | " |
| H-6-116 | 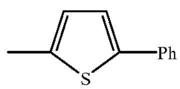 | same | " |
| H-6-117 | 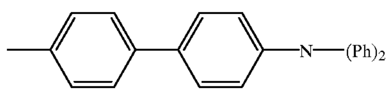 | same | " |
| H-6-118 | 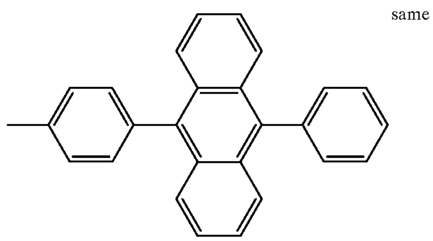 | same | " |
| H-6-119 | Ph | H | " |
| H-6-201 | Ph | same | 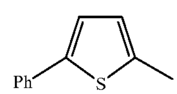 |
| H-6-202 | o-biphenylyl | same | " |
| H-6-203 | m-biphenylyl | same | " |
| H-6-204 | p-biphenylyl | same | " |
| H-6-205 | 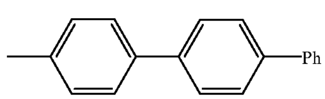 | same | " |
| H-6-206 | 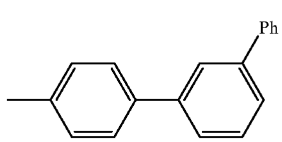 | same | " |

-continued
| (H-6) (combination common in H-6a to H-6c; same in the following (H-6)) | | | |
|---|---|---|---|
| Compound | $\Phi_{19}$ | $\Phi_{20}$ | $\Phi_{21}$ |
| H-6-207 | 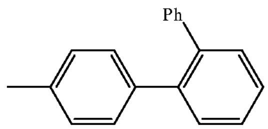 | same | " |
| H-6-208 | 2-naphthyl | same | " |
| H-6-209 | 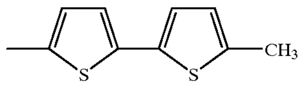 | same | " |
| H-6-210 | 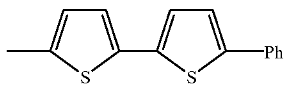 | same | " |
| H-6-211 | 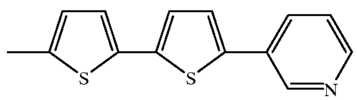 | same | " |
| H-6-212 | 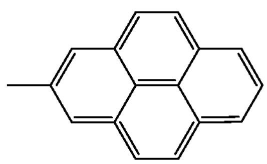 | same | " |
| H-6-213 | 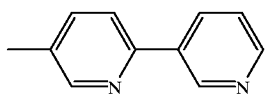 | same | " |
| H-6-214 | 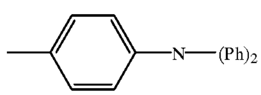 | same | " |
| H-6-215 | 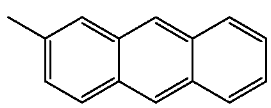 | same | " |
| H-6-216 | 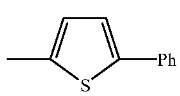 | same | " |
| H-6-217 | 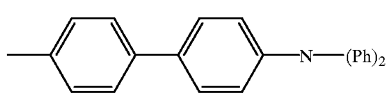 | same | " |
| H-6-218 | 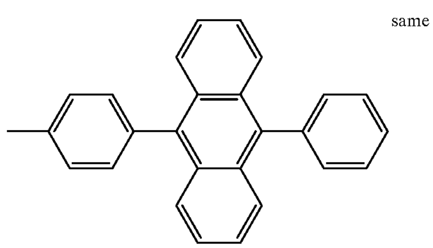 | same | " |

-continued
| (H-6) (combination common in H-6a to H-6c; same in the following (H-6)) | | | |
|---|---|---|---|
| Compound | $\Phi_{19}$ | $\Phi_{20}$ | $\Phi_{21}$ |
| H-6-219 | Ph | H | " |
| H-6-301 | Ph | same | 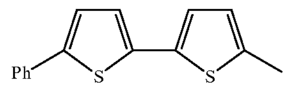 |
| H-6-302 | o-biphenylyl | same | " |
| H-6-303 | m-biphenylyl | same | " |
| H-6-304 | p-biphenylyl | same | " |
| H-6-305 | 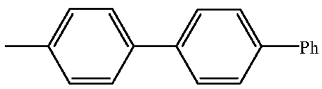 | same | " |
| H-6-306 | 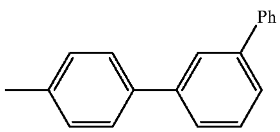 | same | " |
| H-6-307 | 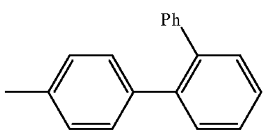 | same | " |
| H-6-308 | 2-naphthyl | same | " |
| H-6-309 | 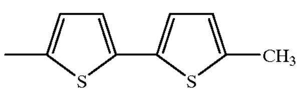 | same | " |
| H-6-310 | 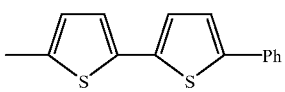 | same | " |
| H-6-311 | 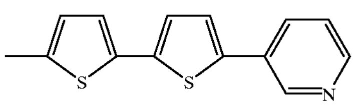 | same | " |
| H-6-312 | 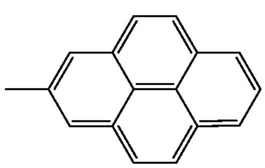 | same | " |
| H-6-313 | 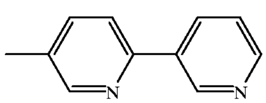 | same | " |
| H-6-314 | 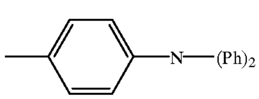 | same | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-315 | 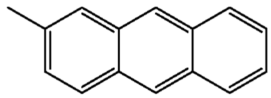 | same | " |
| H-6-316 | 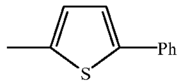 | same | " |
| H-6-317 | 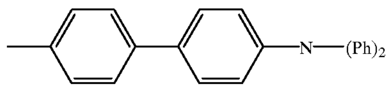 | same | " |
| H-6-318 | 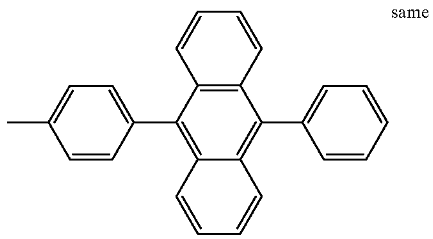 | same | " |
| H-6-319 | Ph | H | " |
| H-6-401 | Ph | same | 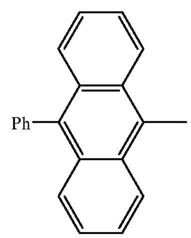 |
| H-6-402 | o-biphenylyl | same | " |
| H-6-403 | m-biphenylyl | same | " |
| H-6-404 | p-biphenylyl | same | " |
| H-6-405 | 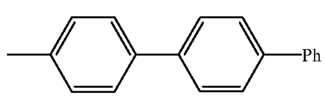 | same | " |
| H-6-406 | 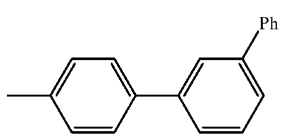 | same | " |
| H-6-407 | 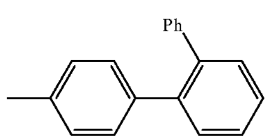 | same | " |
| H-6-408 | 2-naphthyl | same | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-409 | 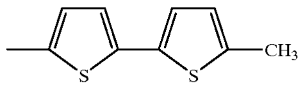 | same | " |
| H-6-410 | 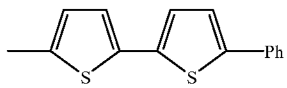 | same | " |
| H-6-411 | 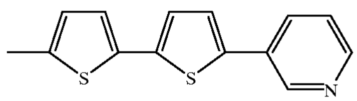 | same | " |
| H-6-412 | 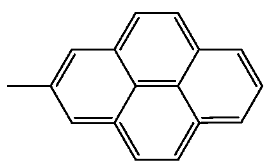 | same | " |
| H-6-413 | 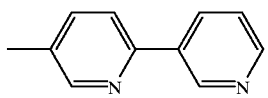 | same | " |
| H-6-414 | 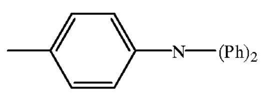 | same | " |
| H-6-415 | 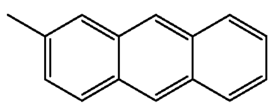 | same | " |
| H-6-416 | 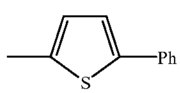 | same | " |
| H-6-417 | 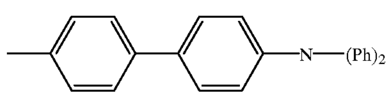 | same | " |
| H-6-418 | 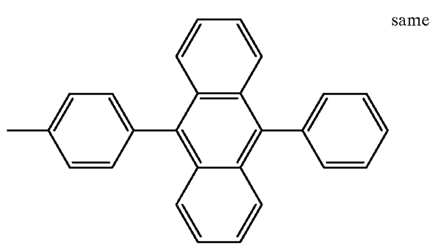 | same | " |
| H-6-419 | Ph | H | " |
| H-6-501 | Ph | same | 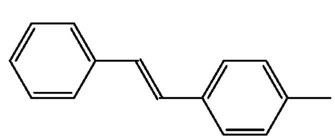 |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-502 | o-biphenylyl | same | " |
| H-6-503 | m-biphenylyl | same | " |
| H-6-504 | p-biphenylyl | same | " |
| H-6-505 | 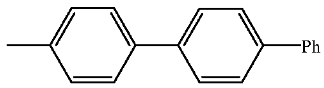 | same | " |
| H-6-506 | 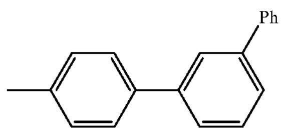 | same | " |
| H-6-507 | 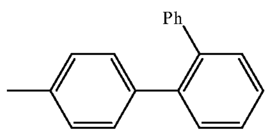 | same | " |
| H-6-508 | 2-naphthyl | same | " |
| H-6-509 | 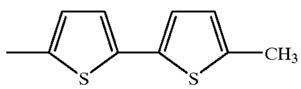 | same | " |
| H-6-510 | 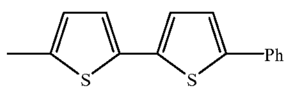 | same | " |
| H-6-511 | 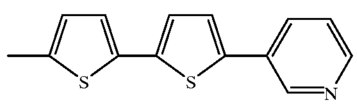 | same | " |
| H-6-512 | 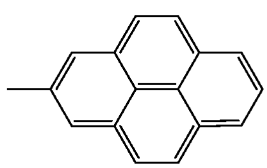 | same | " |
| H-6-513 | 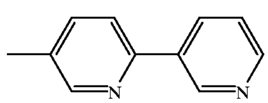 | same | " |
| H-6-514 | 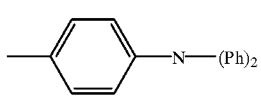 | same | " |
| H-6-515 | 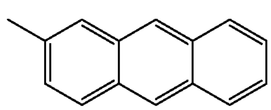 | same | " |
| H-6-516 | 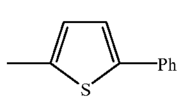 | same | " |

-continued
| Compound | $\Phi_{19}$ | $\Phi_{20}$ | $\Phi_{21}$ |
|---|---|---|---|
| (H-6) (combination common in H-6a to H-6c; same in the following (H-6)) | | | |
| H-6-517 | 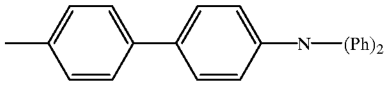 | same | " |
| H-6-518 | 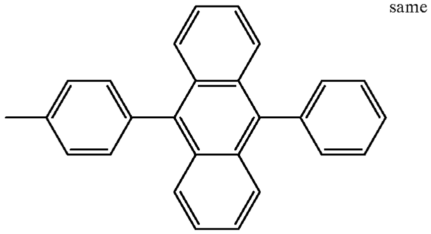 | same | " |
| H-6-519 | Ph | H | " |
| H-6-601 | Ph | same | 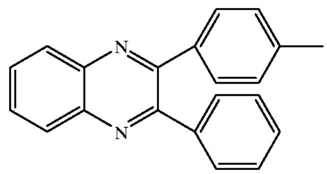 |
| H-6-602 | o-biphenylyl | same | " |
| H-6-603 | m-biphenylyl | same | " |
| H-6-604 | p-biphenylyl | same | " |
| H-6-605 | 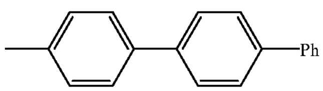 | same | " |
| H-6-606 | 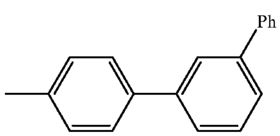 | same | " |
| H-6-607 | 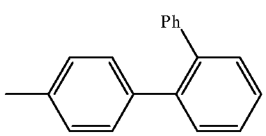 | same | " |
| H-6-608 | 2-naphthyl | same | " |
| H-6-609 | 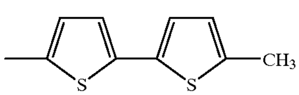 | same | " |
| H-6-610 | 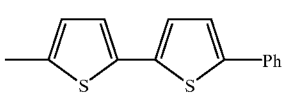 | same | " |
| H-6-611 | 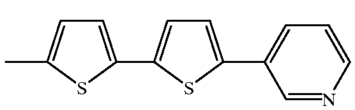 | same | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-612 | 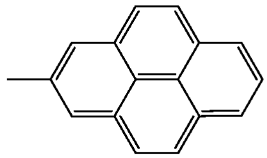 | same | " |
| H-6-613 | 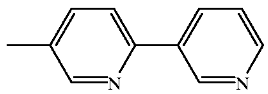 | same | " |
| H-6-614 | 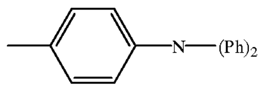 | same | " |
| H-6-615 | 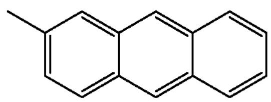 | same | " |
| H-6-616 | 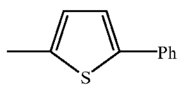 | same | " |
| H-6-617 | 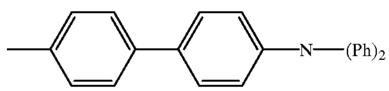 | same | " |
| H-6-618 | 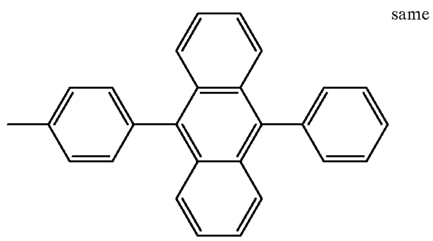 | same | " |
| H-6-619 | Ph | H | " |
| H-6-701 | Ph | same | 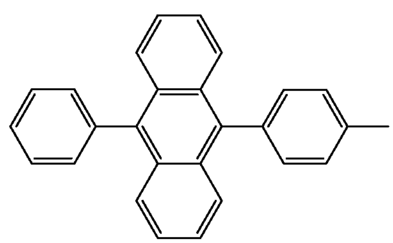 |
| H-6-702 | o-biphenylyl | same | " |
| H-6-703 | m-biphenylyl | same | " |
| H-6-704 | p-biphenylyl | same | " |
| H-6-705 | 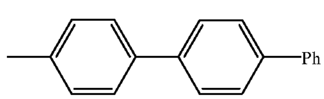 | same | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-706 | 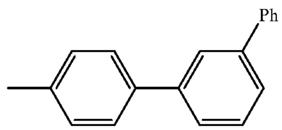 | same | " |
| H-6-707 | 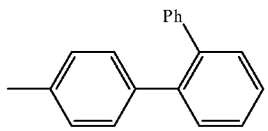 | same | " |
| H-6-708 | 2-naphthyl | same | " |
| H-6-709 | 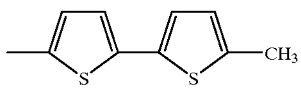 | same | " |
| H-6-710 | 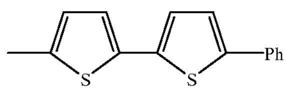 | same | " |
| H-6-711 | 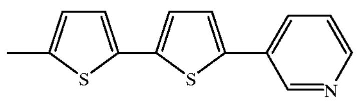 | same | " |
| H-6-712 | 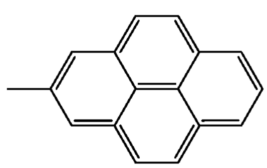 | same | " |
| H-6-713 | 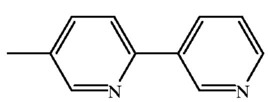 | same | " |
| H-6-714 | 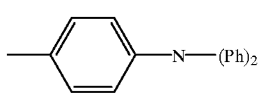 | same | " |
| H-6-715 | 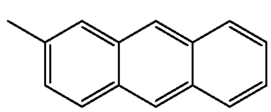 | same | " |
| H-6-716 | 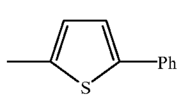 | same | " |
| H-6-717 | 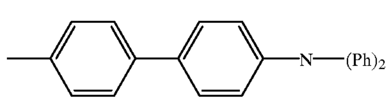 | same | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-718 | 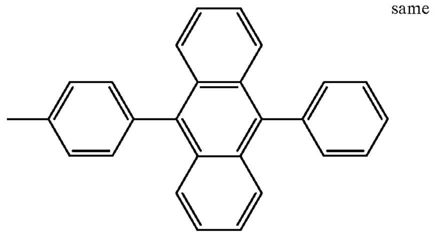 | same | " |
| H-6-719 | Ph | H | " |
| H-6-801 | Ph | same | 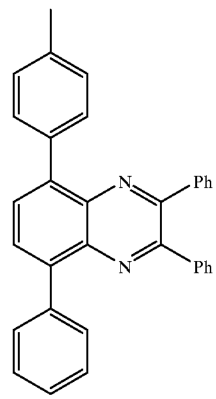 |
| H-6-802 | o-biphenylyl | same | " |
| H-6-803 | m-biphenylyl | same | " |
| H-6-804 | p-biphenylyl | same | " |
| H-6-805 | 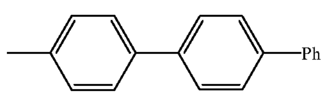 | same | " |
| H-6-806 | 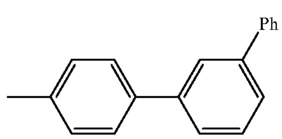 | same | " |
| H-6-807 | 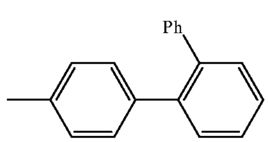 | same | " |
| H-6-808 | 2-naphthyl | same | " |
| H-6-809 | 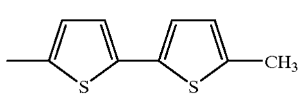 | same | " |
| H-6-810 | 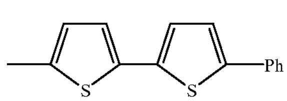 | same | " |

-continued
| (H-6) (combination common in H-6a to H-6c; same in the following (H-6)) | | | |
| --- | --- | --- | --- |
| Compound | $\Phi_{19}$ | $\Phi_{20}$ | $\Phi_{21}$ |
| H-6-811 | 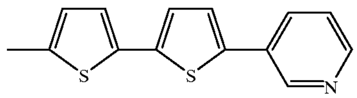 | same | " |
| H-6-812 | 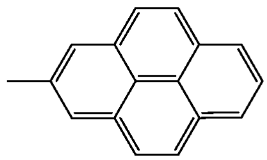 | same | " |
| H-6-813 | 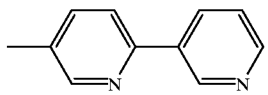 | same | " |
| H-6-814 | 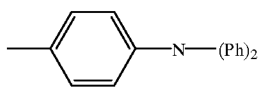 | same | " |
| H-6-815 | 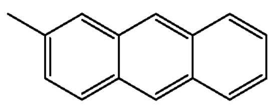 | same | " |
| H-6-816 | 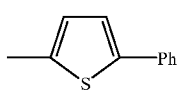 | same | " |
| H-6-817 | 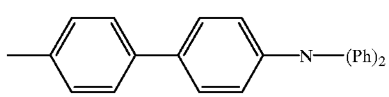 | same | " |
| H-6-818 | 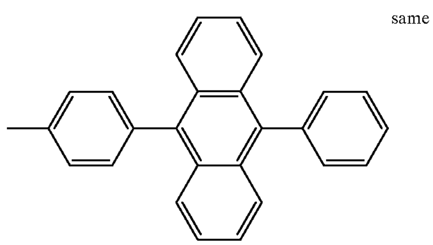 | same | " |
| H-6-819 | Ph | H | " |

-continued
(H-6) (combination common in H-6a to H-6c; same in the following (H-6))
| Compound | $\Phi_{19}$ | $\Phi_{20}$ | $\Phi_{21}$ |
|---|---|---|---|
| H-6-820 | Ph | Ph | 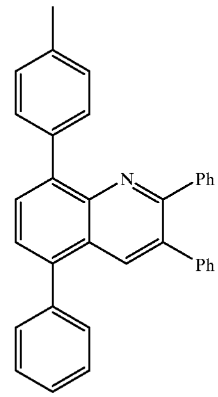 |
(H-7a)
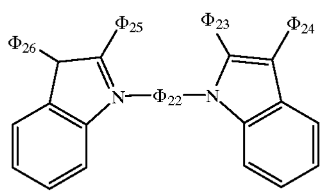
(H-7b)
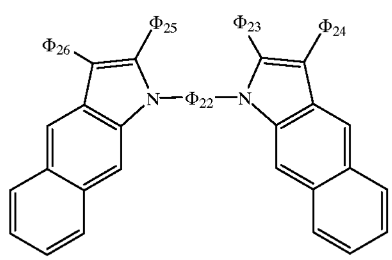
(H-7c)
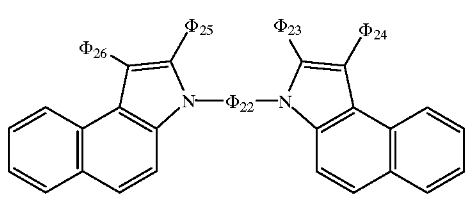
(H-7d)
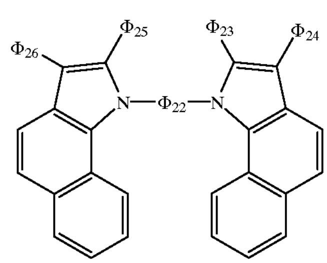

-continued

| (H-6) (combination common in H-6a to H-6c; same in the following (H-6)) | | | |
|---|---|---|---|
| Compound | $\Phi_{19}$ | $\Phi_{20}$ | $\Phi_{21}$ |
| (H-7e) | 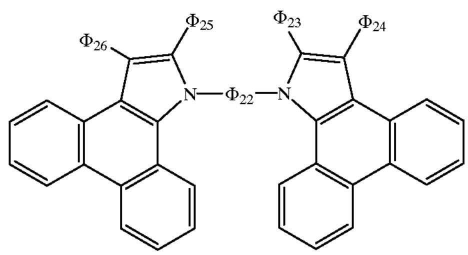 | | |

| (H-7) [combination common in H-7a to H-7e; same in the following (H-7)] | | | | | |
|---|---|---|---|---|---|
| Compound | $\Phi_{22}$ | $\Phi_{23}$ | $\Phi_{24}$ | $\Phi_{25}$ | $\Phi_{26}$ |
| H-7-1 | 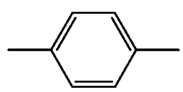 | Ph | same | same | same |
| H-7-2 | " | o-biphenylyl | same | same | same |
| H-7-3 | " | m-biphenylyl | same | same | same |
| H-7-4 | " | p-biphenylyl | same | same | same |
| H-7-5 | " | 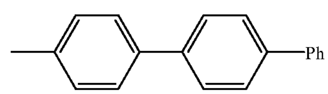 | same | same | same |
| H-7-6 | " | 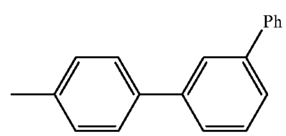 | same | same | same |
| H-7-7 | " | 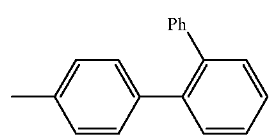 | same | same | same |
| H-7-8 | " | 2-naphthyl | same | same | same |
| H-7-9 | " | 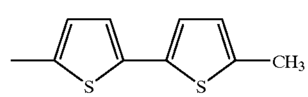 | same | same | same |
| H-7-10 | " | 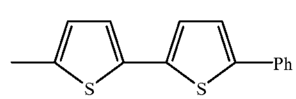 | same | same | same |
| H-7-11 | " | 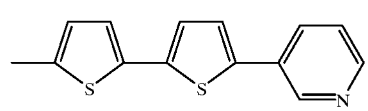 | same | same | same |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-12 | " | 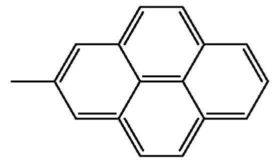 | same | same | same |
| H-7-13 | " | 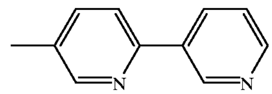 | same | same | same |
| H-7-14 | " | 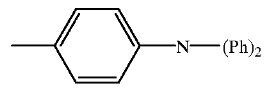 | same | same | same |
| H-7-15 | " | 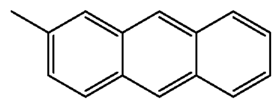 | same | same | same |
| H-7-16 | " | 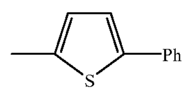 | same | same | same |
| H-7-17 | " | 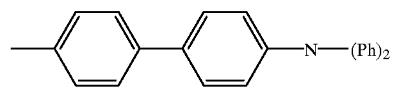 | same | same | same |
| H-7-18 | " | 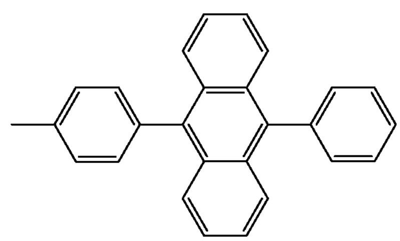 | same | same | same |
| H-7-19 | " | Ph | H | Ph | H |
| H-7-101 | 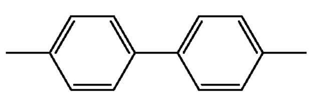 | Ph | same | same | same |
| H-7-102 | " | o-biphenylyl | same | same | same |
| H-7-103 | " | m-biphenylyl | same | same | same |
| H-7-104 | " | p-biphenylyl | same | same | same |
| H-7-105 | " | 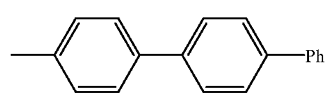 | same | same | same |
| H-7-106 | " | 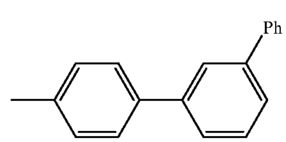 | same | same | same |

-continued
(H-7) [combination common in H-7a to H-7e; same in the following (H-7)]
| Compound | $\Phi_{22}$ | $\Phi_{23}$ | $\Phi_{24}$ | $\Phi_{25}$ | $\Phi_{26}$ |
|---|---|---|---|---|---|
| H-7-107 | " | 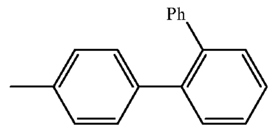 | same | same | same |
| H-7-108 | " | 2-naphthyl | same | same | same |
| H-7-109 | " | 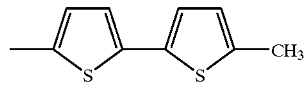 | same | same | same |
| H-7-110 | " | 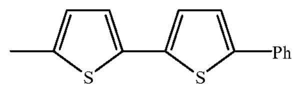 | same | same | same |
| H-7-111 | " | 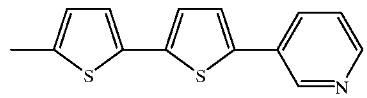 | same | same | same |
| H-7-112 | " | 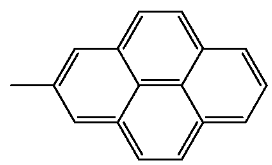 | same | same | same |
| H-7-113 | " | 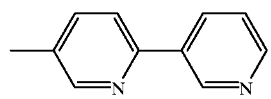 | same | same | same |
| H-7-114 | " | 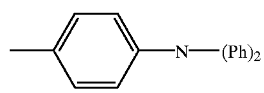 | same | same | same |
| H-7-115 | " | 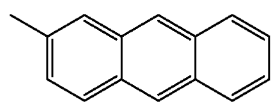 | same | same | same |
| H-7-116 | " | 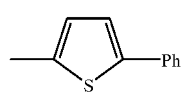 | same | same | same |
| H-7-117 | " | 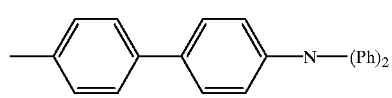 | same | same | same |
| H-7-118 | " | 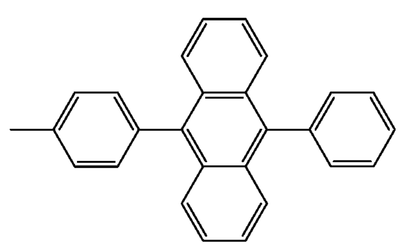 | same | same | same |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-119 | " | Ph | H | Ph | H |
| H-7-201 | 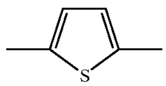 | Ph | same | same | same |
| H-7-202 | " | o-biphenylyl | same | same | same |
| H-7-203 | " | m-biphenylyl | same | same | same |
| H-7-204 | " | p-biphenylyl | same | same | same |
| H-7-205 | " | 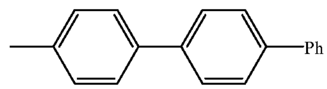 | same | same | same |
| H-7-206 | " | 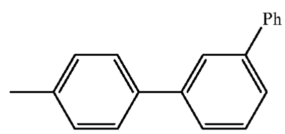 | same | same | same |
| H-7-207 | " | 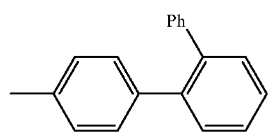 | same | same | same |
| H-7-208 | " | 2-naphthyl | same | same | same |
| H-7-209 | " | 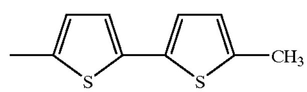 | same | same | same |
| H-7-210 | " | 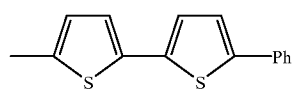 | same | same | same |
| H-7-211 | " | 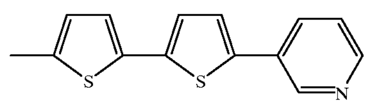 | same | same | same |
| H-7-212 | " | 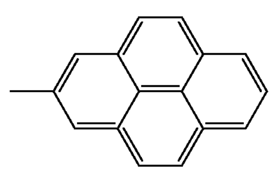 | same | same | same |
| H-7-213 | " | 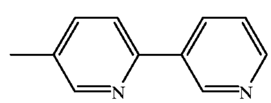 | same | same | same |
| H-7-214 | " | 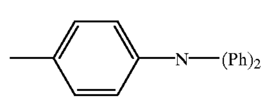 | same | same | same |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-215 | " | 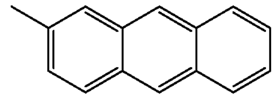 | same | same | same |
| H-7-216 | " | 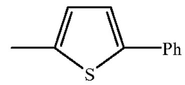 | same | same | same |
| H-7-217 | " | 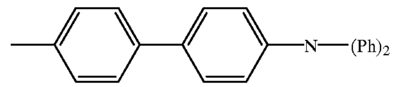 | same | same | same |
| H-7-218 | " | 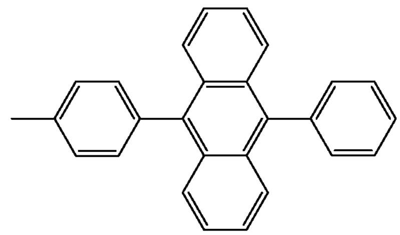 | same | same | same |
| H-7-219 | " | Ph | H | Ph | H |
| H-7-301 | 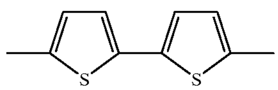 | Ph | same | same | same |
| H-7-302 | " | o-biphenylyl | same | same | same |
| H-7-303 | " | m-biphenylyl | same | same | same |
| H-7-304 | " | p-biphenylyl | same | same | same |
| H-7-305 | " | 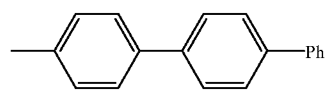 | same | same | same |
| H-7-306 | " | 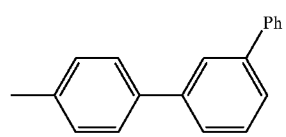 | same | same | same |
| H-7-307 | " | 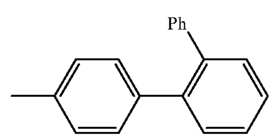 | same | same | same |
| H-7-308 | " | 2-naphthyl | same | same | same |
| H-7-309 | " | 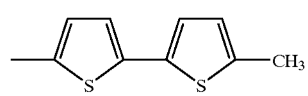 | same | same | same |
| H-7-310 | " | 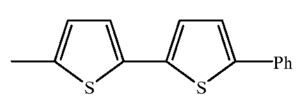 | same | same | same |

-continued

| (H-7) [combination common in H-7a to H-7e; same in the following (H-7)] | | | | | |
|---|---|---|---|---|---|
| Compound | $\Phi_{22}$ | $\Phi_{23}$ | $\Phi_{24}$ | $\Phi_{25}$ | $\Phi_{26}$ |
| H-7-311 | " | 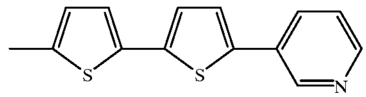 | same | same | same |
| H-7-312 | " | 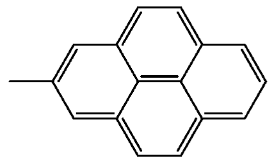 | same | same | same |
| H-7-313 | " | 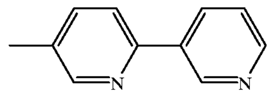 | same | same | same |
| H-7-314 | " | 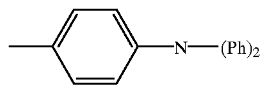 | same | same | same |
| H-7-315 | " | 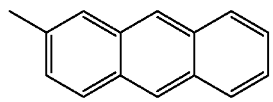 | same | same | same |
| H-7-316 | " | 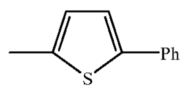 | same | same | same |
| H-7-317 | " | 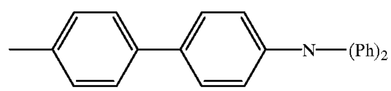 | same | same | same |
| H-7-318 | " | 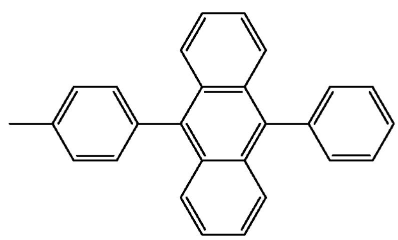 | same | same | same |
| H-7-319 | " | Ph | H | Ph | H |
| H-7-401 | 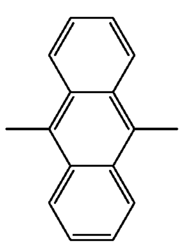 | Ph | same | same | same |
| H-7-402 | " | o-biphenylyl | same | same | same |
| H-7-403 | " | m-biphenylyl | same | same | same |
| H-7-404 | " | p-biphenylyl | same | same | same |

-continued
(H-7) [combination common in H-7a to H-7e; same in the following (H-7)]
| Compound | $\Phi_{22}$ | $\Phi_{23}$ | $\Phi_{24}$ | $\Phi_{25}$ | $\Phi_{26}$ |
|---|---|---|---|---|---|
| H-7-405 | " | 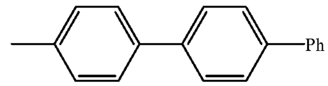 | same | same | same |
| H-7-406 | " | 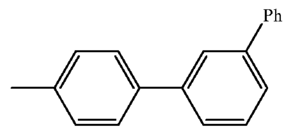 | same | same | same |
| H-7-407 | " | 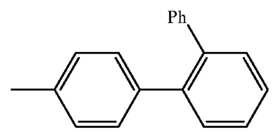 | same | same | same |
| H-7-408 | " | 2-naphthyl | same | same | same |
| H-7-409 | " | 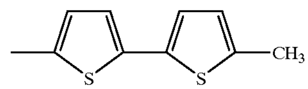 | same | same | same |
| H-7-410 | " | 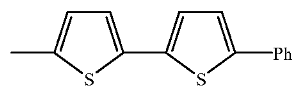 | same | same | same |
| H-7-411 | " | 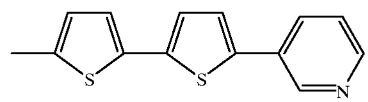 | same | same | same |
| H-7-412 | " | 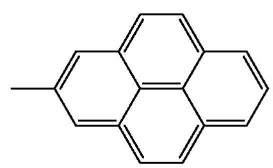 | same | same | same |
| H-7-413 | " | 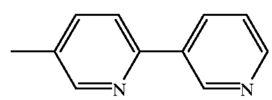 | same | same | same |
| H-7-414 | " | 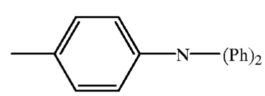 | same | same | same |
| H-7-415 | " | 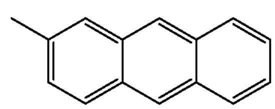 | same | same | same |
| H-7-416 | " | 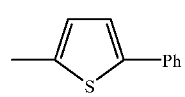 | same | same | same |
| H-7-417 | " | 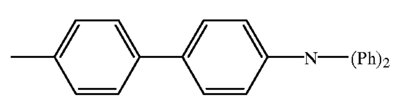 | same | same | same |

-continued
(H-7) [combination common in H-7a to H-7e; same in the following (H-7)]
| Compound | $\Phi_{22}$ | $\Phi_{23}$ | $\Phi_{24}$ | $\Phi_{25}$ | $\Phi_{26}$ |
|---|---|---|---|---|---|
| H-7-418 | " | 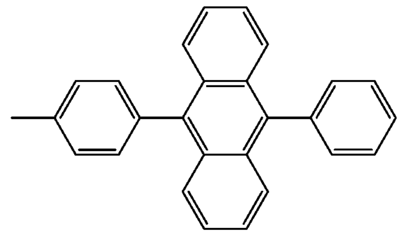 | same | same | same |
| H-7-419 | " | Ph | H | Ph | H |
| H-7-420 | 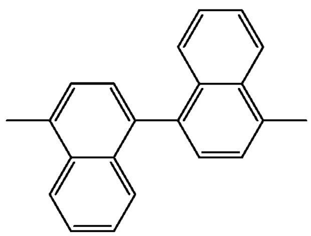 | Ph | same | same | same |
| H-7-421 | 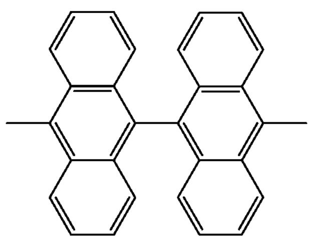 | Ph | same | same | same |
| H-7-501 | 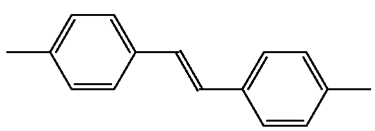 | Ph | same | same | same |
| H-7-502 | " | o-biphenylyl | same | same | same |
| H-7-503 | " | m-biphenylyl | same | same | same |
| H-7-504 | " | p-biphenylyl | same | same | same |
| H-7-505 | " | 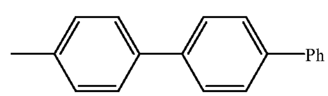 | same | same | same |
| H-7-506 | " | 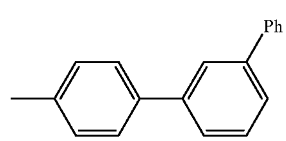 | same | same | same |
| H-7-507 | " | 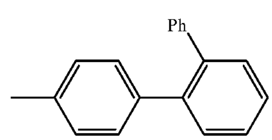 | same | same | same |
| H-7-508 | " | 2-naphthyl | same | same | same |

-continued
(H-7) [combination common in H-7a to H-7e; same in the following (H-7)]
| Compound | $\Phi_{22}$ | $\Phi_{23}$ | $\Phi_{24}$ | $\Phi_{25}$ | $\Phi_{26}$ |
|---|---|---|---|---|---|
| H-7-509 | " | 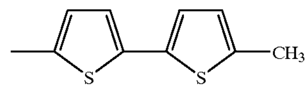 | same | same | same |
| H-7-510 | " | 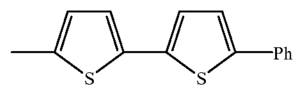 | same | same | same |
| H-7-511 | " | 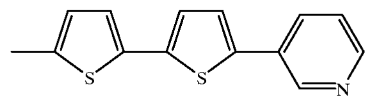 | same | same | same |
| H-7-512 | " | 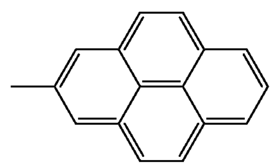 | same | same | same |
| H-7-513 | " | 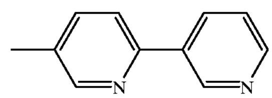 | same | same | same |
| H-7-514 | " | 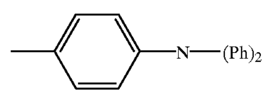 | same | same | same |
| H-7-515 | " | 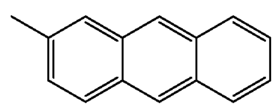 | same | same | same |
| H-7-516 | " | 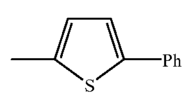 | same | same | same |
| H-7-517 | " | 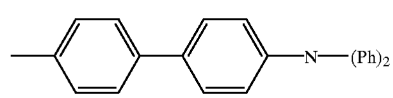 | same | same | same |
| H-7-518 | " | 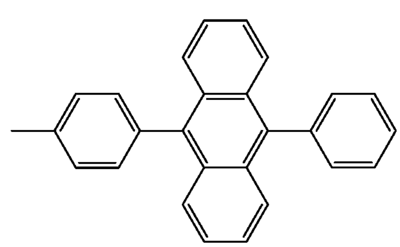 | same | same | same |
| H-7-519 | " | Ph | H | Ph | H |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-601 | 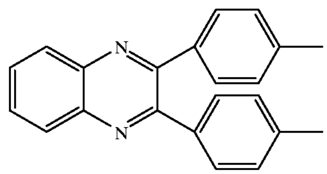 | Ph | same | same | same |
| H-7-602 | " | o-biphenylyl | same | same | same |
| H-7-603 | " | m-biphenylyl | same | same | same |
| H-7-604 | " | p-biphenylyl | same | same | same |
| H-7-605 | " | 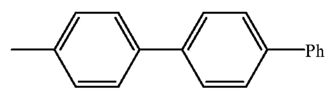 | same | same | same |
| H-7-606 | " | 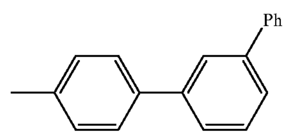 | same | same | same |
| H-7-607 | " | 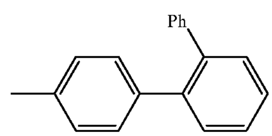 | same | same | same |
| H-7-608 | " | 2-naphthyl | same | same | same |
| H-7-609 | " | 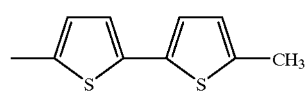 | same | same | same |
| H-7-610 | " | 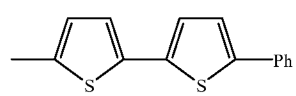 | same | same | same |
| H-7-611 | " | 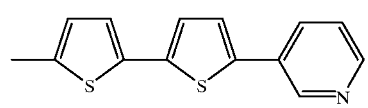 | same | same | same |
| H-7-612 | " | 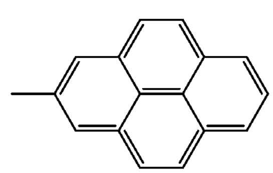 | same | same | same |
| H-7-613 | " | 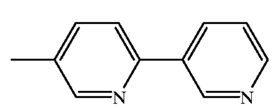 | same | same | same |
| H-7-614 | " | 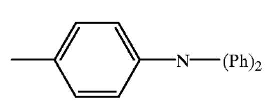 | same | same | same |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-615 | " | 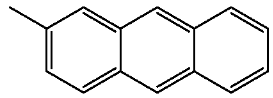 | same | same | same |
| H-7-616 | " | 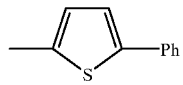 | same | same | same |
| H-7-617 | " | 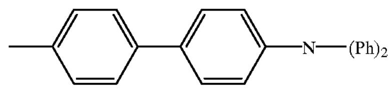 | same | same | same |
| H-7-618 | " | 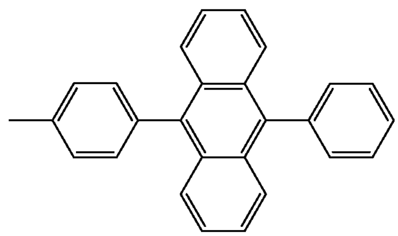 | same | same | same |
| H-7-619 | " | Ph | H | Ph | H |
| H-7-701 | 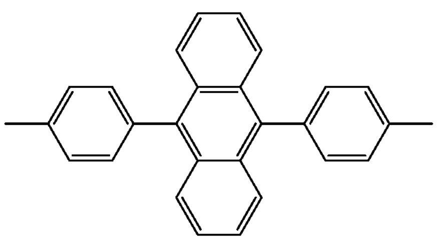 | Ph | same | same | same |
| H-7-702 | " | o-biphenylyl | same | same | same |
| H-7-703 | " | m-biphenylyl | same | same | same |
| H-7-704 | " | p-biphenylyl | same | same | same |
| H-7-705 | " | 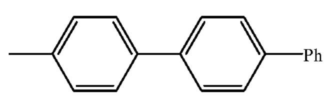 | same | same | same |
| H-7-706 | " | 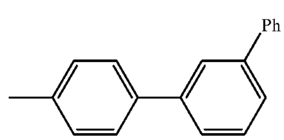 | same | same | same |
| H-7-707 | " | 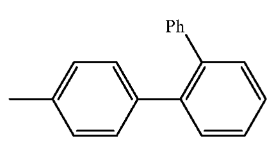 | same | same | same |
| H-7-708 | " | 2-naphthyl | same | same | same |

-continued
(H-7) [combination common in H-7a to H-7e; same in the following (H-7)]
| Compound | $\Phi_{22}$ | $\Phi_{23}$ | $\Phi_{24}$ | $\Phi_{25}$ | $\Phi_{26}$ |
|---|---|---|---|---|---|
| H-7-709 | " | 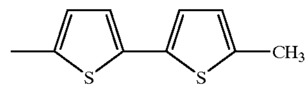 | same | same | same |
| H-7-710 | " | 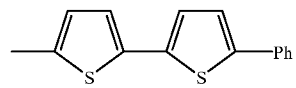 | same | same | same |
| H-7-711 | " | 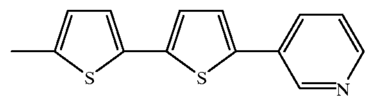 | same | same | same |
| H-7-712 | " | 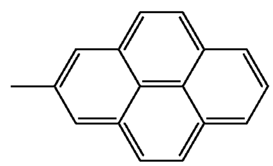 | same | same | same |
| H-7-713 | " | 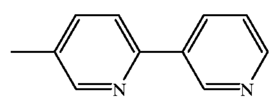 | same | same | same |
| H-7-714 | " | 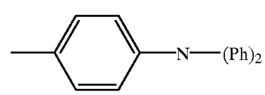 | same | same | same |
| H-7-715 | " | 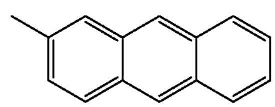 | same | same | same |
| H-7-716 | " | 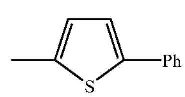 | same | same | same |
| H-7-717 | " | 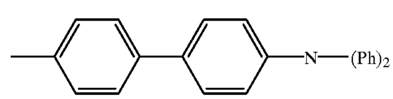 | same | same | same |
| H-7-718 | " | 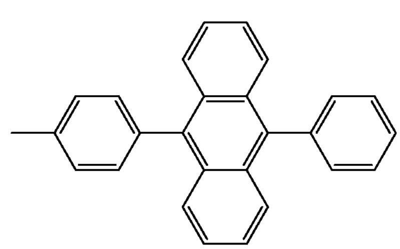 | same | same | same |
| H-7-719 | " | Ph | H | Ph | H |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-801 | 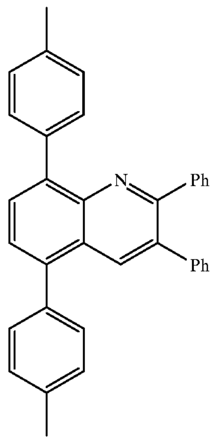 | Ph | same | same | same |
| H-7-802 | " | o-biphenylyl | same | same | same |
| H-7-803 | " | m-biphenylyl | same | same | same |
| H-7-804 | " | p-biphenylyl | same | same | same |
| H-7-805 | " | 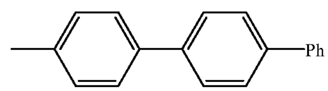 | same | same | same |
| H-7-806 | " | 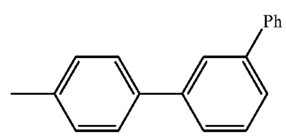 | same | same | same |
| H-7-807 | " | 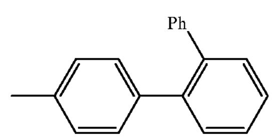 | same | same | same |
| H-7-808 | " | 2-naphthyl | same | same | same |
| H-7-809 | " | 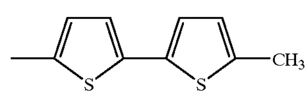 | same | same | same |
| H-7-810 | " | 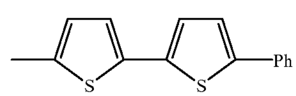 | same | same | same |
| H-7-811 | " | 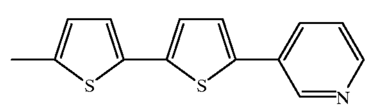 | same | same | same |
| H-7-812 | " | 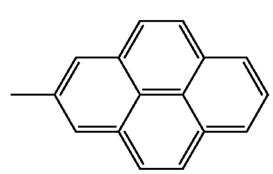 | same | same | same |

-continued (H-7) [combination common in H-7a to H-7e; same in the following (H-7)]

| Compound | $\Phi_{22}$ | $\Phi_{23}$ | $\Phi_{24}$ | $\Phi_{25}$ | $\Phi_{26}$ |
|---|---|---|---|---|---|
| H-7-813 | " | 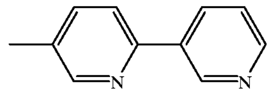 | same | same | same |
| H-7-814 | " | 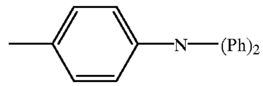 | same | same | same |
| H-7-815 | " | 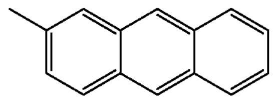 | same | same | same |
| H-7-816 | " | 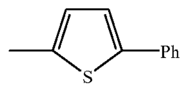 | same | same | same |
| H-7-817 | " | 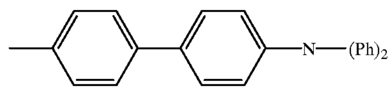 | same | same | same |
| H-7-818 | " | 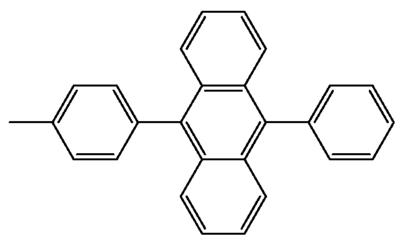 | same | same | same |
| H-7-819 | " | Ph | H | Ph | H |

(H-8)

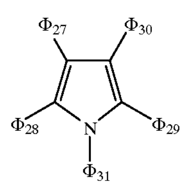

| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-1 | Ph | same | same | same | 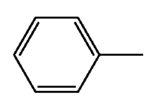 |
| H-8-2 | o-biphenylyl | same | same | same | " |
| H-8-3 | m-biphenylyl | same | same | same | " |
| H-8-4 | p-biphenylyl | same | same | same | " |
| H-8-5 | 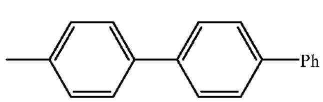 | same | same | same | " |

-continued
(H-8)
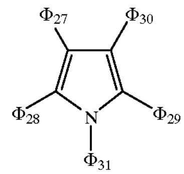
| (H-8) Compound | Φ27 | Φ28 | Φ29 | Φ30 | Φ31 |
|---|---|---|---|---|---|
| H-8-6 | 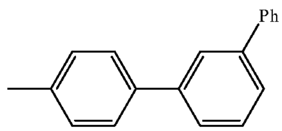 | same | same | same | " |
| H-8-7 | 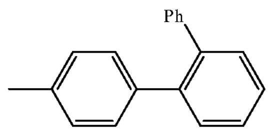 | same | same | same | " |
| H-8-8 | 2-naphthyl | same | same | same | " |
| H-8-9 | 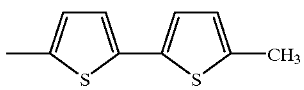 | same | same | same | " |
| H-8-10 | 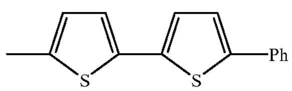 | same | same | same | " |
| H-8-11 | 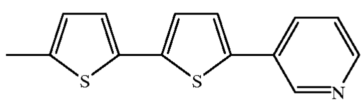 | same | same | same | " |
| H-8-12 | 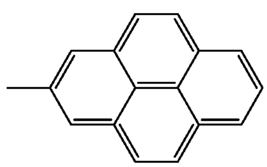 | same | same | same | " |
| H-8-13 | 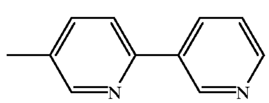 | same | same | same | " |
| H-8-14 | 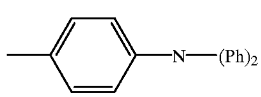 | same | same | same | 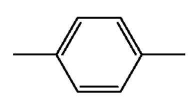 |
| H-8-15 | 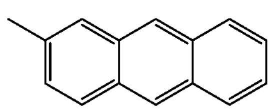 | same | same | same | " |
| H-8-16 | 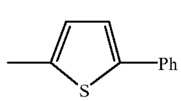 | same | same | same | " |

-continued
(H-8)
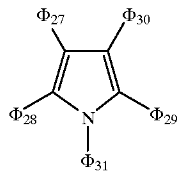
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-17 | 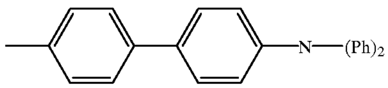 | same | same | same | " |
| H-8-18 | 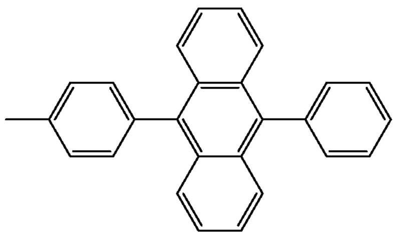 | same | same | same | " |
| H-8-19 | Ph | H | Ph | H | " |
| H-8-101 | Ph | same | same | same | 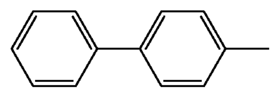 |
| H-8-102 | o-biphenylyl | same | same | same | " |
| H-8-103 | m-biphenylyl | same | same | same | " |
| H-8-104 | p-biphenylyl | same | same | same | " |
| H-8-105 | 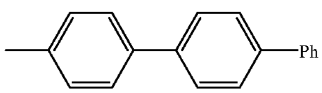 | same | same | same | " |
| H-8-106 | 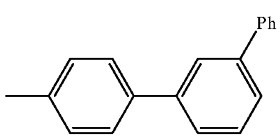 | same | same | same | " |
| H-8-107 | 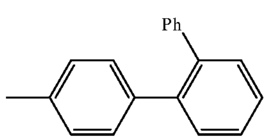 | same | same | same | " |
| H-8-108 | 2-naphthyl | same | same | same | " |
| H-8-109 | 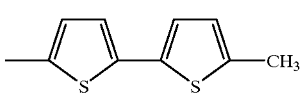 | same | same | same | " |
| H-8-110 | 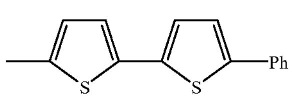 | same | same | same | " |

-continued
(H-8)
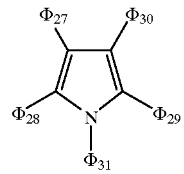
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-111 | 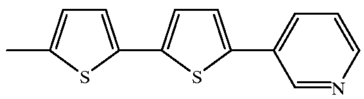 | same | same | same | " |
| H-8-112 | 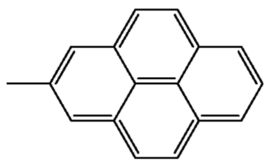 | same | same | same | " |
| H-8-113 | 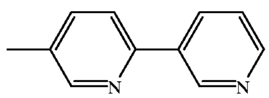 | same | same | same | " |
| H-8-114 | 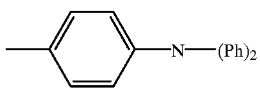 | same | same | same | 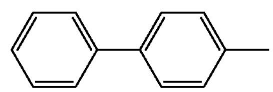 |
| H-8-115 | 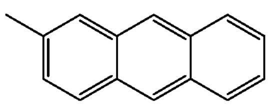 | same | same | same | " |
| H-8-116 | 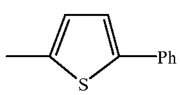 | same | same | same | " |
| H-8-117 | 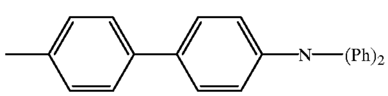 | same | same | same | " |
| H-8-118 | 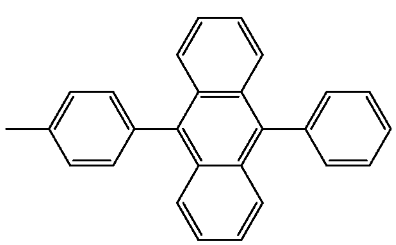 | same | same | same | " |
| H-8-119 | Ph | H | Ph | H | " |
| H-8-201 | Ph | same | same | same | 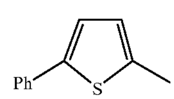 |
| H-8-202 | o-biphenylyl | same | same | same | " |
| H-8-203 | m-biphenylyl | same | same | same | " |
| H-8-204 | p-biphenylyl | same | same | same | " |

-continued
(H-8)
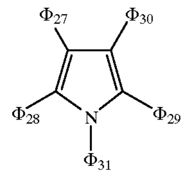
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-205 | 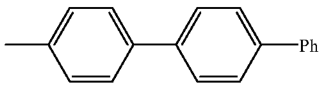 | same | same | same | " |
| H-8-206 | 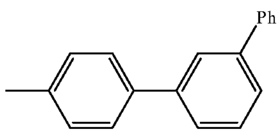 | same | same | same | " |
| H-8-207 | 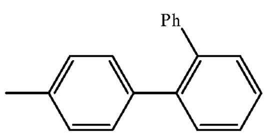 | same | same | same | " |
| H-8-208 | 2-naphthyl | same | same | same | " |
| H-8-209 | 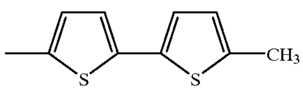 | same | same | same | " |
| H-8-210 | 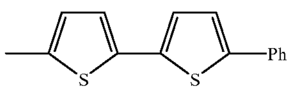 | same | same | same | " |
| H-8-211 | 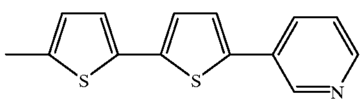 | same | same | same | " |
| H-8-212 | 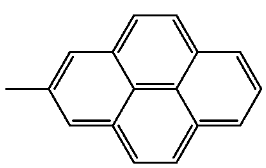 | same | same | same | " |
| H-8-213 | 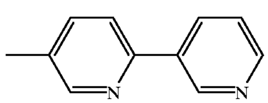 | same | same | same | " |
| H-8-214 | 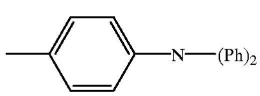 | same | same | same | 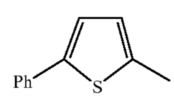 |
| H-8-215 | 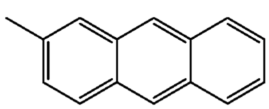 | same | same | same | " |

-continued
(H-8)
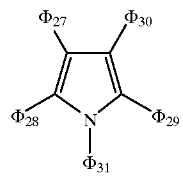
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-216 | 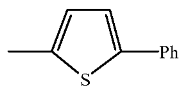 | same | same | same | " |
| H-8-217 | 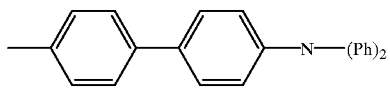 | same | same | same | " |
| H-8-218 | 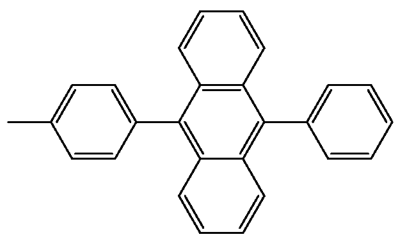 | same | same | same | " |
| H-8-219 | Ph | H | Ph | H | " |
| H-8-301 | Ph | same | same | same | 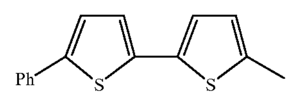 |
| H-8-302 | o-biphenylyl | same | same | same | " |
| H-8-303 | m-biphenylyl | same | same | same | " |
| H-8-304 | p-biphenylyl | same | same | same | " |
| H-8-305 | 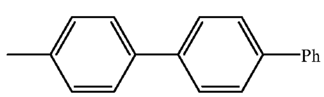 | same | same | same | " |
| H-8-306 | 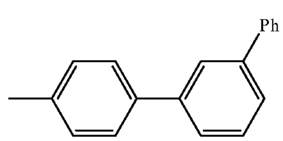 | same | same | same | " |
| H-8-307 | 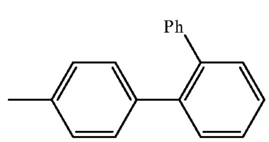 | same | same | same | " |
| H-8-308 | 2-naphthyl | same | same | same | " |
| H-8-309 | 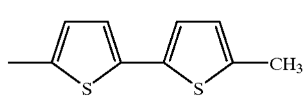 | same | same | same | " |

-continued
(H-8)
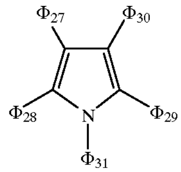
| (H-8) Compound | Φ27 | Φ28 | Φ29 | Φ30 | Φ31 |
|---|---|---|---|---|---|
| H-8-310 | 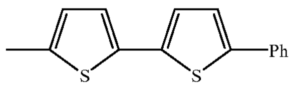 | same | same | same | " |
| H-8-311 | 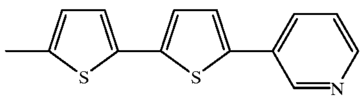 | same | same | same | " |
| H-8-312 | 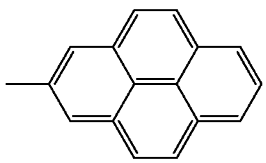 | same | same | same | " |
| H-8-313 | 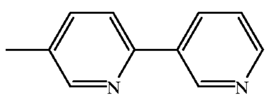 | same | same | same | " |
| H-8-314 | 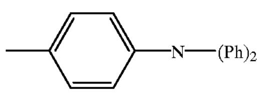 | same | same | same | 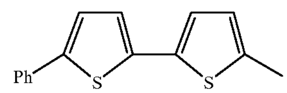 |
| H-8-315 | 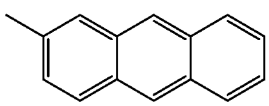 | same | same | same | " |
| H-8-316 | 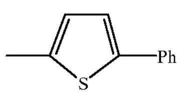 | same | same | same | " |
| H-8-317 | 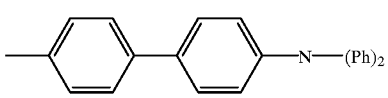 | same | same | same | " |
| H-8-318 | 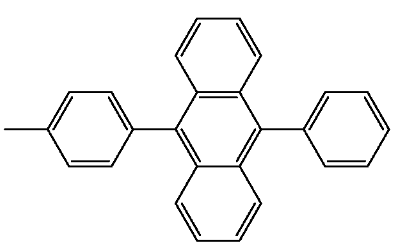 | same | same | same | " |
| H-8-319 | Ph | H | Ph | H | " |

-continued
(H-8)
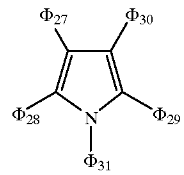
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-401 | Ph | same | same | same | 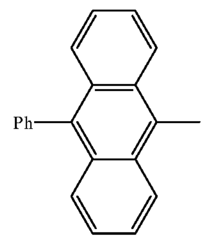 |
| H-8-402 | o-biphenylyl | same | same | same | " |
| H-8-403 | m-biphenylyl | same | same | same | " |
| H-8-404 | p-biphenylyl | same | same | same | " |
| H-8-405 | 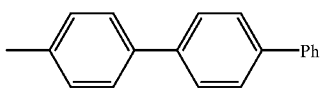 | same | same | same | " |
| H-8-406 | 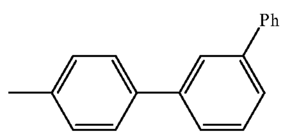 | same | same | same | " |
| H-8-407 | 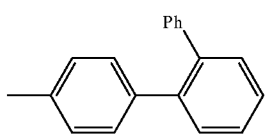 | same | same | same | " |
| H-8-408 | 2-naphthyl | same | same | same | " |
| H-8-409 | 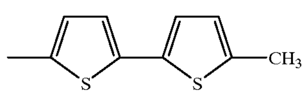 | same | same | same | " |
| H-8-410 | 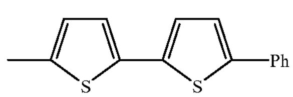 | same | same | same | " |
| H-8-411 | 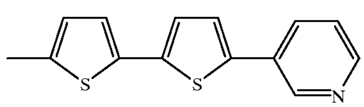 | same | same | same | " |
| H-8-412 | 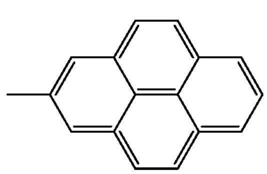 | same | same | same | " |

-continued
(H-8)
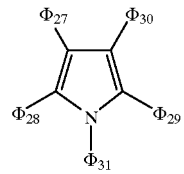
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-413 | 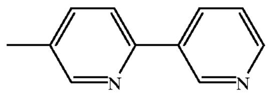 | same | same | same | " |
| H-8-414 | 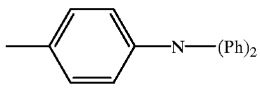 | same | same | same | 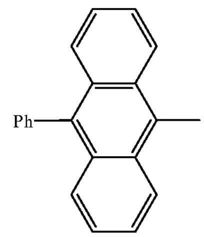 |
| H-8-415 | 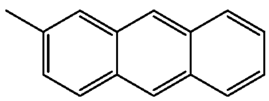 | same | same | same | " |
| H-8-416 | 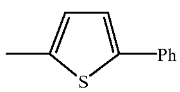 | same | same | same | " |
| H-8-417 | 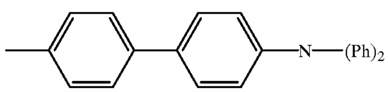 | same | same | same | " |
| H-8-418 | 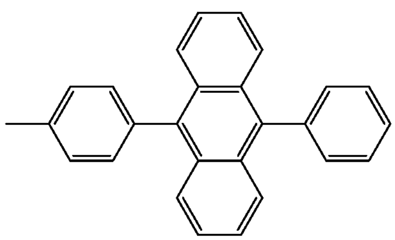 | same | same | same | " |
| H-8-419 | Ph | H | Ph | H | " |
| H-8-501 | Ph | same | same | same | 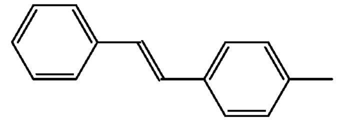 |
| H-8-502 | o-biphenylyl | same | same | same | " |
| H-8-503 | m-biphenylyl | same | same | same | " |
| H-8-504 | p-biphenylyl | same | same | same | " |
| H-8-505 | 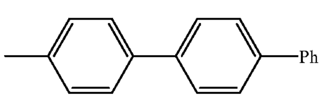 | same | same | same | " |

-continued
(H-8)
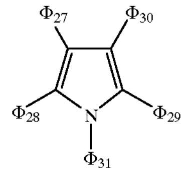
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-506 | 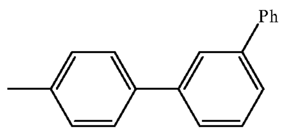 | same | same | same | " |
| H-8-507 | 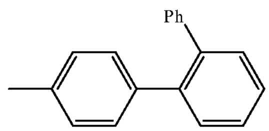 | same | same | same | " |
| H-8-508 | 2-naphthyl | same | same | same | " |
| H-8-509 | 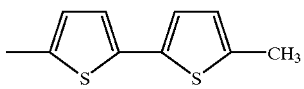 | same | same | same | " |
| H-8-510 | 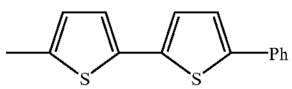 | same | same | same | " |
| H-8-511 | 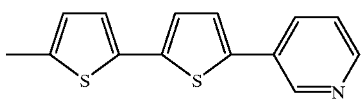 | same | same | same | " |
| H-8-512 | 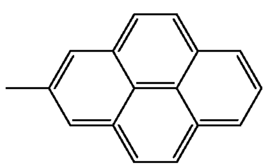 | same | same | same | " |
| H-8-513 | 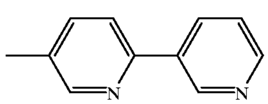 | same | same | same | " |
| H-8-514 | 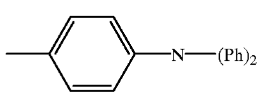 | same | same | same | 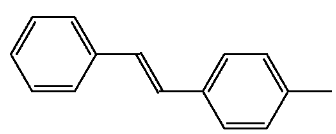 |
| H-8-515 | 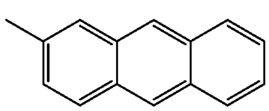 | same | same | same | " |

-continued
(H-8)
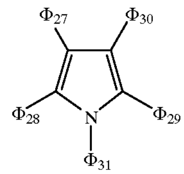
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-516 | 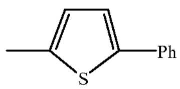 | same | same | same | " |
| H-8-517 | 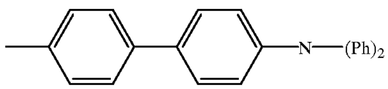 | same | same | same | " |
| H-8-518 | 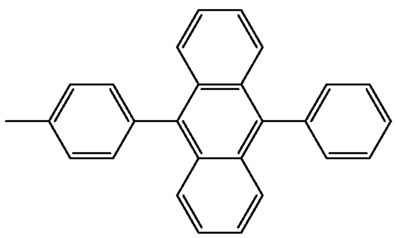 | same | same | same | " |
| H-8-519 | Ph | H | Ph | H | " |
| H-8-601 | Ph | same | same | same | 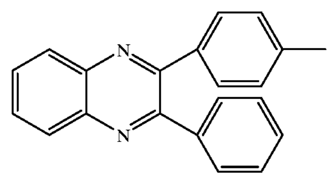 |
| H-8-602 | o-biphenylyl | same | same | same | " |
| H-8-603 | m-biphenylyl | same | same | same | " |
| H-8-604 | p-biphenylyl | same | same | same | " |
| H-8-605 | 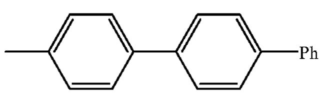 | same | same | same | " |
| H-8-606 | 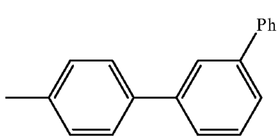 | same | same | same | " |
| H-8-607 | 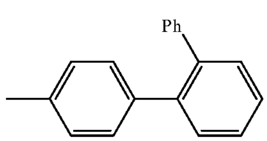 | same | same | same | " |
| H-8-608 | 2-naphthyl | same | same | same | " |
| H-8-609 | 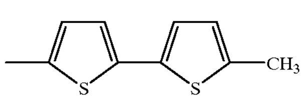 | same | same | same | " |

-continued
(H-8)
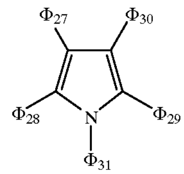
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-610 | 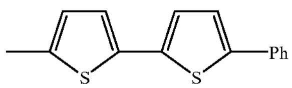 | same | same | same | " |
| H-8-611 | 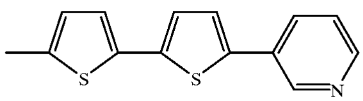 | same | same | same | " |
| H-8-612 | 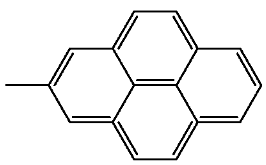 | same | same | same | " |
| H-8-613 | 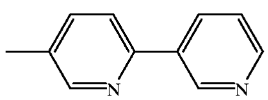 | same | same | same | " |
| H-8-614 | 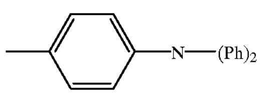 | same | same | same | 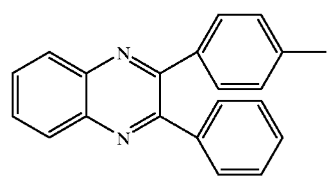 |
| H-8-615 | 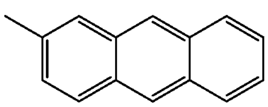 | same | same | same | " |
| H-8-616 | 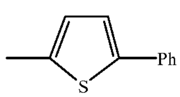 | same | same | same | " |
| H-8-617 | 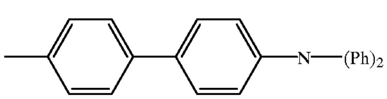 | same | same | same | " |
| H-8-618 | 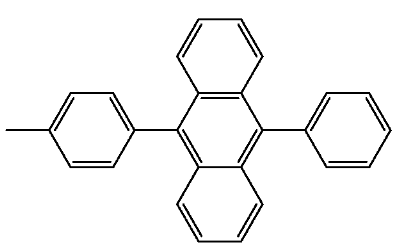 | same | same | same | " |

-continued
(H-8)
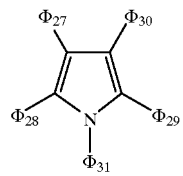
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-619 | Ph | H | Ph | H | " |
| H-8-701 | Ph | same | same | same | 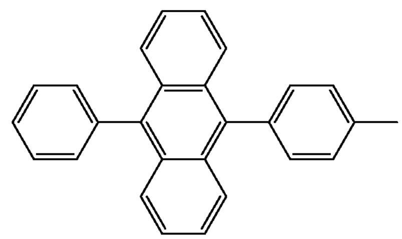 |
| H-8-702 | o-biphenylyl | same | same | same | " |
| H-8-703 | m-biphenylyl | same | same | same | " |
| H-8-704 | p-biphenylyl | same | same | same | " |
| H-8-705 | 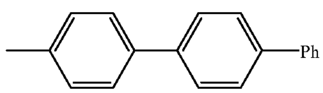 | same | same | same | " |
| H-8-706 | 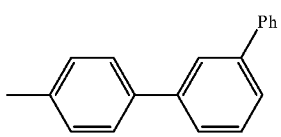 | same | same | same | " |
| H-8-707 | 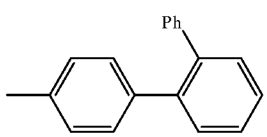 | same | same | same | " |
| H-8-708 | 2-naphthyl | same | same | same | " |
| H-8-709 | 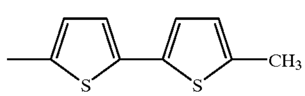 | same | same | same | " |
| H-8-710 | 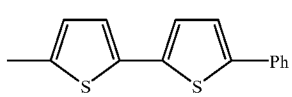 | same | same | same | " |
| H-8-711 | 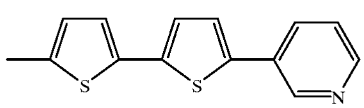 | same | same | same | " |
| H-8-712 | 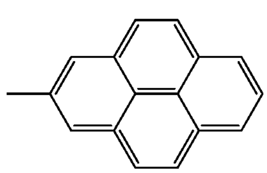 | same | same | same | " |

-continued
(H-8)
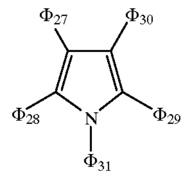
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-713 | 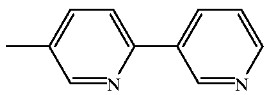 | same | same | same | " |
| H-8-714 | 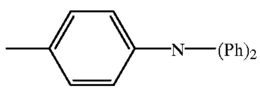 | same | same | same | 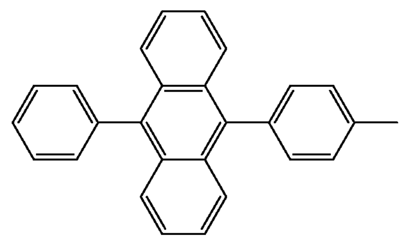 |
| H-8-715 | 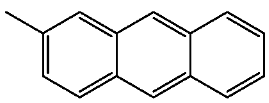 | same | same | same | " |
| H-8-716 | 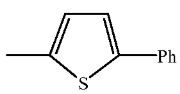 | same | same | same | " |
| H-8-717 | 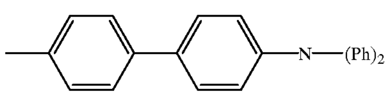 | same | same | same | " |
| H-8-718 | 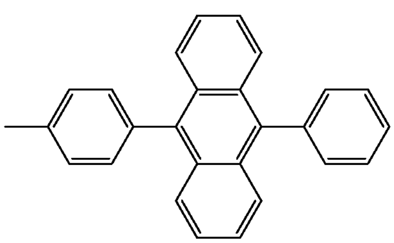 | same | same | same | " |
| H-8-719 | Ph | H | Ph | H | " |

-continued
(H-8)
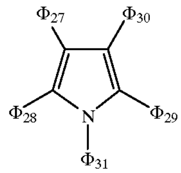
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-801 | Ph | same | same | same | 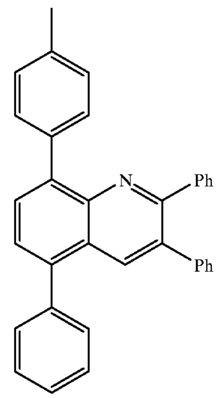 |
| H-8-802 | o-biphenylyl | same | same | same | " |
| H-8-803 | m-biphenylyl | same | same | same | " |
| H-8-804 | p-biphenylyl | same | same | same | " |
| H-8-805 | 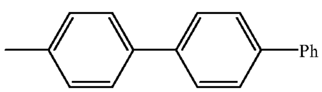 | same | same | same | " |
| H-8-806 | 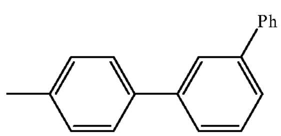 | same | same | same | " |
| H-8-807 | 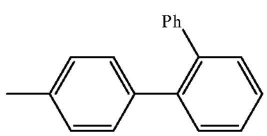 | same | same | same | " |
| H-8-808 | 2-naphthyl | same | same | same | " |
| H-8-809 | 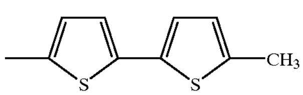 | same | same | same | " |
| H-8-810 | 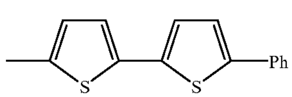 | same | same | same | " |
| H-8-811 | 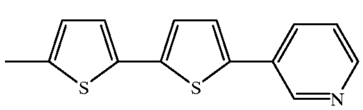 | same | same | same | " |

-continued
(H-8)
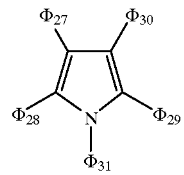
| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-812 | 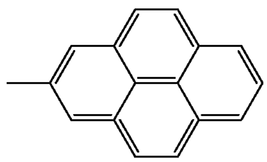 | same | same | same | " |
| H-8-813 | 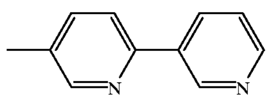 | same | same | same | " |
| H-8-814 | 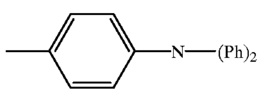 | same | same | same | 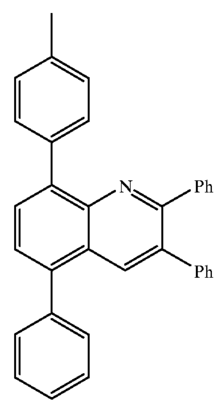 |
| H-8-815 | 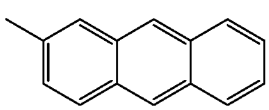 | same | same | same | " |
| H-8-816 | 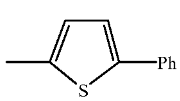 | same | same | same | " |
| H-8-817 | 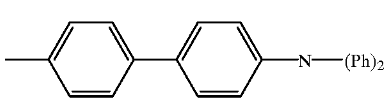 | same | same | same | " |

-continued (H-8)

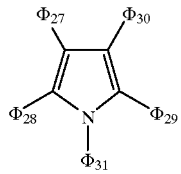

| (H-8) Compound | $\Phi_{27}$ | $\Phi_{28}$ | $\Phi_{29}$ | $\Phi_{30}$ | $\Phi_{31}$ |
|---|---|---|---|---|---|
| H-8-818 | 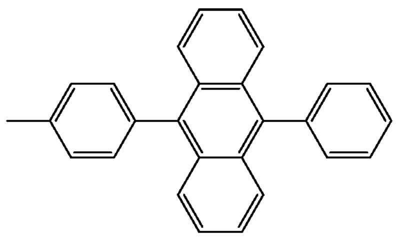 | same | same | same | " |
| H-8-819 | Ph | H | Ph | H | " |

(H-9)

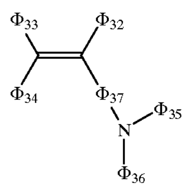

| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-1 | 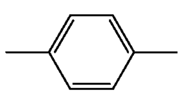 | Ph | same | same | same | same |
| H-9-2 | " | o-biphenylyl | same | same | same | same |
| H-9-3 | " | m-biphenylyl | same | same | same | same |
| H-9-4 | " | p-biphenylyl | same | same | same | same |
| H-9-5 | " | 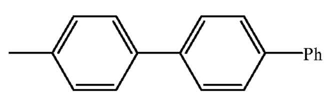 | same | same | same | same |
| H-9-6 | " | 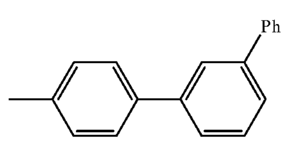 | same | same | same | same |
| H-9-7 | " | 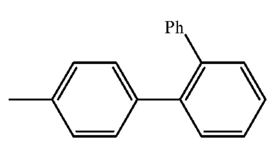 | same | same | same | same |
| H-9-8 | " | 2-naphthyl | same | same | same | same |

-continued
(H-9)
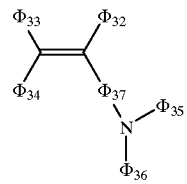
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-9 | " | 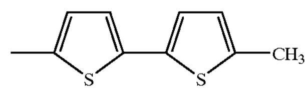 | same | same | same | same |
| H-9-10 | " | 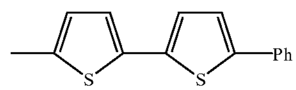 | same | same | same | same |
| H-9-11 | " | 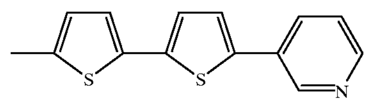 | same | same | same | same |
| H-9-12 | " | 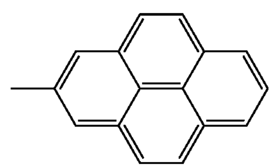 | same | same | same | same |
| H-9-13 | " | 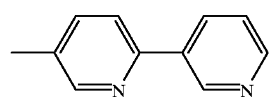 | same | same | same | same |
| H-9-14 | " | 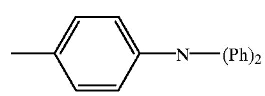 | same | same | same | same |
| H-9-15 | " | 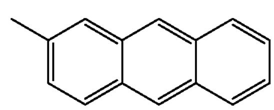 | same | same | same | same |
| H-9-16 | " | 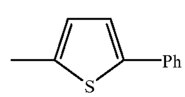 | same | same | same | same |
| H-9-17 | " | 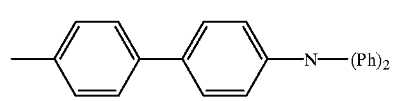 | same | same | same | same |

-continued (H-9)

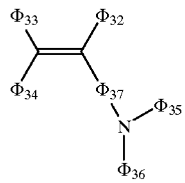

| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-18 | " | 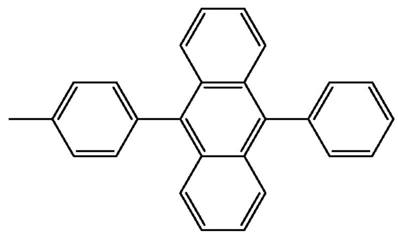 | same | same | same | same |
| H-9-19 | " | Ph | H | Ph | H | Ph |
| H-9-101 | 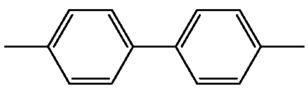 | Ph | same | same | same | same |
| H-9-102 | " | o-biphenylyl | same | same | same | same |
| H-9-103 | " | m-biphenylyl | same | same | same | same |
| H-9-104 | " | p-biphenylyl | same | same | same | same |
| H-9-105 | " | 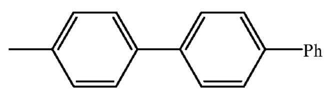 | same | same | same | same |
| H-9-106 | " | 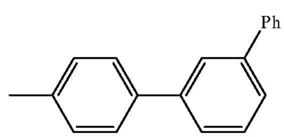 | same | same | same | same |
| H-9-107 | " | 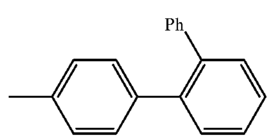 | same | same | same | same |
| H-9-108 | " | 2-naphthyl | same | same | same | same |
| H-9-109 | " | 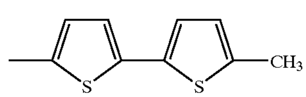 | same | same | same | same |
| H-9-110 | " | 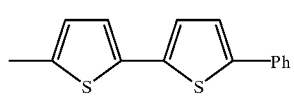 | same | same | same | same |
| H-9-111 | " | 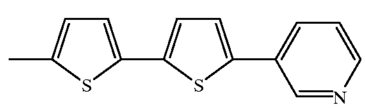 | same | same | same | same |

-continued
(H-9)
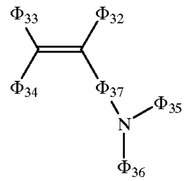
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-112 | " | 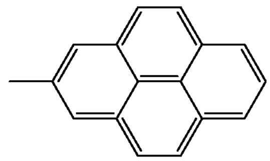 | same | same | same | same |
| H-9-113 | " | 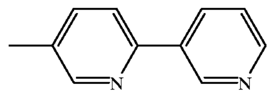 | same | same | same | same |
| H-9-114 | " | 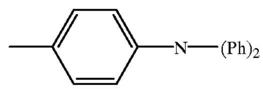 | same | same | same | same |
| H-9-115 | " | 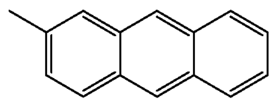 | same | same | same | same |
| H-9-116 | " | 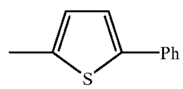 | same | same | same | same |
| H-9-117 | " | 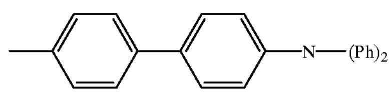 | same | same | same | same |
| H-9-118 | " | 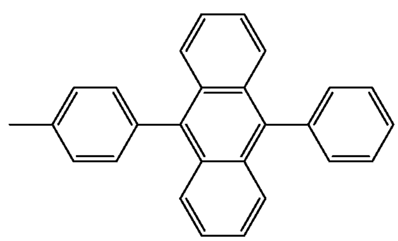 | same | same | same | same |
| H-9-119 | " | Ph | H | Ph | H | Ph |
| H-9-201 | 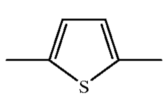 | Ph | same | same | same | same |
| H-9-202 | " | o-biphenylyl | same | same | same | same |
| H-9-203 | " | m-biphenylyl | same | same | same | same |
| H-9-204 | " | p-biphenylyl | same | same | same | same |

-continued
(H-9)
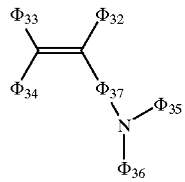
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-205 | " | 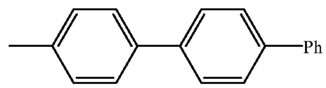 | same | same | same | same |
| H-9-206 | " | 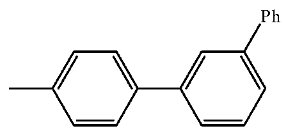 | same | same | same | same |
| H-9-207 | " | 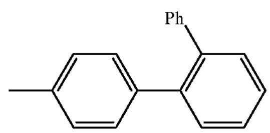 | same | same | same | same |
| H-9-208 | " | 2-naphthyl | same | same | same | same |
| H-9-209 | " | 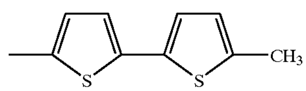 | same | same | same | same |
| H-9-210 | " | 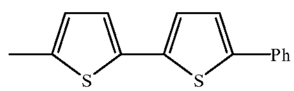 | same | same | same | same |
| H-9-211 | " | 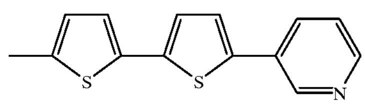 | same | same | same | same |
| H-9-212 | " | 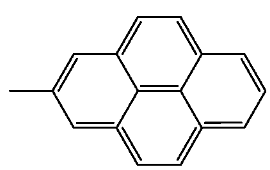 | same | same | same | same |
| H-9-213 | " | 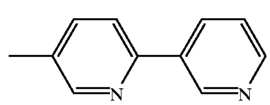 | same | same | same | same |
| H-9-214 | " | 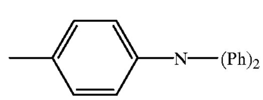 | same | same | same | same |
| H-9-215 | " | 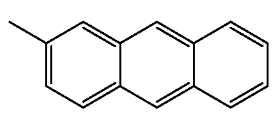 | same | same | same | same |

-continued (H-9)

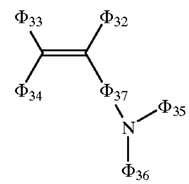

| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-216 | " | 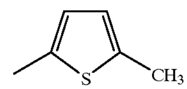 | same | same | same | same |
| H-9-217 | " | 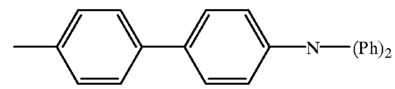 | same | same | same | same |
| H-9-218 | " | 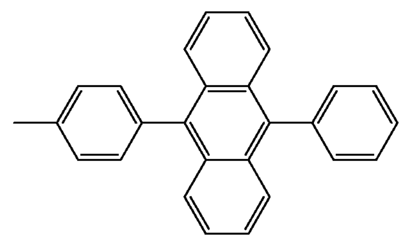 | same | same | same | same |
| H-9-219 | " | Ph | H | Ph | H | Ph |
| H-9-301 | 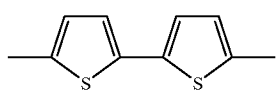 | Ph | same | same | same | same |
| H-9-302 | " | o-biphenylyl | same | same | same | same |
| H-9-303 | " | m-biphenylyl | same | same | same | same |
| H-9-304 | " | p-biphenylyl | same | same | same | same |
| H-9-305 | " | 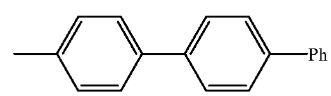 | same | same | same | same |
| H-9-306 | " | 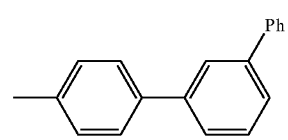 | same | same | same | same |
| H-9-307 | " | 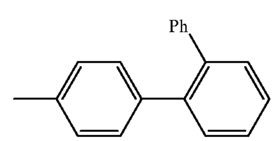 | same | same | same | same |
| H-9-308 | " | 2-naphthyl | same | same | same | same |
| H-9-309 | " | 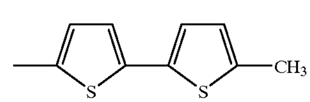 | same | same | same | same |

-continued
(H-9)
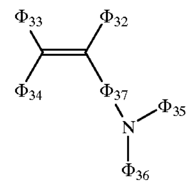
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-310 | " | 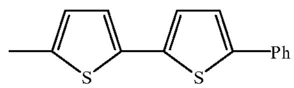 | same | same | same | same |
| H-9-311 | " | 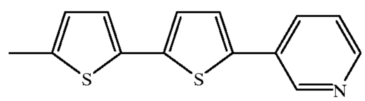 | same | same | same | same |
| H-9-312 | " | 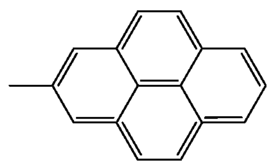 | same | same | same | same |
| H-9-313 | " | 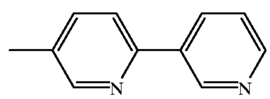 | same | same | same | same |
| H-9-314 | " | 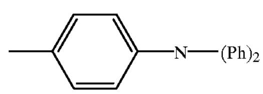 | same | same | same | same |
| H-9-315 | " | 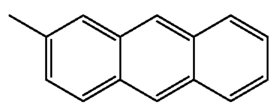 | same | same | same | same |
| H-9-316 | " | 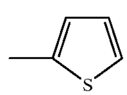 | same | same | same | same |
| H-9-317 | " | 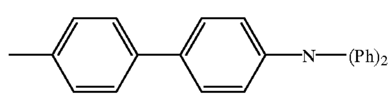 | same | same | same | same |
| H-9-318 | " | 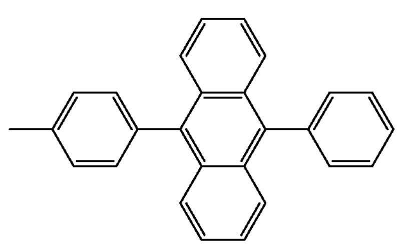 | same | same | same | same |
| H-9-319 | " | Ph | H | Ph | H | Ph |

-continued (H-9)

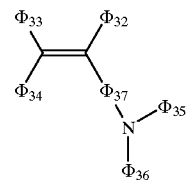

| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-401 | 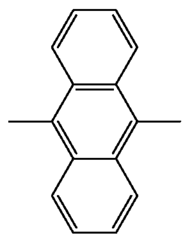 | Ph | same | same | same | same |
| H-9-402 | " | o-biphenylyl | same | same | same | same |
| H-9-403 | " | m-biphenylyl | same | same | same | same |
| H-9-404 | " | p-biphenylyl | same | same | same | same |
| H-9-405 | " | 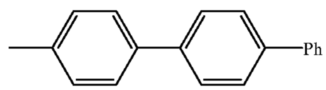 | same | same | same | same |
| H-9-406 | " | 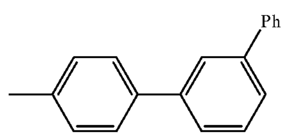 | same | same | same | same |
| H-9-407 | " | 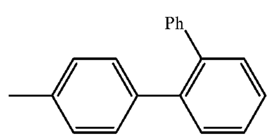 | same | same | same | same |
| H-9-408 | " | 2-naphthyl | same | same | same | same |
| H-9-409 | " | 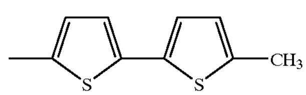 | same | same | same | same |
| H-9-410 | " | 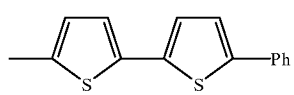 | same | same | same | same |
| H-9-411 | " | 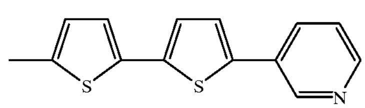 | same | same | same | same |
| H-9-412 | " | 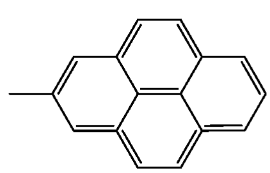 | same | same | same | same |

-continued
(H-9)
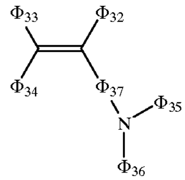
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-413 | " | 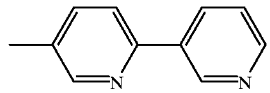 | same | same | same | same |
| H-9-414 | " | 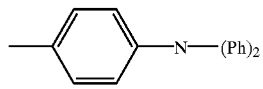 | same | same | same | same |
| H-9-415 | " | 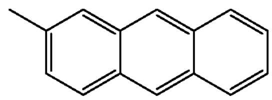 | same | same | same | same |
| H-9-416 | " | 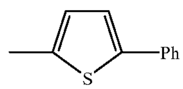 | same | same | same | same |
| H-9-417 | " | 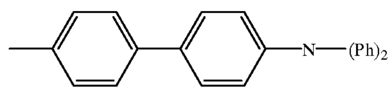 | same | same | same | same |
| H-9-418 | " | 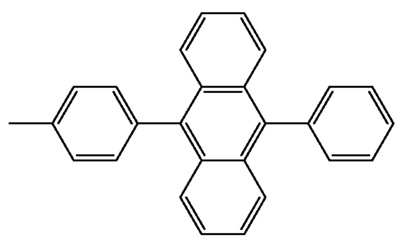 | same | same | same | same |
| H-9-419 | " | Ph | H | Ph | H | Ph |
| H-9-420 | 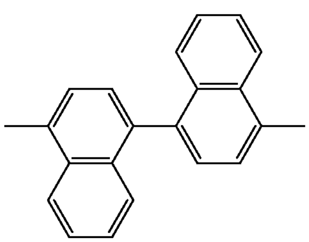 | Ph | same | same | same | same |
| H-9-501 | 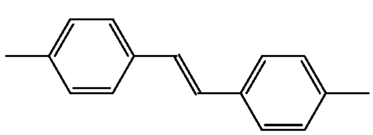 | Ph | same | same | same | same |
| H-9-502 | " | o-biphenylyl | same | same | same | same |

-continued (H-9)

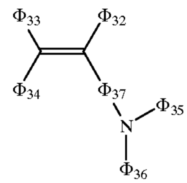

| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-503 | " | m-biphenylyl | same | same | same | same |
| H-9-504 | " | p-biphenylyl | same | same | same | same |
| H-9-505 | " | 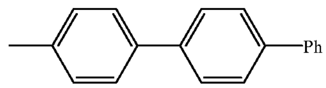 | same | same | same | same |
| H-9-506 | " | 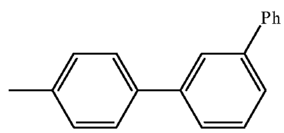 | same | same | same | same |
| H-9-507 | " | 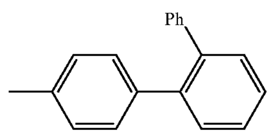 | same | same | same | same |
| H-9-508 | " | 2-naphthyl | same | same | same | same |
| H-9-509 | " | 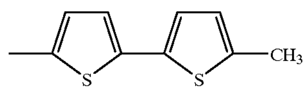 | same | same | same | same |
| H-9-510 | " | 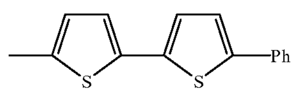 | same | same | same | same |
| H-9-511 | " | 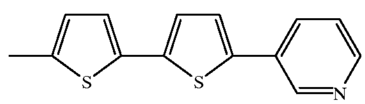 | same | same | same | same |
| H-9-512 | " | 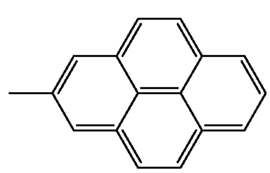 | same | same | same | same |
| H-9-513 | " | 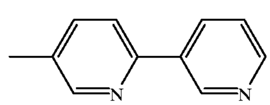 | same | same | same | same |
| H-9-514 | " | 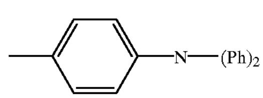 | same | same | same | same |

-continued
(H-9)
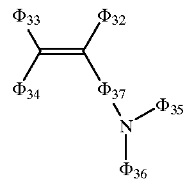
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-515 | " | 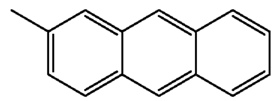 | same | same | same | same |
| H-9-516 | " | 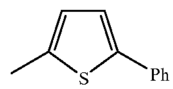 | same | same | same | same |
| H-9-517 | " | 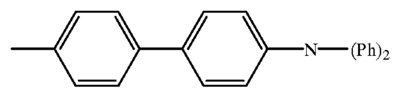 | same | same | same | same |
| H-9-518 | " | 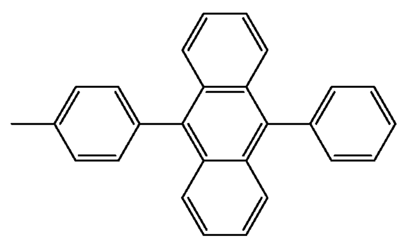 | same | same | same | same |
| H-9-519 | " | Ph | H | Ph | H | Ph |
| H-9-601 | 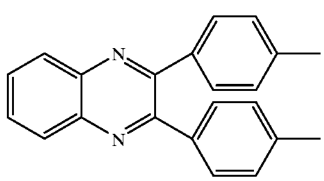 | Ph | same | same | same | same |
| H-9-602 | " | o-biphenylyl | same | same | same | same |
| H-9-603 | " | m-biphenylyl | same | same | same | same |
| H-9-604 | " | p-biphenylyl | same | same | same | same |
| H-9-605 | " | 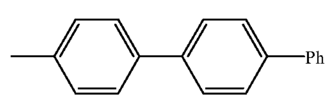 | same | same | same | same |
| H-9-606 | " | 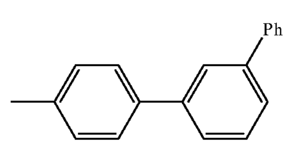 | same | same | same | same |

-continued
(H-9)
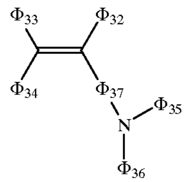
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-607 | " | 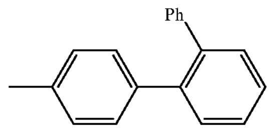 | same | same | same | same |
| H-9-608 | " | 2-naphthyl | same | same | same | same |
| H-9-609 | " | 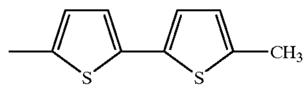 | same | same | same | same |
| H-9-610 | " | 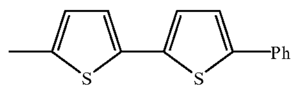 | same | same | same | same |
| H-9-611 | " | 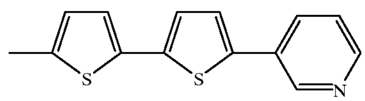 | same | same | same | same |
| H-9-612 | " | 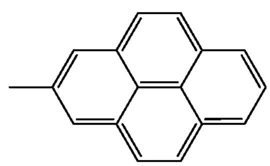 | same | same | same | same |
| H-9-613 | " | 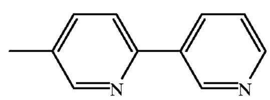 | same | same | same | same |
| H-9-614 | " | 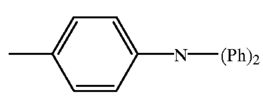 | same | same | same | same |
| H-9-615 | " | 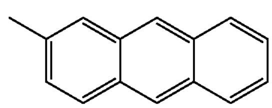 | same | same | same | same |
| H-9-616 | " | 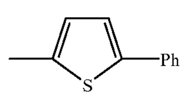 | same | same | same | same |
| H-9-617 | " | 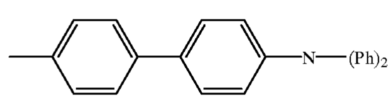 | same | same | same | same |

-continued (H-9)

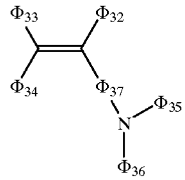

| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-618 | " | 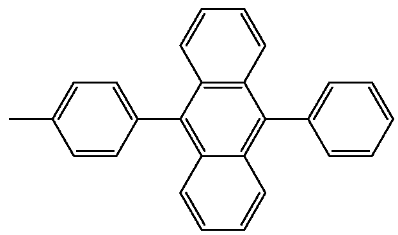 | same | same | same | same |
| H-9-619 | " | Ph | H | Ph | H | Ph |
| H-9-701 | 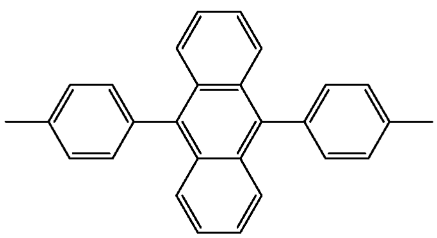 | Ph | same | same | same | same |
| H-9-702 | " | o-biphenylyl | same | same | same | same |
| H-9-703 | " | m-biphenylyl | same | same | same | same |
| H-9-704 | " | p-biphenylyl | same | same | same | same |
| H-9-705 | " | 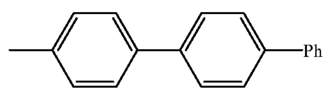 | same | same | same | same |
| H-9-706 | " | 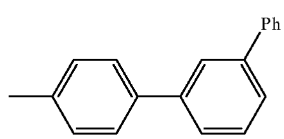 | same | same | same | same |
| H-9-707 | " | 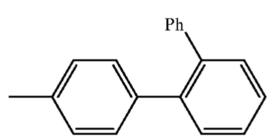 | same | same | same | same |
| H-9-708 | " | 2-naphthyl | same | same | same | same |
| H-9-709 | " | 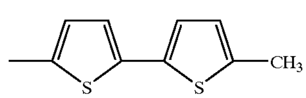 | same | same | same | same |
| H-9-710 | " | 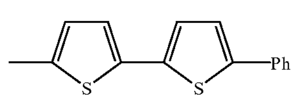 | same | same | same | same |

-continued
(H-9)
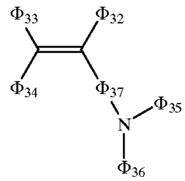
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-711 | " | 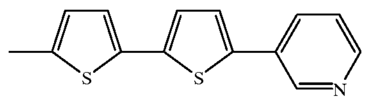 | same | same | same | same |
| H-9-712 | " | 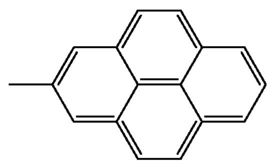 | same | same | same | same |
| H-9-713 | " | 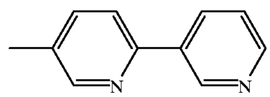 | same | same | same | same |
| H-9-714 | " | 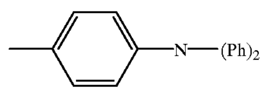 | same | same | same | same |
| H-9-715 | " | 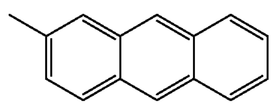 | same | same | same | same |
| H-9-716 | " | 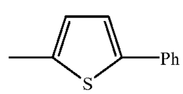 | same | same | same | same |
| H-9-717 | " | 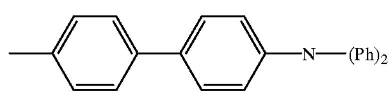 | same | same | same | same |
| H-9-718 | " | 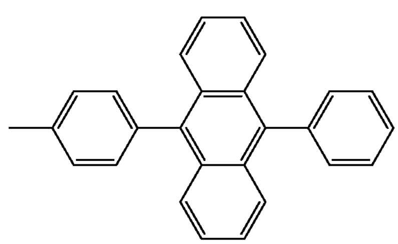 | same | same | same | same |
| H-9-719 | " | Ph | H | Ph | H | Ph |

-continued
(H-9)
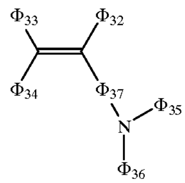
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-801 | 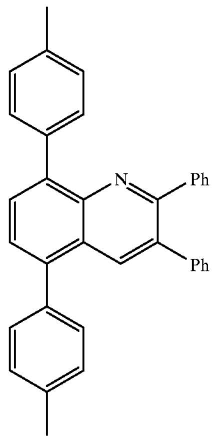 | Ph | same | same | same | same |
| H-9-802 | " | o-biphenylyl | same | same | same | same |
| H-9-803 | " | m-biphenylyl | same | same | same | same |
| H-9-804 | " | p-biphenylyl | same | same | same | same |
| H-9-805 | " | 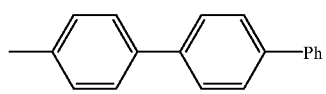 | same | same | same | same |
| H-9-806 | " | 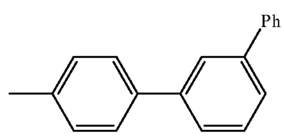 | same | same | same | same |
| H-9-807 | " | 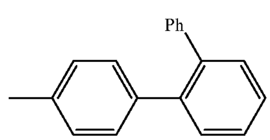 | same | same | same | same |
| H-9-808 | " | 2-naphthyl | same | same | same | same |
| H-9-809 | " | 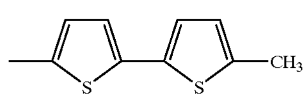 | same | same | same | same |
| H-9-810 | " | 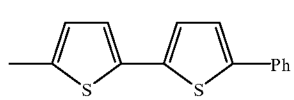 | same | same | same | same |

-continued
(H-9)
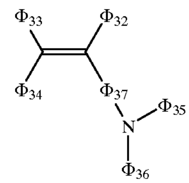
| Com-pound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-811 | " | 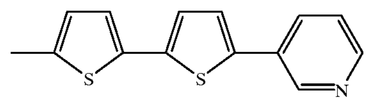 | same | same | same | same |
| H-9-812 | " | 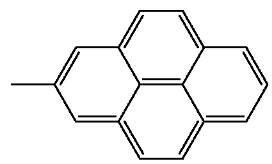 | same | same | same | same |
| H-9-813 | " | 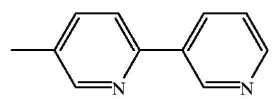 | same | same | same | same |
| H-9-814 | " | 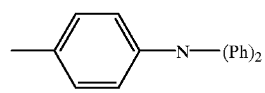 | same | same | same | same |
| H-9-815 | " | 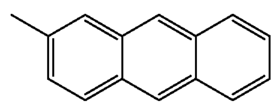 | same | same | same | same |
| H-9-816 | " | 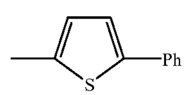 | same | same | same | same |
| H-9-817 | " | 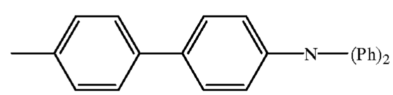 | same | same | same | same |
| H-9-818 | " | 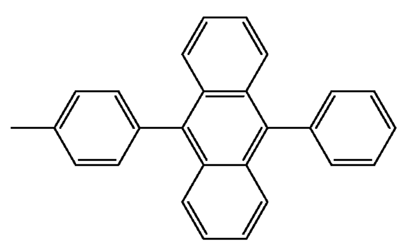 | same | same | same | same |
| H-9-819 | " | Ph | H | Ph | H | Ph |

-continued
(H-9)
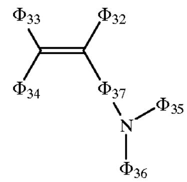
| Compound | $\Phi_{37}$ | $\Phi_{32}$ | $\Phi_{33}$ | $\Phi_{34}$ | $\Phi_{35}$ | $\Phi_{36}$ |
|---|---|---|---|---|---|---|
| H-9-820 | 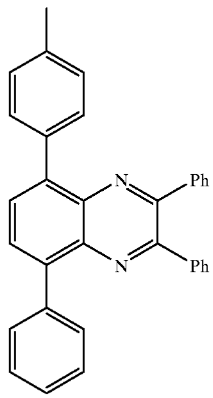 | Ph | same | same | same | same |
(H-10)
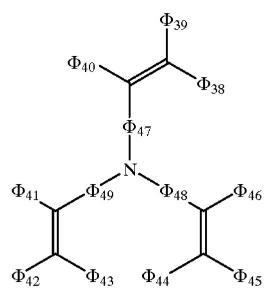
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-1 | 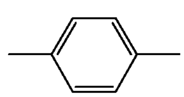 | Ph | Ph |
| H-10-2 | " | o-biphenylyl | Ph |
| H-10-3 | " | m-biphenylyl | Ph |
| H-10-4 | " | p-biphenylyl | Ph |
| H-10-5 | " | 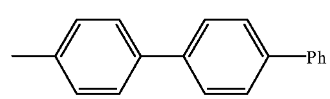 | Ph |
| H-10-6 | " | 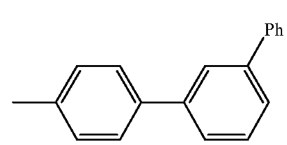 | Ph |

-continued
(H-10)
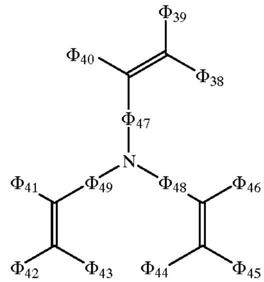
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-7 | " | 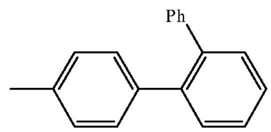 | Ph |
| H-10-8 | " | 2-naphthyl | Ph |
| H-10-9 | " | 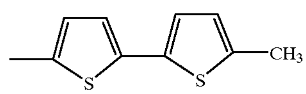 | Ph |
| H-10-10 | " | 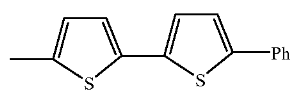 | Ph |
| H-10-11 | " | 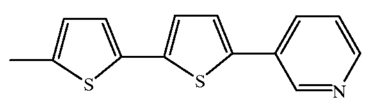 | Ph |
| H-10-12 | " | 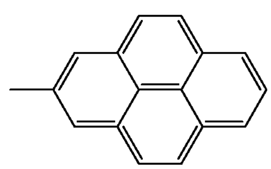 | Ph |
| H-10-13 | " | 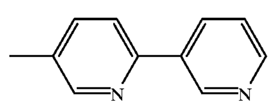 | Ph |
| H-10-14 | " | 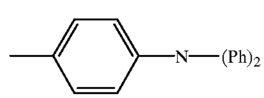 | Ph |
| H-10-15 | " | 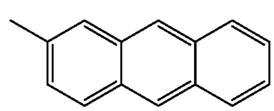 | Ph |
| H-10-16 | " | 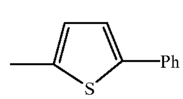 | Ph |

-continued
(H-10)
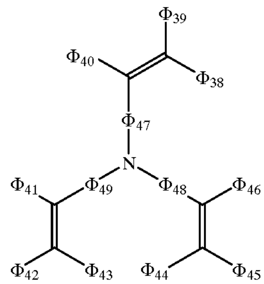
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-17 | " | 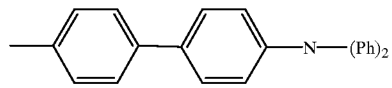  | Ph |
| H-10-18 | " | 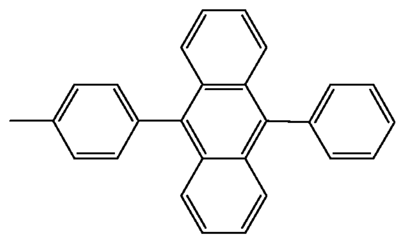 | Ph |
| H-10-101 | 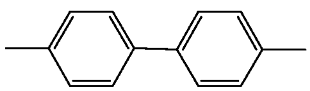 | Ph | Ph |
| H-10-102 | " | o-biphenylyl | Ph |
| H-10-103 | " | m-biphenylyl | Ph |
| H-10-104 | " | p-biphenylyl | Ph |
| H-10-105 | " | 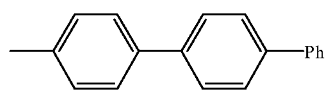  | Ph |
| H-10-106 | " | 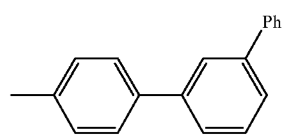  | Ph |
| H-10-107 | " | 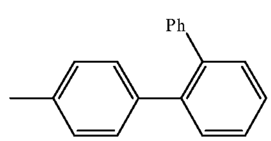  | Ph |
| H-10-108 | " | 2-naphthyl | Ph |
| H-10-109 | " | 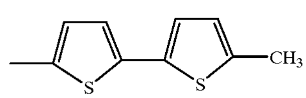  | Ph |
| H-10-110 | " | 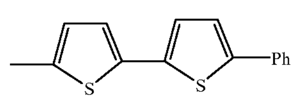  | Ph |

-continued
(H-10)
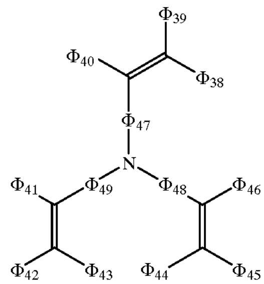
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-111 | " | 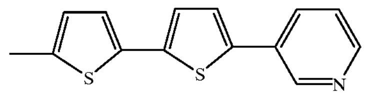 | Ph |
| H-10-112 | " | 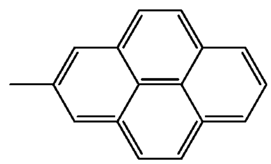 | Ph |
| H-10-113 | " | 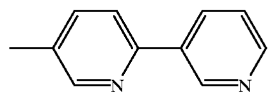 | Ph |
| H-10-114 | " | 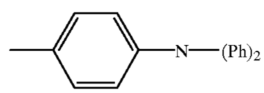 | Ph |
| H-10-115 | " | 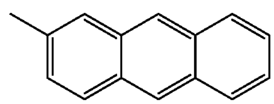 | Ph |
| H-10-116 | " | 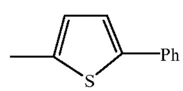 | Ph |
| H-10-117 | " | 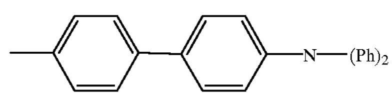 | Ph |
| H-10-118 | " | 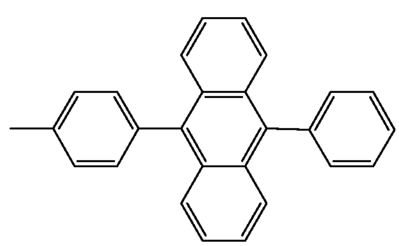 | Ph |
| H-10-201 | 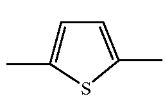 | Ph | Ph |

-continued
(H-10)
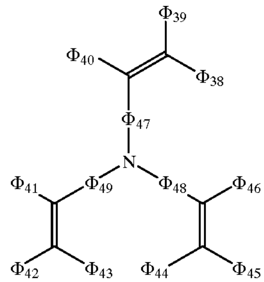
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-202 | " | o-biphenylyl | Ph |
| H-10-203 | " | m-biphenylyl | Ph |
| H-10-204 | " | p-biphenylyl | Ph |
| H-10-205 | " | 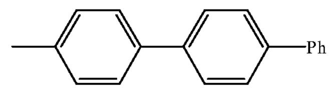 | Ph |
| H-10-206 | " | 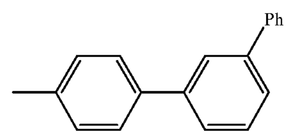 | Ph |
| H-10-207 | " | 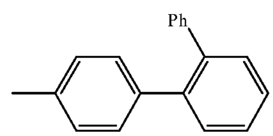 | Ph |
| H-10-208 | " | 2-naphthyl | Ph |
| H-10-209 | " | 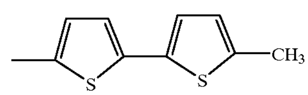 | Ph |
| H-10-210 | " | 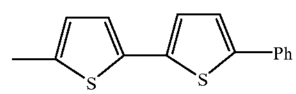 | Ph |
| H-10-211 | " | 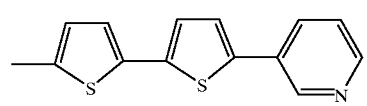 | Ph |
| H-10-212 | " | 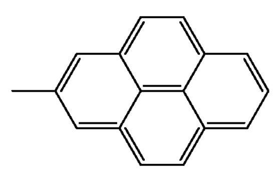 | Ph |
| H-10-213 | " | 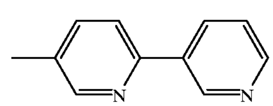 | Ph |

-continued
(H-10)
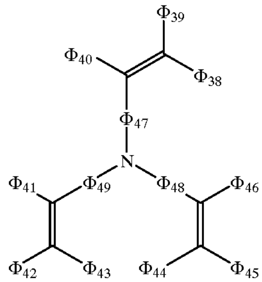
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
| --- | --- | --- | --- |
| H-10-214 | " | 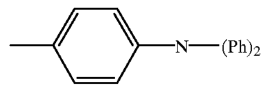 | Ph |
| H-10-215 | " | 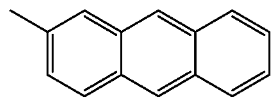 | Ph |
| H-10-216 | " | 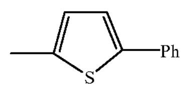 | Ph |
| H-10-217 | " | 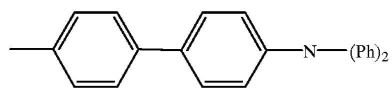 | Ph |
| H-10-218 | " | 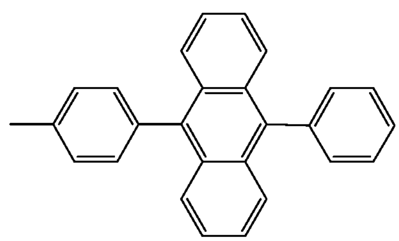 | Ph |
| H-10-301 | 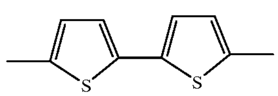 | Ph | Ph |
| H-10-302 | " | o-biphenylyl | Ph |
| H-10-303 | " | m-biphenylyl | Ph |
| H-10-304 | " | p-biphenylyl | Ph |
| H-10-305 | " | 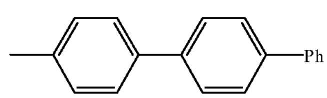 | Ph |
| H-10-306 | " | 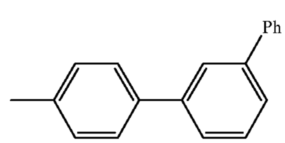 | Ph |

-continued
(H-10)
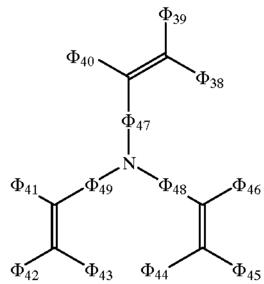
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-307 | " | 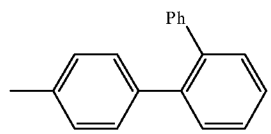 | Ph |
| H-10-308 | " | 2-naphthyl | Ph |
| H-10-309 | " | 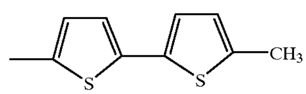 | Ph |
| H-10-310 | " | 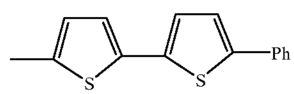 | Ph |
| H-10-311 | " | 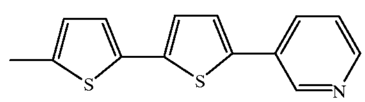 | Ph |
| H-10-312 | " | 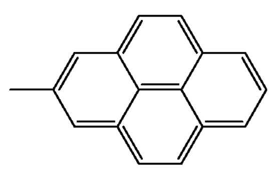 | Ph |
| H-10-313 | " | 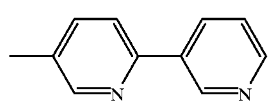 | Ph |
| H-10-314 | " | 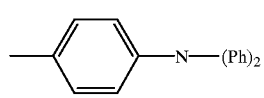 | Ph |
| H-10-315 | " | 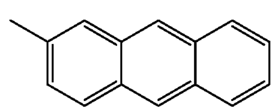 | Ph |
| H-10-316 | " | 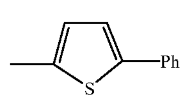 | Ph |

-continued
(H-10)
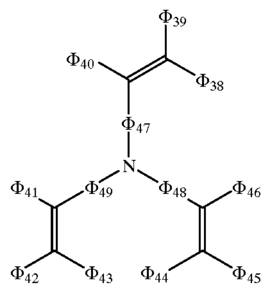
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-317 | " | 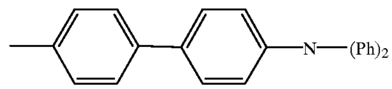 | Ph |
| H-10-318 | " | 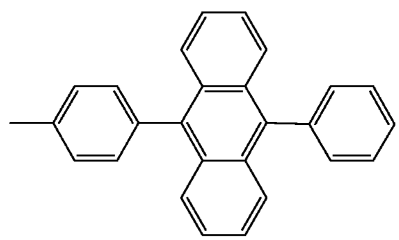 | Ph |
| H-10-401 | 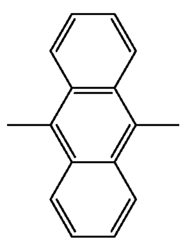 | Ph | Ph |
| H-10-402 | " | o-biphenylyl | Ph |
| H-10-403 | " | m-biphenylyl | Ph |
| H-10-404 | " | p-biphenylyl | Ph |
| H-10-405 | " | 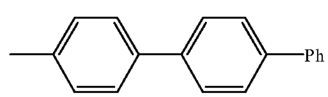 | Ph |
| H-10-406 | " | 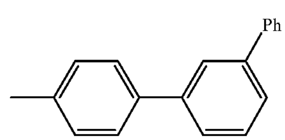 | Ph |
| H-10-407 | " | 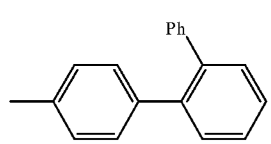 | Ph |
| H-10-408 | " | 2-naphthyl | Ph |

-continued
(H-10)
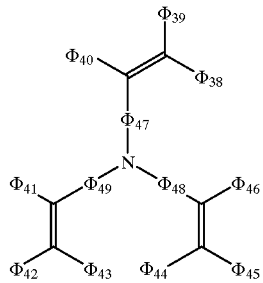
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
| --- | --- | --- | --- |
| H-10-409 | " | 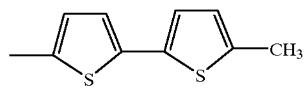 | Ph |
| H-10-410 | " | 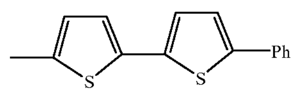 | Ph |
| H-10-411 | " | 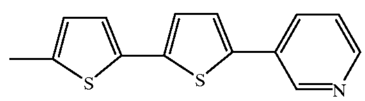 | Ph |
| H-10-412 | " | 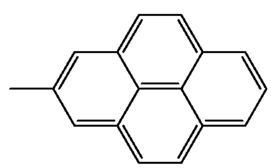 | Ph |
| H-10-413 | " | 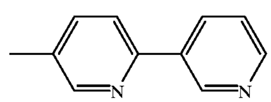 | Ph |
| H-10-414 | " | 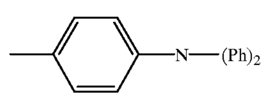 | Ph |
| H-10-415 | " | 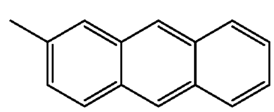 | Ph |
| H-10-416 | " | 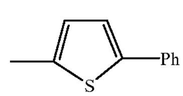 | Ph |
| H-10-417 | " | 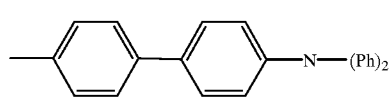 | Ph |

-continued
(H-10)
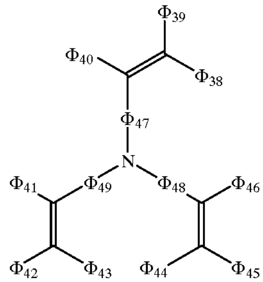
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-418 | " | 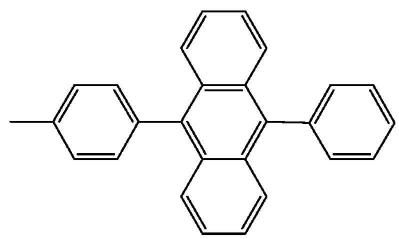 | Ph |
| H-10-501 | 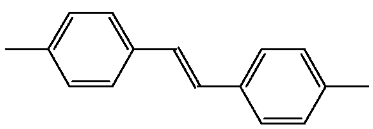 | Ph | Ph |
| H-10-502 | " | o-biphenylyl | Ph |
| H-10-503 | " | m-biphenylyl | Ph |
| H-10-504 | " | p-biphenylyl | Ph |
| H-10-505 | " | 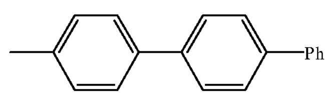 | Ph |
| H-10-506 | " | 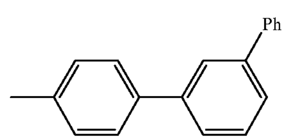 | Ph |
| H-10-507 | " | 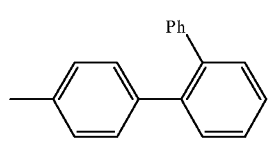 | Ph |
| H-10-508 | " | 2-naphthyl | Ph |
| H-10-509 | " | 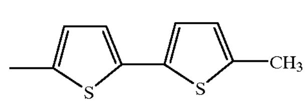 | Ph |
| H-10-510 | " | 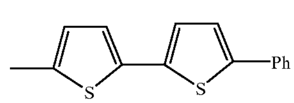 | Ph |

-continued
(H-10)
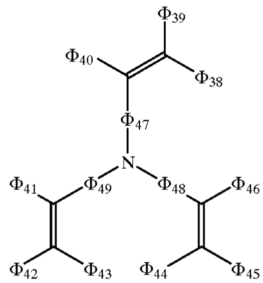
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-511 | " | 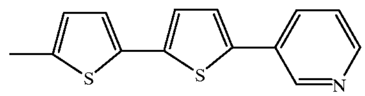 | Ph |
| H-10-512 | " | 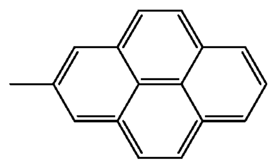 | Ph |
| H-10-513 | " | 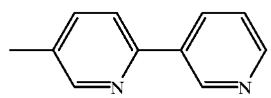 | Ph |
| H-10-514 | " | 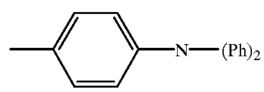 | Ph |
| H-10-515 | " | 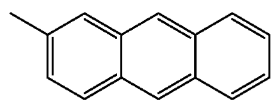 | Ph |
| H-10-516 | " | 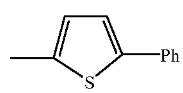 | Ph |
| H-10-517 | " | 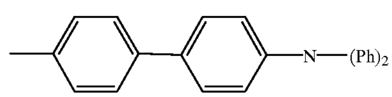 | Ph |
| H-10-518 | " | 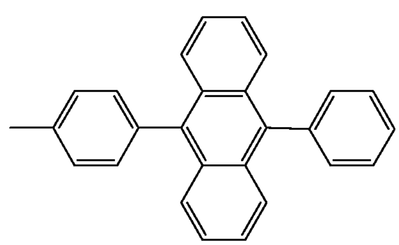 | Ph |

-continued
(H-10)
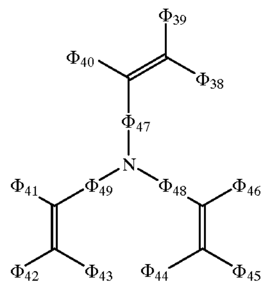
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-601 | 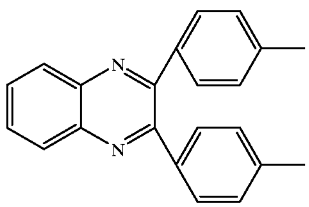 | Ph | Ph |
| H-10-602 | " | o-biphenylyl | Ph |
| H-10-603 | " | m-biphenylyl | Ph |
| H-10-604 | " | p-biphenylyl | Ph |
| H-10-605 | " | 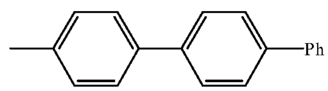 | Ph |
| H-10-606 | " | 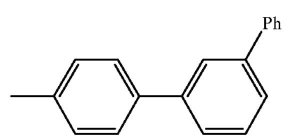 | Ph |
| H-10-607 | " | 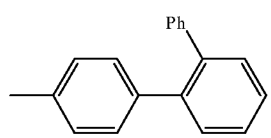 | Ph |
| H-10-608 | " | 2-naphthyl | Ph |
| H-10-609 | " | 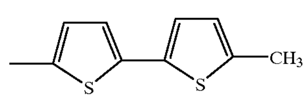 | Ph |
| H-10-610 | " | 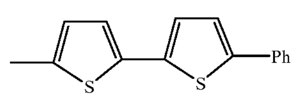 | Ph |
| H-10-611 | " | 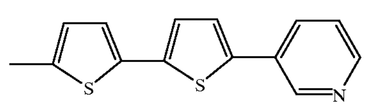 | Ph |

-continued
(H-10)
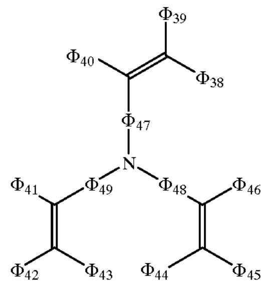
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-612 | " | 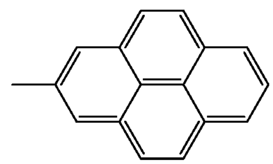 | Ph |
| H-10-613 | " | 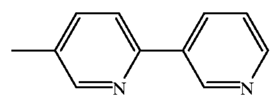 | Ph |
| H-10-614 | " | 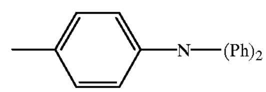 | Ph |
| H-10-615 | " | 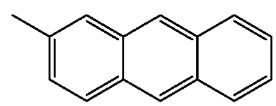 | Ph |
| H-10-616 | " | 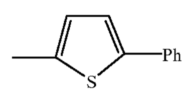 | Ph |
| H-10-617 | " | 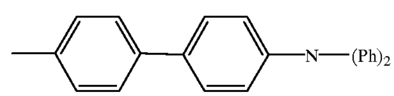 | Ph |
| H-10-618 | " | 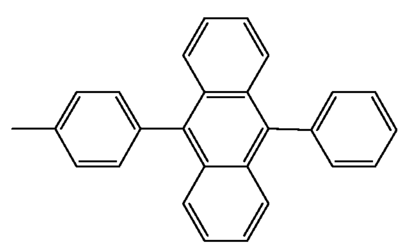 | Ph |
| H-10-701 | 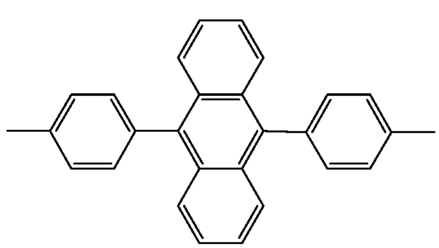 | Ph | Ph |

-continued
(H-10)
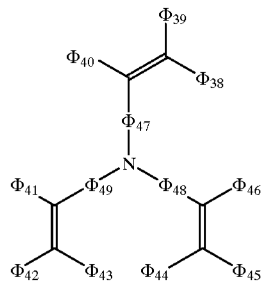
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-702 | " | o-biphenylyl | Ph |
| H-10-703 | " | m-biphenylyl | Ph |
| H-10-704 | " | p-biphenylyl | Ph |
| H-10-705 | " | 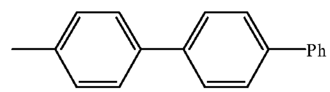 | Ph |
| H-10-706 | " | 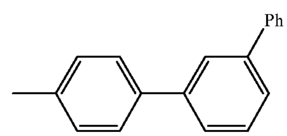 | Ph |
| H-10-707 | " | 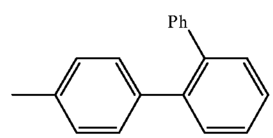 | Ph |
| H-10-708 | " | 2-naphthyl | Ph |
| H-10-709 | " | 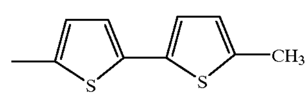 | Ph |
| H-10-710 | " | 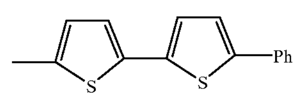 | Ph |
| H-10-711 | " | 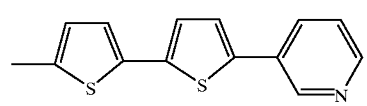 | Ph |
| H-10-712 | " | 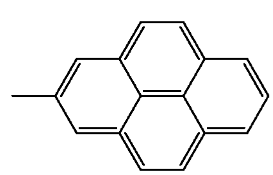 | Ph |
| H-10-713 | " | 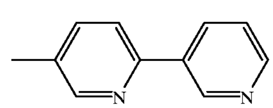 | Ph |

-continued
(H-10)
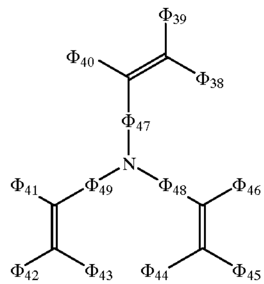
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-714 | " | 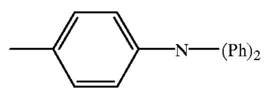 | Ph |
| H-10-715 | " | 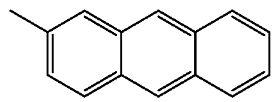 | Ph |
| H-10-716 | " | 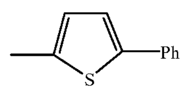 | Ph |
| H-10-717 | " | 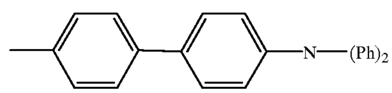 | Ph |
| H-10-718 | " | 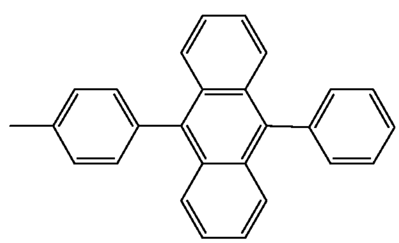 | Ph |
| H-10-801 | 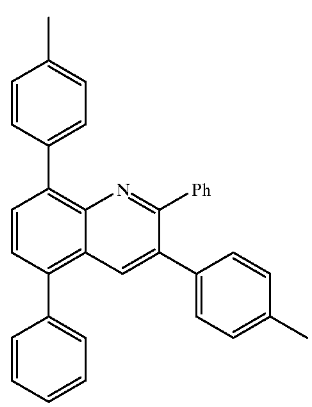 | Ph | Ph |
| H-10-802 | " | o-biphenylyl | Ph |
| H-10-803 | " | m-biphenylyl | Ph |
| H-10-804 | " | p-biphenylyl | Ph |

-continued
(H-10)
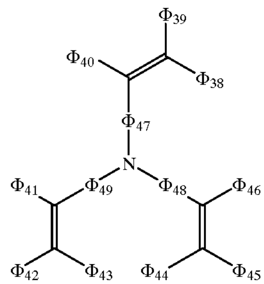
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
| --- | --- | --- | --- |
| H-10-805 | " | 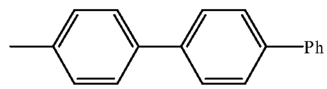 | Ph |
| H-10-806 | " | 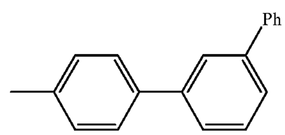 | Ph |
| H-10-807 | " | 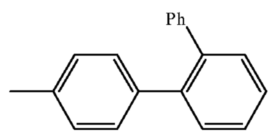 | Ph |
| H-10-808 | " | 2-naphthyl | Ph |
| H-10-809 | " | 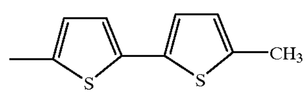 | Ph |
| H-10-810 | " | 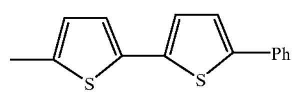 | Ph |
| H-10-811 | " | 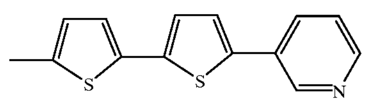 | Ph |
| H-10-812 | " | 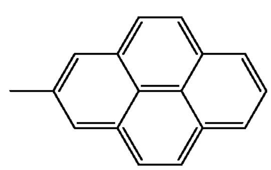 | Ph |
| H-10-813 | " | 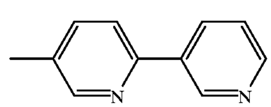 | Ph |
| H-10-814 | " | 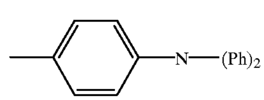 | Ph |

-continued
(H-10)
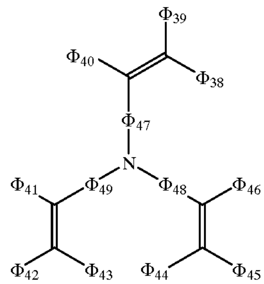
| (H-10) Compound | $\Phi_{47}$–$\Phi_{49}$ | $\Phi_{39}$, $\Phi_{42}$, $\Phi_{45}$ | $\Phi_{38}$, $\Phi_{40}$, $\Phi_{41}$, $\Phi_{43}$, $\Phi_{44}$, $\Phi_{46}$ |
|---|---|---|---|
| H-10-815 | " | 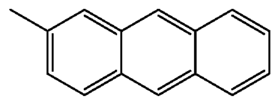 | Ph |
| H-10-816 | " | 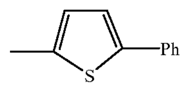 | Ph |
| H-10-817 | " | 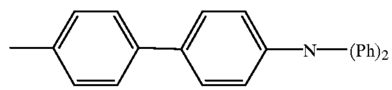 | Ph |
| H-10-818 | " | 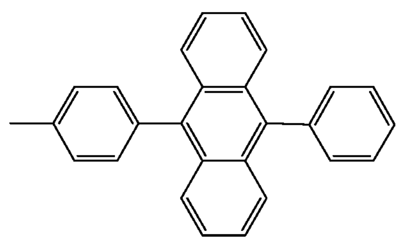 | Ph |
(H-11)
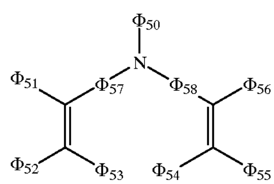
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-1 | 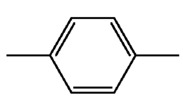 | Ph | Ph |
| H-11-2 | " | o-biphenylyl | Ph |
| H-11-3 | " | m-biphenylyl | Ph |
| H-11-4 | " | p-biphenylyl | Ph |
| H-11-5 | " | 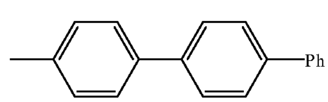 | Ph |

-continued
(H-11)
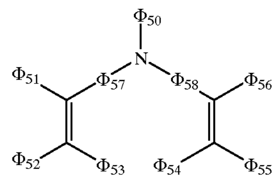
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-6 | " | 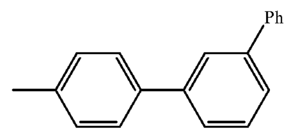 | Ph |
| H-11-7 | " | 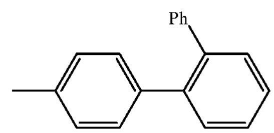 | Ph |
| H-11-8 | " | 2-naphthyl | Ph |
| H-11-9 | " | 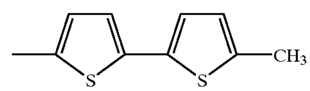 | Ph |
| H-11-10 | " | 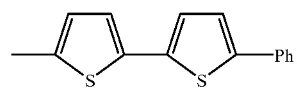 | Ph |
| H-11-11 | " | 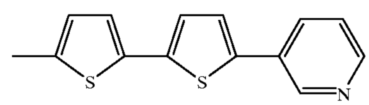 | Ph |
| H-11-12 | " | 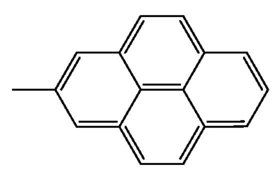 | Ph |
| H-11-13 | " | 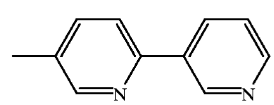 | Ph |
| H-11-14 | 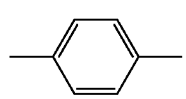 | 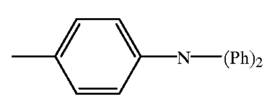 | Ph |
| H-11-15 | " | 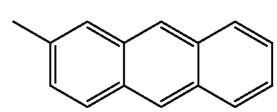 | Ph |
| H-11-16 | " | 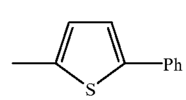 | Ph |

-continued
(H-11)
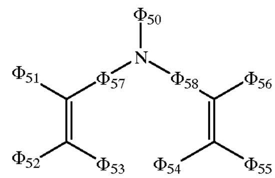
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-17 | " | 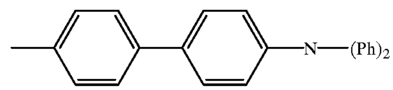 | Ph |
| H-11-18 | " | 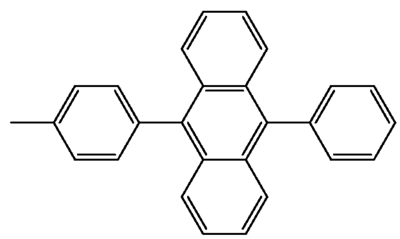 | Ph |
| H-11-101 | 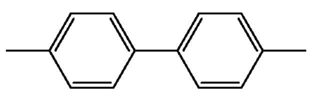 | Ph | Ph |
| H-11-102 | " | o-biphenylyl | Ph |
| H-11-103 | " | m-biphenylyl | Ph |
| H-11-104 | " | p-biphenylyl | Ph |
| H-11-105 | " | 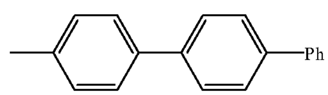 | Ph |
| H-11-106 | " | 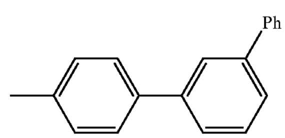 | Ph |
| H-11-107 | " | 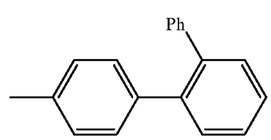 | Ph |
| H-11-108 | " | 2-naphthyl | Ph |
| H-11-109 | " | 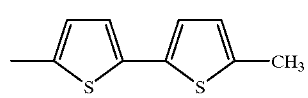 | Ph |
| H-11-110 | " | 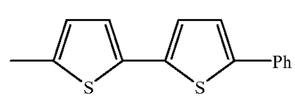 | Ph |
| H-11-111 | " | 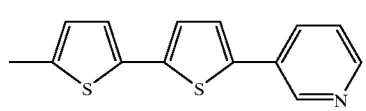 | Ph |

-continued
(H-11)
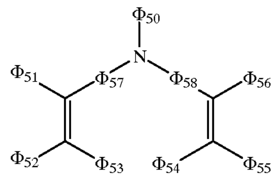
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-112 | " | 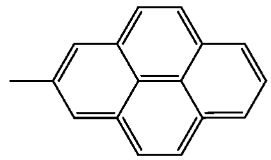 | Ph |
| H-11-113 | " | 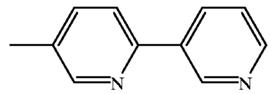 | Ph |
| H-11-114 | 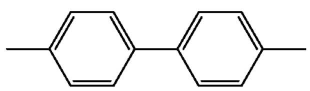 | 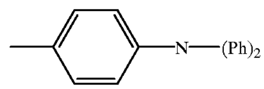 | Ph |
| H-11-115 | " | 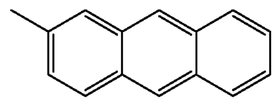 | Ph |
| H-11-116 | " | 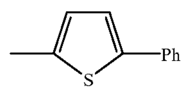 | Ph |
| H-11-117 | " | 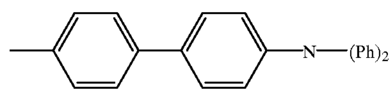 | Ph |
| H-11-118 | " | 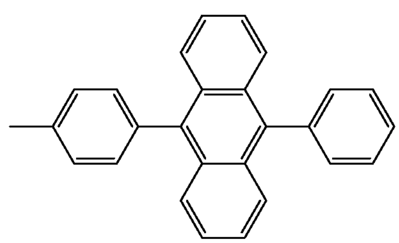 | Ph |
| H-11-201 | 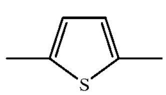 | Ph | Ph |
| H-11-202 | " | o-biphenylyl | Ph |
| H-11-203 | " | m-biphenylyl | Ph |
| H-11-204 | " | p-biphenylyl | Ph |
| H-11-205 | " | 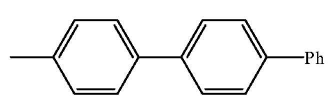 | Ph |

-continued
(H-11)
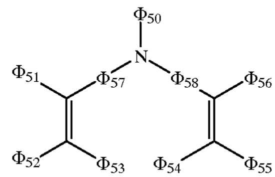
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-206 | " | 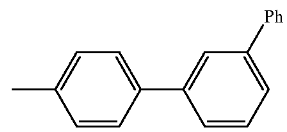 | Ph |
| H-11-207 | " | 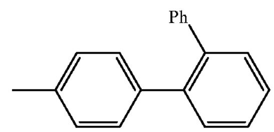 | Ph |
| H-11-208 | " | 2-naphthyl | Ph |
| H-11-209 | " | 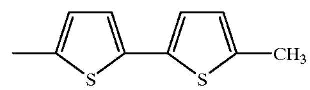 | Ph |
| H-11-210 | " | 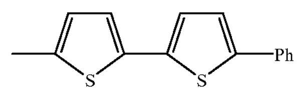 | Ph |
| H-11-211 | " | 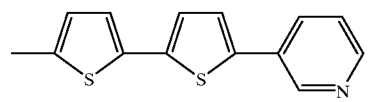 | Ph |
| H-11-212 | " | 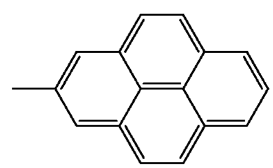 | Ph |
| H-11-213 | " | 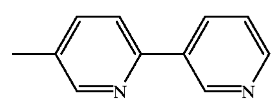 | Ph |
| H-11-214 | 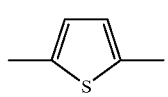 | 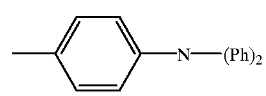 | Ph |
| H-11-215 | " | 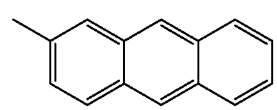 | Ph |
| H-11-216 | " | 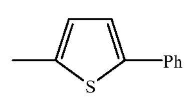 | Ph |

-continued
(H-11)
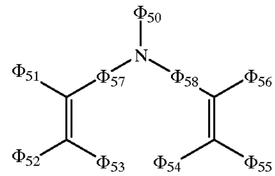
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-217 | " | 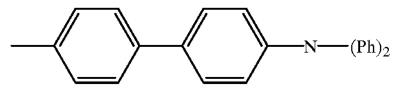 | Ph |
| H-11-218 | " | 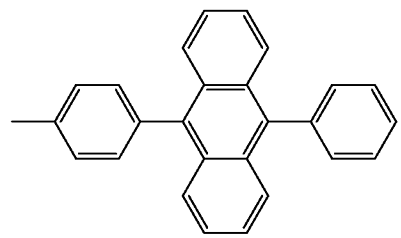 | Ph |
| H-11-301 | 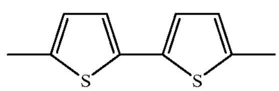 | Ph | Ph |
| H-11-302 | " | o-biphenylyl | Ph |
| H-11-303 | " | m-biphenylyl | Ph |
| H-11-304 | " | p-biphenylyl | Ph |
| H-11-305 | " | 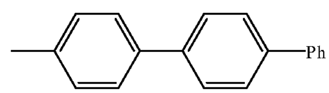 | Ph |
| H-11-306 | " | 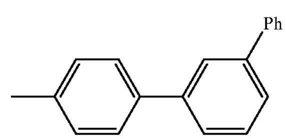 | Ph |
| H-11-307 | " | 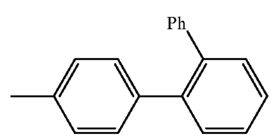 | Ph |
| H-11-308 | " | 2-naphthyl | Ph |
| H-11-309 | " | 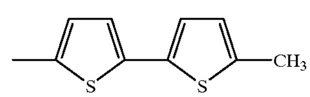 | Ph |
| H-11-310 | " | 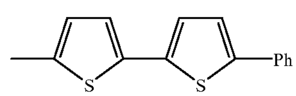 | Ph |
| H-11-311 | " | 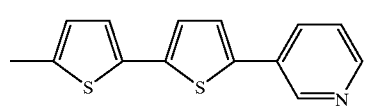 | Ph |

-continued
(H-11)
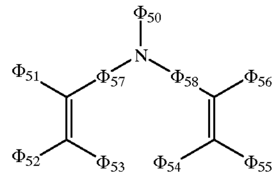
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-312 | " | 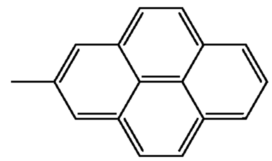 | Ph |
| H-11-313 | " | 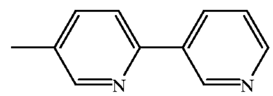  | Ph |
| H-11-314 | 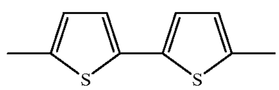  | 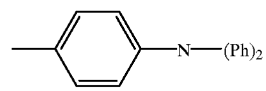  | Ph |
| H-11-315 | " | 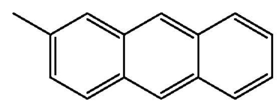 | Ph |
| H-11-316 | " | 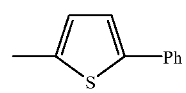  | Ph |
| H-11-317 | " | 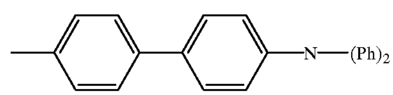  | Ph |
| H-11-318 | " | 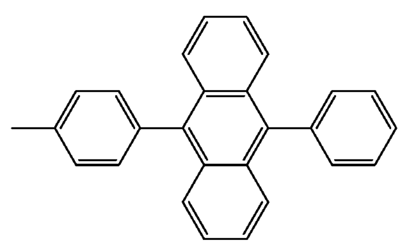 | Ph |
| H-11-401 | 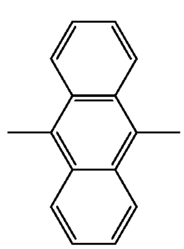 | Ph | Ph |
| H-11-402 | " | o-biphenylyl | Ph |
| H-11-403 | " | m-biphenylyl | Ph |
| H-11-404 | " | p-biphenylyl | Ph |

-continued
(H-11)
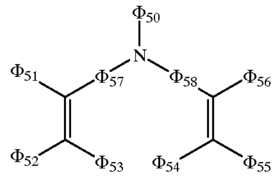
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-405 | " | 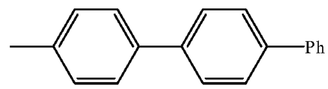 | Ph |
| H-11-406 | " | 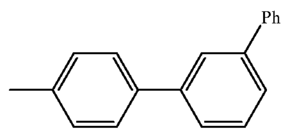 | Ph |
| H-11-407 | " | 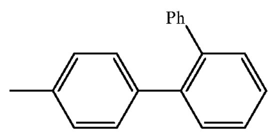 | Ph |
| H-11-408 | " | 2-naphthyl | Ph |
| H-11-409 | " | 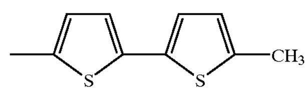 | Ph |
| H-11-410 | " | 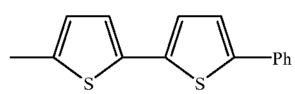 | Ph |
| H-11-411 | " | 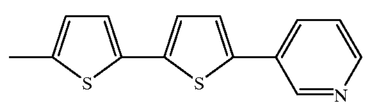 | Ph |
| H-11-412 | " | 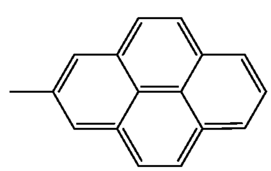 | Ph |
| H-11-413 | " | 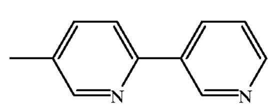 | Ph |
| H-11-414 | 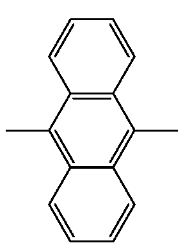 | 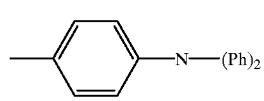 | Ph |

-continued
(H-11)
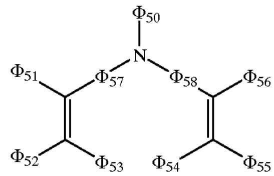
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-415 | " | 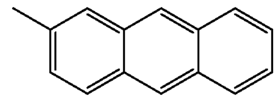 | Ph |
| H-11-416 | " | 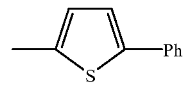  | Ph |
| H-11-417 | " | 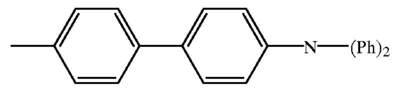  | Ph |
| H-11-418 | " | 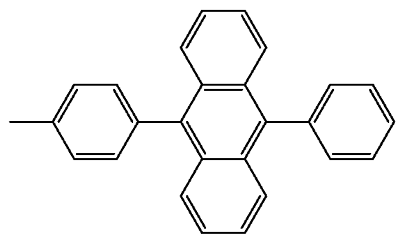 | Ph |
| H-11-419 | 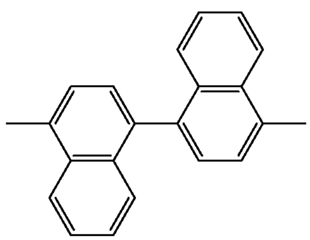 | Ph | Ph |
| H-11-420 | 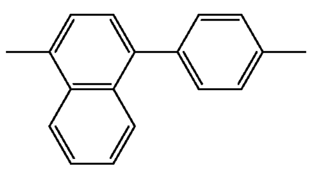 | Ph | Ph |
| H-11-501 | 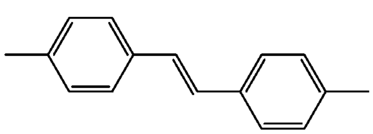 | Ph | Ph |
| H-11-502 | " | o-biphenylyl | Ph |
| H-11-503 | " | m-biphenylyl | Ph |
| H-11-504 | " | p-biphenylyl | Ph |
| H-11-505 | " | 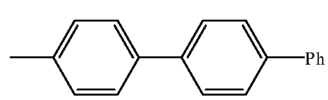  | Ph |

-continued
(H-11)
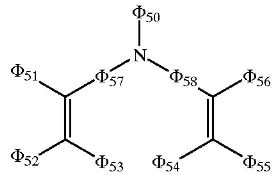
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-506 | " | 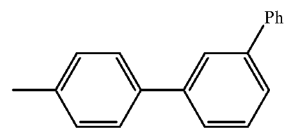 | Ph |
| H-11-507 | " | 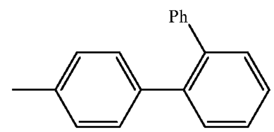 | Ph |
| H-11-508 | " | 2-naphthyl | Ph |
| H-11-509 | " | 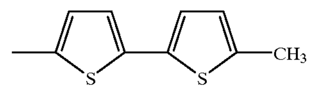 | Ph |
| H-11-510 | " | 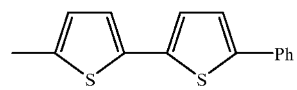 | Ph |
| H-11-511 | " | 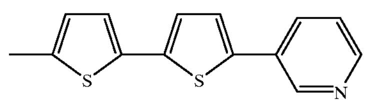 | Ph |
| H-11-512 | " | 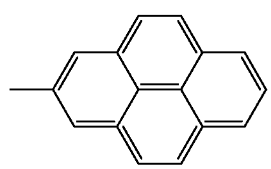 | Ph |
| H-11-513 | " | 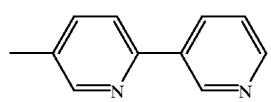 | Ph |
| H-11-514 | 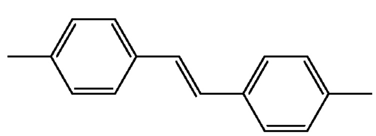 | 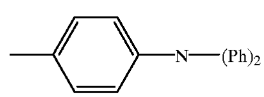 | Ph |
| H-11-515 | " | 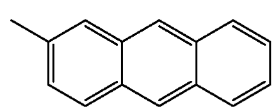 | Ph |
| H-11-516 | " | 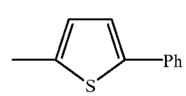 | Ph |

-continued
(H-11)
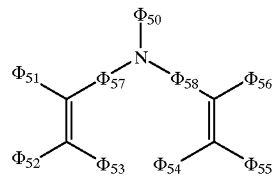
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-517 | " | 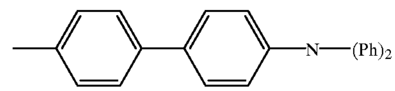 | Ph |
| H-11-518 | " | 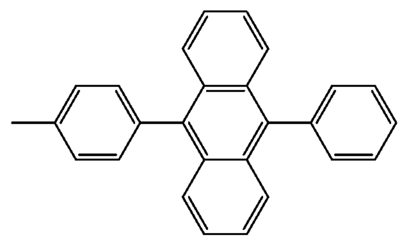 | Ph |
| H-11-601 | 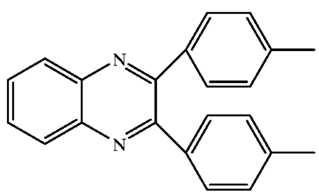 | Ph | Ph |
| H-11-602 | " | o-biphenylyl | Ph |
| H-11-603 | " | m-biphenylyl | Ph |
| H-11-604 | " | p-biphenylyl | Ph |
| H-11-605 | " | 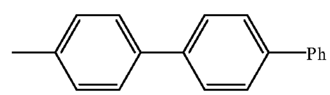 | Ph |
| H-11-606 | " | 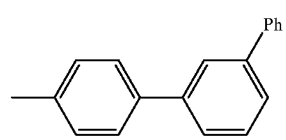 | Ph |
| H-11-607 | " | 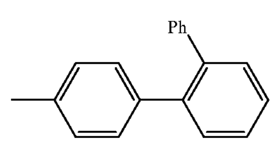 | Ph |
| H-11-608 | " | 2-naphthyl | Ph |
| H-11-609 | " | 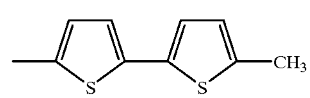 | Ph |
| H-11-610 | " | 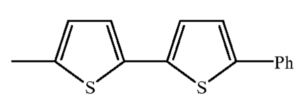 | Ph |

-continued
(H-11)
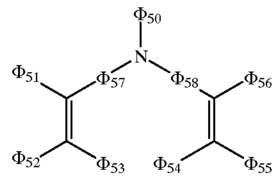
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
| --- | --- | --- | --- |
| H-11-611 | " | 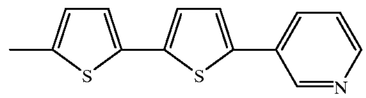 | Ph |
| H-11-612 | " | 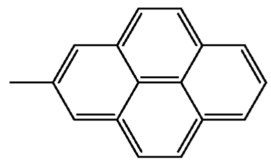 | Ph |
| H-11-613 | " | 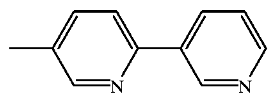 | Ph |
| H-11-614 | 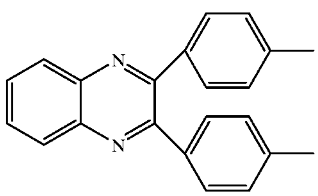 | 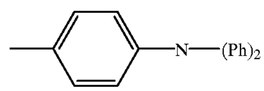 | Ph |
| H-11-615 | " | 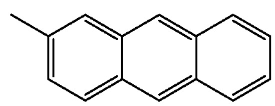 | Ph |
| H-11-616 | " | 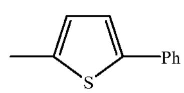 | Ph |
| H-11-617 | " | 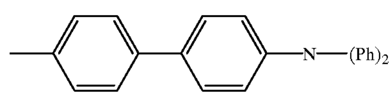 | Ph |
| H-11-618 | " | 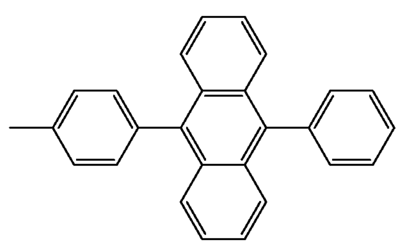 | Ph |

-continued
(H-11)
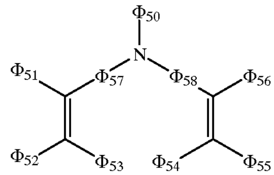
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-701 | 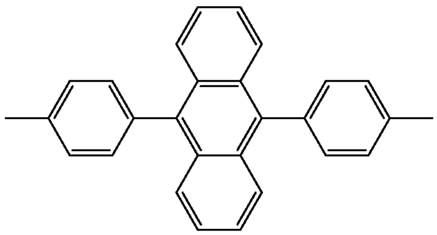 | Ph | Ph |
| H-11-702 | " | o-biphenylyl | Ph |
| H-11-703 | " | m-biphenylyl | Ph |
| H-11-704 | " | p-biphenylyl | Ph |
| H-11-705 | " | 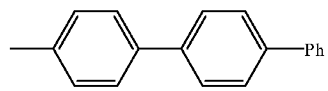 | Ph |
| H-11-706 | " | 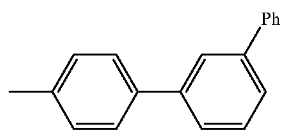 | Ph |
| H-11-707 | " | 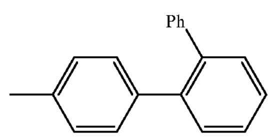 | Ph |
| H-11-708 | " | 2-naphthyl | Ph |
| H-11-709 | " | 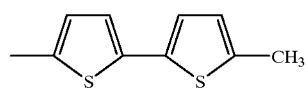 | Ph |
| H-11-710 | " | 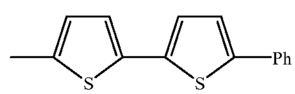 | Ph |
| H-11-711 | " | 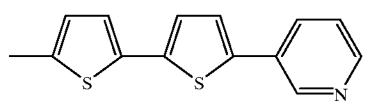 | Ph |
| H-11-712 | " | 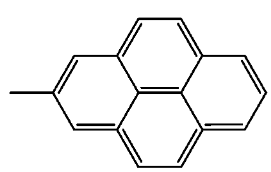 | Ph |

-continued
(H-11)
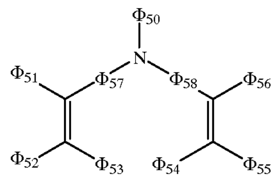
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-713 | " | 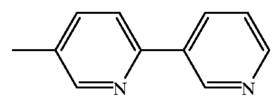 | Ph |
| H-11-714 | 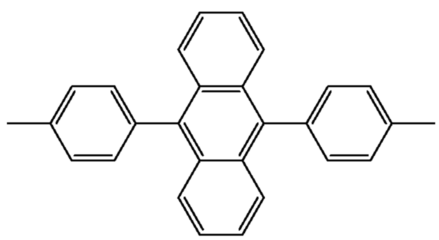 | 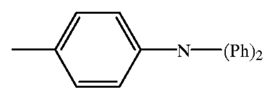 | Ph |
| H-11-715 | " | 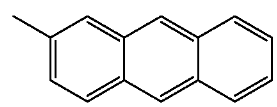 | Ph |
| H-11-716 | " | 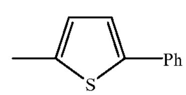 | Ph |
| H-11-717 | " | 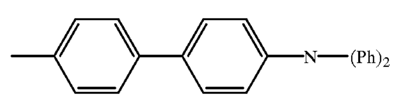 | Ph |
| H-11-718 | " | 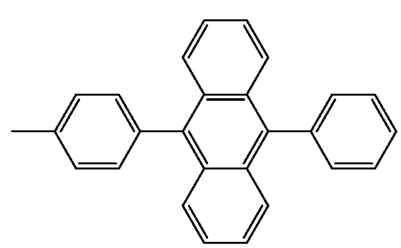 | Ph |

-continued
(H-11)
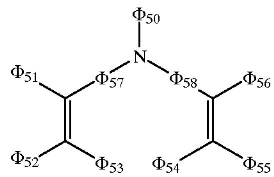
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-801 | 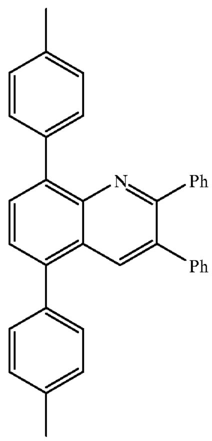 | Ph | Ph |
| H-11-802 | " | o-biphenylyl | Ph |
| H-11-803 | " | m-biphenylyl | Ph |
| H-11-804 | " | p-biphenylyl | Ph |
| H-11-805 | " | 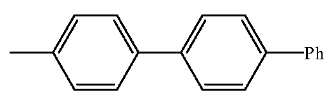 | Ph |
| H-11-806 | " | 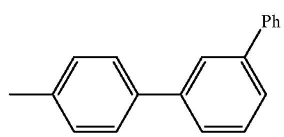 | Ph |
| H-11-807 | " | 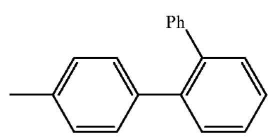 | Ph |
| H-11-808 | " | 2-naphthyl | Ph |
| H-11-809 | " | 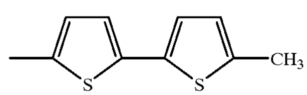 | Ph |
| H-11-810 | " | 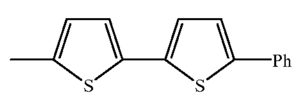 | Ph |
| H-11-811 | " | 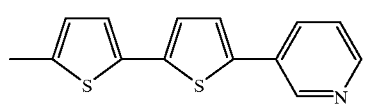 | Ph |

-continued
(H-11)
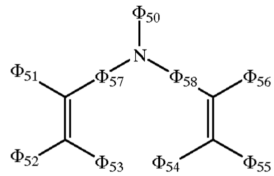
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-812 | " | 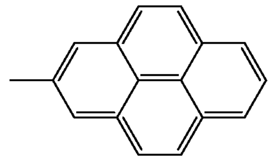 | Ph |
| H-11-813 | " | 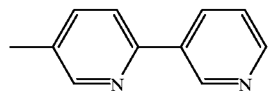 | Ph |
| H-11-814 | 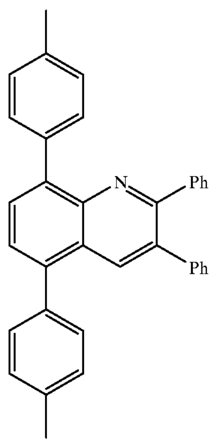 | 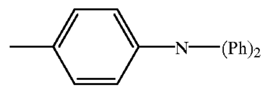 | Ph |
| H-11-815 | " | 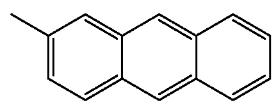 | Ph |
| H-11-816 | " | 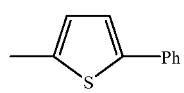 | Ph |
| H-11-817 | " | 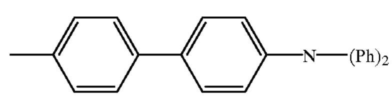 | Ph |
| H-11-818 | " | 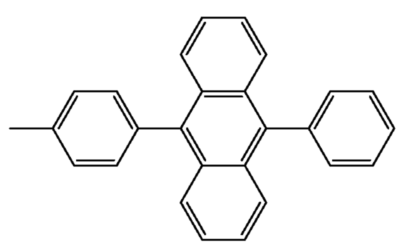 | Ph |

-continued
(H-11)
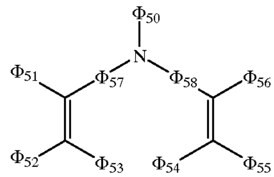
| Compound | $\Phi_{57}$–$\Phi_{58}$ | $\Phi_{50}$, $\Phi_{52}$, $\Phi_{55}$ | $\Phi_{51}$, $\Phi_{53}$, $\Phi_{54}$, $\Phi_{56}$ |
|---|---|---|---|
| H-11-819 | 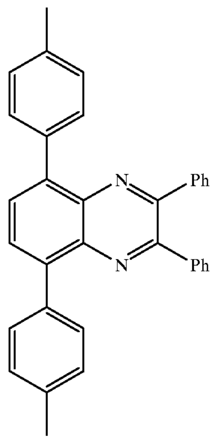 | Ph | Ph |
(H-12)
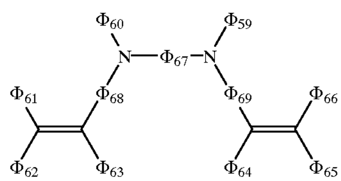
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-1 | 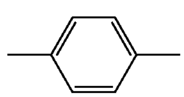 | Ph | same | Ph | Ph |
| H-12-2 | " | o-biphenylyl | same | Ph | Ph |
| H-12-3 | " | m-biphenylyl | same | Ph | Ph |
| H-12-4 | " | p-biphenylyl | same | Ph | Ph |
| H-12-5 | " | 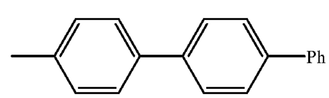 | same | Ph | Ph |
| H-12-6 | " | 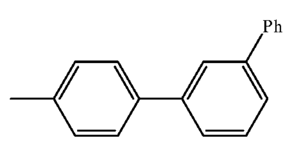 | same | Ph | Ph |

-continued
(H-12)
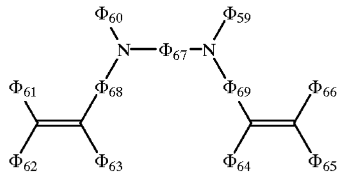
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-7 | " | 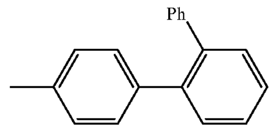 | same | Ph | Ph |
| H-12-8 | " | 2-naphthyl | same | Ph | Ph |
| H-12-9 | " | 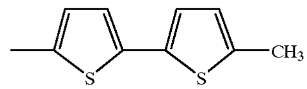 | same | Ph | Ph |
| H-12-10 | " | 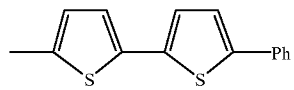 | same | Ph | Ph |
| H-12-11 | " | 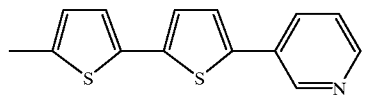 | same | Ph | Ph |
| H-12-12 | " | 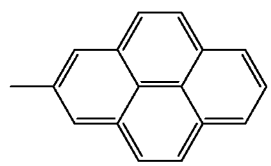 | same | Ph | Ph |
| H-12-13 | " | 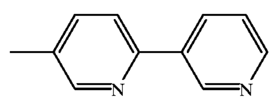 | same | Ph | Ph |
| H-12-14 | 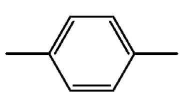 | 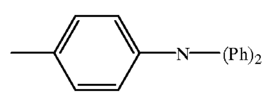 | same | Ph | Ph |
| H-12-15 | " | 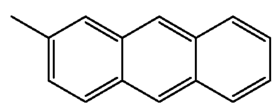 | same | Ph | Ph |
| H-12-16 | " | 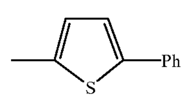 | same | Ph | Ph |
| H-12-17 | " | 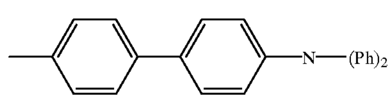 | same | Ph | Ph |

-continued
(H-12)
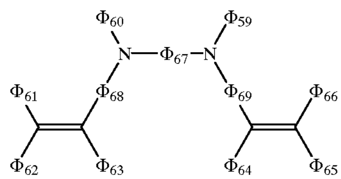
| (H-12) Compound | $\Phi_{67}$–$\Phi_{69}$ | $\Phi_{59}$ | $\Phi_{60}$ | $\Phi_{61}$– $\Phi_{63}$ | $\Phi_{64}$– $\Phi_{66}$ |
|---|---|---|---|---|---|
| H-12-18 | " | 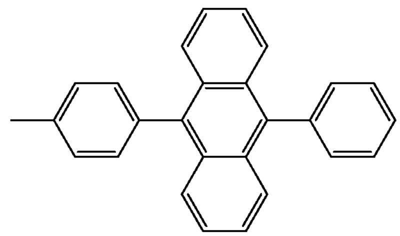 | same | Ph | Ph |
| H-12-101 | 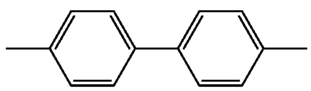 | Ph | same | Ph | Ph |
| H-12-102 | " | o-biphenylyl | same | Ph | Ph |
| H-12-103 | " | m-biphenylyl | same | Ph | Ph |
| H-12-104 | " | p-biphenylyl | same | Ph | Ph |
| H-12-105 | " | 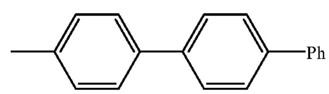 | same | Ph | Ph |
| H-12-106 | " | 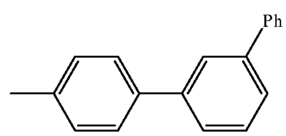 | same | Ph | Ph |
| H-12-107 | " | 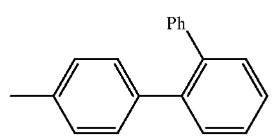 | same | Ph | Ph |
| H-12-108 | " | 2-naphthyl | same | Ph | Ph |
| H-12-109 | " | 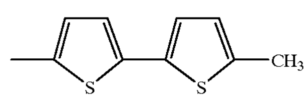 | same | Ph | Ph |
| H-12-110 | " | 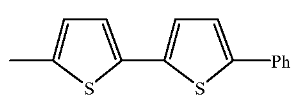 | same | Ph | Ph |
| H-12-111 | " | 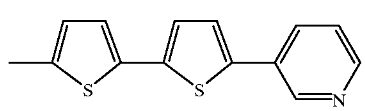 | same | Ph | Ph |

-continued
(H-12)
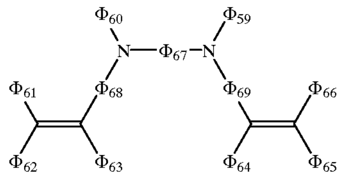
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-112 | " | 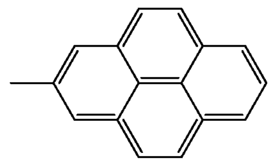 | same | Ph | Ph |
| H-12-113 | " | 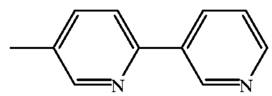 | same | Ph | Ph |
| H-12-114 | 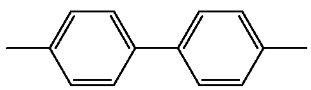 | 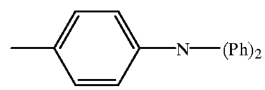 | same | Ph | Ph |
| H-12-115 | " | 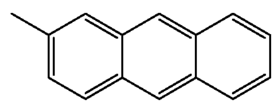 | same | Ph | Ph |
| H-12-116 | " | 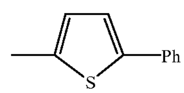 | same | Ph | Ph |
| H-12-117 | " | 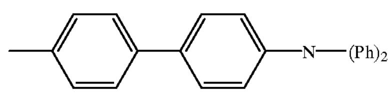 | same | Ph | Ph |
| H-12-118 | " | 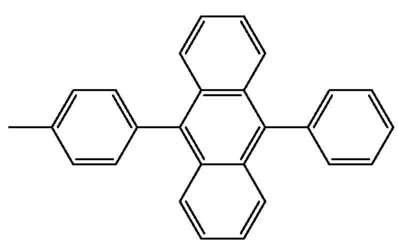 | same | Ph | Ph |
| H-12-201 | 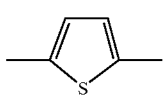 | Ph | same | Ph | Ph |
| H-12-202 | " | o-biphenylyl | same | Ph | Ph |
| H-12-203 | " | m-biphenylyl | same | Ph | Ph |
| H-12-204 | " | p-biphenylyl | same | Ph | Ph |
| H-12-205 | " | 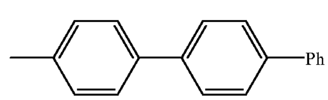 | same | Ph | Ph |

-continued
(H-12)
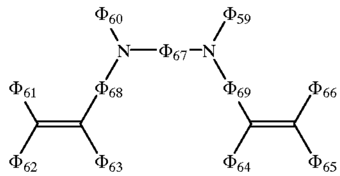
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-206 | " | 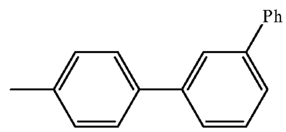 | same | Ph | Ph |
| H-12-207 | " | 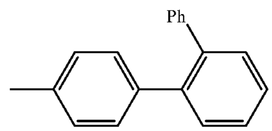 | same | Ph | Ph |
| H-12-208 | " | 2-naphthyl | same | Ph | Ph |
| H-12-209 | " | 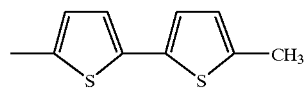 | same | Ph | Ph |
| H-12-210 | " | 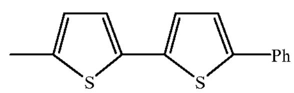 | same | Ph | Ph |
| H-12-211 | " | 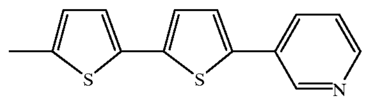 | same | Ph | Ph |
| H-12-212 | " | 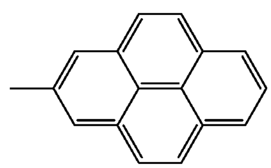 | same | Ph | Ph |
| H-12-213 | " | 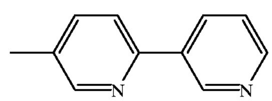 | same | Ph | Ph |
| H-12-214 | 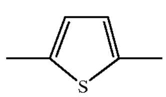 | 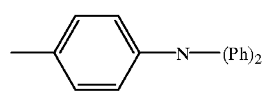 | same | Ph | Ph |
| H-12-215 | " | 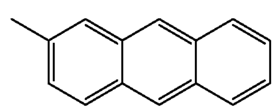 | same | Ph | Ph |
| H-12-216 | " | 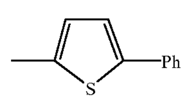 | same | Ph | Ph |

-continued
(H-12)
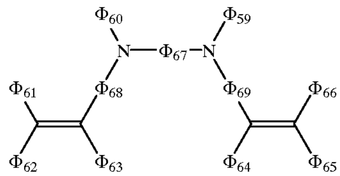
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-217 | " | 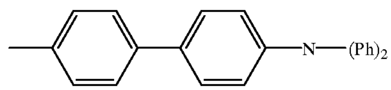 | same | Ph | Ph |
| H-12-218 | " | 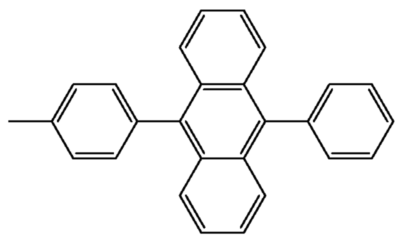 | same | Ph | Ph |
| H-12-301 | 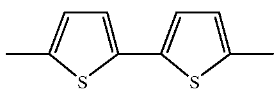 | Ph | same | Ph | Ph |
| H-12-302 | " | o-biphenylyl | same | Ph | Ph |
| H-12-303 | " | m-biphenylyl | same | Ph | Ph |
| H-12-304 | " | p-biphenylyl | same | Ph | Ph |
| H-12-305 | " | 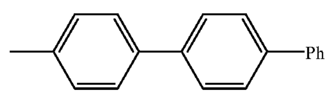 | same | Ph | Ph |
| H-12-306 | " | 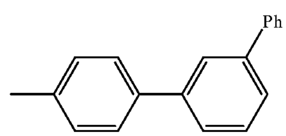 | same | Ph | Ph |
| H-12-307 | " | 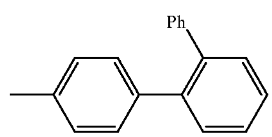 | same | Ph | Ph |
| H-12-308 | " | 2-naphthyl | same | Ph | Ph |
| H-12-309 | " | 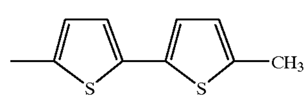 | same | Ph | Ph |
| H-12-310 | " | 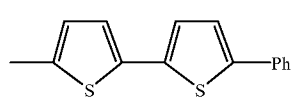 | same | Ph | Ph |
| H-12-311 | " | 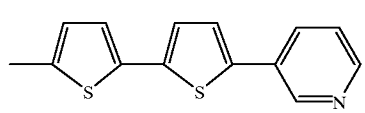 | same | Ph | Ph |

-continued
(H-12)
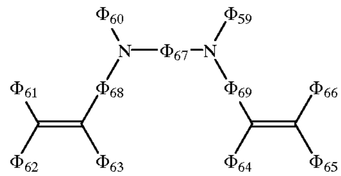
| (H-12) Compound | $\Phi_{67}$–$\Phi_{69}$ | $\Phi_{59}$ | $\Phi_{60}$ | $\Phi_{61}$– $\Phi_{63}$ | $\Phi_{64}$– $\Phi_{66}$ |
|---|---|---|---|---|---|
| H-12-312 | " | 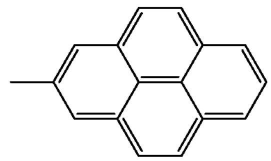 | same | Ph | Ph |
| H-12-313 | " | 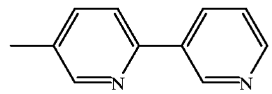 | same | Ph | Ph |
| H-12-314 | 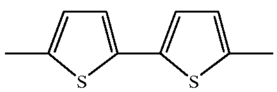 | 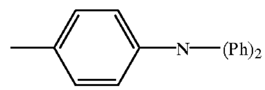 | Ph | Ph | Ph |
| H-12-315 | " | 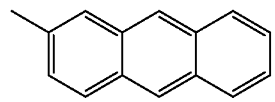 | Ph | Ph | Ph |
| H-12-316 | " | 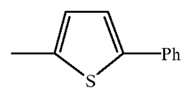 | Ph | Ph | Ph |
| H-12-317 | " | 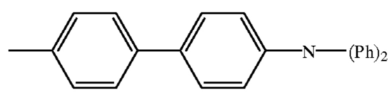 | Ph | Ph | Ph |
| H-12-318 | " | 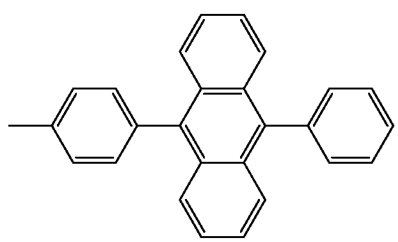 | Ph | Ph | Ph |
| H-12-401 | 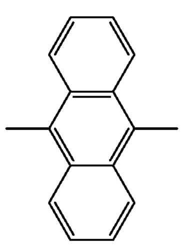 | Ph | same | Ph | Ph |
| H-12-402 | " | o-biphenylyl | same | Ph | Ph |
| H-12-403 | " | m-biphenylyl | same | Ph | Ph |

-continued
(H-12)
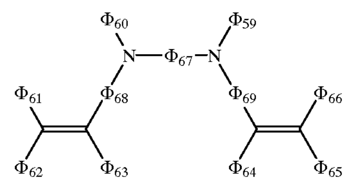
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-404 | " | p-biphenylyl | same | Ph | Ph |
| H-12-405 | " | 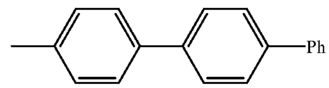 | same | Ph | Ph |
| H-12-406 | " | 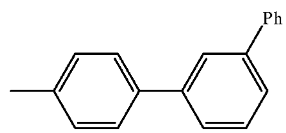 | same | Ph | Ph |
| H-12-407 | " | 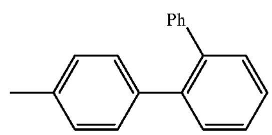 | same | Ph | Ph |
| H-12-408 | " | 2-naphthyl | same | Ph | Ph |
| H-12-409 | " | 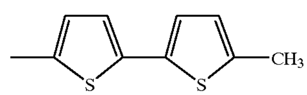 | same | Ph | Ph |
| H-12-410 | " | 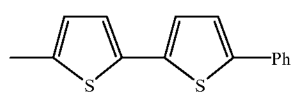 | same | Ph | Ph |
| H-12-411 | " | 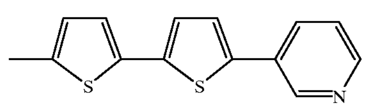 | same | Ph | Ph |
| H-12-412 | " | 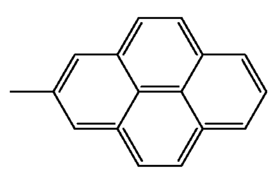 | same | Ph | Ph |
| H-12-413 | " | 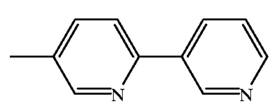 | same | Ph | Ph |

-continued
(H-12)
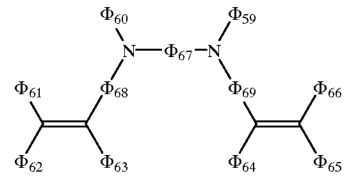
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-414 | 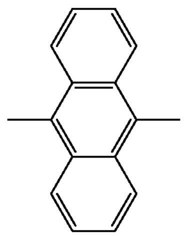 | 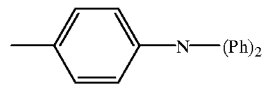  | same | Ph | Ph |
| H-12-415 | " | 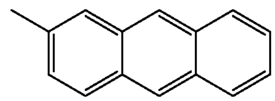 | same | Ph | Ph |
| H-12-416 | " | 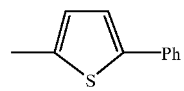  | same | Ph | Ph |
| H-12-417 | " | 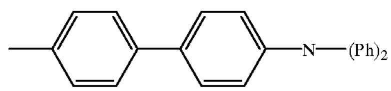  | same | Ph | Ph |
| H-12-418 | " | 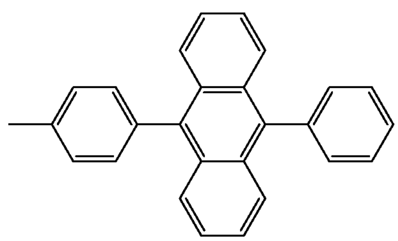 | same | Ph | Ph |
| H-12-501 | 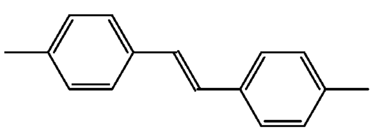 | Ph | same | Ph | Ph |
| H-12-502 | " | o-biphenylyl | same | Ph | Ph |
| H-12-503 | " | m-biphenylyl | same | Ph | Ph |
| H-12-504 | " | p-biphenylyl | same | Ph | Ph |
| H-12-505 | " | 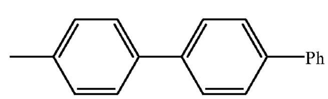  | same | Ph | Ph |
| H-12-506 | " | 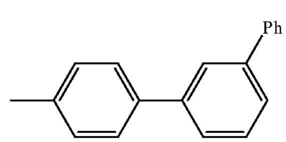  | same | Ph | Ph |

-continued
(H-12)
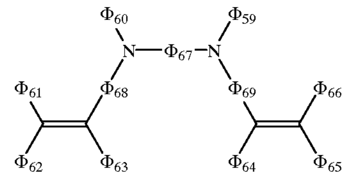
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-507 | " | 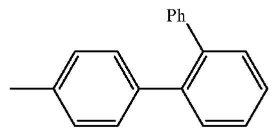 | same | Ph | Ph |
| H-12-508 | " | 2-naphthyl | same | Ph | Ph |
| H-12-509 | " | 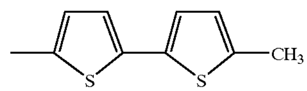 | same | Ph | Ph |
| H-12-510 | " | 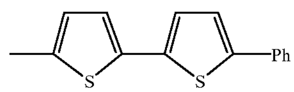 | same | Ph | Ph |
| H-12-511 | " | 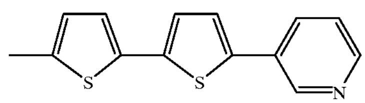 | same | Ph | Ph |
| H-12-512 | " | 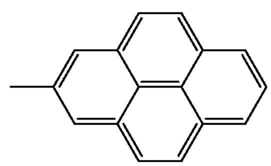 | same | Ph | Ph |
| H-12-513 | " | 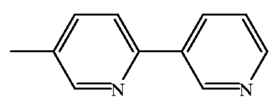 | same | Ph | Ph |
| H-12-514 | 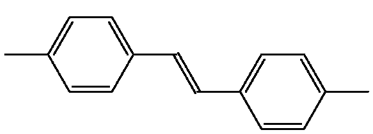 | 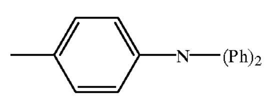 | Ph | Ph | Ph |
| H-12-515 | " | 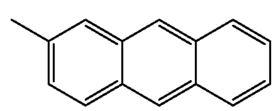 | Ph | Ph | Ph |
| H-12-516 | " | 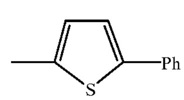 | Ph | Ph | Ph |
| H-12-517 | " | 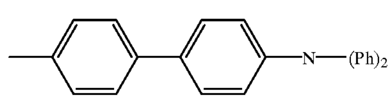 | Ph | Ph | Ph |

-continued
(H-12)
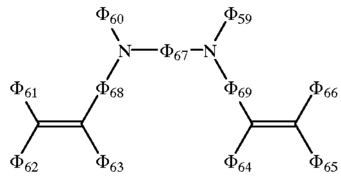
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-518 | " | 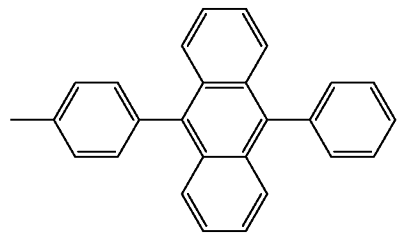 | Ph | Ph | Ph |
| H-12-601 | 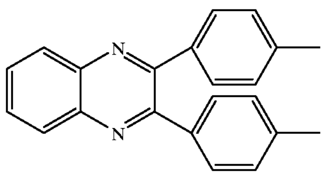 | Ph | same | Ph | Ph |
| H-12-602 | " | o-biphenylyl | same | Ph | Ph |
| H-12-603 | " | m-biphenylyl | same | Ph | Ph |
| H-12-604 | " | p-biphenylyl | same | Ph | Ph |
| H-12-605 | " | 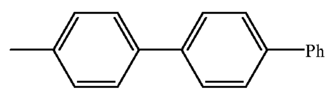 | same | Ph | Ph |
| H-12-606 | " | 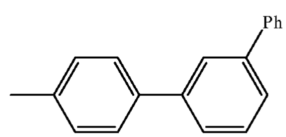 | same | Ph | Ph |
| H-12-607 | " | 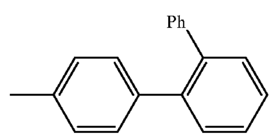 | same | Ph | Ph |
| H-12-608 | " | 2-naphthyl | same | Ph | Ph |
| H-12-609 | " | 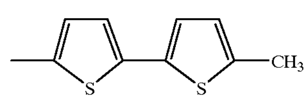 | same | Ph | Ph |
| H-12-610 | " | 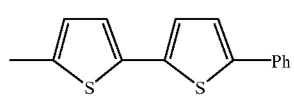 | same | Ph | Ph |
| H-12-611 | " | 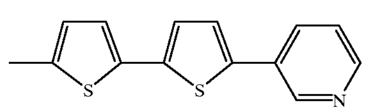 | same | Ph | Ph |

-continued
(H-12)
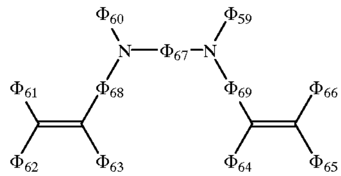
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-612 | " | 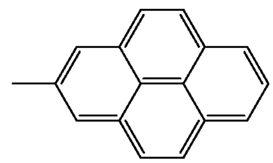 | same | Ph | Ph |
| H-12-613 | " | 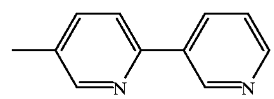 | same | Ph | Ph |
| H-12-614 | 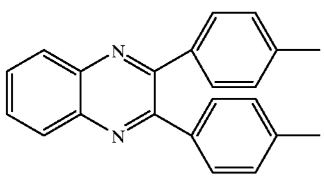 | 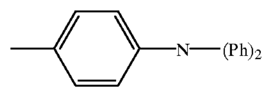 | same | Ph | Ph |
| H-12-615 | " | 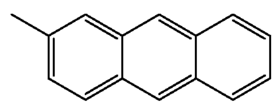 | same | Ph | Ph |
| H-12-616 | " | 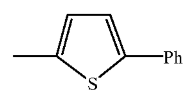 | same | Ph | Ph |
| H-12-617 | " | 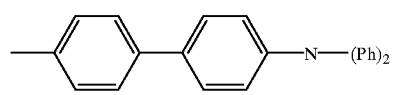 | same | Ph | Ph |
| H-12-618 | " | 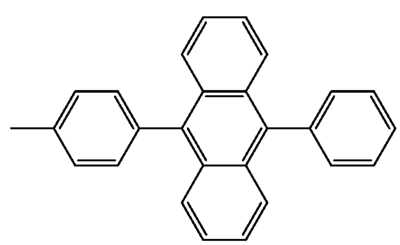 | same | Ph | Ph |
| H-12-701 | 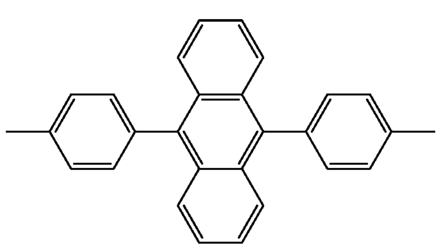 | Ph | same | Ph | Ph |

-continued
(H-12)
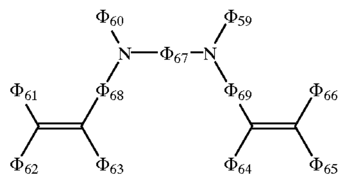
| (H-12) Compound | $\Phi_{67}$–$\Phi_{69}$ | $\Phi_{59}$ | $\Phi_{60}$ | $\Phi_{61}$– $\Phi_{63}$ | $\Phi_{64}$– $\Phi_{66}$ |
|---|---|---|---|---|---|
| H-12-702 | " | o-biphenylyl | same | Ph | Ph |
| H-12-703 | " | m-biphenylyl | same | Ph | Ph |
| H-12-704 | " | p-biphenylyl | same | Ph | Ph |
| H-12-705 | " | 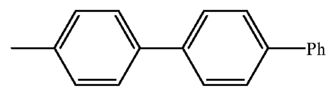  | same | Ph | Ph |
| H-12-706 | " | 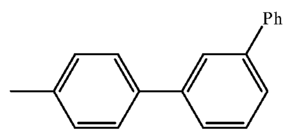  | same | Ph | Ph |
| H-12-707 | " | 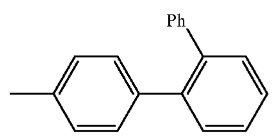  | same | Ph | Ph |
| H-12-708 | " | 2-naphthyl | same | Ph | Ph |
| H-12-709 | " | 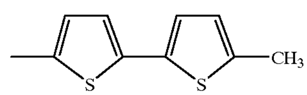  | same | Ph | Ph |
| H-12-710 | " | 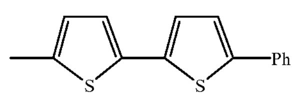  | same | Ph | Ph |
| H-12-711 | " | 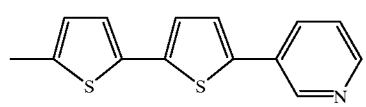  | same | Ph | Ph |
| H-12-712 | " | 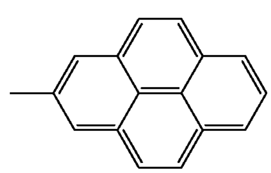 | same | Ph | Ph |
| H-12-713 | " | 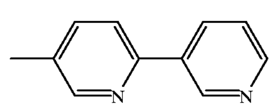  | same | Ph | Ph |

-continued
(H-12)
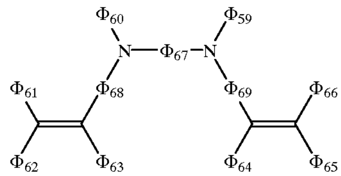
| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-714 | 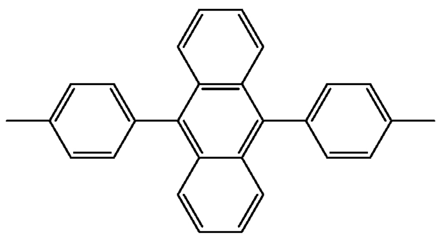 | 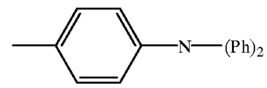 | same | Ph | Ph |
| H-12-715 | " | 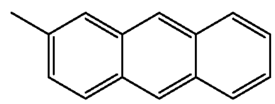 | same | Ph | Ph |
| H-12-716 | " | 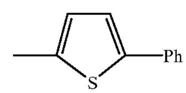 | same | Ph | Ph |
| H-12-717 | " | 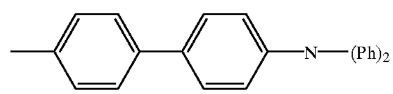 | same | Ph | Ph |
| H-12-718 | " | 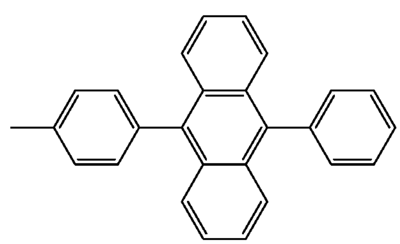 | same | Ph | Ph |
| H-12-801 | 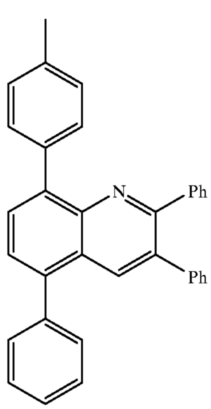 | Ph | same | Ph | Ph |
| H-12-802 | " | o-biphenylyl | same | Ph | Ph |
| H-12-803 | " | m-biphenylyl | same | Ph | Ph |
| H-12-804 | " | p-biphenylyl | same | Ph | Ph |

-continued
(H-12)
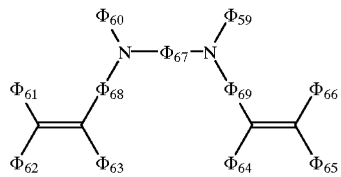
| (H-12) Compound | $\Phi_{67}$–$\Phi_{69}$ | $\Phi_{59}$ | $\Phi_{60}$ | $\Phi_{61}$– $\Phi_{63}$ | $\Phi_{64}$– $\Phi_{66}$ |
|---|---|---|---|---|---|
| H-12-805 | " | 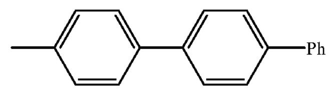 | same | Ph | Ph |
| H-12-806 | " | 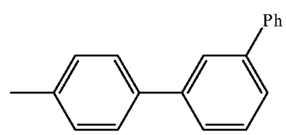 | same | Ph | Ph |
| H-12-807 | " | 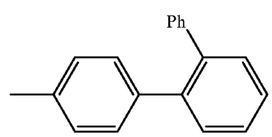 | same | Ph | Ph |
| H-12-808 | " | 2-naphthyl | same | Ph | Ph |
| H-12-809 | " | 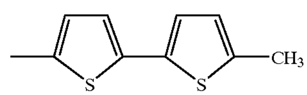 | same | Ph | Ph |
| H-12-810 | " | 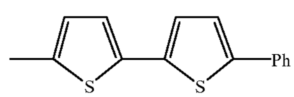 | same | Ph | Ph |
| H-12-811 | " | 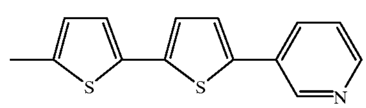 | same | Ph | Ph |
| H-12-812 | " | 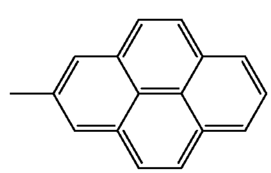 | same | Ph | Ph |
| H-12-813 | " | 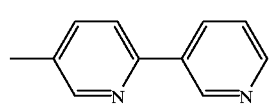 | same | Ph | Ph |

-continued
(H-12)
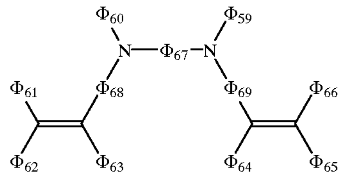
| (H-12) Compound | $\Phi_{67}$–$\Phi_{69}$ | $\Phi_{59}$ | $\Phi_{60}$ | $\Phi_{61}$– $\Phi_{63}$ | $\Phi_{64}$– $\Phi_{66}$ |
|---|---|---|---|---|---|
| H-12-814 | 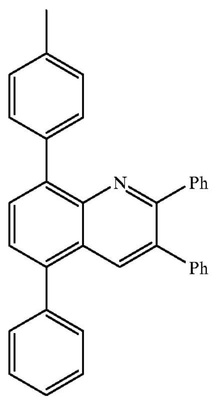 | 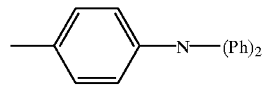 | same | Ph | Ph |
| H-12-815 | " | 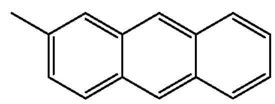 | same | Ph | Ph |
| H-12-816 | " | 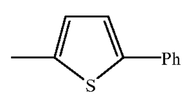 | same | Ph | Ph |
| H-12-817 | " | 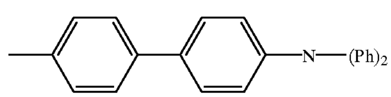 | same | Ph | Ph |
| H-12-818 | " | 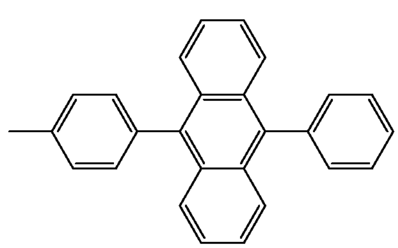 | same | Ph | Ph |

-continued (H-12)

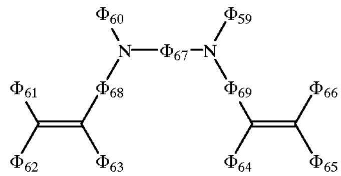

| (H-12) Compound | $\Phi_{67}$–$\Phi_{69}$ | $\Phi_{59}$ | $\Phi_{60}$ | $\Phi_{61}$–$\Phi_{63}$ | $\Phi_{64}$–$\Phi_{66}$ |
|---|---|---|---|---|---|
| H-12-819 | 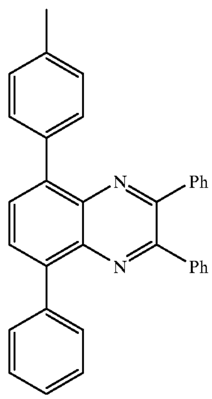 | Ph | Ph | Ph | Ph |

On the other hand, the electron transporting host materials which are electron injecting and transporting compounds are preferably the aforementioned quinolinolato metal complexes.

Exemplary electron transporting host materials are give. below although some are embraced in or overlap with the aforementioned compounds. The following examples are expressed by a combination of Φ's in formulae (E-1) to (E-14).

(E-1)

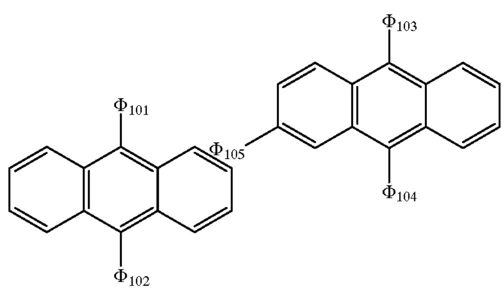

| Compound | $\Phi_{105}$ | $\Phi_{101}$ | $\Phi_{102}$ | $\Phi_{103}$ | $\Phi_{104}$ |
|---|---|---|---|---|---|
| E-1-1 | 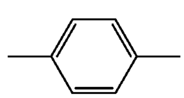 | Ph | same | same | same |
| E-1-2 | " | o-biphenylyl | same | same | same |
| E-1-3 | " | m-biphenylyl | same | same | same |
| E-1-4 | " | p-biphenylyl | same | same | same |
| E-1-5 | " | 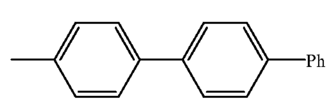 | same | same | same |

-continued
(E-1)
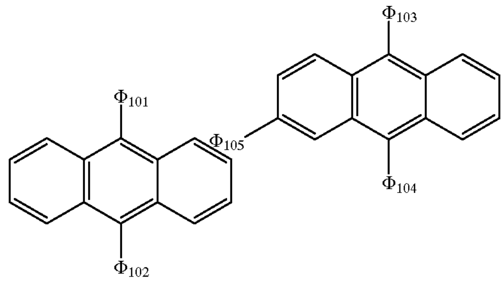
| Compound | $\Phi_{105}$ | $\Phi_{101}$ | $\Phi_{102}$ | $\Phi_{103}$ | $\Phi_{104}$ |
|---|---|---|---|---|---|
| E-1-6 | " | 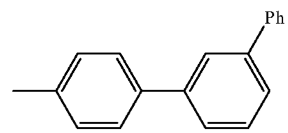 | same | same | same |
| E-1-7 | " | 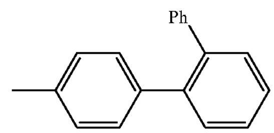 | same | same | same |
| E-1-8 | " | 2-naphthyl | same | same | same |
| E-1-9 | " | 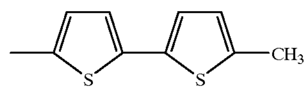 | same | same | same |
| E-1-10 | " | 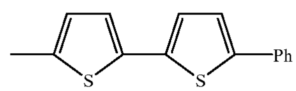 | same | same | same |
| E-1-11 | " | 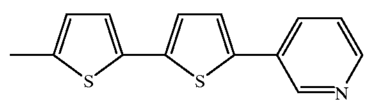 | same | same | same |
| E-1-12 | " | 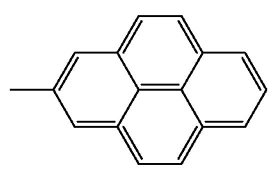 | same | same | same |
| E-1-13 | " | 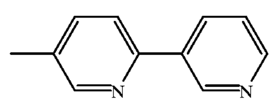 | same | same | same |
| E-1-14 | 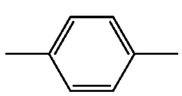 | 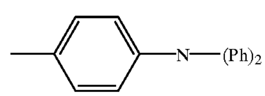 | same | same | same |
| E-1-15 | " | 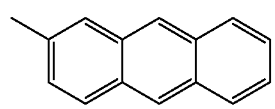 | same | same | same |

-continued
(E-1)
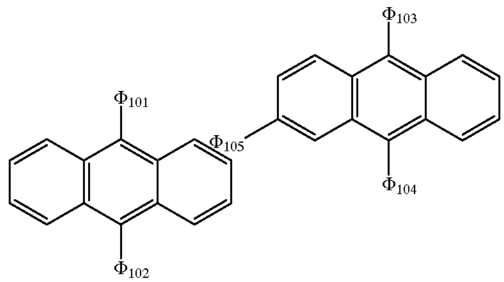
| Compound | $\Phi_{105}$ | $\Phi_{101}$ | $\Phi_{102}$ | $\Phi_{103}$ | $\Phi_{104}$ |
|---|---|---|---|---|---|
| E-1-16 | " | 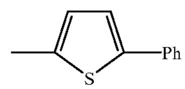 | same | same | same |
| E-1-17 | " | 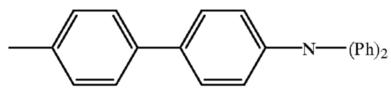 | same | same | same |
| E-1-18 | " | 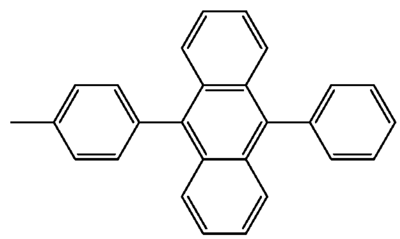 | same | same | same |
| E-1-19 | " | Ph | H | Ph | H |
| E-1-101 | 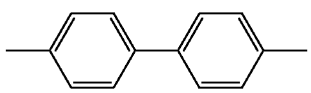 | Ph | same | same | same |
| E-1-102 | " | o-biphenylyl | same | same | same |
| E-1-103 | " | m-biphenylyl | same | same | same |
| E-1-104 | " | p-biphenylyl | same | same | same |
| E-1-105 | " | 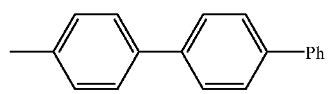 | same | same | same |
| E-1-106 | " | 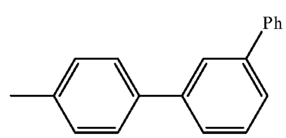 | same | same | same |
| E-1-107 | " | 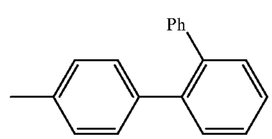 | same | same | same |
| E-1-108 | " | 2-naphthyl | same | same | same |
| E-1-109 | " | 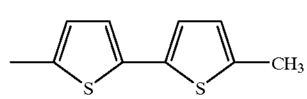 | same | same | same |

-continued
(E-1)
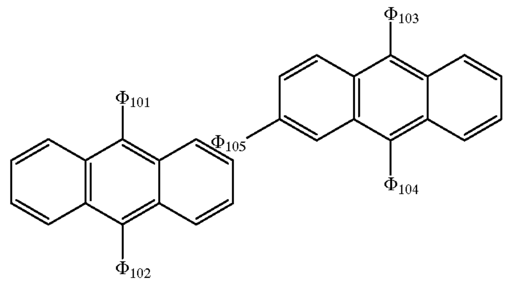
| Compound | $\Phi_{105}$ | $\Phi_{101}$ | $\Phi_{102}$ | $\Phi_{103}$ | $\Phi_{104}$ |
|---|---|---|---|---|---|
| E-1-110 | " | 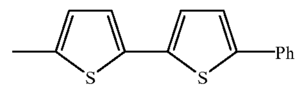 | same | same | same |
| E-1-111 | " | 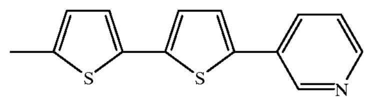 | same | same | same |
| E-1-112 | " | 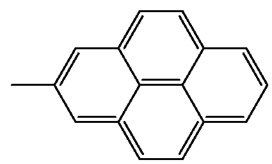 | same | same | same |
| E-1-113 | " | 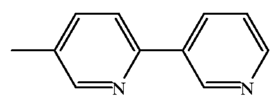 | same | same | same |
| E-1-114 | 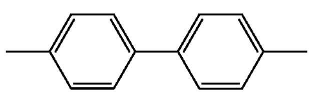 | 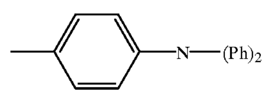 | same | same | same |
| E-1-115 | " | 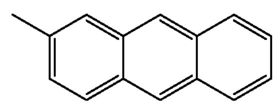 | same | same | same |
| E-1-116 | " | 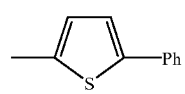 | same | same | same |
| E-1-117 | " | 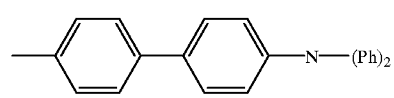 | same | same | same |
| E-1-118 | " | 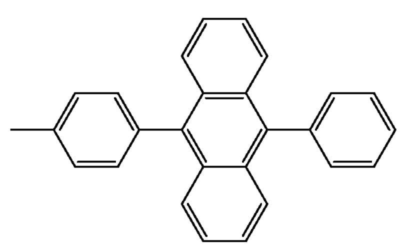 | same | same | same |

-continued
(E-1)
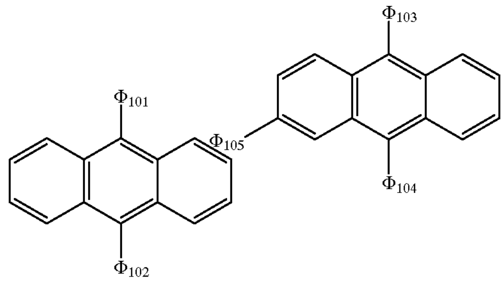
| Compound | $\Phi_{105}$ | $\Phi_{101}$ | $\Phi_{102}$ | $\Phi_{103}$ | $\Phi_{104}$ |
|---|---|---|---|---|---|
| E-1-119 | " | Ph | H | Ph | H |
| E-1-201 | 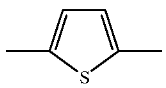  | Ph | same | same | same |
| E-1-202 | " | o-biphenylyl | same | same | same |
| E-1-203 | " | m-biphenylyl | same | same | same |
| E-1-204 | " | p-biphenylyl | same | same | same |
| E-1-205 | " | 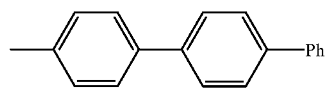  | same | same | same |
| E-1-206 | " | 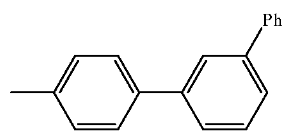  | same | same | same |
| E-1-207 | " | 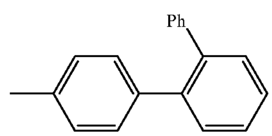  | same | same | same |
| E-1-208 | " | 2-naphthyl | same | same | same |
| E-1-209 | " | 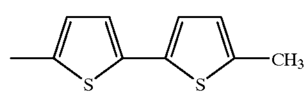  | same | same | same |
| E-1-210 | " | 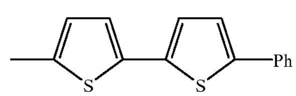  | same | same | same |
| E-1-211 | " | 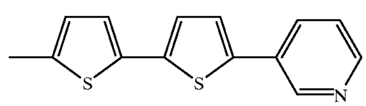  | same | same | same |
| E-1-212 | " | 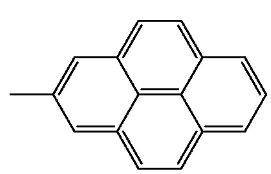 | same | same | same |

-continued
(E-1)
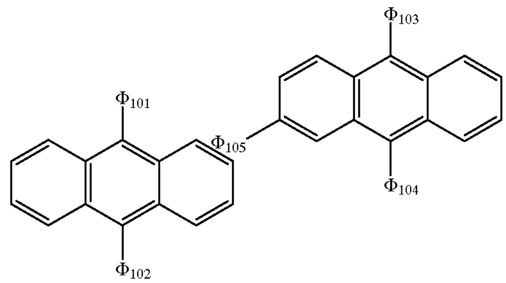
| Compound | $\Phi_{105}$ | $\Phi_{101}$ | $\Phi_{102}$ | $\Phi_{103}$ | $\Phi_{104}$ |
|---|---|---|---|---|---|
| E-1-213 | " | 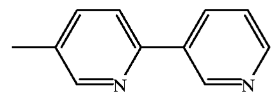 | same | same | same |
| E-1-214 | 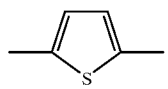 | 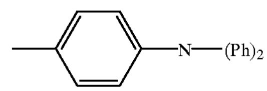 | same | same | same |
| E-1-215 | " | 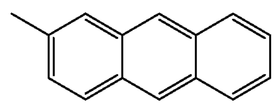 | same | same | same |
| E-1-216 | " | 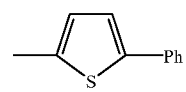 | same | same | same |
| E-1-217 | " | 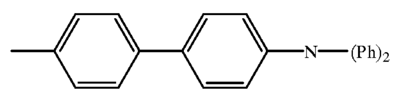 | same | same | same |
| E-1-218 | " | 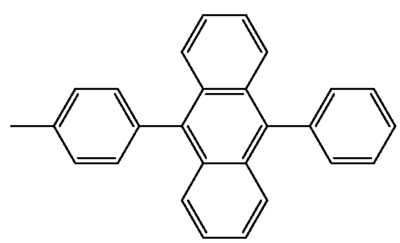 | same | same | same |
| E-1-219 | " | Ph | H | Ph | H |
| E-1-301 | 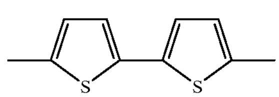 | Ph | same | same | same |
| E-1-302 | " | o-biphenylyl | same | same | same |
| E-1-303 | " | m-biphenylyl | same | same | same |
| E-1-304 | " | p-biphenylyl | same | same | same |
| E-1-305 | " | 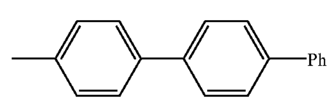 | same | same | same |

-continued
(E-1)
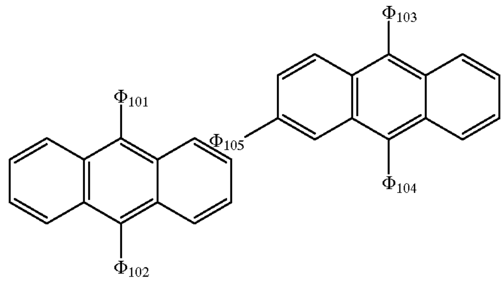
| Compound | $\Phi_{105}$ | $\Phi_{101}$ | $\Phi_{102}$ | $\Phi_{103}$ | $\Phi_{104}$ |
|---|---|---|---|---|---|
| E-1-306 | " | 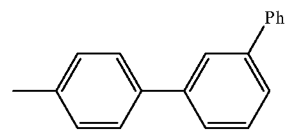 | same | same | same |
| E-1-307 | " | 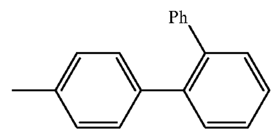 | same | same | same |
| E-1-308 | " | 2-naphthyl | same | same | same |
| E-1-309 | " | 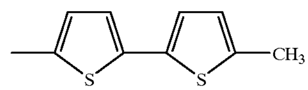 | same | same | same |
| E-1-310 | " | 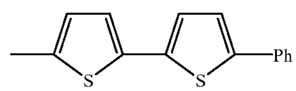 | same | same | same |
| E-1-311 | " | 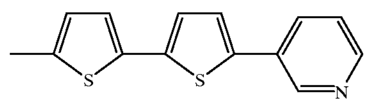 | same | same | same |
| E-1-312 | " | 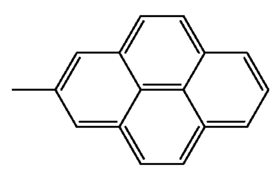 | same | same | same |
| E-1-313 | " | 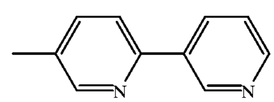 | same | same | same |
| E-1-314 | 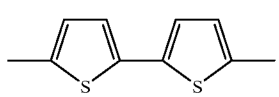 | 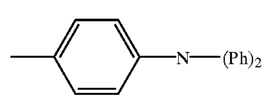 | same | same | same |
| E-1-315 | " | 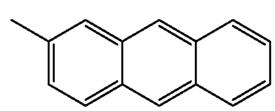 | same | same | same |

-continued
(E-1)
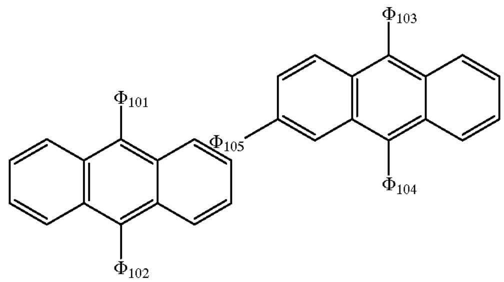
| Compound | $\Phi_{105}$ | $\Phi_{101}$ | $\Phi_{102}$ | $\Phi_{103}$ | $\Phi_{104}$ |
|---|---|---|---|---|---|
| E-1-316 | " | 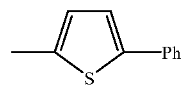 | same | same | same |
| E-1-317 | " | 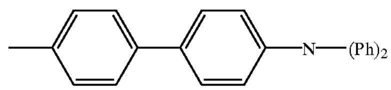 | same | same | same |
| E-1-318 | " | 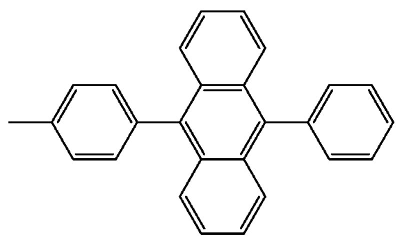 | same | same | same |
| E-1-319 | " | Ph | H | Ph | H |
| E-1-401 | 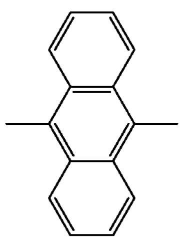 | Ph | same | same | same |
| E-1-402 | " | o-biphenylyl | same | same | same |
| E-1-403 | " | m-biphenylyl | same | same | same |
| E-1-404 | " | p-biphenylyl | same | same | same |
| E-1-405 | " | 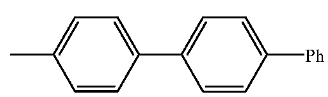 | same | same | same |
| E-1-406 | " | 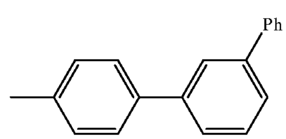 | same | same | same |
| E-1-407 | " | 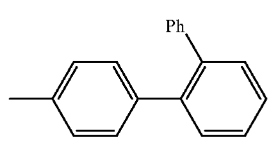 | same | same | same |

-continued
(E-1)
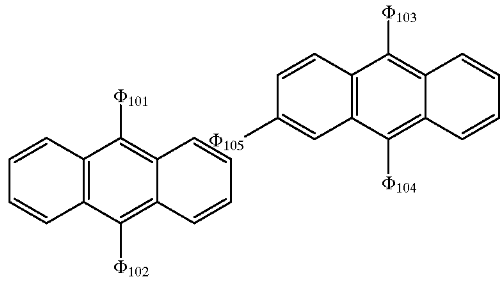
| Compound | $\Phi_{105}$ | $\Phi_{101}$ | $\Phi_{102}$ | $\Phi_{103}$ | $\Phi_{104}$ |
|---|---|---|---|---|---|
| E-1-408 | " | 2-naphthyl | same | same | same |
| E-1-409 | " | 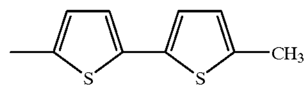 | same | same | same |
| E-1-410 | " | 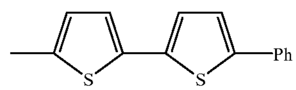 | same | same | same |
| E-1-411 | " | 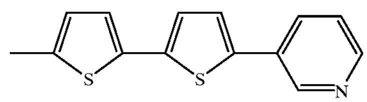 | same | same | same |
| E-1-412 | " | 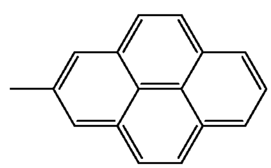 | same | same | same |
| E-1-413 | " | 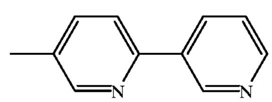 | same | same | same |
| E-1-414 | 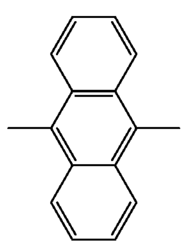 | 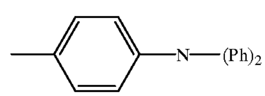 | same | same | same |
| E-1-415 | " | 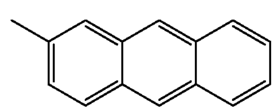 | same | same | same |
| E-1-416 | " | 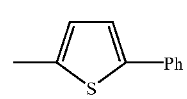 | same | same | same |

-continued
(E-1)
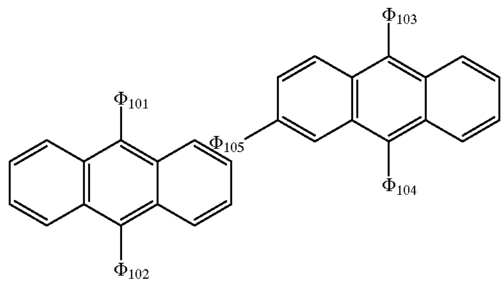
| Compound | $\Phi_{105}$ | $\Phi_{101}$ | $\Phi_{102}$ | $\Phi_{103}$ | $\Phi_{104}$ |
|---|---|---|---|---|---|
| E-1-417 | " | 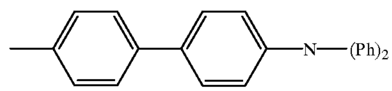 | same | same | same |
| E-1-418 | " | 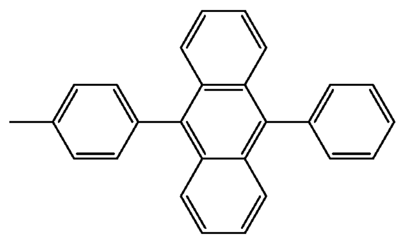 | same | same | same |
| E-1-419 | " | Ph | H | Ph | H |
| E-1-501 | 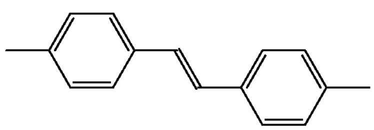 | Ph | same | same | same |
| E-1-502 | " | o-biphenylyl | same | same | same |
| E-1-503 | " | m-biphenylyl | same | same | same |
| E-1-504 | " | p-biphenylyl | same | same | same |
| E-1-505 | " | 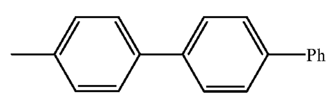 | same | same | same |
| E-1-506 | " | 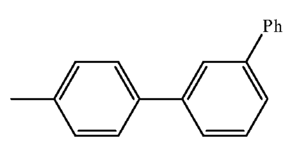 | same | same | same |
| E-1-507 | " | 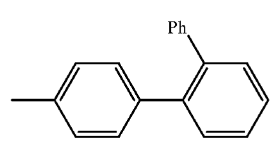 | same | same | same |
| E-1-508 | " | 2-naphthyl | same | same | same |
| E-1-509 | " | 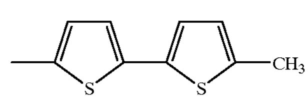 | same | same | same |

-continued
(E-1)
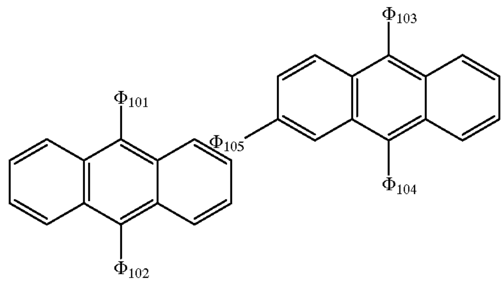
| Compound | $\Phi_{105}$ | $\Phi_{101}$ | $\Phi_{102}$ | $\Phi_{103}$ | $\Phi_{104}$ |
|---|---|---|---|---|---|
| E-1-510 | " | 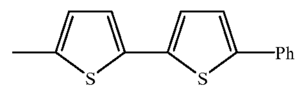 | same | same | same |
| E-1-511 | " | 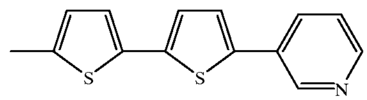 | same | same | same |
| E-1-512 | " | 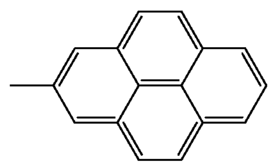 | same | same | same |
| E-1-513 | " | 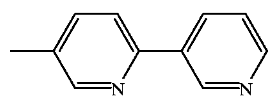 | same | same | same |
| E-1-514 | 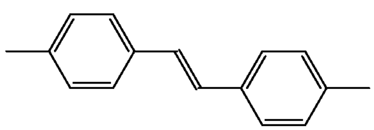 | 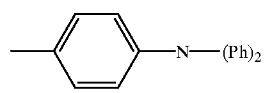 | same | same | same |
| E-1-515 | " | 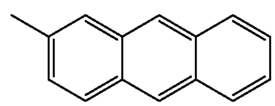 | same | same | same |
| E-1-516 | " | 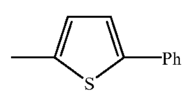 | same | same | same |
| E-1-517 | " | 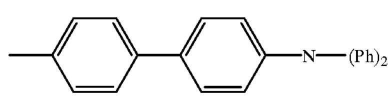 | same | same | same |
| E-1-518 | " | 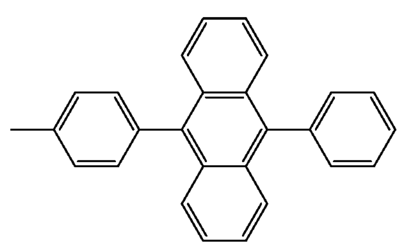 | same | same | same |

-continued
(E-1)
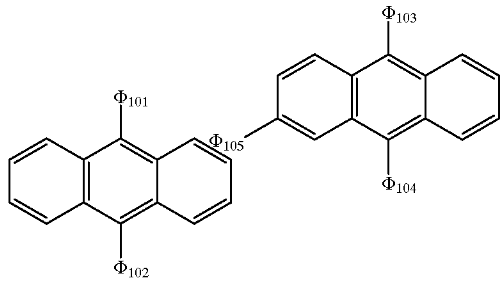
| Compound | $\Phi_{105}$ | $\Phi_{101}$ | $\Phi_{102}$ | $\Phi_{103}$ | $\Phi_{104}$ |
|---|---|---|---|---|---|
| E-1-519 | " | Ph | H | Ph | H |
| E-1-601 | 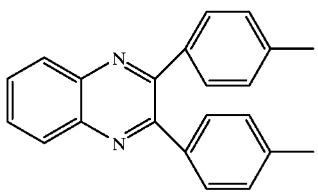 | Ph | same | same | same |
| E-1-602 | " | o-biphenylyl | same | same | same |
| E-1-603 | " | m-biphenylyl | same | same | same |
| E-1-604 | " | p-biphenylyl | same | same | same |
| E-1-605 | " | 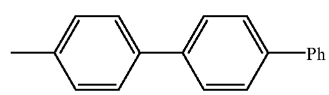 | same | same | same |
| E-1-606 | " | 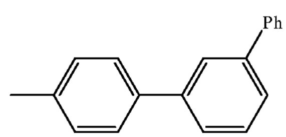 | same | same | same |
| E-1-607 | " | 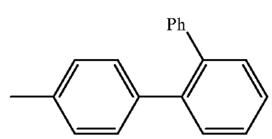 | same | same | same |
| E-1-608 | " | 2-naphthyl | same | same | same |
| E-1-609 | " | 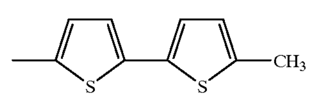 | same | same | same |
| E-1-610 | " | 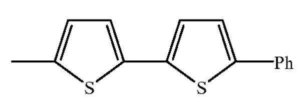 | same | same | same |
| E-1-611 | " | 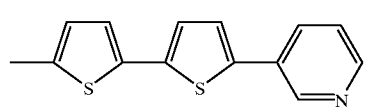 | same | same | same |

-continued
(E-1)
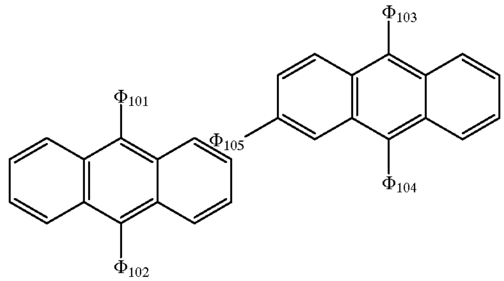
| Compound | $\Phi_{105}$ | $\Phi_{101}$ | $\Phi_{102}$ | $\Phi_{103}$ | $\Phi_{104}$ |
|---|---|---|---|---|---|
| E-1-612 | " | 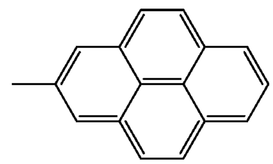 | same | same | same |
| E-1-613 | " | 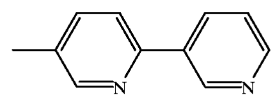 | same | same | same |
| E-1-614 | 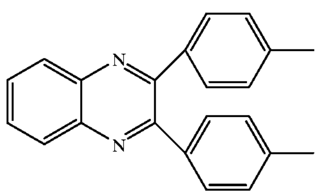 | 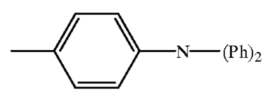 | same | same | same |
| E-1-615 | " | 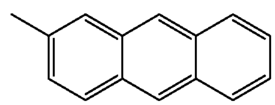 | same | same | same |
| E-1-616 | " | 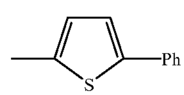 | same | same | same |
| E-1-617 | " | 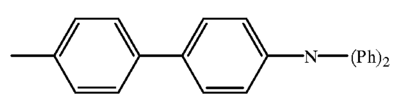 | same | same | same |
| E-1-618 | " | 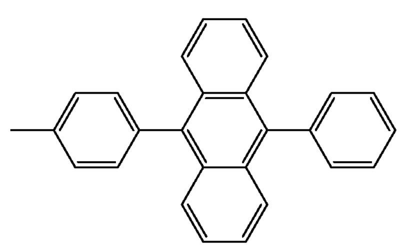 | same | same | same |
| E-1-619 | " | Ph | H | Ph | H |

-continued
(E-1)
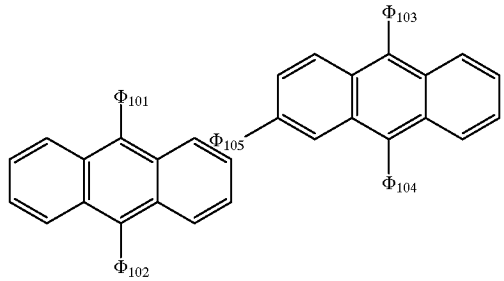
| Compound | $\Phi_{105}$ | $\Phi_{101}$ | $\Phi_{102}$ | $\Phi_{103}$ | $\Phi_{104}$ |
|---|---|---|---|---|---|
| E-1-701 | 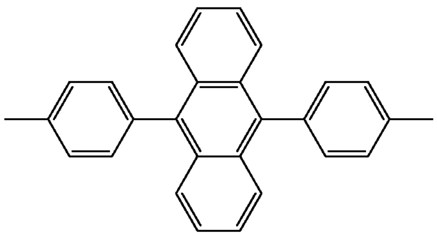 | Ph | same | same | same |
| E-1-702 | " | o-biphenylyl | same | same | same |
| E-1-703 | " | m-biphenylyl | same | same | same |
| E-1-704 | " | p-biphenylyl | same | same | same |
| E-1-705 | " | 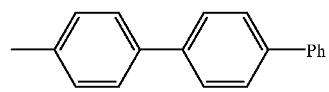  | same | same | same |
| E-1-706 | " | 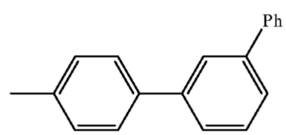  | same | same | same |
| E-1-707 | " | 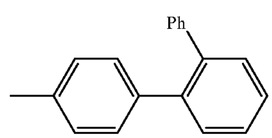  | same | same | same |
| E-1-708 | " | 2-naphthyl | same | same | same |
| E-1-709 | " | 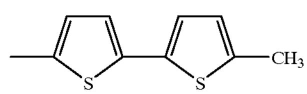  | same | same | same |
| E-1-710 | " | 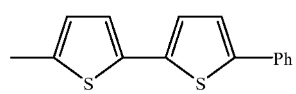  | same | same | same |
| E-1-711 | " | 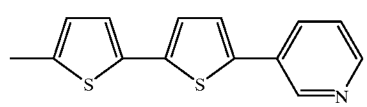  | same | same | same |

-continued
(E-1)
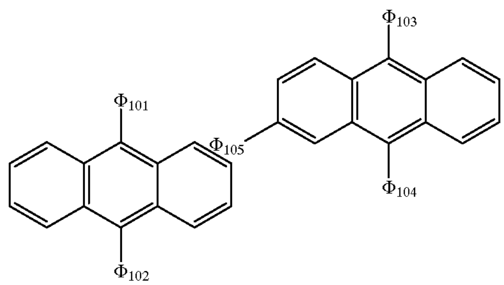
| Compound | $\Phi_{105}$ | $\Phi_{101}$ | $\Phi_{102}$ | $\Phi_{103}$ | $\Phi_{104}$ |
|---|---|---|---|---|---|
| E-1-712 | " | 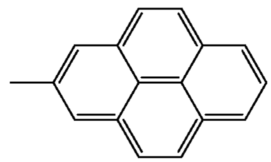 | same | same | same |
| E-1-713 | " | 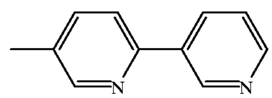 | same | same | same |
| E-1-714 | 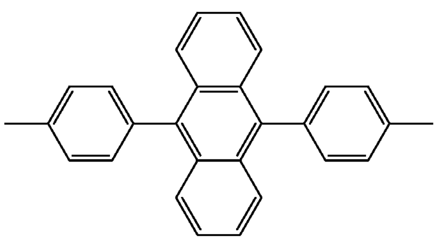 | 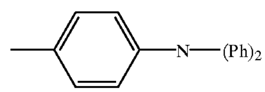 | same | same | same |
| E-1-715 | " | 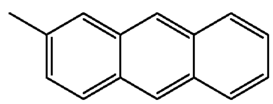 | same | same | same |
| E-1-716 | " | 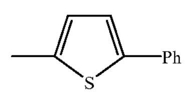 | same | same | same |
| E-1-717 | " | 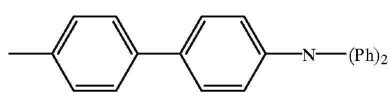 | same | same | same |
| E-1-718 | " | 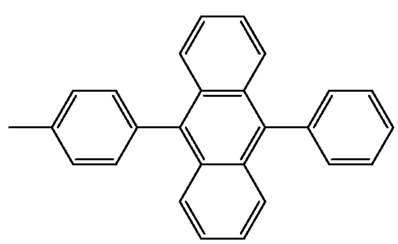 | same | same | same |
| E-1-719 | " | Ph | H | Ph | H |

-continued
(E-1)
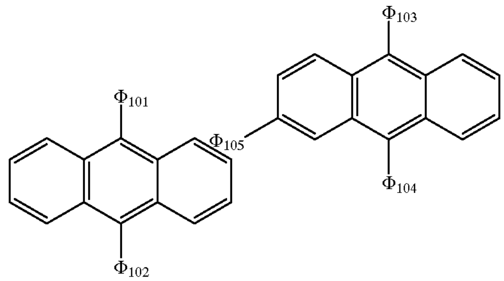
| Compound | $\Phi_{105}$ | $\Phi_{101}$ | $\Phi_{102}$ | $\Phi_{103}$ | $\Phi_{104}$ |
|---|---|---|---|---|---|
| E-1-801 | 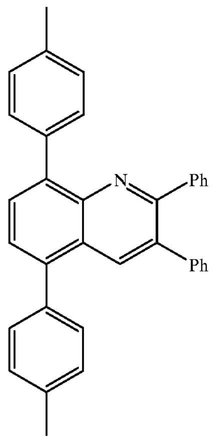 | Ph | same | same | same |
| E-1-802 | " | o-biphenylyl | same | same | same |
| E-1-803 | " | m-biphenylyl | same | same | same |
| E-1-804 | " | p-biphenylyl | same | same | same |
| E-1-805 | " | 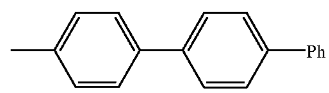 | same | same | same |
| E-1-806 | " | 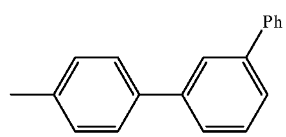 | same | same | same |
| E-1-807 | " | 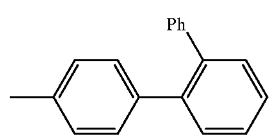 | same | same | same |
| E-1-808 | " | 2-naphthyl | same | same | same |
| E-1-809 | " | 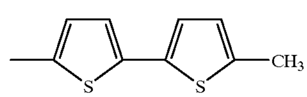 | same | same | same |
| E-1-810 | " | 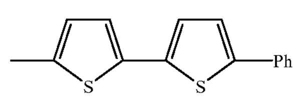 | same | same | same |

-continued
(E-1)
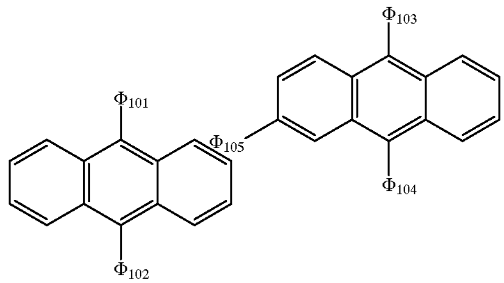
| Compound | $\Phi_{105}$ | $\Phi_{101}$ | $\Phi_{102}$ | $\Phi_{103}$ | $\Phi_{104}$ |
|---|---|---|---|---|---|
| E-1-811 | " | 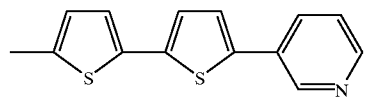 | same | same | same |
| E-1-812 | " | 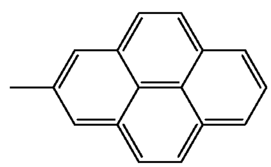 | same | same | same |
| E-1-813 | " | 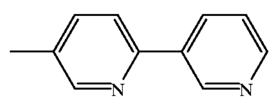 | same | same | same |
| E-1-814 | 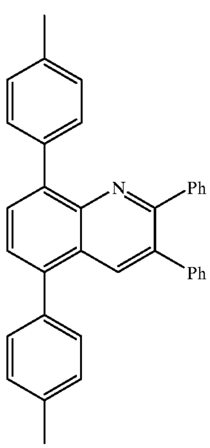 | 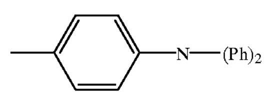 | same | same | same |

-continued
(E-1)
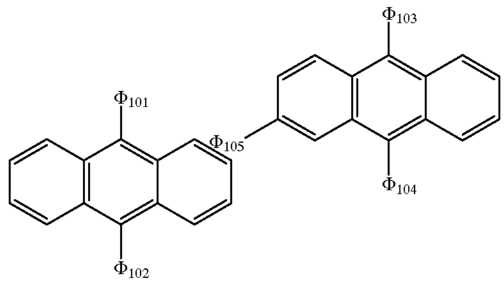
| Compound | $\Phi_{105}$ | $\Phi_{101}$ | $\Phi_{102}$ | $\Phi_{103}$ | $\Phi_{104}$ |
|---|---|---|---|---|---|
| E-1-815 | " | 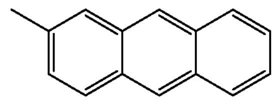 | same | same | same |
| E-1-816 | " | 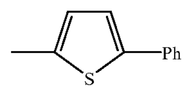 | same | same | same |
| E-1-817 | " | 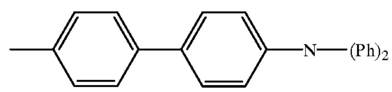 | same | same | same |
| E-1-818 | " | 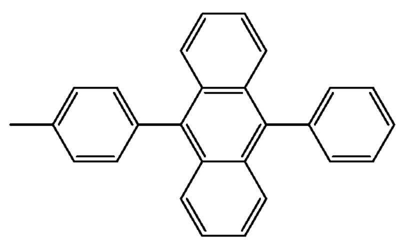 | same | same | same |
| E-1-819 | " | Ph | H | Ph | H |
| E-1-820 | 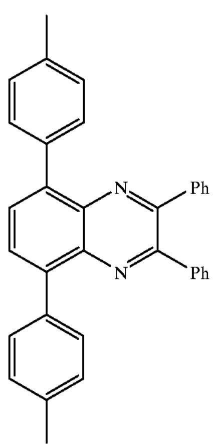 | Ph | same | same | same |

(E-2)
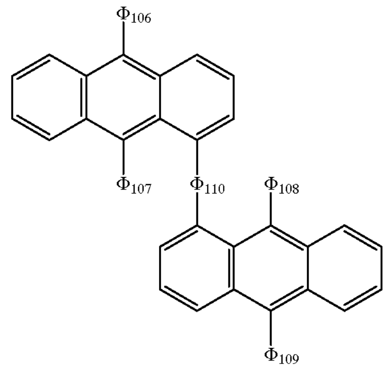
| Compound | $\Phi_{110}$ | $\Phi_{106}$ | $\Phi_{107}$ | $\Phi_{108}$ | $\Phi_{109}$ |
|---|---|---|---|---|---|
| E-2-1 | 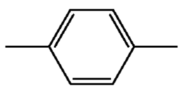 | Ph | same | same | same |
| E-2-2 | " | o-biphenylyl | same | same | same |
| E-2-3 | " | m-biphenylyl | same | same | same |
| E-2-4 | " | p-biphenylyl | same | same | same |
| E-2-5 | " | 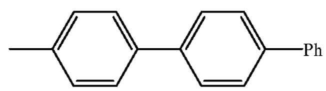 | same | same | same |
| E-2-6 | " | 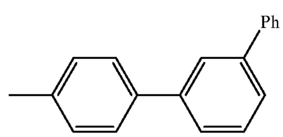 | same | same | same |
| E-2-7 | " | 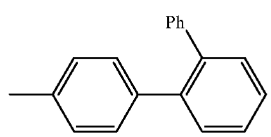 | same | same | same |
| E-2-8 | " | 2-naphthyl | same | same | same |
| E-2-9 | " | 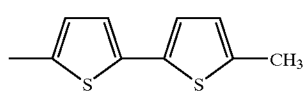 | same | same | same |
| E-2-10 | " | 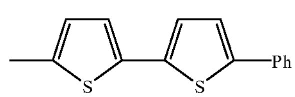 | same | same | same |
| E-2-11 | " | 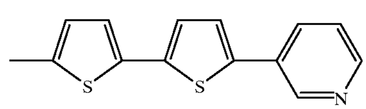 | same | same | same |

-continued
(E-2)
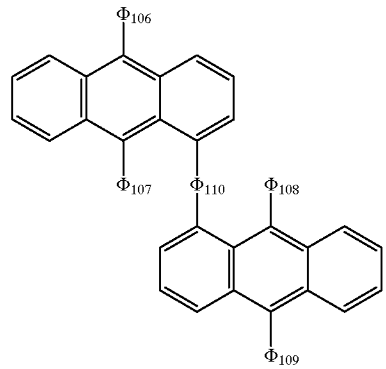
| Compound | $\Phi_{110}$ | $\Phi_{106}$ | $\Phi_{107}$ | $\Phi_{108}$ | $\Phi_{109}$ |
|---|---|---|---|---|---|
| E-2-12 | " | 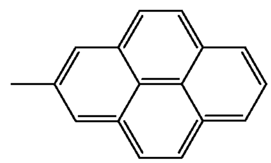 | same | same | same |
| E-2-13 | " | 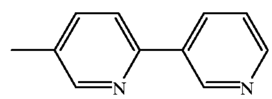 | same | same | same |
| E-2-14 | " | 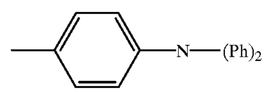 | same | same | same |
| E-2-15 | " | 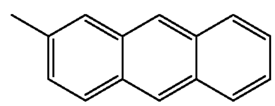 | same | same | same |
| E-2-16 | " | 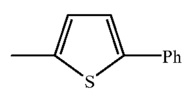 | same | same | same |
| E-2-17 | " | 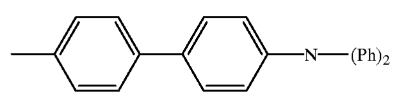 | same | same | same |
| E-2-18 | " | 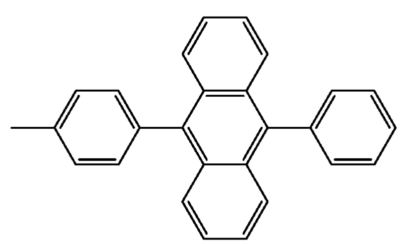 | same | same | same |
| E-2-19 | " | Ph | H | Ph | H |
| E-2-101 | 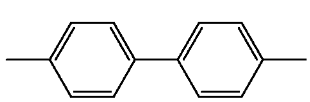 | Ph | same | same | same |

-continued
(E-2)
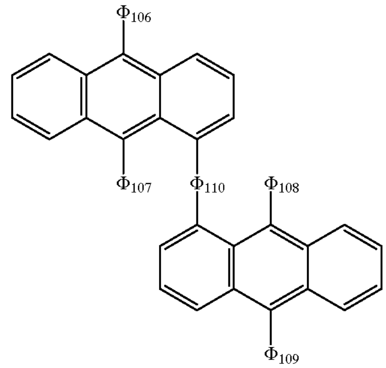
| Compound | $\Phi_{110}$ | $\Phi_{106}$ | $\Phi_{107}$ | $\Phi_{108}$ | $\Phi_{109}$ |
|---|---|---|---|---|---|
| E-2-102 | " | o-biphenylyl | same | same | same |
| E-2-103 | " | m-biphenylyl | same | same | same |
| E-2-104 | " | p-biphenylyl | same | same | same |
| E-2-105 | " | 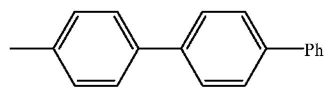 | same | same | same |
| E-2-106 | " | 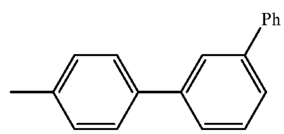 | same | same | same |
| E-2-107 | " | 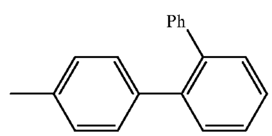 | same | same | same |
| E-2-108 | " | 2-naphthyl | same | same | same |
| E-2-109 | " | 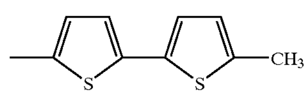 | same | same | same |
| E-2-110 | " | 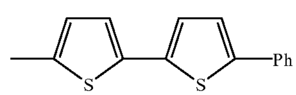 | same | same | same |
| E-2-111 | " | 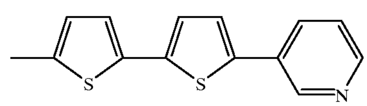 | same | same | same |
| E-2-112 | " | 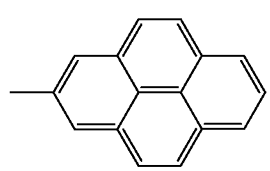 | same | same | same |

-continued
(E-2)
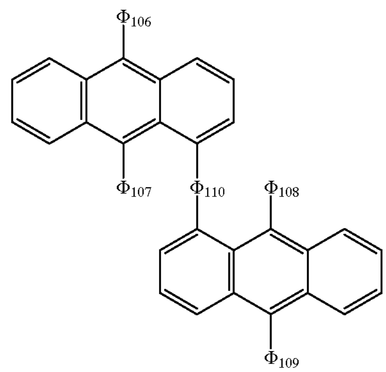
| Compound | $\Phi_{110}$ | $\Phi_{106}$ | $\Phi_{107}$ | $\Phi_{108}$ | $\Phi_{109}$ |
|---|---|---|---|---|---|
| E-2-113 | " | 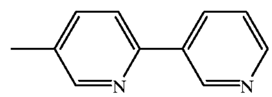 | same | same | same |
| E-2-114 | " | 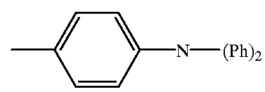 | same | same | same |
| E-2-115 | " | 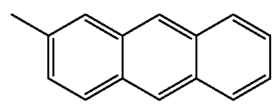 | same | same | same |
| E-2-116 | " | 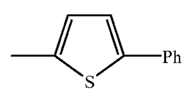 | same | same | same |
| E-2-117 | " | 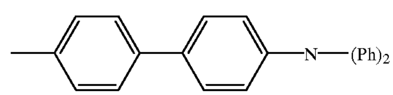 | same | same | same |
| E-2-118 | " | 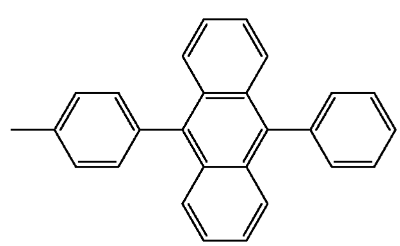 | same | same | same |
| E-2-119 | " | Ph | H | Ph | H |
| E-2-201 | 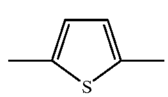 | Ph | same | same | same |
| E-2-202 | " | o-biphenylyl | same | same | same |
| E-2-203 | " | m-biphenylyl | same | same | same |
| E-2-204 | " | p-biphenylyl | same | same | same |

-continued
(E-2)
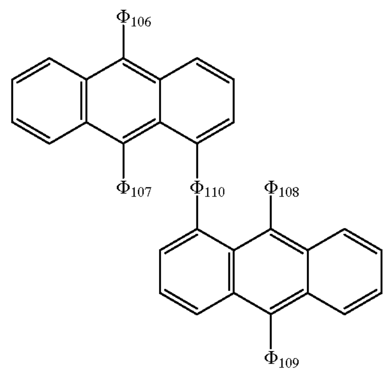
| Compound | $\Phi_{110}$ | $\Phi_{106}$ | $\Phi_{107}$ | $\Phi_{108}$ | $\Phi_{109}$ |
|---|---|---|---|---|---|
| E-2-205 | " | 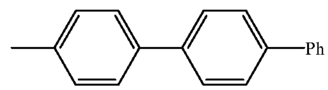 | same | same | same |
| E-2-206 | " | 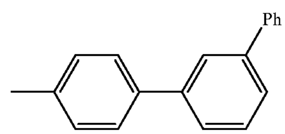 | same | same | same |
| E-2-207 | " | 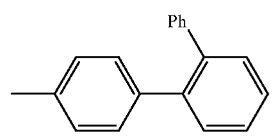 | same | same | same |
| E-2-208 | " | 2-naphthyl | same | same | same |
| E-2-209 | " | 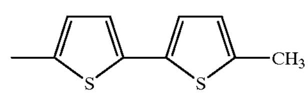 | same | same | same |
| E-2-210 | " | 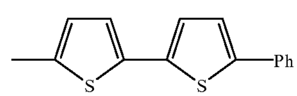 | same | same | same |
| E-2-211 | " | 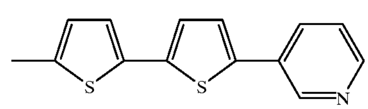 | same | same | same |
| E-2-212 | " | 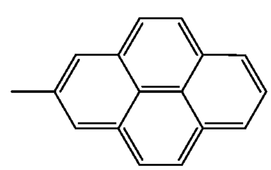 | same | same | same |
| E-2-213 | " | 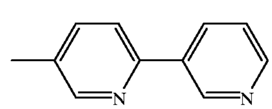 | same | same | same |

-continued
(E-2)
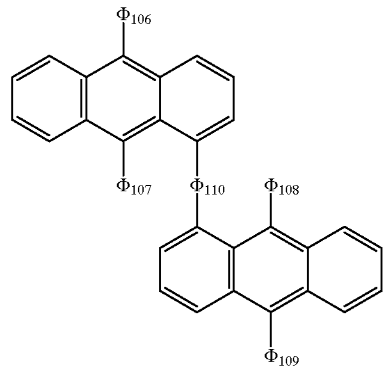
| Compound | $\Phi_{110}$ | $\Phi_{106}$ | $\Phi_{107}$ | $\Phi_{108}$ | $\Phi_{109}$ |
| --- | --- | --- | --- | --- | --- |
| E-2-214 | " | 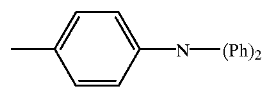 | same | same | same |
| E-2-215 | " | 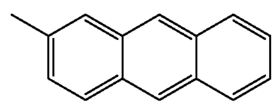 | same | same | same |
| E-2-216 | " | 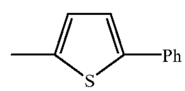 | same | same | same |
| E-2-217 | " | 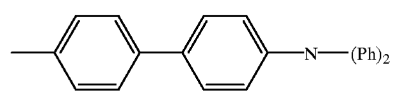 | same | same | same |
| E-2-218 | " | 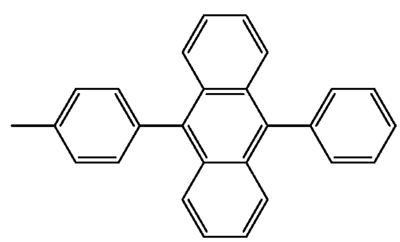 | same | same | same |
| E-2-219 | " | Ph | H | Ph | H |
| E-2-301 | 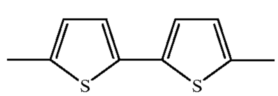 | Ph | same | same | same |
| E-2-302 | " | o-biphenylyl | same | same | same |
| E-2-303 | " | m-biphenylyl | same | same | same |
| E-2-304 | " | p-biphenylyl | same | same | same |
| E-2-305 | " | 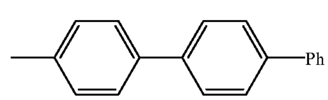 | same | same | same |

-continued
(E-2)
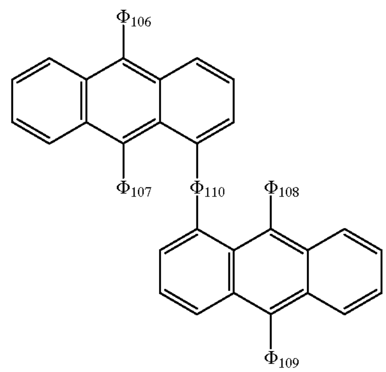
| Compound | $\Phi_{110}$ | $\Phi_{106}$ | $\Phi_{107}$ | $\Phi_{108}$ | $\Phi_{109}$ |
|---|---|---|---|---|---|
| E-2-306 | " | 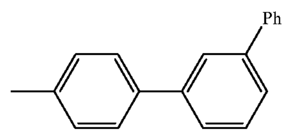 | same | same | same |
| E-2-307 | " | 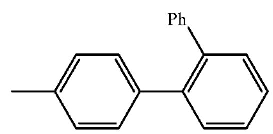 | same | same | same |
| E-2-308 | " | 2-naphthyl | same | same | same |
| E-2-309 | " | 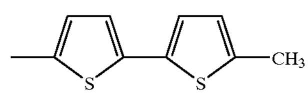 | same | same | same |
| E-2-310 | " | 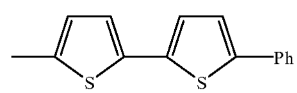 | same | same | same |
| E-2-311 | " | 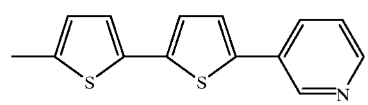 | same | same | same |
| E-2-312 | " | 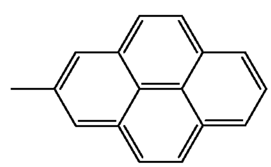 | same | same | same |
| E-2-313 | " | 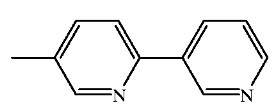 | same | same | same |
| E-2-314 | " | 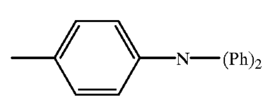 | same | same | same |

-continued
(E-2)
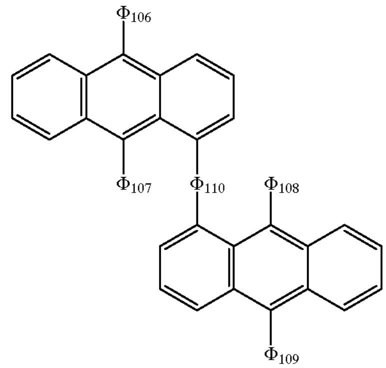
| Compound | $\Phi_{110}$ | $\Phi_{106}$ | $\Phi_{107}$ | $\Phi_{108}$ | $\Phi_{109}$ |
|---|---|---|---|---|---|
| E-2-315 | " | 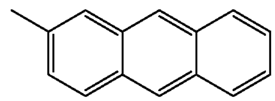 | same | same | same |
| E-2-316 | " | 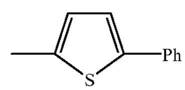 | same | same | same |
| E-2-317 | " | 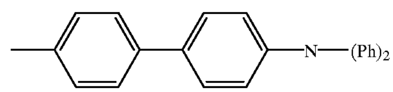 | same | same | same |
| E-2-318 | " | 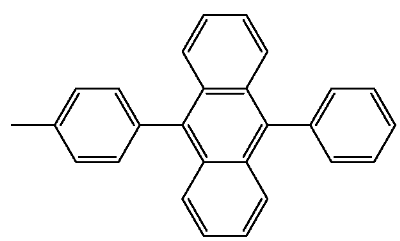 | same | same | same |
| E-2-319 | " | Ph | H | Ph | H |
| E-2-401 | 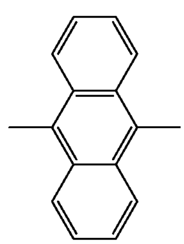 | Ph | same | same | same |
| E-2-402 | " | o-biphenylyl | same | same | same |
| E-2-403 | " | m-biphenylyl | same | same | same |
| E-2-404 | " | p-biphenylyl | same | same | same |
| E-2-405 | " | 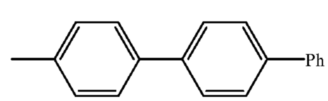 | same | same | same |

-continued
(E-2)
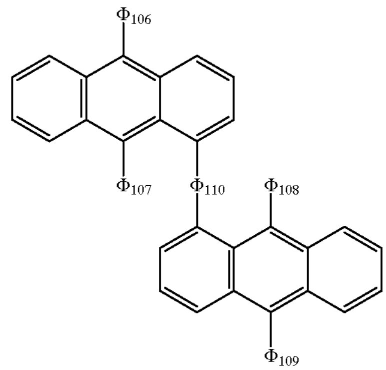
| Compound | $\Phi_{110}$ | $\Phi_{106}$ | $\Phi_{107}$ | $\Phi_{108}$ | $\Phi_{109}$ |
|---|---|---|---|---|---|
| E-2-406 | " | 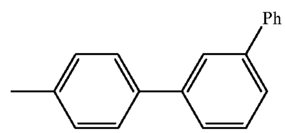 | same | same | same |
| E-2-407 | " | 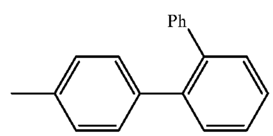 | same | same | same |
| E-2-408 | " | 2-naphthyl | same | same | same |
| E-2-409 | " | 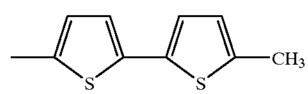 | same | same | same |
| E-2-410 | " | 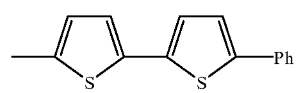 | same | same | same |
| E-2-411 | " | 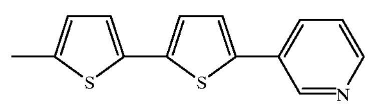 | same | same | same |
| E-2-412 | " | 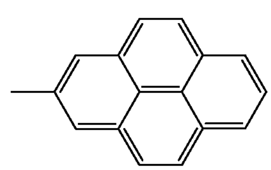 | same | same | same |
| E-2-413 | " | 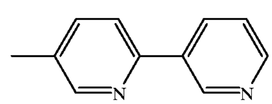 | same | same | same |
| E-2-414 | " | 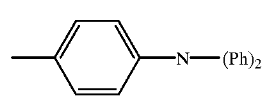 | same | same | same |

-continued
(E-2)
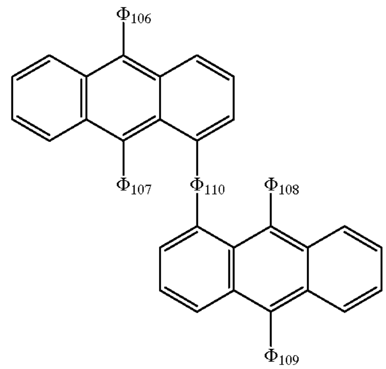
| Compound | $\Phi_{110}$ | $\Phi_{106}$ | $\Phi_{107}$ | $\Phi_{108}$ | $\Phi_{109}$ |
|---|---|---|---|---|---|
| E-2-415 | " | 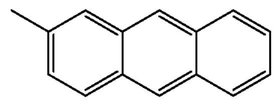 | same | same | same |
| E-2-416 | " | 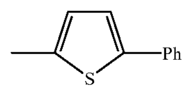 | same | same | same |
| E-2-417 | " | 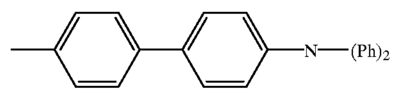 | same | same | same |
| E-2-418 | " | 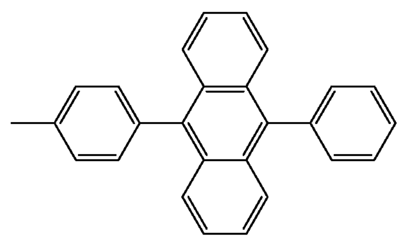 | same | same | same |
| E-2-419 | " | Ph | H | Ph | H |
| E-2-501 | 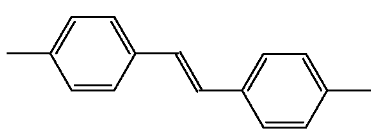 | Ph | same | same | same |
| E-2-502 | " | o-biphenylyl | same | same | same |
| E-2-503 | " | m-biphenylyl | same | same | same |
| E-2-504 | " | p-biphenylyl | same | same | same |
| E-2-505 | " | 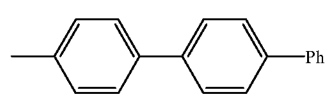 | same | same | same |
| E-2-506 | " | 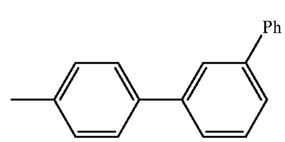 | same | same | same |

-continued
(E-2)
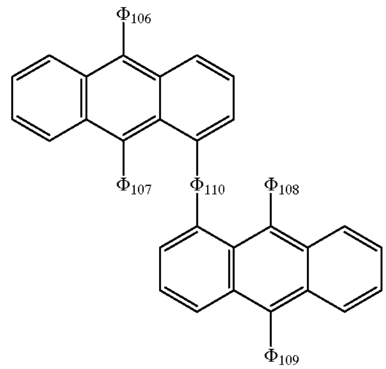
| Compound | $\Phi_{110}$ | $\Phi_{106}$ | $\Phi_{107}$ | $\Phi_{108}$ | $\Phi_{109}$ |
|---|---|---|---|---|---|
| E-2-507 | " | 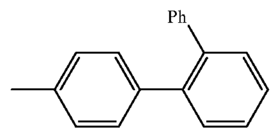  | same | same | same |
| E-2-508 | " | 2-naphthyl | same | same | same |
| E-2-509 | " | 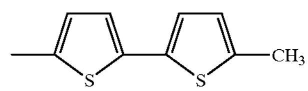  | same | same | same |
| E-2-510 | " | 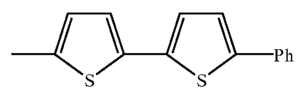  | same | same | same |
| E-2-511 | " | 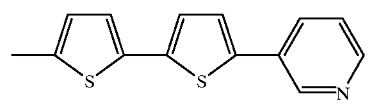  | same | same | same |
| E-2-512 | " | 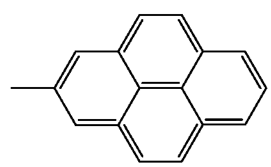 | same | same | same |
| E-2-513 | " | 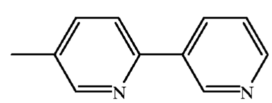  | same | same | same |
| E-2-514 | " | 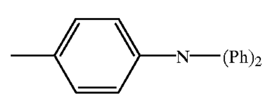  | same | same | same |
| E-2-515 | " | 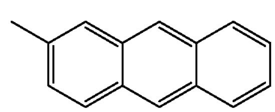 | same | same | same |
| E-2-516 | " | 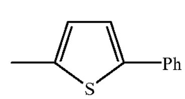  | same | same | same |

-continued
(E-2)
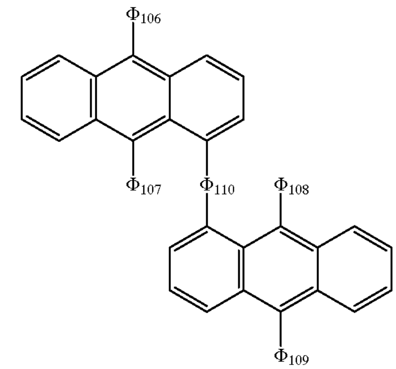
| Compound | $\Phi_{110}$ | $\Phi_{106}$ | $\Phi_{107}$ | $\Phi_{108}$ | $\Phi_{109}$ |
|---|---|---|---|---|---|
| E-2-517 | " | 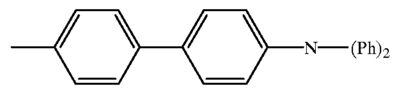 | same | same | same |
| E-2-518 | " | 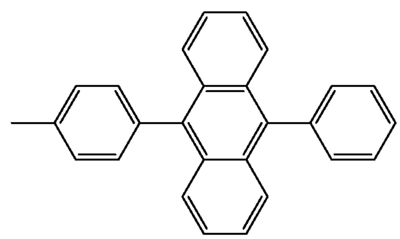 | same | same | same |
| E-2-519 | " | Ph | H | Ph | H |
| E-2-601 | 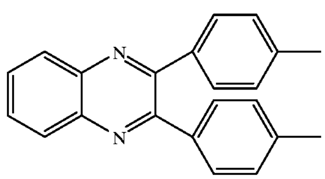 | Ph | same | same | same |
| E-2-602 | " | o-biphenylyl | same | same | same |
| E-2-603 | " | m-biphenylyl | same | same | same |
| E-2-604 | " | p-biphenylyl | same | same | same |
| E-2-605 | " | 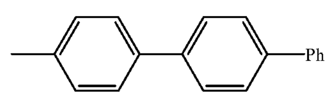 | same | same | same |
| E-2-606 | " | 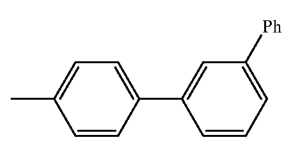 | same | same | same |
| E-2-607 | " | 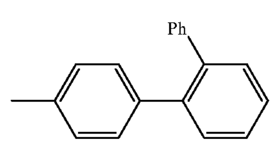 | same | same | same |
| E-2-608 | " | 2-naphthyl | same | same | same |

-continued
(E-2)
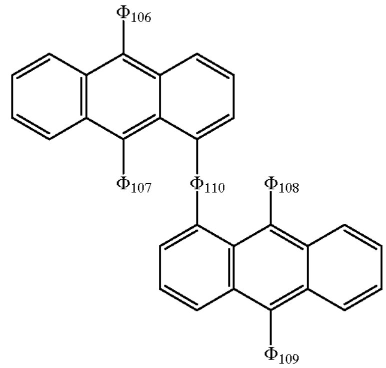
| Compound | $\Phi_{110}$ | $\Phi_{106}$ | $\Phi_{107}$ | $\Phi_{108}$ | $\Phi_{109}$ |
|---|---|---|---|---|---|
| E-2-609 | " | 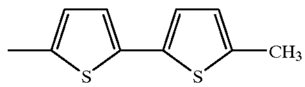 | same | same | same |
| E-2-610 | " | 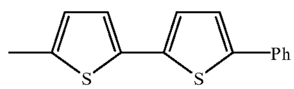 | same | same | same |
| E-2-611 | " | 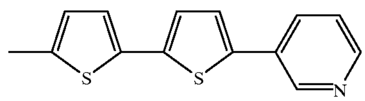 | same | same | same |
| E-2-612 | " | 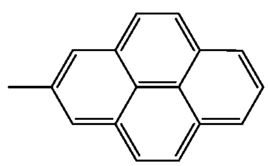 | same | same | same |
| E-2-613 | " | 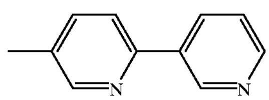 | same | same | same |
| E-2-614 | " | 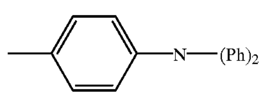 | same | same | same |
| E-2-615 | " | 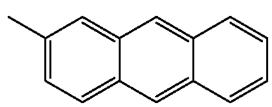 | same | same | same |
| E-2-616 | " | 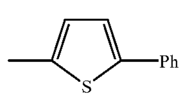 | same | same | same |
| E-2-617 | " | 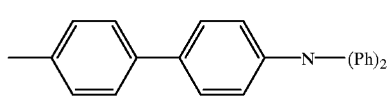 | same | same | same |

-continued
(E-2)
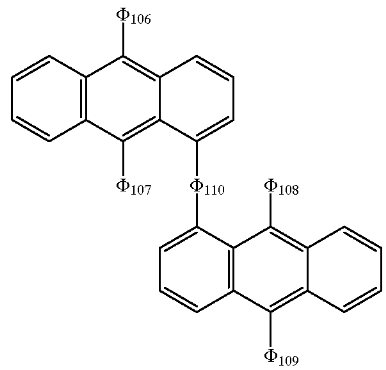
| Compound | $\Phi_{110}$ | $\Phi_{106}$ | $\Phi_{107}$ | $\Phi_{108}$ | $\Phi_{109}$ |
|---|---|---|---|---|---|
| E-2-618 | " | 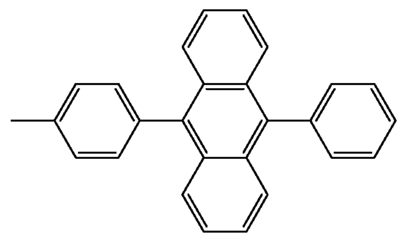 | same | same | same |
| E-2-619 | " | Ph | H | Ph | H |
| E-2-701 | 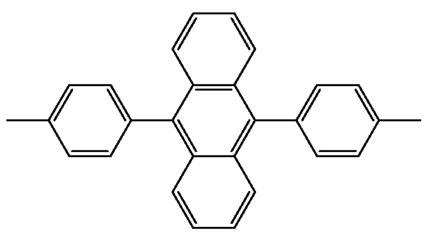 | Ph | same | same | same |
| E-2-702 | " | o-biphenylyl | same | same | same |
| E-2-703 | " | m-biphenylyl | same | same | same |
| E-2-704 | " | p-biphenylyl | same | same | same |
| E-2-705 | " | 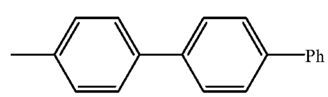 | same | same | same |
| E-2-706 | " | 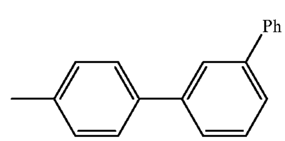 | same | same | same |
| E-2-707 | " | 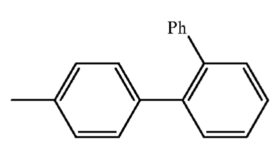 | same | same | same |
| E-2-708 | " | 2-naphthyl | same | same | same |

-continued
(E-2)
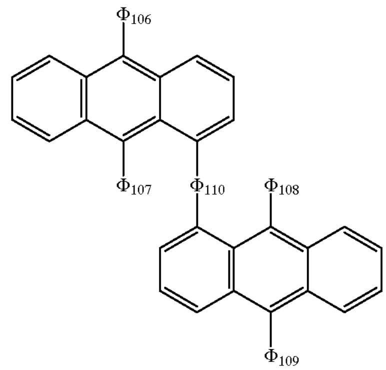
| Compound | $\Phi_{110}$ | $\Phi_{106}$ | $\Phi_{107}$ | $\Phi_{108}$ | $\Phi_{109}$ |
|---|---|---|---|---|---|
| E-2-709 | " | 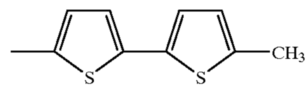  | same | same | same |
| E-2-710 | " | 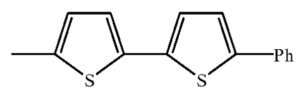  | same | same | same |
| E-2-711 | " | 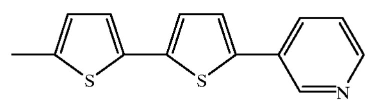  | same | same | same |
| E-2-712 | " | 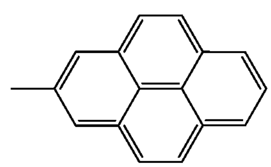 | same | same | same |
| E-2-713 | " | 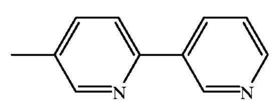  | same | same | same |
| E-2-714 | " | 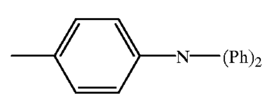  | same | same | same |
| E-2-715 | " | 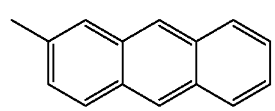 | same | same | same |
| E-2-716 | " | 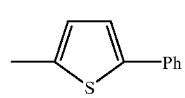  | same | same | same |
| E-2-717 | " | 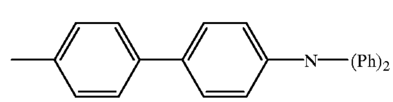  | same | same | same |

-continued
(E-2)
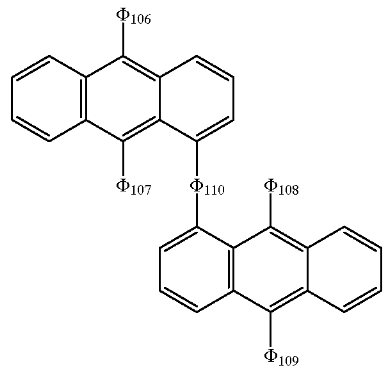
| Compound | $\Phi_{110}$ | $\Phi_{106}$ | $\Phi_{107}$ | $\Phi_{108}$ | $\Phi_{109}$ |
|---|---|---|---|---|---|
| E-2-718 | " | 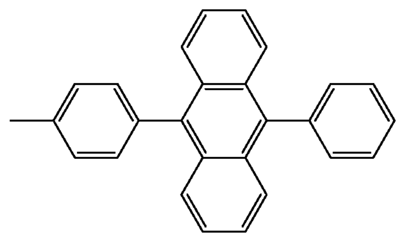 | same | same | same |
| E-2-719 | " | Ph | H | Ph | H |
| E-2-801 | 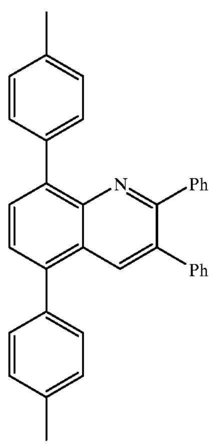 | Ph | same | same | same |
| E-2-802 | " | o-biphenylyl | same | same | same |
| E-2-803 | " | m-biphenylyl | same | same | same |
| E-2-804 | " | p-biphenylyl | same | same | same |
| E-2-805 | " | 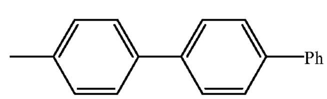 | same | same | same |
| E-2-806 | " | 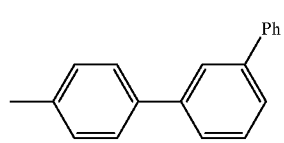 | same | same | same |

-continued
(E-2)
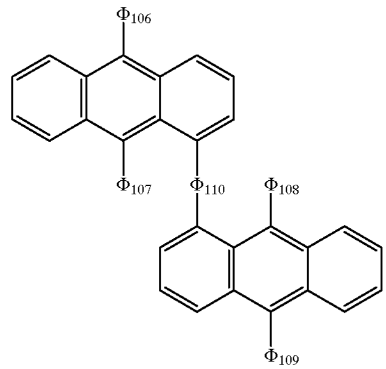
| Compound | $\Phi_{110}$ | $\Phi_{106}$ | $\Phi_{107}$ | $\Phi_{108}$ | $\Phi_{109}$ |
|---|---|---|---|---|---|
| E-2-807 | " | 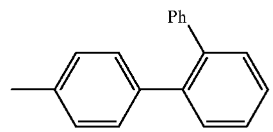 | same | same | same |
| E-2-808 | " | 2-naphthyl | same | same | same |
| E-2-809 | " | 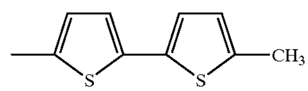 | same | same | same |
| E-2-810 | " | 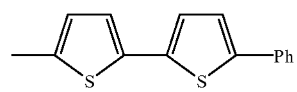 | same | same | same |
| E-2-811 | " | 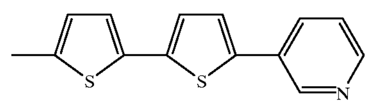 | same | same | same |
| E-2-812 | " | 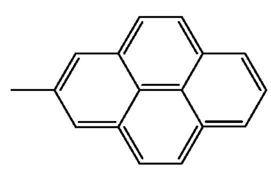 | same | same | same |
| E-2-813 | " | 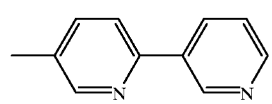 | same | same | same |
| E-2-814 | " | 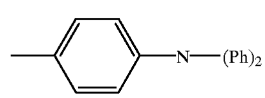 | same | same | same |
| E-2-815 | " | 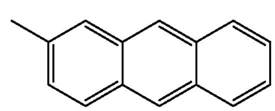 | same | same | same |
| E-2-816 | " | 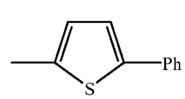 | same | same | same |

-continued
(E-2)
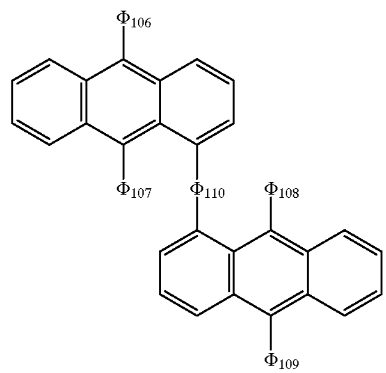
| Compound | $\Phi_{110}$ | $\Phi_{106}$ | $\Phi_{107}$ | $\Phi_{108}$ | $\Phi_{109}$ |
|---|---|---|---|---|---|
| E-2-817 | " | 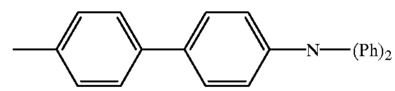 | same | same | same |
| E-2-818 | " | 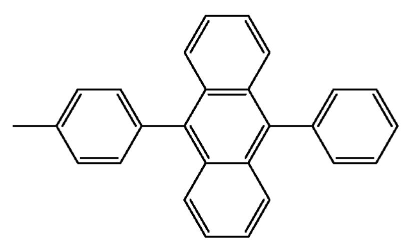 | same | same | same |
| E-2-819 | " | Ph | H | Ph | H |
| E-2-820 | 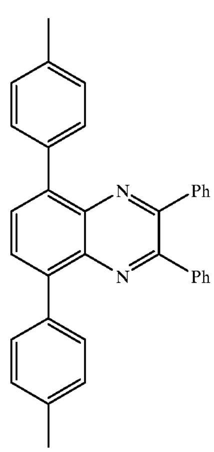 | Ph | same | same | same |

(E-3)
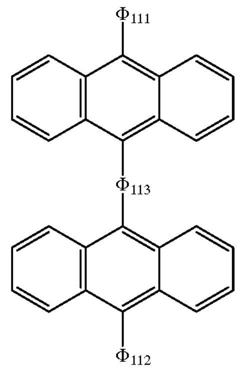
| (E-3) Compound | $\Phi_{113}$ | $\Phi_{111}$ | $\Phi_{112}$ |
|---|---|---|---|
| E-3-1 | 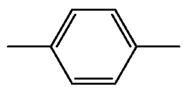 | Ph | same |
| E-3-2 | " | o-biphenylyl | same |
| E-3-3 | " | m-biphenylyl | same |
| E-3-4 | " | p-biphenylyl | same |
| E-3-5 | " | 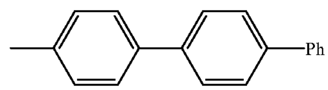 | same |
| E-3-6 | " | 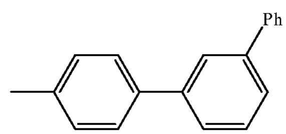 | same |
| E-3-7 | " | 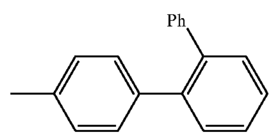 | same |
| E-3-8 | " | 2-naphthyl | same |
| E-3-9 | " | 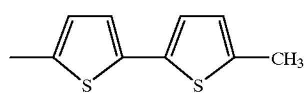 | same |
| E-3-10 | " | 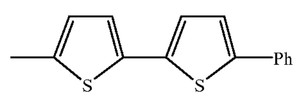 | same |
| E-3-11 | " | 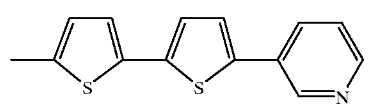 | same |
| E-3-12 | " | 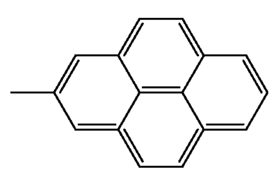 | same |

-continued
(E-3)
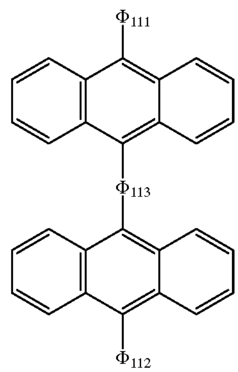
| (E-3) Compound | $\Phi_{113}$ | $\Phi_{111}$ | $\Phi_{112}$ |
|---|---|---|---|
| E-3-13 | " | 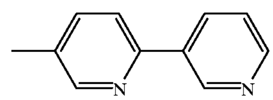 | same |
| E-3-14 | 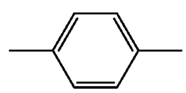 | 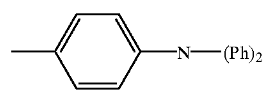 | same |
| E-3-15 | " | 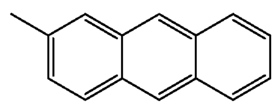 | same |
| E-3-16 | " | 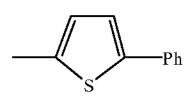 | same |
| E-3-17 | " | 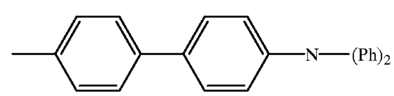 | same |
| E-3-18 | " | 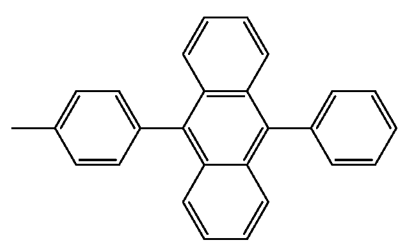 | same |
| E-3-19 | " | Ph | H |
| E-3-101 | 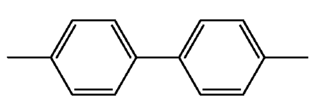 | Ph | same |
| E-3-102 | " | o-biphenylyl | same |
| E-3-103 | " | m-biphenylyl | same |
| E-3-104 | " | p-biphenylyl | same |

-continued
(E-3)
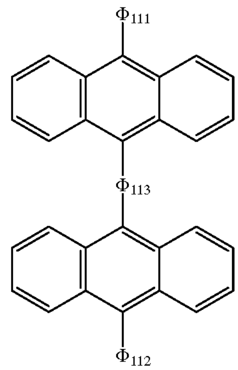
| (E-3) Compound | $\Phi_{113}$ | $\Phi_{111}$ | $\Phi_{112}$ |
|---|---|---|---|
| E-3-105 | " | 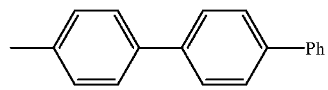 | same |
| E-3-106 | " | 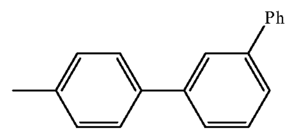 | same |
| E-3-107 | " | 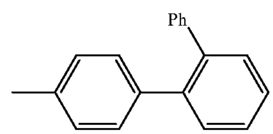 | same |
| E-3-108 | " | 2-naphthyl | same |
| E-3-109 | " | 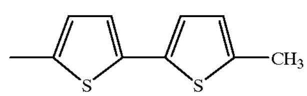 | same |
| E-3-110 | " | 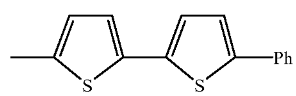 | same |
| E-3-111 | " | 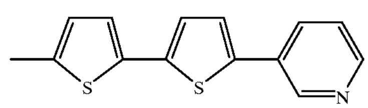 | same |
| E-3-112 | " | 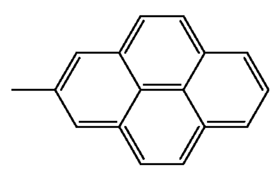 | same |
| E-3-113 | " | 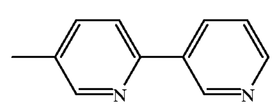 | same |

-continued
(E-3)
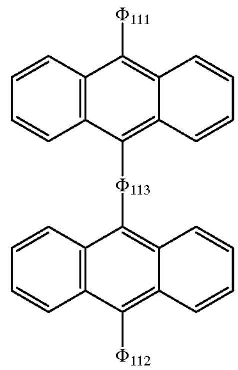
| (E-3) Compound | $\Phi_{113}$ | $\Phi_{111}$ | $\Phi_{112}$ |
|---|---|---|---|
| E-3-114 | 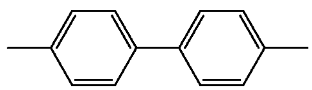 | 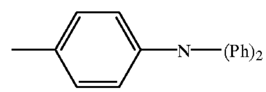 | same |
| E-3-115 | " | 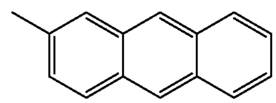 | same |
| E-3-116 | " | 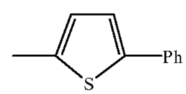 | same |
| E-3-117 | " | 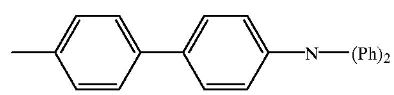 | same |
| E-3-118 | " | 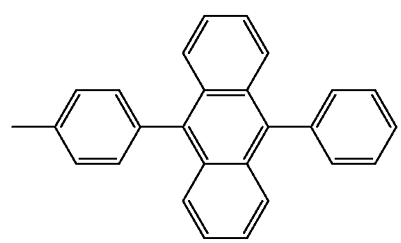 | same |
| E-3-119 | " | Ph | H |
| E-3-201 | 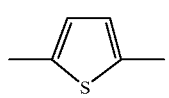 | Ph | same |
| E-3-202 | " | o-biphenylyl | same |
| E-3-203 | " | m-biphenylyl | same |
| E-3-204 | " | p-biphenylyl | same |
| E-3-205 | " | 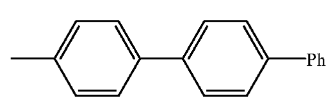 | same |

-continued
(E-3)
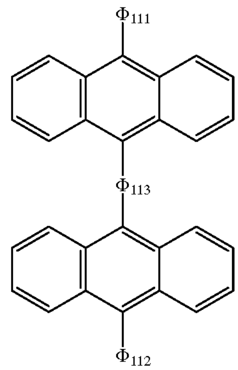
| (E-3) Compound | $\Phi_{113}$ | $\Phi_{111}$ | $\Phi_{112}$ |
|---|---|---|---|
| E-3-206 | " | 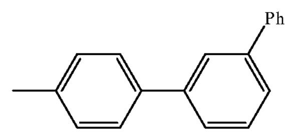 | same |
| E-3-207 | " | 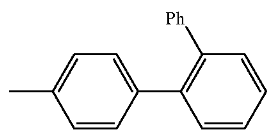 | same |
| E-3-208 | " | 2-naphthyl | same |
| E-3-209 | " | 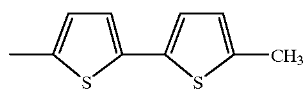 | same |
| E-3-210 | " | 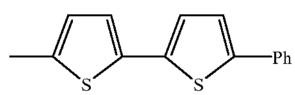 | same |
| E-3-211 | " | 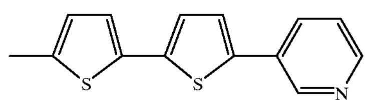 | same |
| E-3-212 | " | 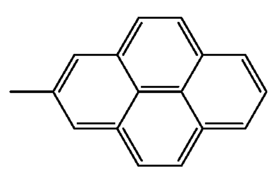 | same |
| E-3-213 | " | 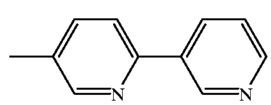 | same |
| E-3-214 | 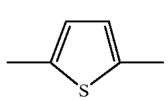 | 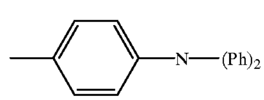 | same |

-continued
(E-3)
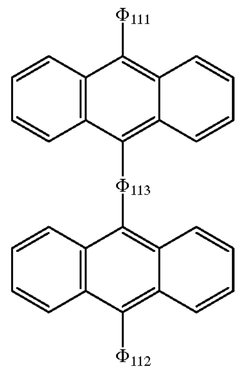
| (E-3) Compound | $\Phi_{113}$ | $\Phi_{111}$ | $\Phi_{112}$ |
|---|---|---|---|
| E-3-215 | " | 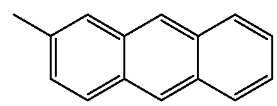 | same |
| E-3-216 | " | 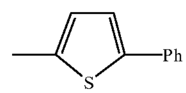 | same |
| E-3-217 | " | 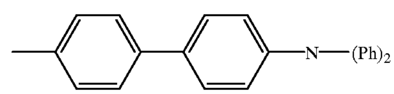 | same |
| E-3-218 | " | 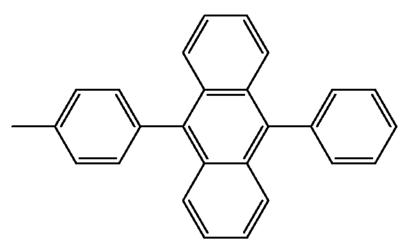 | same |
| E-3-219 | " | Ph | H |
| E-3-301 | 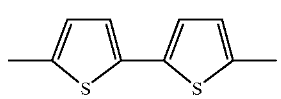 | Ph | same |
| E-3-302 | " | o-biphenylyl | same |
| E-3-303 | " | m-biphenylyl | same |
| E-3-304 | " | p-biphenylyl | same |
| E-3-305 | " | 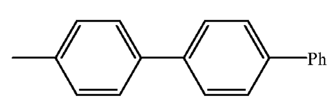 | same |
| E-3-306 | " | 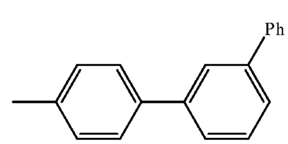 | same |

-continued
(E-3)
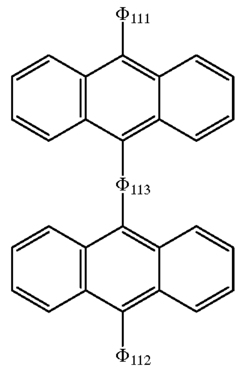
| (E-3) Compound | $\Phi_{113}$ | $\Phi_{111}$ | $\Phi_{112}$ |
|---|---|---|---|
| E-3-307 | " | 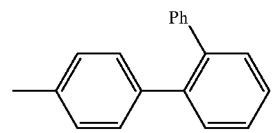 | same |
| E-3-308 | " | 2-naphthyl | same |
| E-3-309 | " | 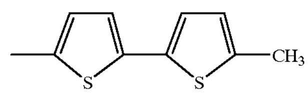 | same |
| E-3-310 | " | 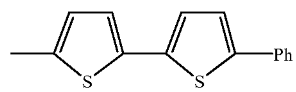 | same |
| E-3-311 | " | 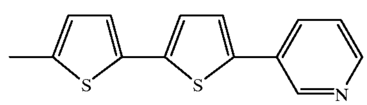 | same |
| E-3-312 | " | 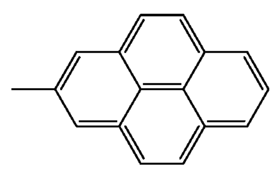 | same |
| E-3-313 | " | 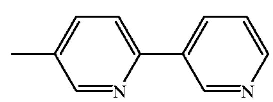 | same |
| E-3-314 | 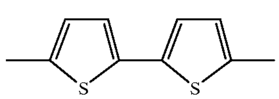 | 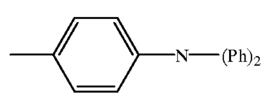 | same |
| E-3-315 | " | 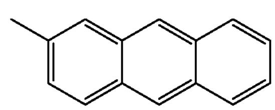 | same |
| E-3-316 | " | 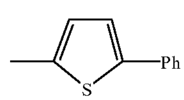 | same |

-continued
(E-3)
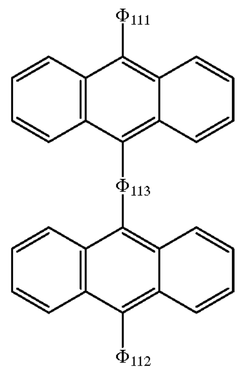
| (E-3) Compound | $\Phi_{113}$ | $\Phi_{111}$ | $\Phi_{112}$ |
|---|---|---|---|
| E-3-317 | " | 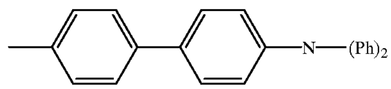 | same |
| E-3-318 | " | 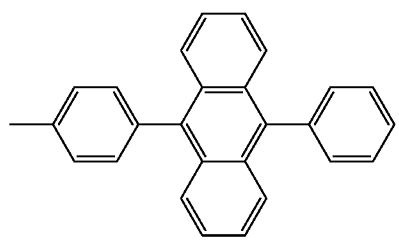 | same |
| E-3-319 | " | Ph | H |
| E-3-401 | 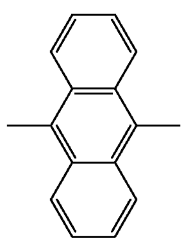 | Ph | same |
| E-3-402 | " | o-biphenylyl | same |
| E-3-403 | " | m-biphenylyl | same |
| E-3-404 | " | p-biphenylyl | same |
| E-3-405 | " | 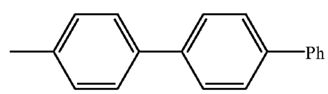 | same |
| E-3-406 | " | 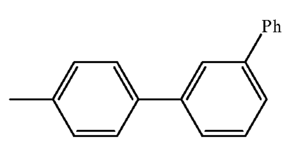 | same |

-continued
(E-3)
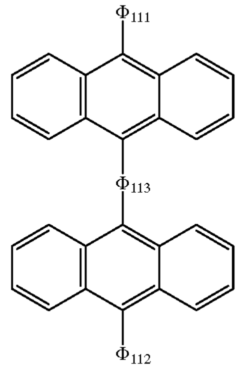
| (E-3) Compound | $\Phi_{113}$ | $\Phi_{111}$ | $\Phi_{112}$ |
|---|---|---|---|
| E-3-407 | " | 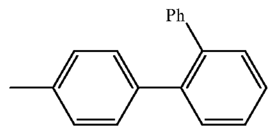 | same |
| E-3-408 | " | 2-naphthyl | same |
| E-3-409 | " | 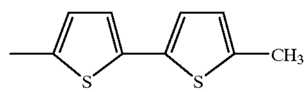 | same |
| E-3-410 | " | 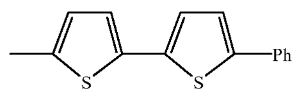 | same |
| E-3-411 | " | 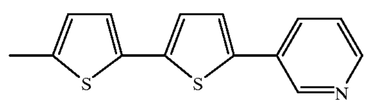 | same |
| E-3-412 | " | 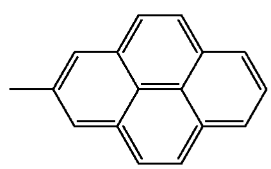 | same |
| E-3-413 | " | 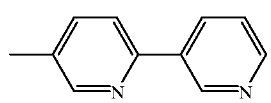 | same |
| E-3-414 | 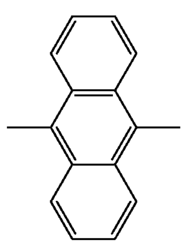 | 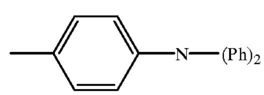 | same |

-continued
(E-3)
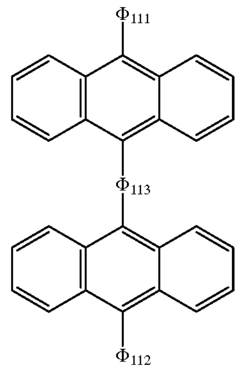
| (E-3) Compound | $\Phi_{113}$ | $\Phi_{111}$ | $\Phi_{112}$ |
|---|---|---|---|
| E-3-415 | " | 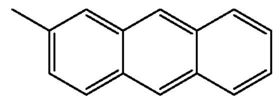 | same |
| E-3-416 | " | 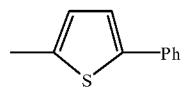 | same |
| E-3-417 | " | 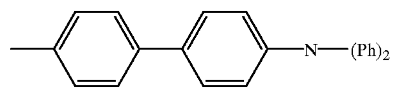 | same |
| E-3-418 | " | 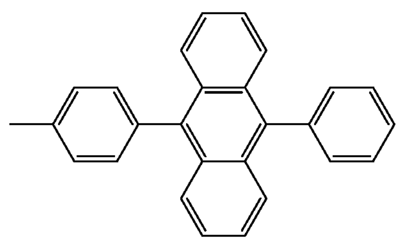 | same |
| E-3-419 | " | Ph | H |
| E-3-501 | 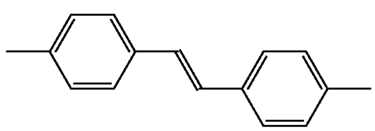 | Ph | same |
| E-3-502 | " | o-biphenylyl | same |
| E-3-503 | " | m-biphenylyl | same |
| E-3-504 | " | p-biphenylyl | same |
| E-3-505 | " | 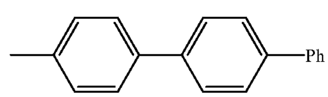 | same |
| E-3-506 | " | 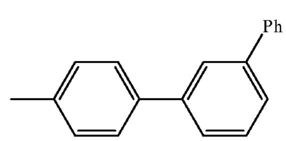 | same |

-continued
(E-3)
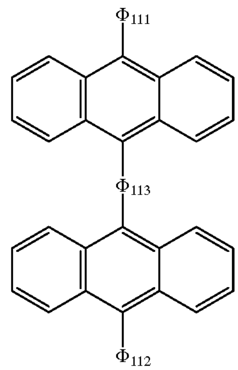
| (E-3) Compound | $\Phi_{113}$ | $\Phi_{111}$ | $\Phi_{112}$ |
|---|---|---|---|
| E-3-507 | " | 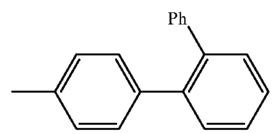 | same |
| E-3-508 | " | 2-naphthyl | same |
| E-3-509 | " | 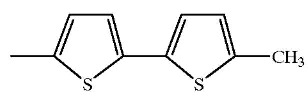 | same |
| E-3-510 | " | 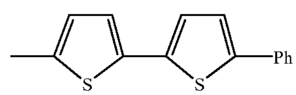 | same |
| E-3-511 | " | 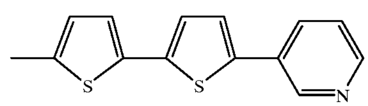 | same |
| E-3-512 | " | 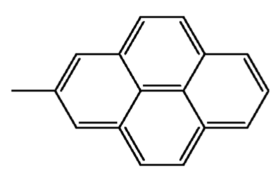 | same |
| E-3-513 | " | 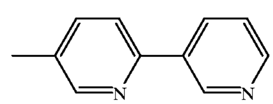 | same |
| E-3-514 | 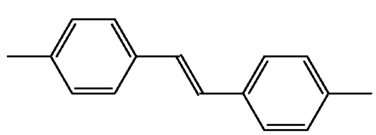 | 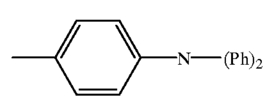 | same |
| E-3-515 | " | 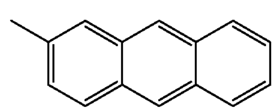 | same |

-continued
(E-3)
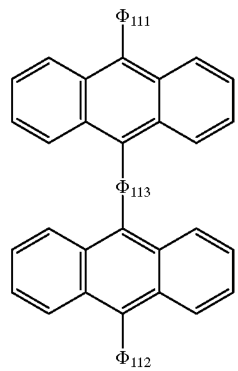
| (E-3) Compound | $\Phi_{113}$ | $\Phi_{111}$ | $\Phi_{112}$ |
|---|---|---|---|
| E-3-516 | " | 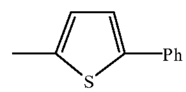 | same |
| E-3-517 | " | 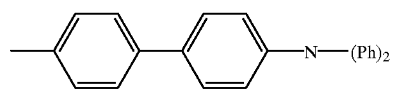 | same |
| E-3-518 | " | 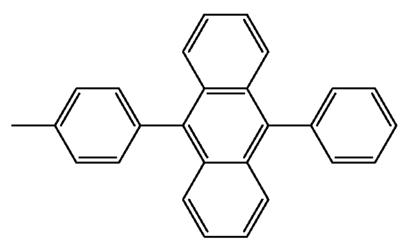 | same |
| E-3-519 | " | Ph | H |
| E-3-601 | 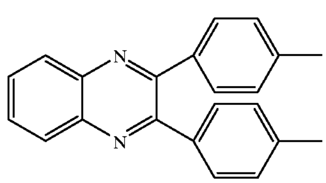 | Ph | same |
| E-3-602 | " | o-biphenylyl | same |
| E-3-603 | " | m-biphenylyl | same |
| E-3-604 | " | p-biphenylyl | same |
| E-3-605 | " | 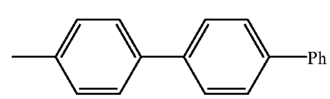 | same |
| E-3-606 | " | 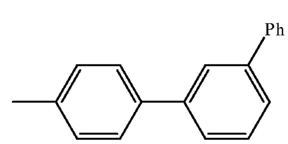 | same |

-continued
(E-3)
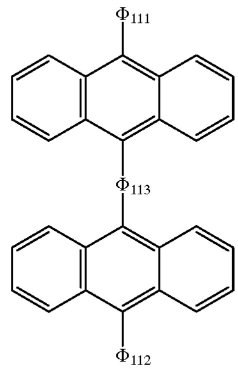
| (E-3) Compound | $\Phi_{113}$ | $\Phi_{111}$ | $\Phi_{112}$ |
|---|---|---|---|
| E-3-607 | " | 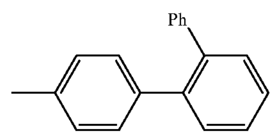 | same |
| E-3-608 | " | 2-naphthyl | same |
| E-3-609 | " | 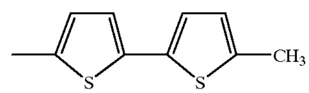 | same |
| E-3-610 | " | 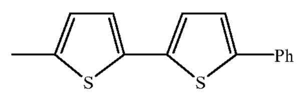 | same |
| E-3-611 | " | 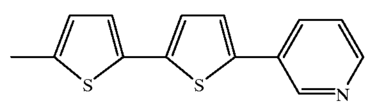 | same |
| E-3-612 | " | 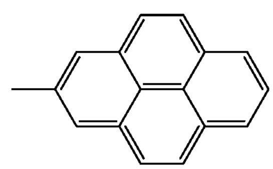 | same |
| E-3-613 | " | 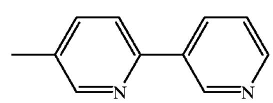 | same |
| E-3-614 | 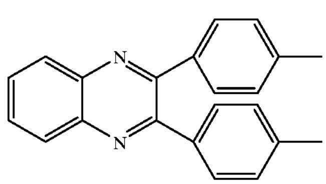 | 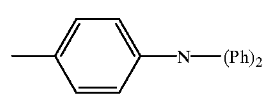 | same |
| E-3-615 | " | 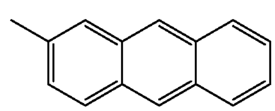 | same |

-continued
(E-3)
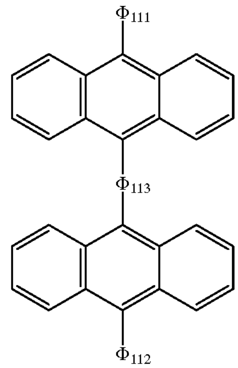
| (E-3) Compound | $\Phi_{113}$ | $\Phi_{111}$ | $\Phi_{112}$ |
| --- | --- | --- | --- |
| E-3-616 | " | 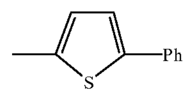 | same |
| E-3-617 | " | 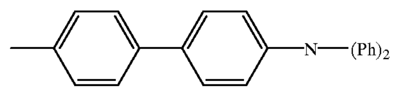 | same |
| E-3-618 | " | 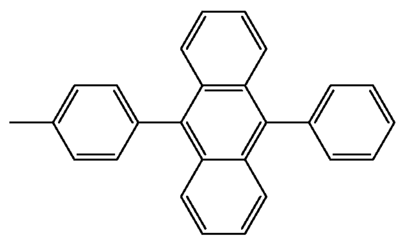 | same |
| E-3-619 | " | Ph | H |
| E-3-701 | 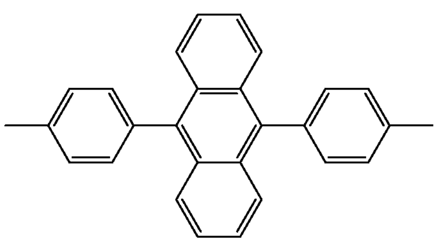 | Ph | same |
| E-3-702 | " | o-biphenylyl | same |
| E-3-703 | " | m-biphenylyl | same |
| E-3-704 | " | p-biphenylyl | same |
| E-3-705 | " | 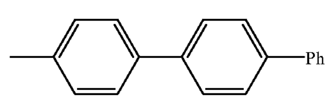 | same |
| E-3-706 | " | 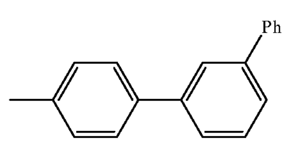 | same |

-continued
(E-3)
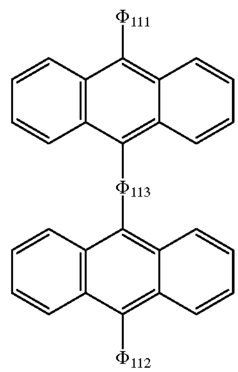
| (E-3) Compound | $\Phi_{113}$ | $\Phi_{111}$ | $\Phi_{112}$ |
|---|---|---|---|
| E-3-707 | " | 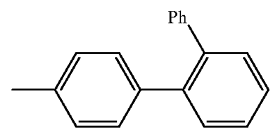 | same |
| E-3-708 | " | 2-naphthyl | same |
| E-3-709 | " | 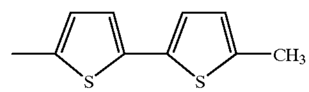 | same |
| E-3-710 | " | 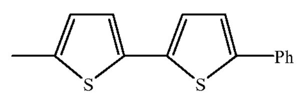 | same |
| E-3-711 | " | 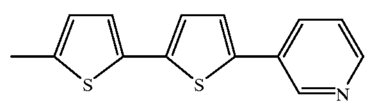 | same |
| E-3-712 | " | 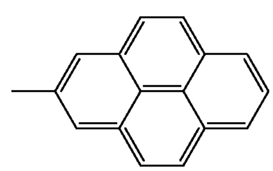 | same |
| E-3-713 | " | 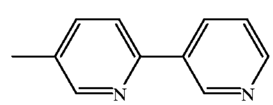 | same |
| E-3-714 | 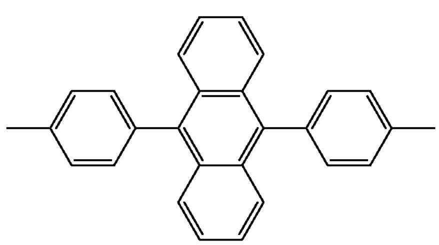 | 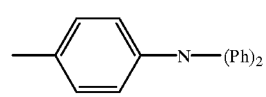 | same |

-continued
(E-3)
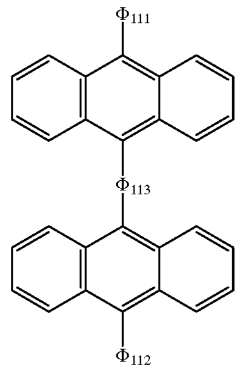
| (E-3) Compound | $\Phi_{113}$ | $\Phi_{111}$ | $\Phi_{112}$ |
|---|---|---|---|
| E-3-715 | " | 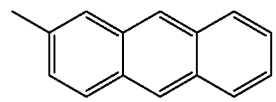 | same |
| E-3-716 | " | 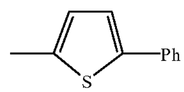 | same |
| E-3-717 | " | 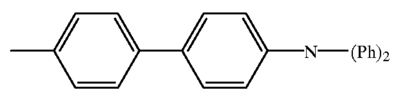 | same |
| E-3-718 | " | 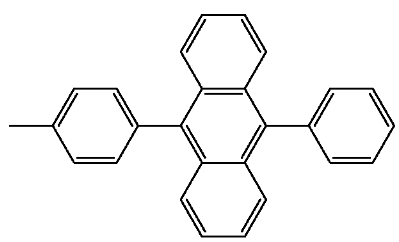 | same |
| E-3-719 | " | Ph | H |
| E-3-801 | 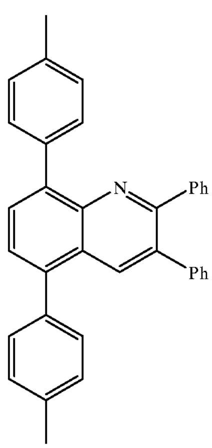 | Ph | same |
| E-3-802 | " | o-biphenylyl | same |
| E-3-803 | " | m-biphenylyl | same |
| E-3-804 | " | p-biphenylyl | same |

-continued
(E-3)
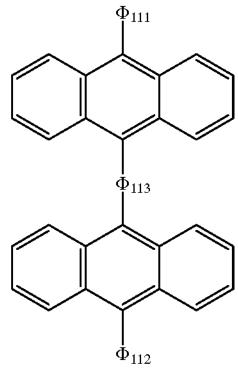
| (E-3) Compound | $\Phi_{113}$ | $\Phi_{111}$ | $\Phi_{112}$ |
|---|---|---|---|
| E-3-805 | " | 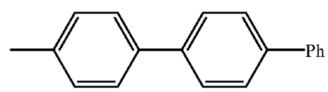 | same |
| E-3-806 | " | 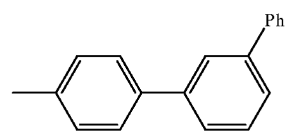 | same |
| E-3-807 | " | 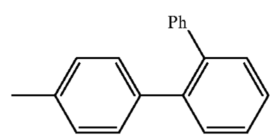 | same |
| E-3-808 | " | 2-naphthyl | same |
| E-3-809 | " | 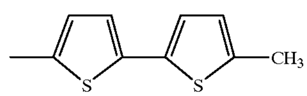 | same |
| E-3-810 | " | 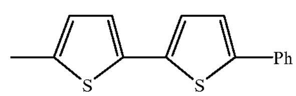 | same |
| E-3-811 | " | 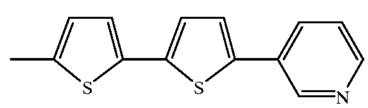 | same |
| E-3-812 | " | 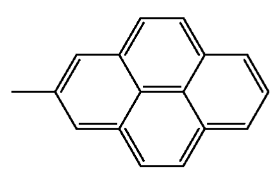 | same |
| E-3-813 | " | 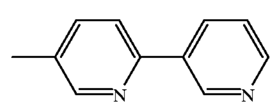 | same |

-continued
(E-3)
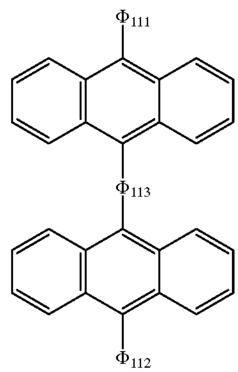
| (E-3) Compound | $\Phi_{113}$ | $\Phi_{111}$ | $\Phi_{112}$ |
|---|---|---|---|
| E-3-814 | 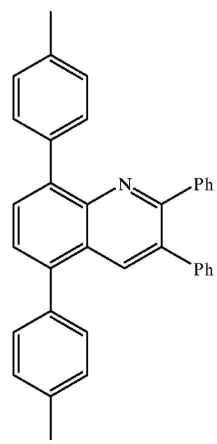 | 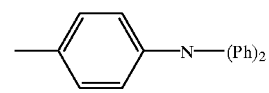 | same |
| E-3-815 | " | 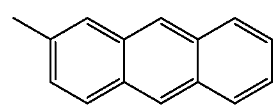 | same |
| E-3-816 | " | 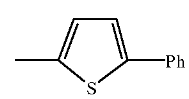 | same |
| E-3-817 | " | 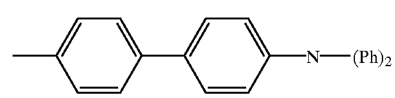 | same |
| E-3-818 | " | 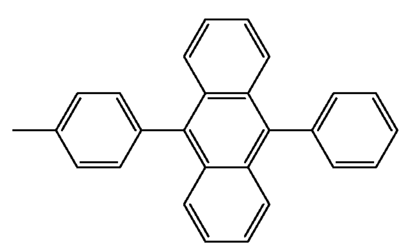 | same |
| E-3-819 | " | Ph | H |

-continued
(E-3)
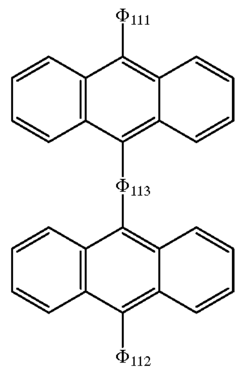
| (E-3) Compound | $\Phi_{113}$ | $\Phi_{111}$ | $\Phi_{112}$ |
|---|---|---|---|
| E-3-820 | 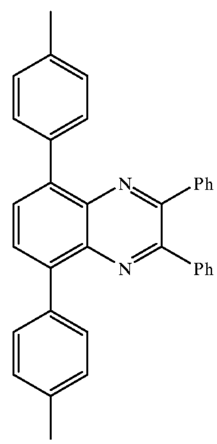 | same | same |
(E-4)
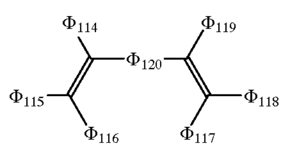
| (E-4) Compound | $\Phi_{120}$ | $\Phi_{115}$–$\Phi_{118}$ | $\Phi_{114}$, $\Phi_{119}$ |
|---|---|---|---|
| E-4-1 | 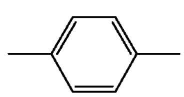 | Ph | Ph |
| E-4-2 | " | o-biphenylyl | Ph |
| E-4-3 | " | m-biphenylyl | Ph |
| E-4-4 | " | p-biphenylyl | Ph |
| E-4-5 | " | 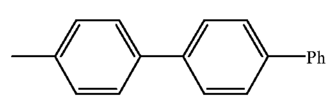 | Ph |

-continued
(E-4)
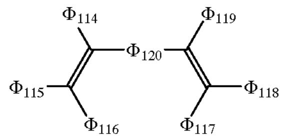
| | | | |
|---|---|---|---|
| E-4-6 | " | 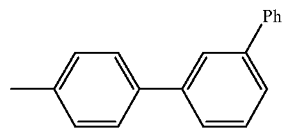 | Ph |
| E-4-7 | " | 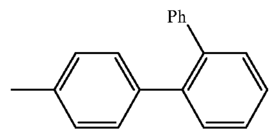 | Ph |
| E-4-8 | " | 2-naphthyl | Ph |
| E-4-9 | " | 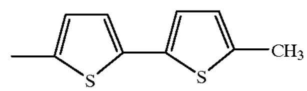 | Ph |
| E-4-10 | " | 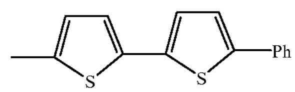 | Ph |
| E-4-11 | " | 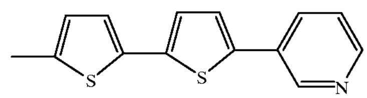 | Ph |
| E-4-12 | " | 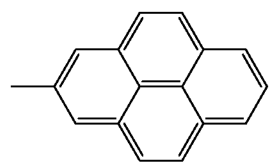 | Ph |
| E-4-13 | " | 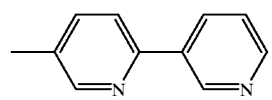 | Ph |
| E-4-14 | " | 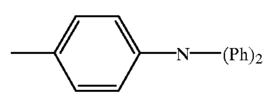 | Ph |
| E-4-15 | " | 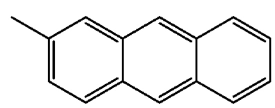 | Ph |
| E-4-16 | " | 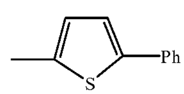 | Ph |
| E-4-17 | " | 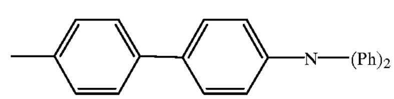 | Ph |

-continued
(E-4)
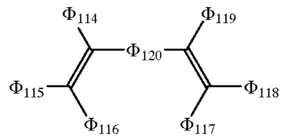
| | | | |
|---|---|---|---|
| E-4-18 | " | 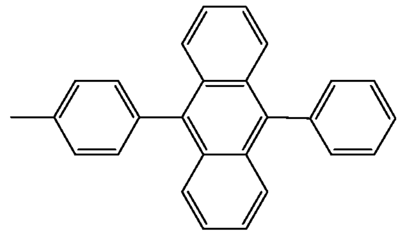 | Ph |
| E-4-101 | 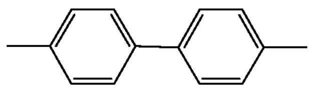 | Ph | Ph |
| E-4-102 | " | o-biphenylyl | Ph |
| E-4-103 | " | m-biphenylyl | Ph |
| E-4-104 | " | p-biphenylyl | Ph |
| E-4-105 | " | 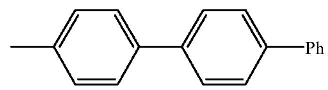  | Ph |
| E-4-016 | " | 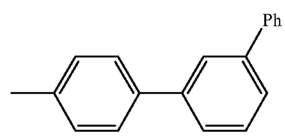  | Ph |
| E-4-107 | " | 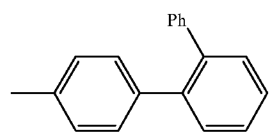  | Ph |
| E-4-108 | " | 2-naphthyl | Ph |
| E-4-109 | " | 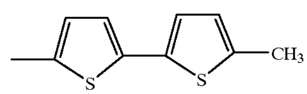  | Ph |
| E-4-110 | " | 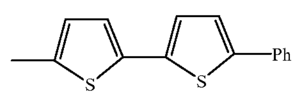  | Ph |
| E-4-111 | " | 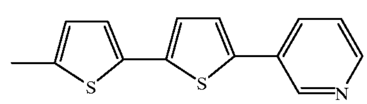  | Ph |
| E-4-112 | " | 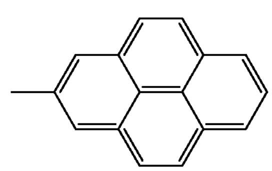 | Ph |

-continued
(E-4)
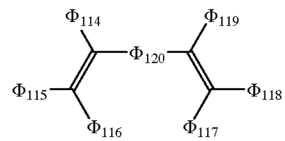
| | | | |
|---|---|---|---|
| E-4-113 | " | 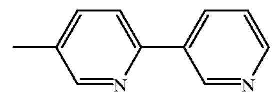 | Ph |
| E-4-114 | " | 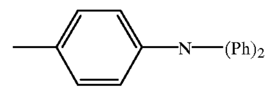 | Ph |
| E-4-115 | " | 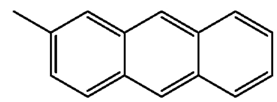 | Ph |
| E-4-116 | " | 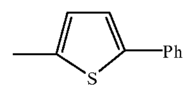 | Ph |
| E-4-117 | " | 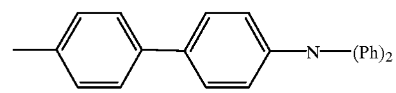 | Ph |
| E-4-118 | " | 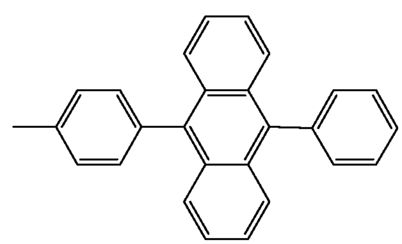 | Ph |
| E-4-119 | " | p-biphenylyl | H |
| E-4-120 | " | m-biphenylyl | H |
| E-4-121 | " | o-biphenylyl | H |
| (E-4) Compound | $\Phi_{120}$ | $\Phi_{115}$, $\Phi_{118}$ | $\Phi_{116}$, $\Phi_{117}$ | $\Phi_{114}$, $\Phi_{119}$ |
|---|---|---|---|---|
| E-4-122 | 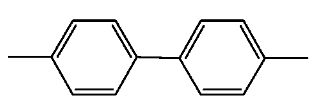 | 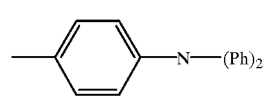 | Ph | H |
| E-4-123 | " | " | H | Ph |
| E-4-124 | " | b-biphenylyl | Ph | H |
| E-4-125 | " | m-biphenylyl | Ph | H |
| E-4-126 | " | o-biphenylyl | Ph | H |
| E-4-127 | " | 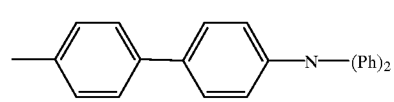 | H | H |

-continued
(E-4)
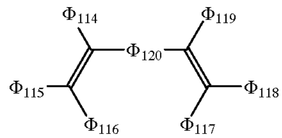
| | | | | |
|---|---|---|---|---|
| E-4-128 | " | 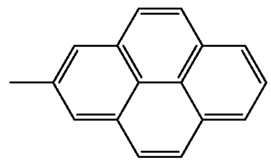 | H | H |
| E-4-129 | " | 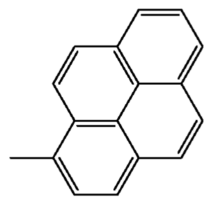 | H | H |
| E-4-130 | " | $\Phi_{115}$ = Ph<br>$\Phi_{118}$ = H | $\Phi_{116}$ = H<br>$\Phi_{117}$ = Ph | H |
| (E-4) Compound | $\Phi_{120}$ | $\Phi_{115}$–$\Phi_{118}$ | $\Phi_{114}$, $\Phi_{119}$ |
|---|---|---|---|
| E-4-201 | 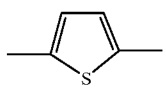 | Ph | Ph |
| E-4-202 | " | o-biphenylyl | Ph |
| E-4-203 | " | m-biphenylyl | Ph |
| E-4-204 | " | p-biphenylyl | Ph |
| E-4-205 | " | 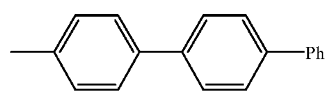 | Ph |
| E-4-206 | " | 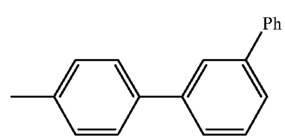 | Ph |
| E-4-207 | " | 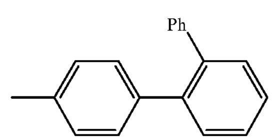 | Ph |
| E-4-208 | " | 2-naphthyl | Ph |
| E-4-209 | " | 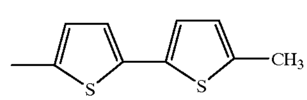 | Ph |
| E-4-210 | " | 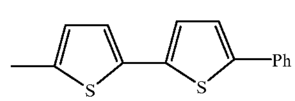 | Ph |

-continued
(E-4)
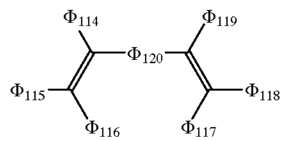
| | | | |
|---|---|---|---|
| E-4-211 | " | 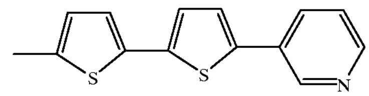 | Ph |
| E-4-212 | " | 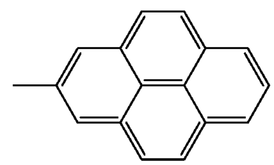 | Ph |
| E-4-213 | " | 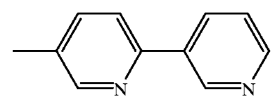 | Ph |
| E-4-214 | " | 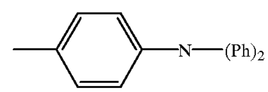 | Ph |
| E-4-215 | " | 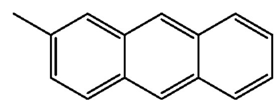 | Ph |
| E-4-216 | " | 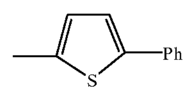 | Ph |
| E-4-217 | " | 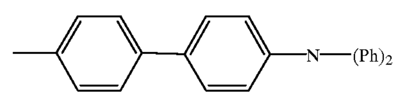 | Ph |
| E-4-218 | " | 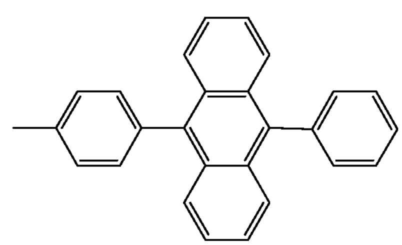 | Ph |
| E-4-219 | " | $\Phi_{115} = \Phi_{117} = Ph$<br>$\Phi_{116} = \Phi_{118} = H$ | H |
| E-4-301 | 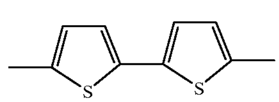 | Ph | Ph |
| E-4-302 | " | o-biphenylyl | Ph |
| E-4-303 | " | m-biphenylyl | Ph |
| E-4-304 | " | p-biphenylyl | Ph |

-continued
(E-4)
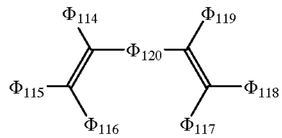
| | | | |
|---|---|---|---|
| E-4-305 | " | 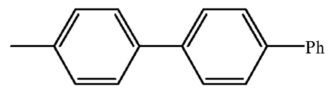 | Ph |
| E-4-306 | " | 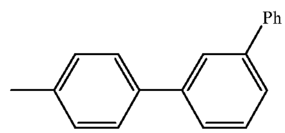 | Ph |
| E-4-307 | " | 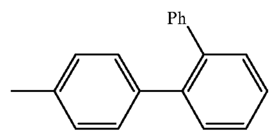 | Ph |
| E-4-308 | " | 2-naphthyl | Ph |
| E-4-309 | " | 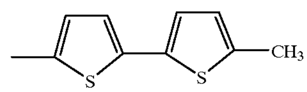 | Ph |
| E-4-310 | " | 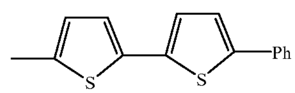 | Ph |
| E-4-311 | " | 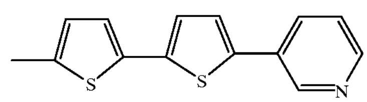 | Ph |
| E-4-312 | " | 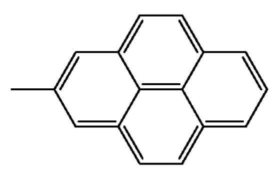 | Ph |
| E-4-313 | " | 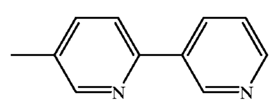 | Ph |
| E-4-314 | " | 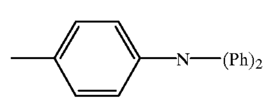 | Ph |
| E-4-315 | " | 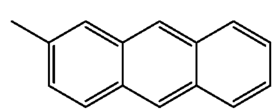 | Ph |
| E-4-316 | " | 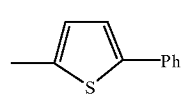 | Ph |

-continued
(E-4)
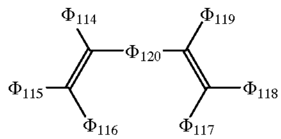
| | | | |
|---|---|---|---|
| E-4-317 | " | 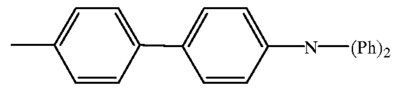 | Ph |
| E-4-318 | " | 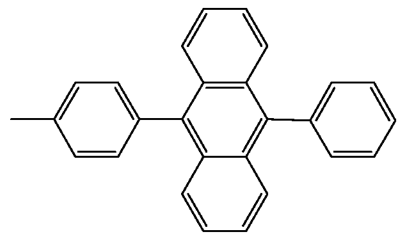 | Ph |
| E-4-319 | " | p-biphenylyl | H |
| E-4-320 | " | m-biphenylyl | H |
| E-4-321 | " | o-biphenylyl | H |
| E-4-322 | " | $\Phi_{115} = \Phi_{117} = Ph$<br>$\Phi_{116} = \Phi_{118} = H$ | H |
| E-4-401 | 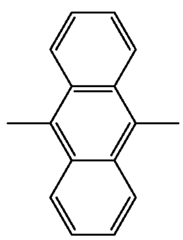 | Ph | Ph |
| E-4-402 | " | o-biphenylyl | Ph |
| E-4-403 | " | m-biphenylyl | Ph |
| E-4-404 | " | p-biphenylyl | Ph |
| E-4-405 | " | 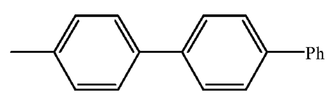 | Ph |
| E-4-406 | " | 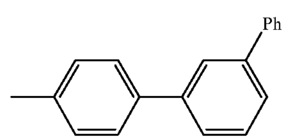 | Ph |
| E-4-407 | " | 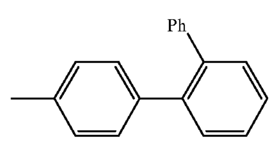 | Ph |
| E-4-408 | " | 2-naphthyl | Ph |
| E-4-409 | " | 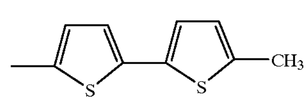 | Ph |

-continued
(E-4)
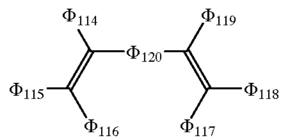
| | | | |
|---|---|---|---|
| E-4-410 | " | 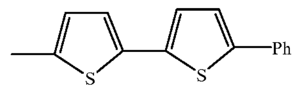 | Ph |
| E-4-411 | " | 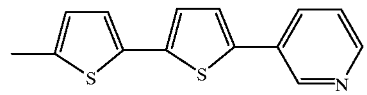 | Ph |
| E-4-412 | " | 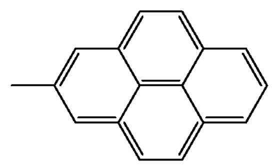 | Ph |
| E-4-413 | " | 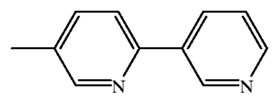 | Ph |
| E-4-414 | " | 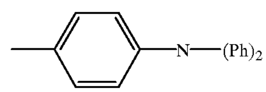 | Ph |
| E-4-415 | " | 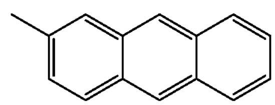 | Ph |
| E-4-416 | " | 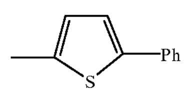 | Ph |
| E-4-417 | " | 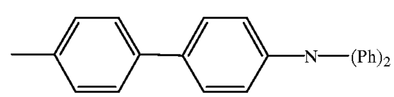 | Ph |
| E-4-418 | " | 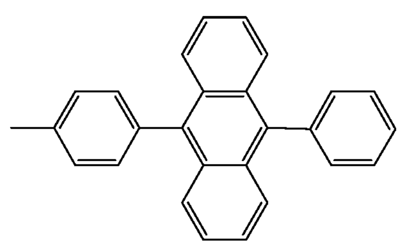 | Ph |

-continued
(E-4)
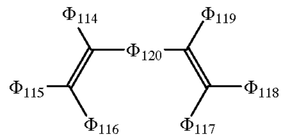
| | | | |
|---|---|---|---|
| E-4-419 | 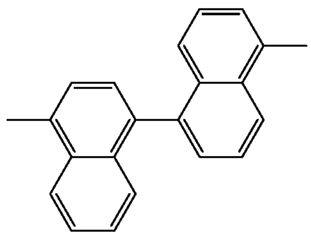 | Ph | Ph |
| E-4-501 | 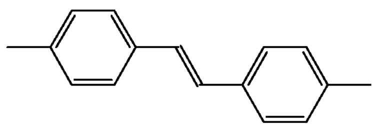 | Ph | Ph |
| E-4-502 | " | o-biphenylyl | Ph |
| E-4-503 | " | m-biphenylyl | Ph |
| E-4-504 | " | p-biphenylyl | Ph |
| E-4-505 | " | 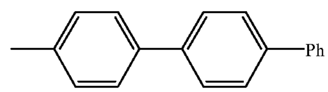 | Ph |
| E-4-506 | " | 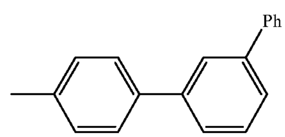 | Ph |
| E-4-507 | " | 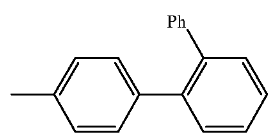 | Ph |
| E-4-508 | " | 2-naphthyl | Ph |
| E-4-509 | " | 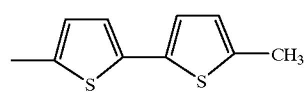 | Ph |
| E-4-510 | " | 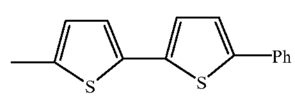 | Ph |
| E-4-511 | " | 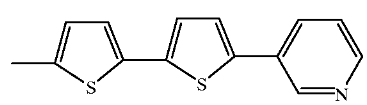 | Ph |
| E-4-512 | " | 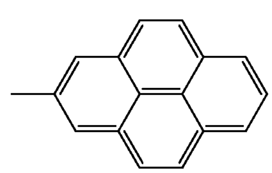 | Ph |

-continued
(E-4)
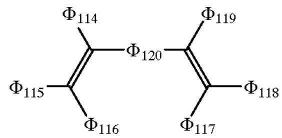
| | | | |
|---|---|---|---|
| E-4-513 | " | 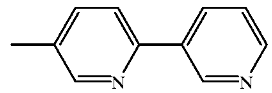 | Ph |
| E-4-514 | " | 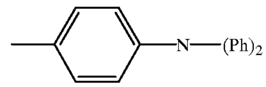 | Ph |
| E-4-515 | " | 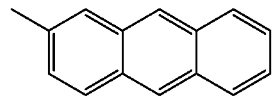 | Ph |
| E-4-516 | " | 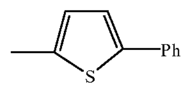 | Ph |
| E-4-517 | " | 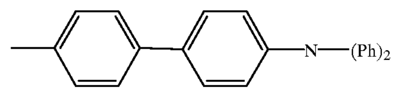 | Ph |
| E-4-518 | " | 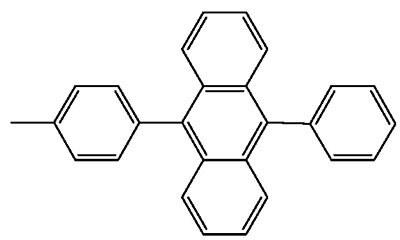 | Ph |
| E-4-519 | " | p-biphenylyl | H |
| E-4-520 | " | m-biphenylyl | H |
| E-4-521 | " | o-biphenylyl | H |
| E-4-522 | " | $\Phi_{115} = \Phi_{118} =$ 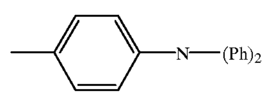 $\Phi_{116} = \Phi_{117} = H$ | H |
| E-4-523 | " | $\Phi_{115} = \Phi_{118} =$ 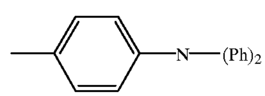 $\Phi_{116} = \Phi_{117} = H$ | Ph |
| E-4-524 | " | $\Phi_{115} = \Phi_{118} =$ p-biphenylyl $\Phi_{116} = \Phi_{117} =$ Ph | H |
| E-4-525 | " | $\Phi_{115} = \Phi_{118} =$ o-biphenylyl $\Phi_{116} = \Phi_{117} =$ Ph | H |
| E-4-526 | " | $\Phi_{115} = \Phi_{118} =$ m-biphenylyl $\Phi_{116} = \Phi_{117} =$ Ph | H |
| E-4-527 | " | $\Phi_{115} = \Phi_{118} =$ 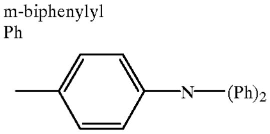 $\Phi_{116} = \Phi_{117} = H$ | H |

-continued
(E-4)
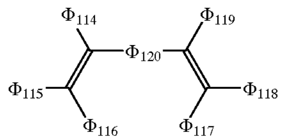
| | | | |
|---|---|---|---|
| E-4-528 | " | $\Phi_{115} = \Phi_{118}$ = 1-pyrenyl<br>$\Phi_{116} = \Phi_{117}$ = H | H |
| E-4-529 | " | $\Phi_{115} = \Phi_{118}$ = 2-pyrenyl<br>$\Phi_{116} = \Phi_{117}$ = H | H |
| E-4-601 | 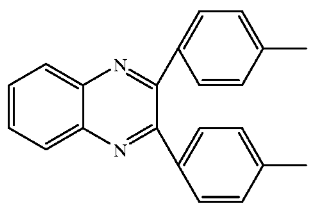 | Ph | Ph |
| E-4-602 | " | o-biphenylyl | Ph |
| E-4-603 | " | m-biphenylyl | Ph |
| E-4-604 | " | p-biphenylyl | Ph |
| E-4-605 | " | 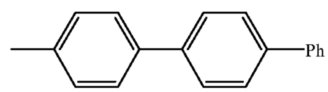 | Ph |
| E-4-606 | " | 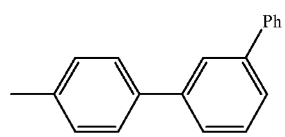 | Ph |
| E-4-607 | " | 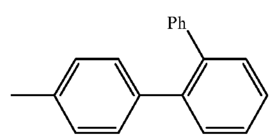 | Ph |
| E-4-608 | " | 2-naphthyl | Ph |
| E-4-609 | " | 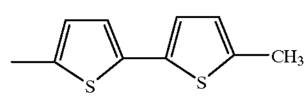 | Ph |
| E-4-610 | " | 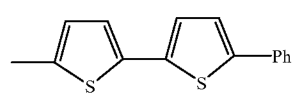 | Ph |
| E-4-611 | " | 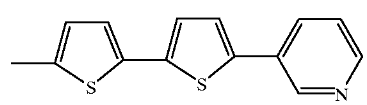 | Ph |
| E-4-612 | " | 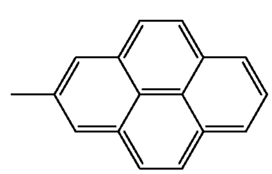 | Ph |

-continued
(E-4)
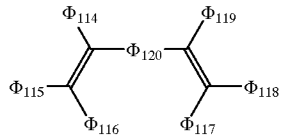
| | | | |
|---|---|---|---|
| E-4-613 | " | 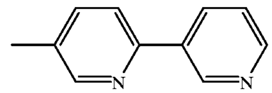 | Ph |
| E-4-614 | " | 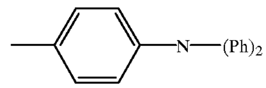 | Ph |
| E-4-615 | " | 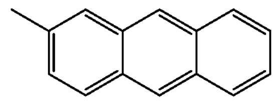 | Ph |
| E-4-616 | " | 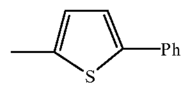 | Ph |
| E-4-617 | " | 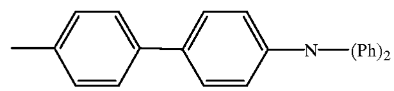 | Ph |
| E-4-618 | " | 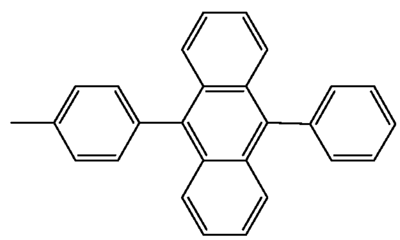 | Ph |
| E-4-619 | " | $\Phi_{115} = \Phi_{116} = Ph$<br>$\Phi_{116} = \Phi_{117} = H$ | H |
| E-4-701 | 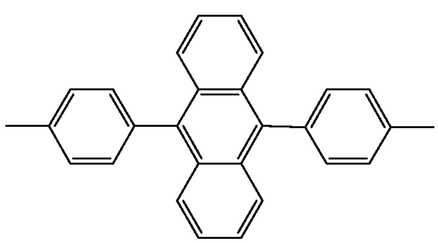 | Ph | Ph |
| E-4-702 | " | o-biphenylyl | Ph |
| E-4-703 | " | m-biphenylyl | Ph |
| E-4-704 | " | p-biphenylyl | Ph |
| E-4-705 | " | 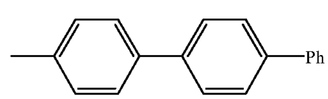 | Ph |

-continued
(E-4)
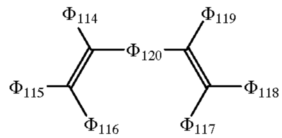
| | | | |
|---|---|---|---|
| E-4-706 | " | 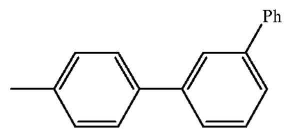 | Ph |
| E-4-707 | " | 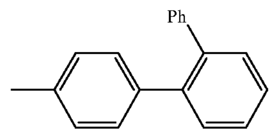 | Ph |
| E-4-708 | " | 2-naphthyl | Ph |
| E-4-709 | " | 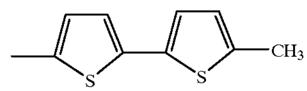 | Ph |
| E-4-710 | " | 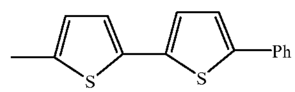 | Ph |
| E-4-711 | " | 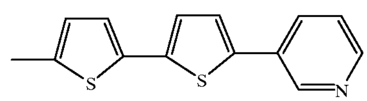 | Ph |
| E-4-712 | " | 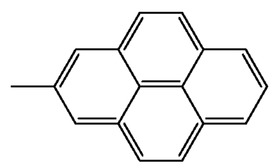 | Ph |
| E-4-713 | " | 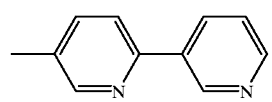 | Ph |
| E-4-714 | " | 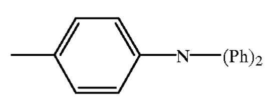 | Ph |
| E-4-715 | " | 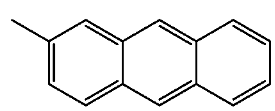 | Ph |
| E-4-716 | " | 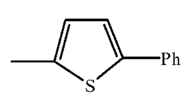 | Ph |
| E-4-717 | " | 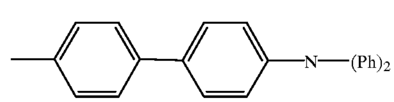 | Ph |

-continued
(E-4)
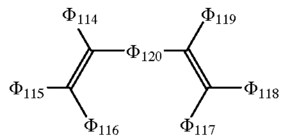
| | | | |
|---|---|---|---|
| E-4-718 | " | 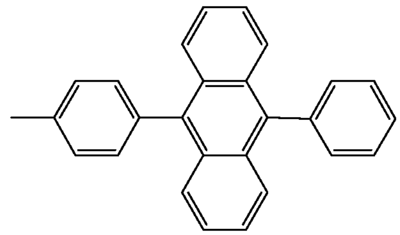 | Ph |
| E-4-719 | 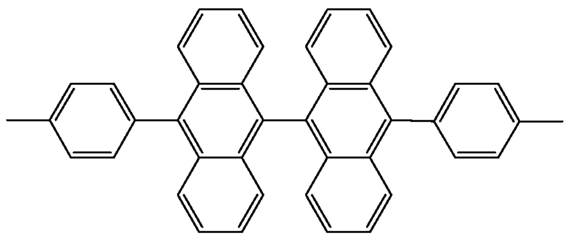 | Ph | Ph |
| E-4-720 | 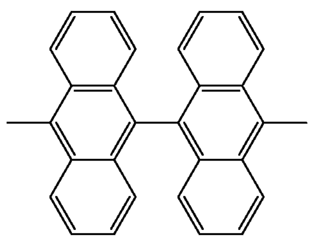 | Ph | Ph |
| E-4-801 | 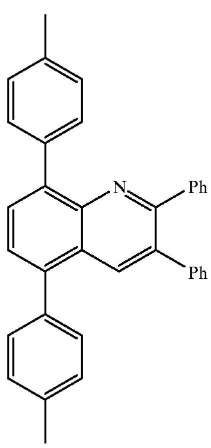 | Ph | Ph |
| E-4-802 | " | o-biphenylyl | Ph |
| E-4-803 | " | m-biphenylyl | Ph |
| E-4-804 | " | p-biphenylyl | Ph |
| E-4-805 | " | 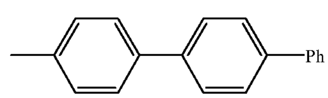 | Ph |

-continued
(E-4)
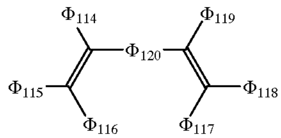
| | | | |
|---|---|---|---|
| E-4-806 | " | 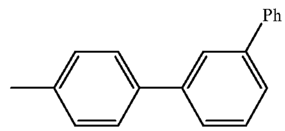 | Ph |
| E-4-807 | " | 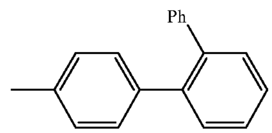 | Ph |
| E-4-808 | " | 2-naphthyl | Ph |
| E-4-809 | " | 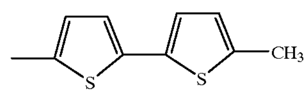 | Ph |
| E-4-810 | " | 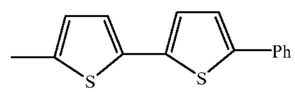 | Ph |
| E-4-811 | " | 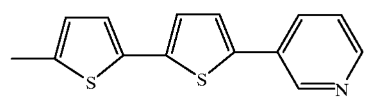 | Ph |
| E-4-812 | " | 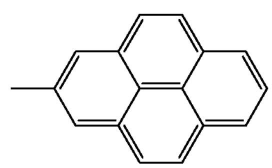 | Ph |
| E-4-813 | " | 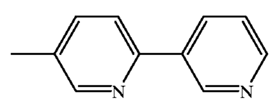 | Ph |
| E-4-814 | " | 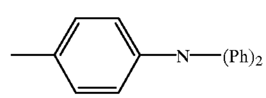 | Ph |
| E-4-815 | " | 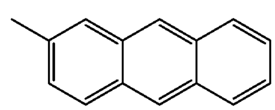 | Ph |
| E-4-816 | " | 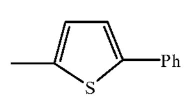 | Ph |
| E-4-817 | " | 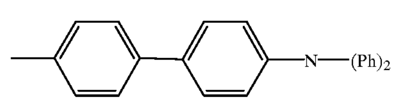 | Ph |

-continued
(E-4)
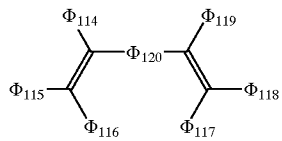
| | | | |
|---|---|---|---|
| E-4-818 | " | 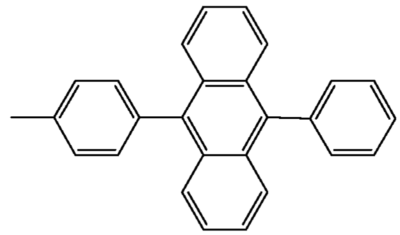 | Ph |
| E-4-819 | 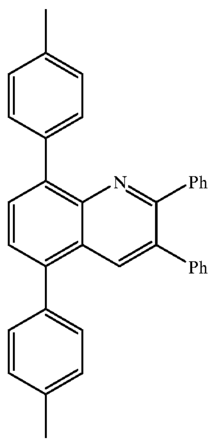 | Ph | Ph |
| E-4-820 | 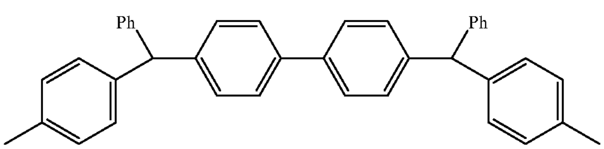 | Ph | Ph |
(E-5)
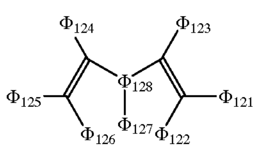
| (E-5) Compound | $\Phi_{128}$ | $\Phi_{127}$ | $\Phi_{121}$ | $\Phi_{122}$ | $\Phi_{123}$ | $\Phi_{124}$ | $\Phi_{125}$ | $\Phi_{126}$ |
|---|---|---|---|---|---|---|---|---|
| E-5-1 | 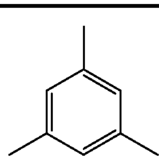 | Ph | same | same | same | same | same | same |

-continued
(E-5)
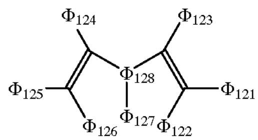
| (E-5) Compound | $\Phi_{128}$ | $\Phi_{127}$ | $\Phi_{121}$ | $\Phi_{122}$ | $\Phi_{123}$ | $\Phi_{124}$ | $\Phi_{125}$ | $\Phi_{126}$ |
|---|---|---|---|---|---|---|---|---|
| E-5-2 | 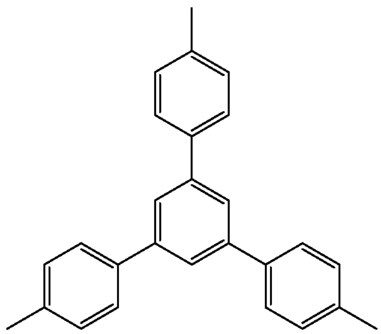 | Ph | same | same | same | same | same | same |
| E-5-3 | 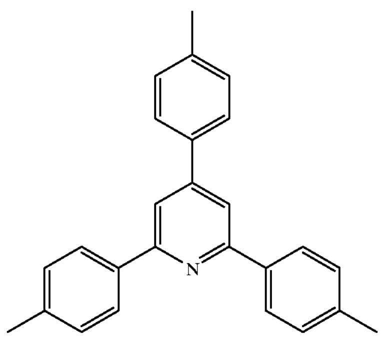 | Ph | same | same | same | same | same | same |
| E-5-4 | 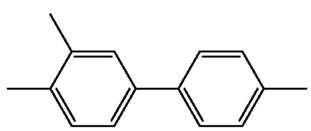 | Ph | same | same | same | same | same | same |
| E-5-5 | 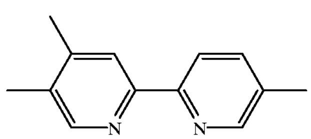 | Ph | same | same | same | same | same | same |
| E-5-6 | 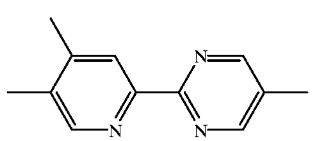 | Ph | same | same | same | same | same | same |
| E-5-7 | 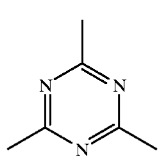 | Ph | same | same | same | same | same | same |

(E-6)
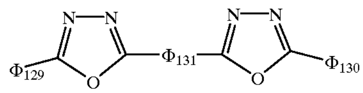
| (E-6) Compound | $\Phi_{131}$ | $\Phi_{130}$ | $\Phi_{129}$ |
|---|---|---|---|
| E-6-1 | 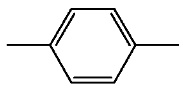 | Ph | Ph |
| E-6-2 | 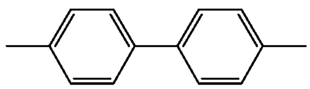 | Ph | Ph |
| E-6-3 | 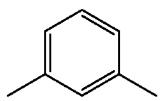 | Ph | Ph |
| E-6-4 | 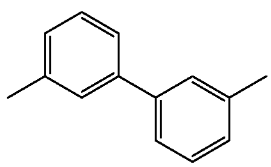 | Ph | Ph |
| E-6-5 | 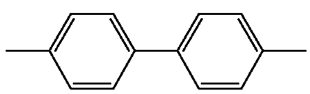 | 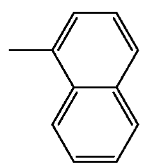 | 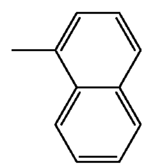 |
| E-6-6 | 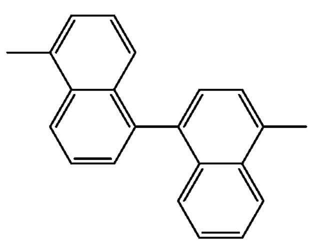 | 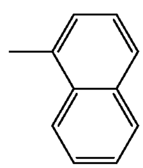 | 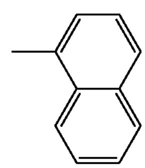 |
| E-6-7 | 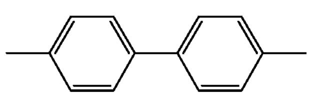 | p-biphenylyl | p-biphenylyl |
| E-6-8 | 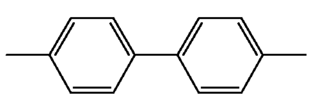 | m-biphenylyl | m-biphenylyl |

-continued
(E-6)
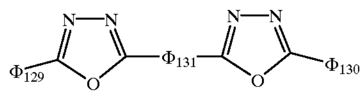
| (E-6) Compound | $\Phi_{131}$ | $\Phi_{130}$ | $\Phi_{129}$ |
|---|---|---|---|
| E-6-9 | 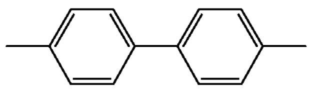 | 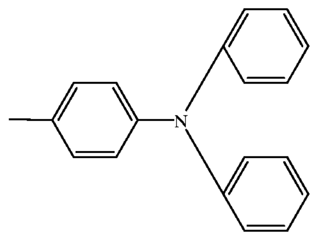 | 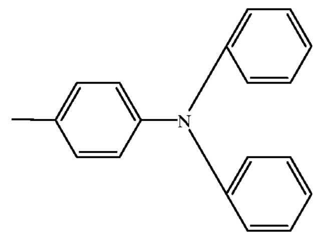 |
| E-6-10 | 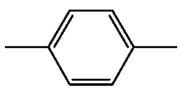 | 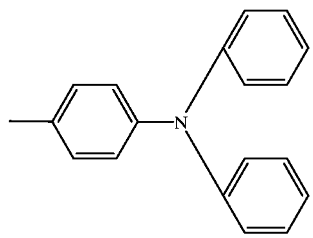 | 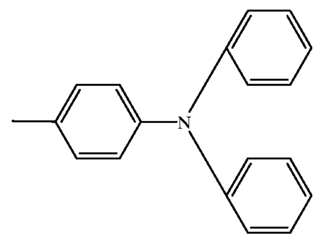 |
(E-7)
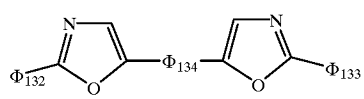
| (E-7) Compound | $\Phi_{132}$ | $\Phi_{133}$ | $\Phi_{134}$ |
|---|---|---|---|
| E-7-1 | Ph | Ph | 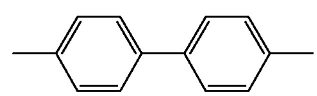 |
| E-7-2 | p-biphenylyl | p-biphenylyl | 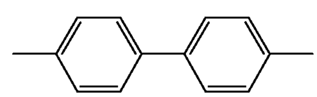 |
| E-7-3 | m-biphenylyl | m-biphenylyl | 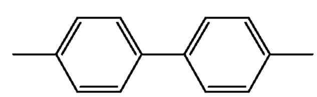 |
| E-7-4 | 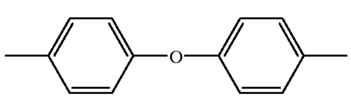 | 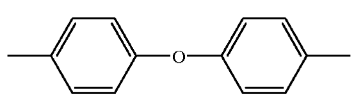 | 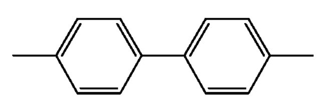 |
| E-7-5 | 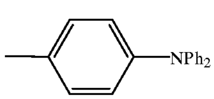 | 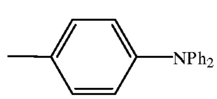 | 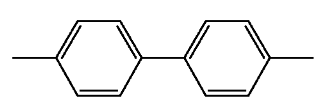 |

-continued
(E-7)
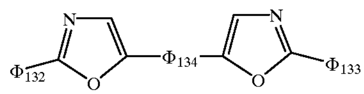
| (E-7) Compound | $\Phi_{132}$ | $\Phi_{133}$ | $\Phi_{134}$ |
|---|---|---|---|
| E-7-6 | Ph | Ph | 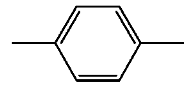 |
| E-7-7 | p-biphenylyl | p-biphenylyl | 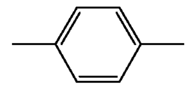 |
| E-7-8 | m-biphenylyl | m-biphenylyl | 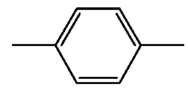 |
| E-7-9 | 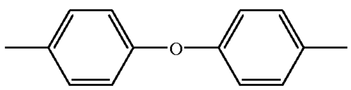 | 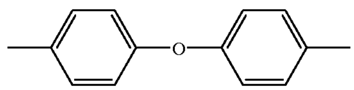 | 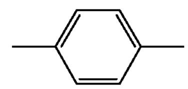 |
| E-7-10 | 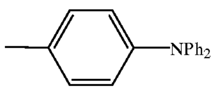 | 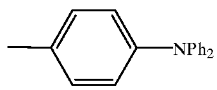 | 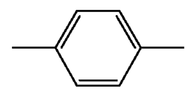 |
(E-8)
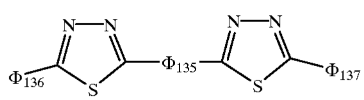
| (E-8) Compound | $\Phi_{136}$ | $\Phi_{137}$ | $\Phi_{138}$ |
|---|---|---|---|
| E-8-1 | Ph | Ph | 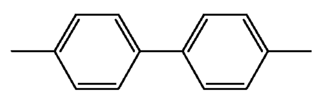 |
| E-8-2 | p-biphenylyl | p-biphenylyl | 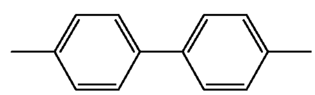 |
| E-8-3 | m-biphenylyl | m-biphenylyl | 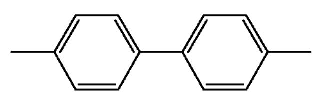 |
| E-8-4 | 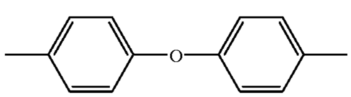 | 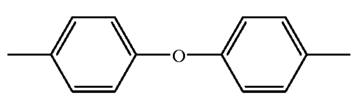 | 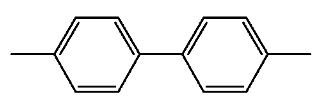 |
| E-8-5 | 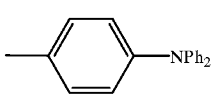 | 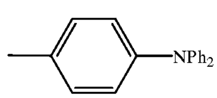 | 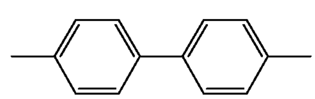 |

-continued
(E-8)
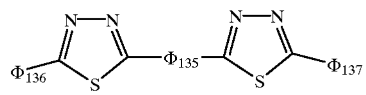
| (E-8) Compound | $\Phi_{136}$ | $\Phi_{137}$ | $\Phi_{138}$ |
|---|---|---|---|
| E-8-6 | Ph | Ph | 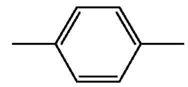 |
| E-8-7 | p-biphenylyl | p-biphenylyl | 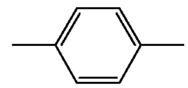 |
| E-8-8 | m-biphenylyl | m-biphenylyl | 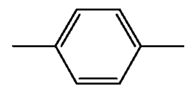 |
| E-8-9 | 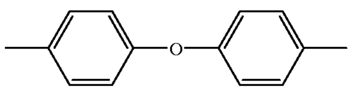 | 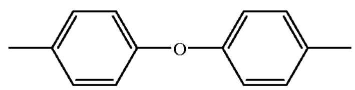 | 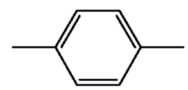 |
| E-8-10 | 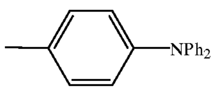 | 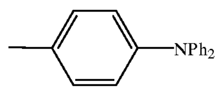 | 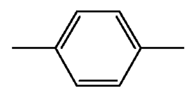 |
(E-9)
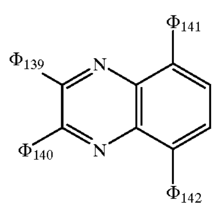
| (E-9) Compound | $\Phi_{139}$ | $\Phi_{140}$ |
|---|---|---|
| E-9-1 | Ph | Ph |
| E-9-2 | Ph | Ph |
| E-9-3 | p-biphenylyl | p-biphenylyl |
| E-9-4 | p-biphenylyl | p-biphenylyl |
| E-9-5 | m-biphenylyl | m-biphenylyl |
| E-9-6 | m-biphenylyl | m-biphenylyl |
| E-9-7 | 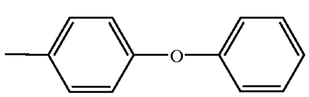 | 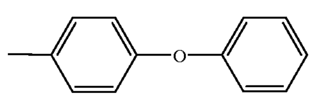 |
| E-9-8 | 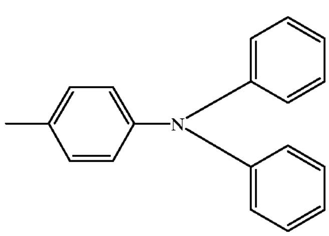 | 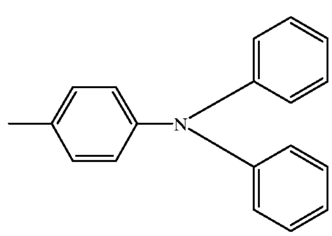 |

-continued
(E-9)
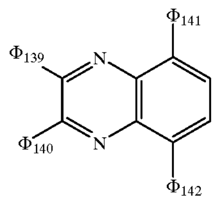
| | | |
|---|---|---|
| E-9-9 | 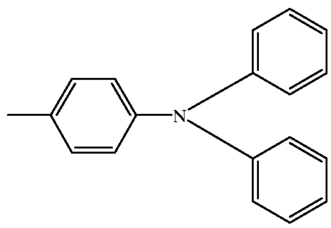 | 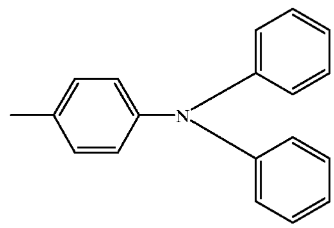 |
| E-9-10 | 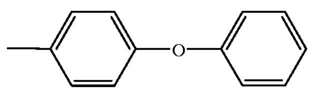 | 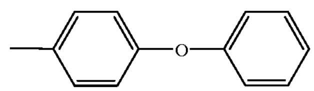 |
| E-9-11 | Ph | Ph |
| E-9-12 | Ph | Ph |
| Compound | $\phi_{141}$ | $\Phi_{142}$ |
|---|---|---|
| E-9-1 | Ph | Ph |
| E-9-2 | H | H |
| E-9-3 | Ph | Ph |
| E-9-4 | H | H |
| E-9-5 | Ph | Ph |
| E-9-6 | H | H |
| E-9-7 | Ph | Ph |
| E-9-8 | Ph | Ph |
| E-9-9 | H | H |
| E-9-10 | H | H |
| E-9-11 | 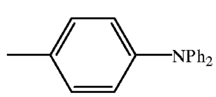 | 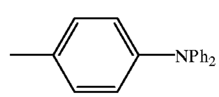 |
| E-9-12 | 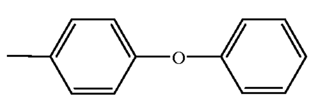 | 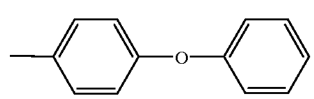 |

(E-10)

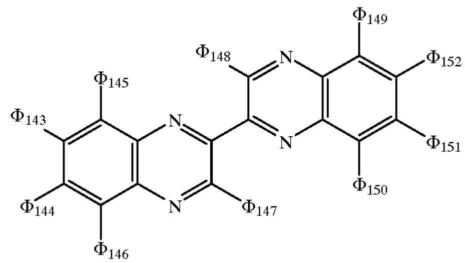

| (E-10) Compound | $\Phi_{143}$ | $\Phi_{144}$ | $\Phi_{145}$ | $\Phi_{146}$ | $\Phi_{147}$ |
|---|---|---|---|---|---|
| E-10-1 | H | H | H | H | Ph |
| E-10-2 | Ph | Ph | H | H | H |
| E-10-3 | H | H | H | H | p-biphenylyl |
| E-10-4 | p-biphenylyl | p-biphenylyl | H | H | H |
| E-10-5 | m-biphenylyl | m-biphenylyl | H | H | H |
| E-10-6 | 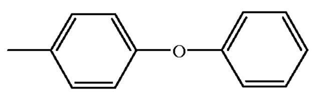 | 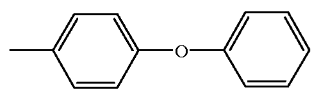 | H | H | H |
| E-10-7 | H | H | Ph | Ph | Ph |
| E-10-8 | Ph | Ph | Ph | Ph | Ph |

| (E-10) Compound | $\Phi_{148}$ | $\Phi_{149}$ | $\Phi_{150}$ | $\Phi_{151}$ | $\Phi_{152}$ |
|---|---|---|---|---|---|
| E-10-1 | Ph | H | H | H | H |
| E-10-2 | H | H | H | Ph | Ph |
| E-10-3 | p-biphenylyl | H | H | H | H |
| E-10-4 | H | H | H | p-biphenylyl | p-biphenylyl |
| E-10-5 | H | H | H | m-biphenylyl | m-biphenylyl |
| E-10-6 | H | H | H | 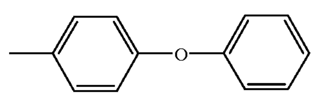 | 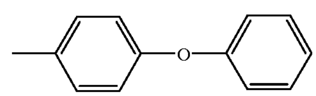 |
| E-10-7 | Ph | Ph | Ph | H | H |
| E-10-8 | Ph | Ph | Ph | Ph | Ph |

(E-11)

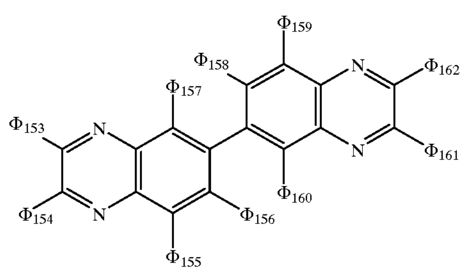

| (E-11) Compound | $\Phi_{153}$ | $\Phi_{154}$ | $\Phi_{155}$ | $\Phi_{156}$ | $\Phi_{157}$ |
|---|---|---|---|---|---|
| E-11-1 | Ph | Ph | H | H | H |
| E-11-2 | p-biphenylyl | p-biphenylyl | H | H | H |
| E-11-3 | m-biphenylyl | m-biphenylyl | H | H | H |

-continued
(E-11)
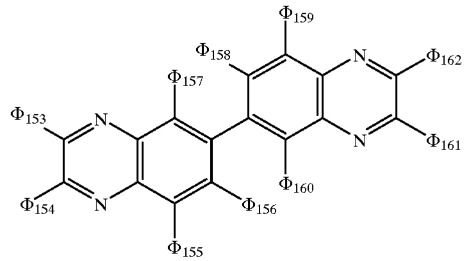
| | | | | | |
|---|---|---|---|---|---|
| E-11-4 | 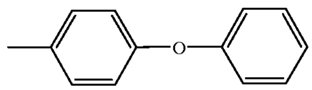 | 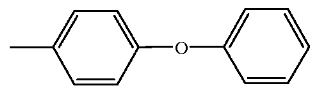 | H | H | H |
| E-11-5 | Ph | Ph | H | Ph | H |
| E-11-6 | Ph | Ph | Ph | Ph | Ph |
| E-11-7 | Ph | Ph | Ph | H | Ph |
| (E-11) Compound | $\Phi_{158}$ | $\Phi_{159}$ | $\Phi_{160}$ | $\Phi_{161}$ | $\Phi_{162}$ |
|---|---|---|---|---|---|
| E-11-1 | H | H | H | Ph | Ph |
| E-11-2 | H | H | H | p-biphenylyl | p-biphenylyl |
| E-11-3 | H | H | H | m-biphenylyl | m-biphenylyl |
| E-11-4 | H | H | H | 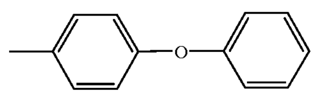 | 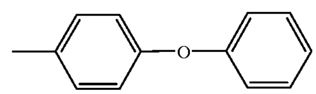 |
| E-11-5 | Ph | H | H | Ph | Ph |
| E-11-6 | Ph | Ph | Ph | Ph | Ph |
| E-11-7 | H | H | H | Ph | Ph |

(E-12)
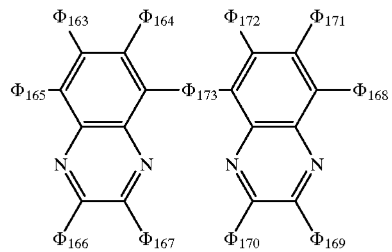
| (E-12) Compound | $\Phi_{163}$ | $\Phi_{164}$ | $\Phi_{165}$ | $\Phi_{166}$ | $\Phi_{167}$ | $\Phi_{168}$ | $\Phi_{169}$ | $\Phi_{170}$ | $\Phi_{171}$ | $\Phi_{172}$ | $\Phi_{173}$ |
|---|---|---|---|---|---|---|---|---|---|---|---|
| E-12-1 | H | H | Ph | Ph | Ph | Ph | Ph | Ph | H | H | 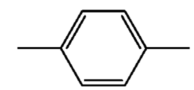 |
| E-12-2 | H | H | Ph | Ph | Ph | Ph | Ph | Ph | H | H | 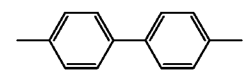 |
| E-12-3 | Ph | Ph | Ph | Ph | Ph | Ph | Ph | Ph | Ph | Ph | 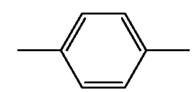 |
| E-12-4 | Ph | Ph | Ph | Ph | Ph | Ph | Ph | Ph | Ph | Ph | 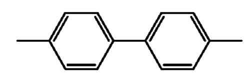 |
| E-12-5 | H | H | Ph | p-biphenylyl | p-biphenylyl | Ph | p-biphenylyl | p-biphenylyl | H | H | 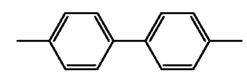 |
| E-12-6 | H | H | Ph | m-biphenylyl | m-biphenylyl | Ph | m-biphenylyl | m-biphenylyl | H | H | 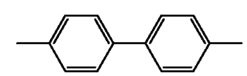 |

-continued
(E-12)
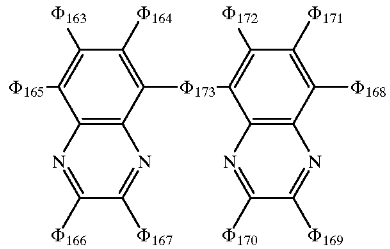
| (E-12) Compound | $\Phi_{163}$ | $\Phi_{164}$ | $\Phi_{165}$ | $\Phi_{166}$ | $\Phi_{167}$ | $\Phi_{168}$ | $\Phi_{169}$ | $\Phi_{170}$ | $\Phi_{171}$ | $\Phi_{172}$ | $\Phi_{173}$ |
|---|---|---|---|---|---|---|---|---|---|---|---|
| E-12-7 | H | H | Ph | 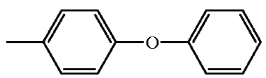 | 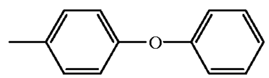 | Ph | 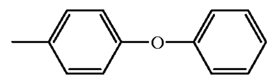 | 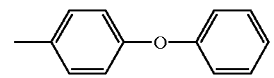 | H | H | 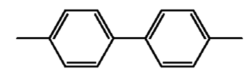 |
| E-12-8 | H | H | Ph | p-biphenylyl | p-biphenylyl | Ph | p-biphenylyl | p-biphenylyl | H | H | 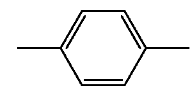 |
| E-12-9 | H | H | Ph | m-biphenylyl | m-biphenylyl | Ph | m-biphenylyl | m-biphenylyl | H | H | 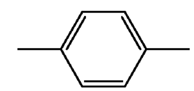 |
| E-12-10 | H | H | Ph | 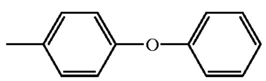 | 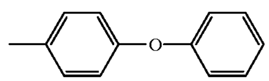 | Ph | 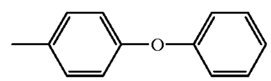 | 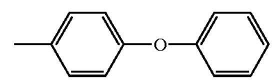 | H | H | 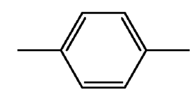 |

(E-13)

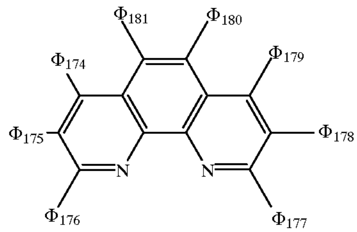

(E-13)

| Compound | $\Phi_{174}$ | $\Phi_{175}$ | $\Phi_{176}$ | $\Phi_{177}$ | $\Phi_{178}$ | $\Phi_{179}$ | $\Phi_{180}$ | $\Phi_{181}$ |
|---|---|---|---|---|---|---|---|---|
| E-13-1 | H | H | $CH_3$ | $CH_3$ | H | H | $CH_3$ | $CH_3$ |
| E-13-2 | H | H | $CH_3$ | $CH_3$ | H | H | Ph | Ph |
| E-13-3 | H | H | $CH_3$ | $CH_3$ | H | H | p-biphenylyl | p-biphenylyl |
| E-13-4 | H | H | $CH_3$ | $CH_3$ | H | H | m-biphenylyl | m-biphenylyl |
| E-13-5 | H | H | $CH_3$ | $CH_3$ | H | H | o-biphenylyl | o-biphenylyl |
| E-13-6 | H | H | 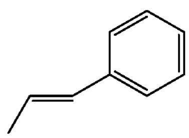 | 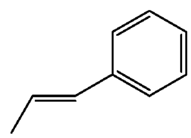 | H | H | Ph | Ph |
| E-13-7 | H | H | 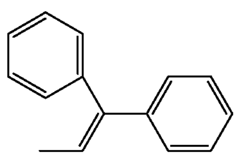 | 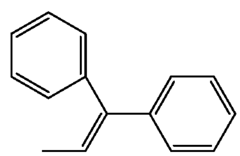 | H | H | Ph | Ph |
| E-13-8 | H | H | 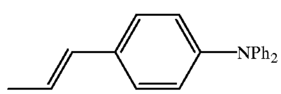  | 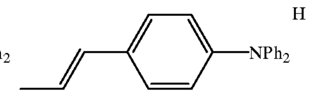  | H | H | Ph | Ph |
| E-13-9 | H | H | Ph | Ph | H | H | Ph | Ph |
| E-13-10 | H | H | p-tolyl | p-tolyl | H | H | Ph | Ph |
| E-13-11 | H | H | m-biphenylyl | m-biphenylyl | H | H | m-biphenylyl | m-biphenylyl |
| E-13-12 | Ph | Ph | Ph | Ph | Ph | Ph | Ph | Ph |

(E-14)

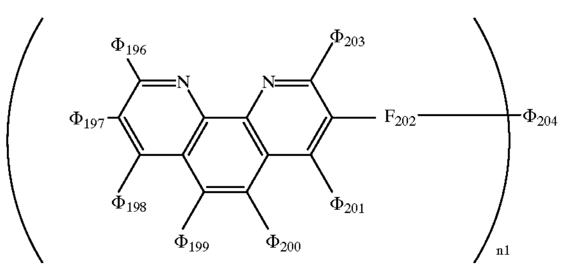

(E-14)

| Compound | $\Phi_{196}$ | $\Phi_{197}$ | $\Phi_{198}$ | $\Phi_{199}$ | $\Phi_{200}$ | $\Phi_{201}$ | $\Phi_{202}$ | $\Phi_{203}$ | $\Phi_{204}$ | n1 |
|---|---|---|---|---|---|---|---|---|---|---|
| E-14-1 | Ph | H | H | H | — | H | H | Ph | 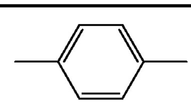 | 2 |

-continued
(E-14)
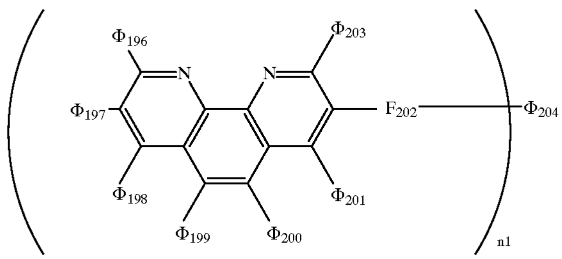
| (E-14) Compound | $\Phi_{196}$ | $\Phi_{197}$ | $\Phi_{198}$ | $\Phi_{199}$ | $\Phi_{200}$ | $\Phi_{201}$ | $\Phi_{202}$ | $\Phi_{203}$ | $\Phi_{204}$ | n1 |
|---|---|---|---|---|---|---|---|---|---|---|
| E-14-2 | Ph | H | H | H | — | H | H | Ph | 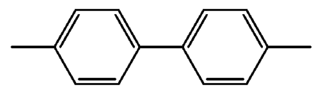 | 2 |
| E-14-3 | Ph | H | Ph | H | — | Ph | H | Ph | 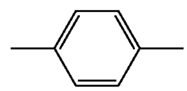 | 2 |
| E-14-4 | Ph | H | Ph | H | — | Ph | H | Ph | 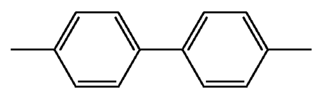 | 2 |
| E-14-5 | Ph | H | Ph | H | — | Ph | H | Ph | — | 2 |
| E-14-6 | Ph | H | H | H | H | — | H | Ph | 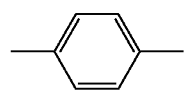 | 2 |
| E-14-7 | Ph | H | H | H | H | — | H | Ph | — | 2 |
| E-14-8 | Ph | H | H | H | H | — | H | Ph | 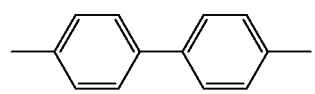 | 2 |
| E-14-9 | — | H | Ph | H | H | Ph | H | H | — | 2 |
| E-14-10 | — | H | Ph | H | H | Ph | H | H | 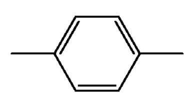 | 2 |
| E-14-11 | — | H | | H | H | Ph | H | H | 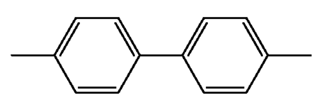 | 2 |
| E-14-12 | H | H | H | Ph | Ph | — | H | H | 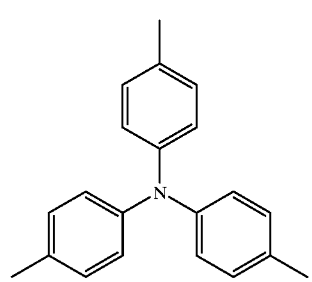 | 3 |

-continued
(E-14)
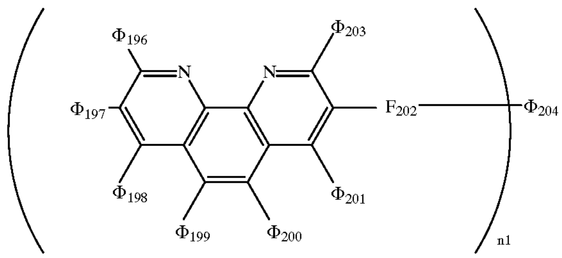
(E-14)
| Compound | $\Phi_{196}$ | $\Phi_{197}$ | $\Phi_{198}$ | $\Phi_{199}$ | $\Phi_{200}$ | $\Phi_{201}$ | $\Phi_{202}$ | $\Phi_{203}$ | $\Phi_{204}$ | n1 |
|---|---|---|---|---|---|---|---|---|---|---|
| E-14-13 | H | H | H | Ph | Ph | — | H | H | 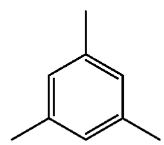 | 3 |
| E-14-14 | H | H | H | Ph | Ph | — | H | H | 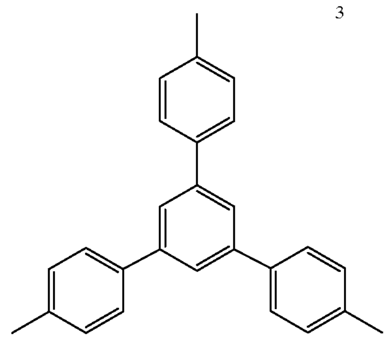 | 3 |
| E-14-15 | H | H | H | H | H | H | H | — | 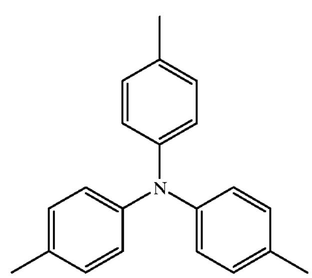 | 3 |
| E-14-16 | H | H | H | H | H | H | H | — | 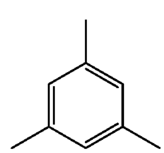 | 3 |

-continued (E-14)

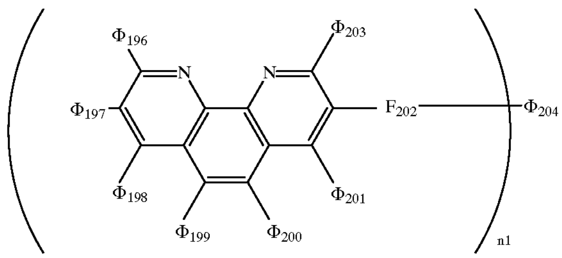

| (E-14) Compound | $\Phi_{196}$ | $\Phi_{197}$ | $\Phi_{198}$ | $\Phi_{199}$ | $\Phi_{200}$ | $\Phi_{201}$ | $\Phi_{202}$ | $\Phi_{203}$ | $\Phi_{204}$ | n1 |
|---|---|---|---|---|---|---|---|---|---|---|
| E-14-17 | H | H | H | H | H | H | H | — | 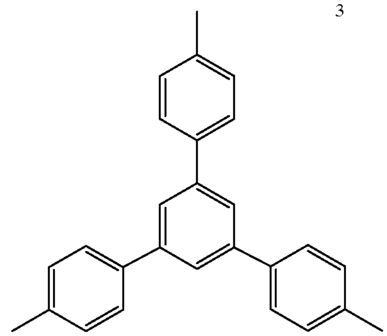 | 3 |

Each of the hole transporting host material and the electron transporting host material in the light emitting layer may be used alone or in admixture of two or more.

In the organic EL device of the above-mentioned construction, a hole injecting and transporting layer is provided on the anode side and an electron injecting and/or transporting layer is provided on the cathode side so that the light emitting layer is interleaved therebetween. The hole injecting and/or transporting layer, the electron injecting and/or transporting layer, the anode, and the cathode in this embodiment are the same as in the previous embodiments.

The methods involved in the preparation of the organic EL device, for example, the methods of forming organic compound layers including a mix layer are also the same as in the previous embodiments.

The organic EL device of the invention is generally of the DC drive type while it can be of the AC or pulse drive type. The applied voltage is generally about 2 to about 20 volts.

EXAMPLE

Examples of the present invention are given below by way of illustration.

Example 1

A glass substrate having a transparent ITO electrode (anode) of 200 nm thick was subjected to ultrasonic washing with neutral detergent, acetone, and ethanol, pulled up from boiling ethanol, dried, cleaned with UV/ozone, and then secured by a holder in an evaporation chamber, which was evacuated to a vacuum of $1\times10^{-6}$ Torr.

Then, 4,4',4"-tris(N-(3-methylphenyl)-N-phenylamino) triphenylamine (MTDATA) was evaporated at a deposition rate of 2 nm/sec. to a thickness of 50 nm, forming a hole injecting layer.

Exemplary Compound II-102, N,N'-diphenyl-N,N'-bis(4'-(N-(m-biphenyl)-N-phenyl)aminobiphenyl-4-yl)benzidine was evaporated at a deposition rate of 2 nm/sec. to a thickness of 20 nm, forming a hole transporting layer.

Next, Exemplary Compound I-201 and tris(8-quinolinolato)aluminum (AlQ3) in a weight ratio of 2:100 were evaporated to a thickness of 50 nm, forming a light emitting layer.

With the vacuum kept, tris(8-quinolinolato)aluminum was then evaporated at a deposition rate of 0.2 nm/sec. to a thickness of 10 nm, forming an electron injecting and transporting layer.

Next, with the vacuum kept, MgAg (weight ratio 10:1) was evaporated at a deposition rate of 0.2 nm/sec. to a thickness of 200 nm to form a cathode, and aluminum was evaporated to a thickness of 100 nm as a protective layer, obtaining an EL device.

When current was conducted through the EL device under a certain applied voltage, the device was found to emit 103,800 cd/m$^2$ green light (emission maximum wavelength $\lambda$max=525 nm, chromaticity coordinates x=0.28, y=0.68) at 14 Vand 800 mA/cm$^2$. Stable light emission continued over 10, 000 hours in a dry argon atmosphere. No local dark spots appeared or grew. On constant current driving at 10 mA/cm$^2$, the half-life of luminance was 890 hours from an initial luminance of 1,288 cd/m$^2$ (drive voltage increase 1.5 V) and 4,500 hours from an initial luminance 300 cd/m$^2$.

Example 2

The device was fabricated as in Example 1 except that Exemplary Compound II-101, N,N'-diphenyl-N,N'-bis(4'-(N,N-bis (m-biphenyl) aminobiphenyl-4-yl) benzidine was used in the hole transporting layer instead of Exemplary Compound II-102.

When current was conducted through the EL device under a certain applied voltage, the device was found to emit 100,480 cd/m$^2$ green light (emission maximum wavelength λmax=525 nm, chroimaticitycoordinates x=0.31, y=0.66) at 14 Vand 753 mA/cm$^2$. Stable light emission continued over 10,000 hours in a dry nitrogen atmosphere. No local dark spots appeared or grew. On constant current driving at 10 mA/cm$^2$, the half-life of luminance was 680 hours (1,433 cd/m$^2$, drive voltage increase 1.5 V) and 4,000 hours from an initial luminance 300 cd/m$^2$.

Example 3

The device was fabricated as in Example 1 except that Exemplary Compound I-203 was used in the light emitting layer instead of Exemplary Compound I-201.

When current was conducted through the EL device under a certain applied voltage, the device was found to emit 69,500 cd/m$^2$ green light (emission maximum wavelength λmax=515 nm, chromaticity coordinates x=0.26, y=0.66) at 13 V and 553 mA/cm$^2$. Stable light emission continued over 10,000 hours in a dry nitrogen atmosphere. No local dark spots appeared or grew. On constant current driving at 10 mA/cm$^2$, the half-life of luminance was 600 hours (1,078cd/m$^2$, drive voltage increase 1.5 V) and 4,000 hours from an initial luminance 300 cd/m$^2$.

Example 4

The device was fabricated as in Example 1 except that Exemplary Compound I-202 was used in the light emitting layer instead of Exemplary Compound I-201.

When current was conducted through the EL device under a certain applied voltage, the device was found to emit 71,700 cd/m$^2$ green light (emission maximum wavelength λmax=515 nm, chromaticity coordinates x=0.29, y=0.64) at 14 V and 753 mA/cm$^2$. Stable light emission continued over 10,000 hours in a dry nitrogen atmosphere. No local dark spots appeared or grew. On constant current driving at 10 mA/cm$^2$, the half-life of luminance was (800 hours (998 cd/m$^2$, drive voltage increase 1.5 V) and 5,000 hours from an initial luminance 300 cd/M$^2$.

Example 5

The device was fabricated as in Example 1 except that Exemplary Compound I-103 was used in the light emitting layer instead of Exemplary Compound I-201.

When current was conducted through the EL device under a certain applied voltage, the device was found to emit 61,400 cd/m$^2$ green light (emission maximum wavelength λmax=510 nm, chromaticity coordinates x=0.23, y=0.63) at 16 V and 980 mA/cm$^2$. Stable light emission continued over 10,000 hours in a dry nitrogen atmosphere. No local dark spots appeared or grew. On constant current driving at 10 mA/cm$^2$, the half-life of luminance was 3,000 hours (730 cd/m$^2$, drive voltage increase 8.0 V) and 10,000 hours from an initial luminance 300 cd/m$^2$.

Example 6

The device was fabricated as in Example 1 except that Exemplary Compound I-104 was used in the light emitting layer instead of Exemplary Compound I-201.

When current was conducted through the EL device under a certain applied voltage, the device was found to emit 40,300 cd/m$^2$ green light (emission maximum wavelength λmax=500 nm, chromaticity coordinates x=0.23, y=0.58) at 12 V and 625 mA/cm$^2$. Stable light emission continued over 10,000 hours in a dry nitrogen atmosphere. No local dark spots appeared or grew. On constant current driving at 10 mA/cm$^2$, the half-life of luminance was 800 hours (680 cd/m$^2$, drive voltage increase 2.5 V) and 4,000 hours from an initial luminance 300 cd/m$^2$.

Comparative Example 1

The device was fabricated as in Example 1 except that N,N'-bis(3-methylphenyl)-N,N'-diphenyl-4,4'-diaminobiphenyl (TPD001) was used in the hole transporting layer instead of Exemplary Compound II-102.

When current was conducted through the EL device under a certain applied voltage, the device was found to emit 71,700 cd/m$^2$ green light (emission maximum wavelength λmax=525 nm, chromaticity coordinates x=0.29, y=0.66) at 13 V and 518 mA/cm$^2$. Stable light emission continued over 10,000 hours in a dry nitrogen atmosphere. On constant current driving at 10 mA/cm$^3$, the half-life of luminance was 65 hours (1,281 cd/m$^2$, drive voltage increase 1.5 V) and 800 hours from an initial luminance 300 cd/m$^2$.

Comparative Example 2

The device was fabricated as in Example 1 except that N,N'-bis(3-biphenyl)-N,N'-diphenyl-4,4'-diaminobiphenyl (TPD006) was used in the hole transporting layer instead of Exemplary Compound II-102.

When current was conducted through the EL device under a certain applied voltage, the device was found to emit 81,000 cd/m$^2$ green light (emission maximum wavelength λmax=525 nm, chromaticity coordinates x=0.32, y=0.65) at 14 V and 532 mA/cm$^2$. Stable light emission continued over 10,000 hours in a dry nitrogen atmosphere. On constant current driving at 10 mA/cm$^2$, the half-life of luminance was 68 hours (1,730 cd/M$^2$, drive voltage increase 2.0 V) and 800 hours from an initial luminance 300 cd/m$^2$.

Comparative Example 3

The device was fabricated as in Example 1 except that N,N'-bis(3-t-butylphenyl)-N,N'-diphenyl-1,1'-biphenyl-4,4'-diamine (TPD008) was used in the hole transporting layer instead of Exemplary Compound II-102.

When current was conducted through the EL device under a certain applied voltage, the device was found to emit 79,300 cd/m$^2$ green light (emission maximum wavelength λmax=525 nm, chroimaticity coordinates x=0.30, y=0.66) at 13 V and 508 mA/cm$^2$. Stable light emission continued over 10,000 hours in a dry nitrogen atmosphere. On constant current driving at 10 mA/cm$^2$, the half-life of luminance was 29 hours (1,749 cd/m$^2$, drive voltage increase 1.4 V) and 500 hours from an initial luminance 300 cd/m$^2$.

Comparative Example 4

The device was fabricated as in Example 1 except that N,N,N',N'-tetrakis(m-biphenyl)-1,1'-biphenyl-4,4'-diamine (TPD005) was used in the hole transporting layer instead of Exemplary Compound II-102.

When current was conducted through the EL device under a certain applied voltage, the device was found to emit 102,700 cd/m$^2$ green light (emission maximum wavelength λmax=525 nm, chrormaticity coordinates x=0.28, y=0.68) at 14 V and 643 mA/cm$^2$. Stable light emission continued over 10,000 hours in a dry nitrogen atmosphere. On constant current driving at 10 mA/cm$^2$, the half-life of luminance was 115 hours (1,842 cd/m$^2$, drive voltage increase 1.8 V) and 1,600 hours from an initial luminance 300 cd/m$^2$.

Comparative Example 5

The device was fabricated as in Example 1 except that N,N'-diphenyl-N,N'-bis(4'-(N-(3-methylphenyl)-N-phenyl)-aminobiphenyl-4-yl)benzidine (TPD017) was used in the hole injecting layer instead of Exemplary Compound II-102.

When current was conducted through the EL device under a certain applied voltage, the device was found to emit 75,600 cd/$m^2$ green light (emission maximum wavelength λmax=525 nm, chromaticity coordinates x=0.32, y=0.66) at 14 V and 715 mA/$cm^2$. Stable light emission continued over 10,000 hours in a dry nitrogen atmosphere. On constant current driving at 10 mA/$cm^2$, the half-life of luminance was 197 hours (1,156 cd/$m^2$, drive voltage increase 2.3 V) and 2,000 hours from an initial luminance 300 cd/$m^2$.

Comparative Example 6

The device was fabricated as in Example 1 except that the quinacridone shown below (Exemplary Compound III-1) was used in the light emitting layer instead of Exemplary Compound I-201 and contained in an amount of 0.75% by weight.

When current was conducted through the EL device under a certain applied voltage, the device was found to emit 60,000 cd/$m^2$ yellowish green light (emission maximum wavelength λmax=540 nm, chromaticity coordinates x=0.37, y=0.60) at 16 V and 840 mA/$cm^2$. Stable light emission continued over 10,000 hours in a dry nitrogen atmosphere. On constant current driving at 10 mA/$cm^2$, the half-life of luminance was 100 hours (800 cd/$m^2$, drive voltage increase 3.2 V) and 500 hours from an initial luminance 300 cd/$m^2$.

Properties of the organic EL devices of Examples 1 to 6 and Comparative Examples 1 to 6 are summarized in Tables 1 and 2.

TABLE 1

| Sample | Light emitting layer | Hole trans-porting | Light emission: λ max | Light emission: Luminance | Stable time | Half-life of luminance Constant current drive (10 mA/$cm^2$) Initial luminance, Voltage increase | Initial luminance 300 cd/$m^2$ |
|---|---|---|---|---|---|---|---|
| E 1 | A1Q3 + I-201 | II-102 | 525 nm green | 103800 cd/$m^2$ (14 V · 800 mA/$cm^2$) | >10000 hr. | 890 hr [1288 cd/$m^2$, 1.5 V] | 4500 hr |
| E 2 | A1Q3 + I-201 | II-101 | 525 nm green | 104800 cd/$m^2$ (14 V · 753 mA/$cm^2$) | >10000 hr. | 680 hr [1433 cd/$m^2$, 1.5 V] | 4000 hr |
| E 3 | A1Q3 + I-203 | II-102 | 515 nm green | 69500 cd/$m^2$ (13 V · 553 mA/$cm^2$) | >10000 hr. | 600 hr [1078 cd/$m^2$, 1.5 V] | 4000 hr |
| E 4 | A1Q3 + I-202 | II-102 | 515 nm green | 71700 cd/$m^2$ (14 V · 753 mA/$cm^2$) | >10000 hr. | 800 hr [998 cd/$m^2$, 1.5 V] | 5000 hr |
| E 5 | A1Q3 + I-103 | II-102 | 510 nm green | 61400 cd/$m^2$ (16 V · 980 mA/$cm^2$) | >10000 hr. | 3000 hr [730 cd/$m^2$, 8.0 V] | 10000 hr |
| E 6 | A1Q3 + I-104 | II-102 | 500 nm green | 40300 cd/$m^2$ (12 V · 625 mA/$cm^2$) | >10000 hr. | 800 hr [680 cd/$m^2$, 1.5 V] | 4000 hr |

E: Example

TABLE 2

| Sample | Light emitting layer | Hole trans-porting | Light emission: λ max | Light emission: Luminance | Stable time | Half-life of luminance Constant current drive (10 mA/$cm^2$) Initial luminance, Voltage increase | Initial luminance 300 cd/$m^2$ |
|---|---|---|---|---|---|---|---|
| CE 1 | A1Q3 + I-201 | TPD001 | 525 nm green | 71700 cd/$m^2$ (13 V · 518 mA/$cm^2$) | >10000 hr. | 65 hr [1281 cd/$m^2$, 1.5 V] | 800 hr |
| CE 2 | A1Q3 + I-201 | TPD006 | 525 nm green | 81000 cd/$m^2$ (14 V · 532 mA/$cm^2$) | >10000 hr. | 68 hr [1730 cd/$m^2$, 2.0 V] | 800 hr |
| CE 3 | A1Q3 + I-201 | TPD008 | 525 nm green | 79300 cd/$m^2$ (13 V · 508 mA/$cm^2$) | >10000 hr. | 29 hr [1749 cd/$m^2$, 1.4 V] | 500 hr |
| CE 4 | A1Q3 + I-201 | TPD005 | 525 nm green | 102700 cd/$m^2$ (14 V · 643 mA/$cm^2$) | >10000 hr. | 115 hr [1842 cd/$m^2$, 1.8 V] | 1600 hr |
| CE 5 | A1Q3 + I-201 | TPD017 | 525 nm green | 75600 cd/$m^2$ (14 V · 715 mA/$cm^2$) | >10000 hr. | 197 hr [1156 cd/$m^2$, 2.3 V] | 2000 hr |
| CE 6 | A1Q3 + Chinacridon | II-102 | 540 nm yellowish green | 60000 cd/$m^2$ (16 V · 840 mA/$cm^2$) | >10000 hr. | 100 hr [800 cd/$m^2$, 3.2 V] | 500 hr |

CE: Comparative Example

It is evident from these results that the EL devices using a combination of a coumarin derivative of formula (I) with a tetraaryldiamine derivative of formula (II) according to the invention have a prolonged luminescent lifetime.

Example 7

A color filter film was formed on a glass substrate by coating to a thickness of 1 μm using CR-2000 by Fuji Hunt K. K., a red fluorescence conversion film was formed thereon to a thickness of 5 μm by coating a 2 wt % solution of Lumogen F Red 300 by BASF in CT-1 by Fuji Hunt K. K., followed by baking, and an overcoat was further formed thereon by coating to a thickness of 1 μm using CT-1 by Fuji Hunt K. K., followed by baking. ITO was then sputtered thereon to a thickness of 100 nm, obtaining an anode-bearing red device substrate. Using this substrate, a device was fabricated as in Example 1.

The color filter material described above was to cut light having a wavelength of up to 580 nm, and the red fluorescence conversion material had an emission maximum wavelength λmax of 630 nm and a spectral half-value width near λmax of 50 nm.

When current was conducted through the EL device under a certain applied voltage, the device was found to emit 9,000 cd/$m^2$ red light (emission maximum wavelength λmax=600 nm, chromaticity coordinates x=0.60, y=0.38) at 15 V and 615 mA/$cm^2$. Stable light emission continued over 10,000 hours in a dry nitrogen atmosphere. No local dark spots appeared or grew.

Example 8

A device was fabricated as in Example 1 except that the hole transporting layer was formed by co-evaporation using Exemplary Compound II-102 and rubrene in a weight ratio of 10:1.

When current was conducted through the EL device under a certain applied voltage, the device was found to emit 79,800 cd/$m^2$ green light (emission maximum wavelength λmax=525 nm and 555 nm, chromaticity coordinates x=0.38, y=0.57) at 14 V and 750 mA/$cm^2$. Stable light emission continued over 10,000 hours in a dry nitrogen atmosphere. On constant current driving at 10 mA/$cm^2$, the half-life of luminance was 700 hours (1,173 cd/$m^2$, drive voltage increase 2.5 V) and 4,500 hours from an initial luminance 300 cd/$m^2$.

Example 9

In Example 1, the light emitting layer was formed by using N,N,N',N'-tetrakis(m-biphenyl)-1,1'-biphenyl-4,4'-diamine (TPD005) as the hole injecting and transporting compound and tris(8-quinolinolato)aluminum (AlQ3) as the electron injecting and transporting compound, evaporating them at an approximately equal deposition rate of 0.5 nm/sec., and simultaneously evaporating Exemplary Compound I-103 at a deposition rate of about 0.007 nm/sec., thereby forming a mix layer of 40 nm thick. In the mix layer, the film thickness ratio of TPD005:AlQ3:Exemplary Compound I-103 was 50:50:0.7. Otherwise, a device was fabricated as in Example 1. It is noted that the hole injecting and transporting layer using MTDATA was 50 nm thick, the hole transporting layer using TPD005 was 10 nm thick, and the electron injecting and transporting layer using AlQ3 was 40 nm thick.

When current was conducted through the EL device under a certain applied voltage, the device was found to emit 54,000 cd/$m^2$ green light (emission maximum wavelength λmax=510 nm, chromaticity coordinates x=0.30, y=0.60) at 18 V and 600 mA/$cm^2$. Stable light emission continued over 10,000 hours in a dry nitrogen atmosphere. On constant current driving at 10 mA/$cm^2$, the half-life of luminance was 6,000 hours (1,030 cd/$m^2$, drive voltage increase 2.0 V) and 20,000 hours from an initial luminance 300 cd/$m^2$.

It is evident that the characteristics are significantly improved as compared with the device of Comparative Example 4 without the mix layer.

Example 10

A device was fabricated as in Example 1 except that the hole injecting layer was formed to a thickness of 40 nm, the hole transporting layer was formed to a thickness of 20 nm using TPD005 and rubrene (7% by weight), and the light emitting layer was formed thereon as in Example 9 using TPD005, AlQ3 and Exemplary Compound I-103.

When current was conducted through the EL device under a certain applied voltage, the device was found to emit 67,600 cd/$m^2$ green light (emission maximum wavelength λmax=510 nm and 550 nm, chromaticity coordinates x=0.38, y=0.56) at 12 V and 650 mA/$cm^2$. Stable light emission continued over 10,000 hours in a dry nitrogen atmosphere. On constant current driving at 10 mA/50$cm^2$, the half-life of luminance was 6,500 hours (900 cd/$m^2$, drive voltage increase 2.0 V) and 25,000 hours from an initial luminance 300 cd/$m^2$.

Example 11

In Example 1, the light emitting layer was formed by using Exemplary Compound II-102 as the hole injecting and transporting compound and tris(8-quinolinolato)aluminum (AlQ3) as the electron injecting and transporting compound, evaporating them at an approximately equal deposition rate of 0.5 nm/sec. and simultaneously evaporating Exemplary Compound I-201 at a deposition rate of about 0.015 nm/sec., thereby forming a mix layer of 40 nm thick. In the mix layer, the film thickness ratio of Exemplary Compound II-102:AlQ3:Exemplary Compound I-201 was 50:50:1.5. Otherwise, a device was fabricated as in Example 1. It is noted that the hole injecting and transporting layer using MTDATA was 50 nm thick, the hole transporting layer using II-102 was 10 nm thick, and the electron injecting and transporting layer using AlQ3 was 20 nm thick.

When current was conducted through the EL device under a certain applied voltage, the device was found to emit 98,000 cd/$m^3$ green light (emission maximum wavelength λmax=525 nm, chromaticity coordinates x=0.29, y=0.67) at 13 V and 750 mA/$cm^2$. Stable light emission continued over 10,000 hours in a dry nitrogen atmosphere. On constant current driving at 10 mA/$cm^2$, the half-life of luminance was 4,000 hours (1, 100 cd /$m^2$, drive voltage increase 2.0 V) and 18,000 hours from an initial luminance 300 cd/$m^2$.

Example 12

A device was fabricated as in Example 1 except that the hole injecting layer was formed to a thickness of 40 nm, the hole transporting layer was formed to a thickness of 20 nm using Exemplary Compound II-102 and rubrene, and the light emitting layer was formed thereon as in Example 9 using Exemplary Compound II-102, AlQ3 and Exemplary Compound I-201.

When current was conducted through the EL device under a certain applied voltage, the device was found to emit 80,000 cd/m$^2$ yellowish green light (emission maximum wavelength λmax=525 nm and 560 nm, chromaticity coordinates x=0.40, y=0.55) at 13 V and 900 mA/cm$^2$. Stable light emission continued over 10,000 hours in a dry nitrogen atmosphere. On constant current driving at 10 mA/cm$^2$, the half-life of luminance was 6,000 hours (1,050 cd/m$^2$, drive voltage increase 1.5 V) and 25,000 hours from an initial luminance 300 cd/m$^2$.

Example 13

A device was fabricated as in Examples 9 and 10 except that Exemplary Compound III-1 (quinacridone) was used instead of Exemplary Compound I-103. On testing, the device showed satisfactory characteristics.

Example 14

A device was fabricated as in Examples 9 and 10 except that Exemplary Compound IV-1 (styryl amine compound) was used instead of Exemplary Compound I-103. On testing, the device showed satisfactory characteristics.

Example 15

A device was fabricated as in Examples 11 and 12 except that Exemplary Compound III-1 (quinacridone) was used instead of Exemplary Compound I-201. On testing, the device showed satisfactory characteristics.

Example 16

A device was fabricated as in Examples 11 and 12 except that Exemplary Compound IV-1 (styryl amine compound) was used instead of Exemplary Compound I-201. On testing, the device showed satisfactory characteristics.

Next, Examples of the organic EL device adapted for multi-color light emission are presented. Compound HIM used for the hole injecting layer and TPD005 used as the compound for the hole transporting layer and the hole transporting host material in the following Examples are shown below.

HIM

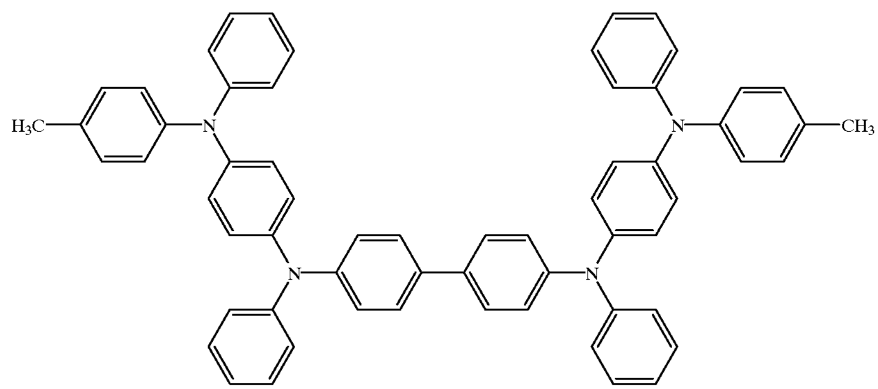

TPD005

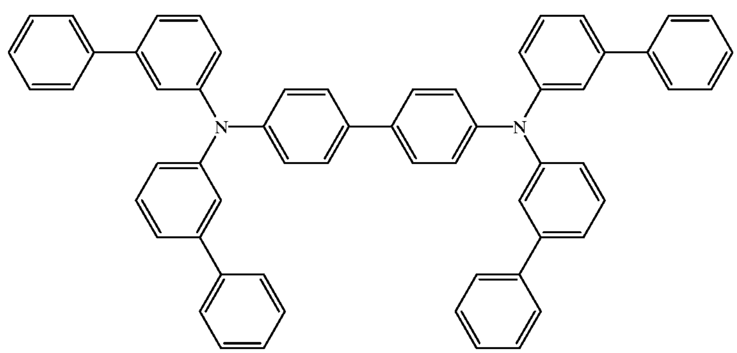

Emission spectra of a coumarin derivative (Exemplary Compound I-103), rubrene (Exemplary Compound 1–22), and tris(8-quinolinolato)aluminum (AlQ3) are shown as Reference Examples.

Reference Example 1

Figure 2:
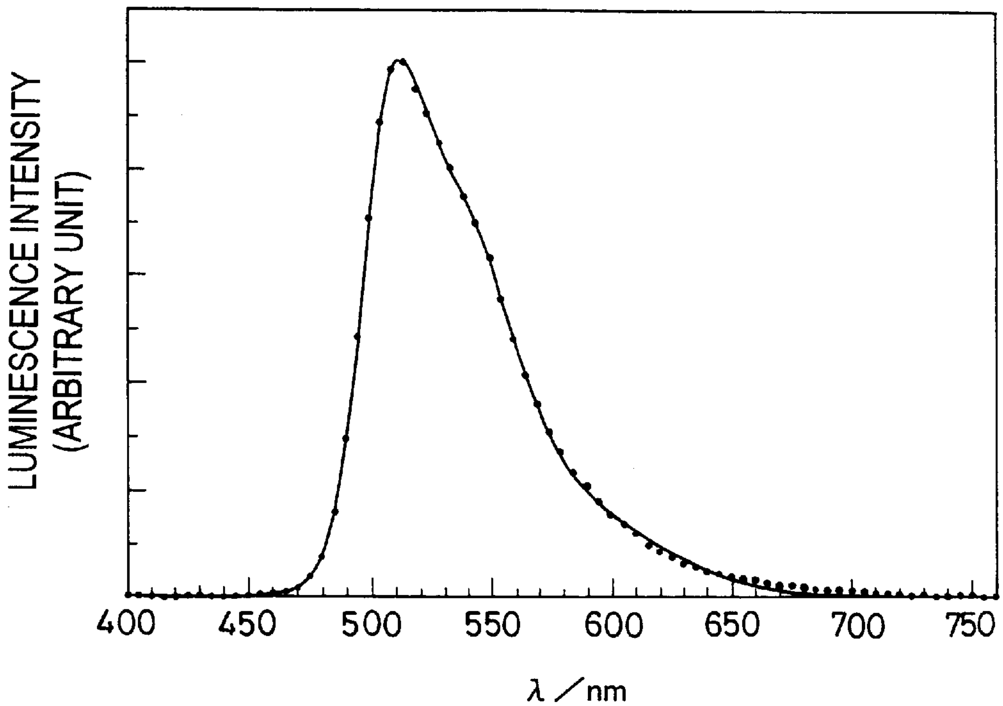
FIG. 2 is a graph showing an emission spectrum of an organic EL device.

FIG. 2 shows an emission spectrum of the coumarin derivative. The emission spectrum was measured using an organic EL device of the construction shown below.

Fabrication of Organic El Device

A glass substrate (of 1.1 mm thick) having a transparent ITO electrode (anode) of 100 nm thick was subjected to ultrasonic washing with neutral detergent, acetone, and ethanol, pulled up from boiling ethanol, dried, cleaned with UV/ozone, and then secured by a holder in an evaporation chamber, which was evacuated to a vacuum of $1\times10^{-6}$ Torr.

Then, N,N'-diphenyl-N,N'-bis[N-phenyl-N-4-tolyl(4-aminophenyl)]benzidine (HIM) was evaporated at a deposition rate of 2 nm/sec. to a thickness of 50 nm, forming a hole injecting layer.

N,N,N',N'-tetrakis(3-biphenyl-1-yl)benzidine (TPD005) was evaporated at a deposition rate of 2 nm/sec. to a thickness of 10 nm, forming a hole transporting layer.

Next, tris(8-quinolinolato)aluminum (AlQ3) and the coumarin derivative were co-evaporated at a deposition rate of 2 nm/sec. and 0.02 nm/sec., respectively, to form an electron transporting/light emitting layer of 70 nm thick containing 1.0% by volume of the coumarin derivative.

Further, with the vacuum kept, MgAg (weight ratio 10:1) was evaporated at a deposition rate of 0.2 nm/sec. to a thickness of 200 nm to form a cathode, and aluminum was evaporated to a thickness of 100 nm as a protective layer, obtaining an organic EL device.

As seen from FIG. 2, the coumarin derivative has an emission maximum wavelength near 510 nm. The half-value width of the emission spectrum (the width at one-half of the peak intensity) was 70 nm.

Reference Example 2

Figure 3:
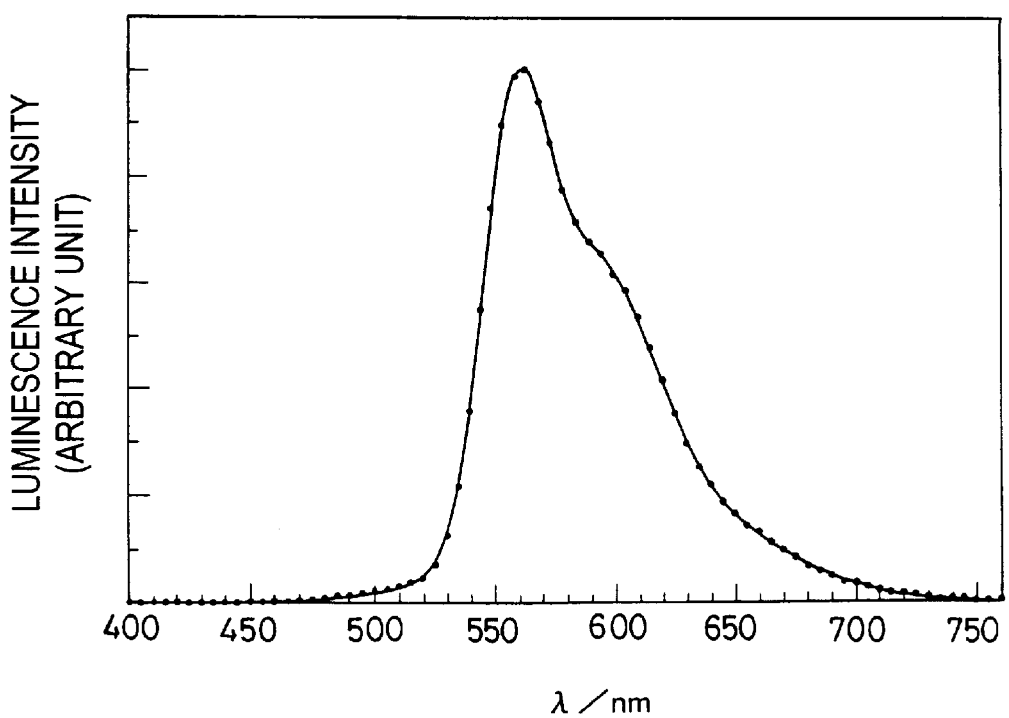
FIG. 3 is a graph showing an emission spectrum of an organic EL device.

FIG. 3 shows an emission spectrum of rubrene. The emission spectrum was measured using an organic EL device of the construction shown below.

Fabrication of Organic EL Device

A glass substrate (of 1.1 mm thick) having a transparent ITO electrode (anode) of 100 nm thick was subjected to ultrasonic washing with neutral detergent, acetone, and ethanol, pulled up from boiling ethanol, dried, cleaned with UV/ozone, and then secured by a holder in an evaporation chamber, which was evacuated to a vacuum of $1\times10^{-6}$ Torr.

Then, N,N'-diphenyl-N,N'-bis[N-phenyl-N-4-tolyl(4-aminophenyl)]benzidine (HIM) was evaporated at a deposition rate of 2 nm/sec. to a thickness of 15 nm, forming a hole injecting layer.

N,N,N',N'-tetrakis(3-biphenyl-1-yl)benzidine (TPD005) was evaporated at a deposition rate of 2 nm/sec. to a thickness of 15 nm, forming a hole transporting layer.

Next, TPD005, tris(8-quinolinolato)aluminum (AlQ3), and rubrene (Exemplary Compound 1–20) were co-evaporated to a thickness of 40 nm so that the volume ratio of TPD005 to AlQ3 was 1:1 and 2.5% by volume of rubrene was contained, yielding a first light emitting layer of the mix layer type. The deposition rates of these compounds were 0.05 nm/sec., 0.05 nm/sec., and 0.00025 nm/sec.

Next, with the vacuum kept, tris(8-quinolinolato) aluminum (AlQ3) was evaporated at a deposition rate of 0.2 nm/sec. to a thickness of 55 nm to form an electron injecting and transporting/light emitting layer.

Further, with the vacuum kept, MgAg (weight ratio 10:1) was evaporated at a deposition rate of 0.2 nm/sec. to a thickness of 200 nm to form a cathode, and aluminum was evaporated to a thickness of 100 nm as a protective layer, obtaining an EL device.

As seen from FIG. 3, rubrene has an emission maximum wavelength near 560 nm. The half-value width of the emission spectrum was 75 nm.

Reference Example 3

FIG. 2 shows an emission spectrum of the coumarin derivative. The emission spectrum was measured using an organic EL device of the construction shown below.

Fabrication of Organic EL Device

Figure 4:
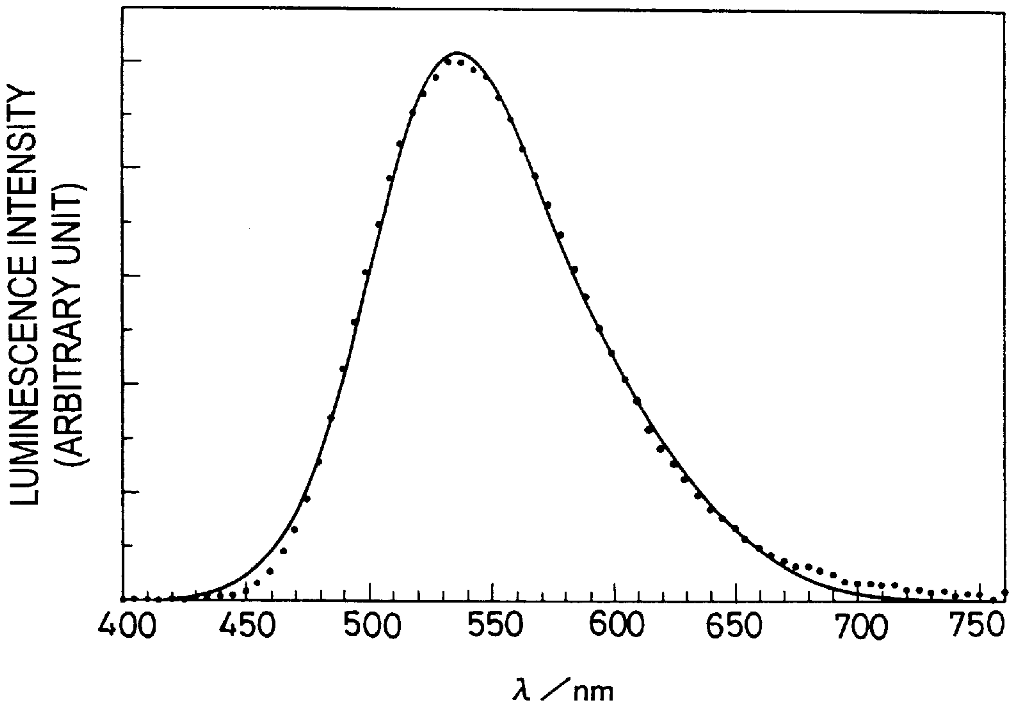
FIG. 4 is a graph showing an emission spectrum of an organic EL device.

FIG. 4 shows an emission spectrum of tris(8-quinolinolato)aluminum (AlQ3). The emission spectrum was measured using an organic EL device of the construction shown below.

Fabrication of Organic EL Device

A glass substrate (of 1.1 mm thick) having a transparent ITO electrode (anode) of 100 nm thick was subjected to ultrasonic washing with neutral detergent, acetone, and ethanol, pulled up from boiling ethanol, dried, cleaned with UV/ozone, and then secured by a holder in an evaporation chamber, which was evacuated to a vacuum of $1\times10^{-6}$ Torr.

Then, 4,4',4"-tris(N-(3-methylphenyl)-N-phenylamino) triphenylamine (MTDATA) was evaporated at a deposition rate of 2 nm/sec. to a thickness of 40 nm, forming a hole injecting layer.

N,N,N',N'-tetrakis(3-biphenyl-1-yl)benzidine (TPD005) was evaporated at a deposition rate of 2 nm/sec. to a thickness of 15 nm, forming a hole transporting layer.

Next, with the vacuum kept, tris (8-quinolinolato) aluminum (AlQ3) was evaporated at a deposition rate of 0.2 nm/sec. to a thickness of 70 nm, forming an electron injecting and transporting/light emitting layer.

Further, with the vacuum kept, MgAg (weight ratio 10:1) was evaporated at a deposition rate of 0.2 nm/sec. to a thickness of 200 nm to form a cathode, and aluminum was evaporated to a thickness of 100 nm as a protective layer, obtaining an EL device.

As seen from FIG. 4, tris(8-quinolinolato)aluminum (AlQ3) has an emission maximum wavelength near 540 nm. The half-value width of the emission spectrum was 110 nm.

Example 17

A glass substrate (of 1.1 mm thick) having a transparent ITO electrode (anode) of 100 nm thick was subjected to ultrasonic washing with neutral detergent, acetone, and ethanol, pulled up from boiling ethanol, dried, cleaned with UV/ozone, and then secured by a holder in an evaporation chamber, which was evacuated to a vacuum of $1\times10^{-6}$ Torr.

Then, N,N'-diphenyl-N,N'-bis[N-phenyl-N-4-tolyl(4-aminophenyl)]benzidine (HIM) was evaporated at a deposition rate of 2 nm/sec. to a thickness of 50 nm, forming a hole injecting layer.

N,N,N',N'-tetrakis(3-biphenyl-1-yl)benzidine (TPD005) was evaporated at a deposition rate of 2 nm/sec. to a thickness of 15 nm, forming a hole transporting layer.

Next, TPD005, tris(8-quinolinolato)aluminum (AlQ3), and rubrene (Exemplary Compound 1–22) were co-evaporated to a thickness of 20 nm so that the volume ratio of TPD005 to AlQ3 was 1:1 and 2.5% by volume of rubrene was contained, yielding a first light emitting layer of the mix layer type. The deposition rates of these compounds were 0.05 nm/sec., 0.05 nm/sec., and 0.0025 nm/sec.

Also, TPD005, AlQ3, and a coumarin derivative (Exemplary Compound I-103) were co-evaporated to a thickness of 20 nm so that the volume ratio of TPD005 to AlQ3 was 1:1 and 1.0% by volume of the coumarin derivative was contained, yielding a second light emitting layer of the mix layer type. The deposition rates of these compounds were 0.05 nm/sec., 0.05 nm/sec., and 0.001 nm/sec.

Next, with the vacuum kept, tris(8-quinolinolato) aluminum (AlQ3) was evaporated at a deposition rate of 0.2 nm/sec. to a thickness of 50 nm to form an electron injecting and transporting/light emitting layer.

Further, with the vacuum kept, MgAg (weight ratio 10:1) was evaporated at a deposition rate of 0.2 nm/sec. to a thickness of 200 nm to form a cathode, and aluminum was evaporated to a thickness of 100 nm as a protective layer, obtaining an organic EL device.

When current was conducted through the organic EL device under a certain applied voltage, the device was found to emit 5,000 cd/$m^2$-yellowish green light (emission maximum wavelength λmax=560 nm and 500 nm, chromaticity coordinates x=0.39, y=0.55) at 10 V and 50 mA/$cm^2$. Stable light emission continued over 1,000 hours in a dry argon atmosphere. No local dark spots appeared or grew. On constant current driving at 10 mA/$cm^2$, the half-life of luminance was 40,000 hours (initial luminance 1,000 cd/$m^2$, initial drive voltage 7.2 V, drive voltage increase 3.0 v).

Figure 5:
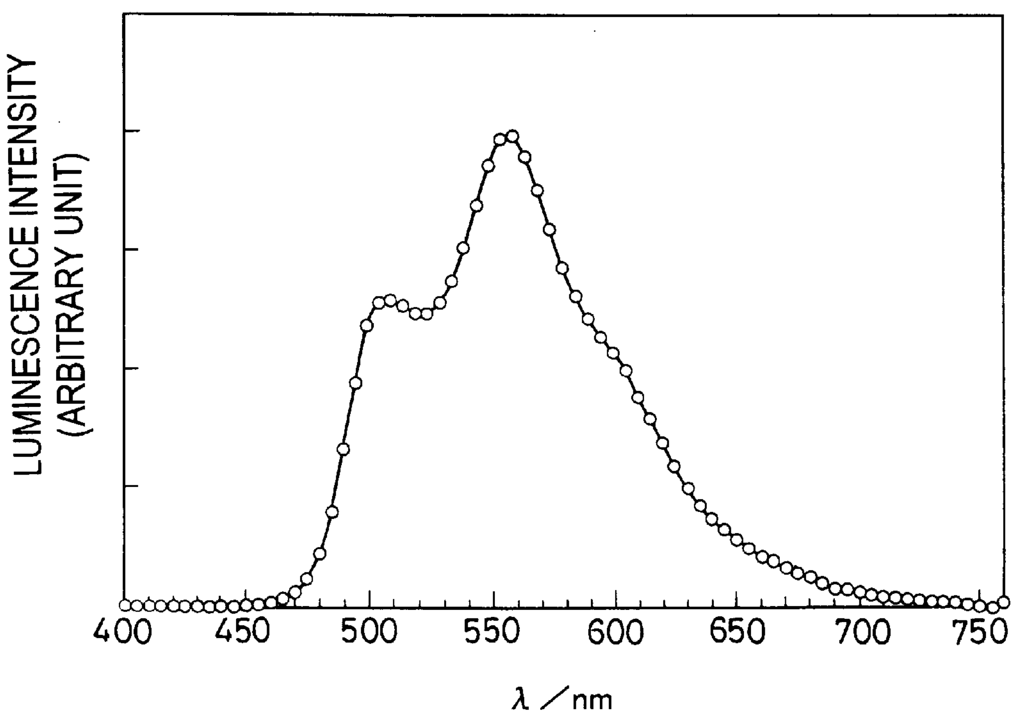
FIG. 5 is a graph showing an emission spectrum of an organic EL device.

FIG. 5 shows an emission spectrum of this device. It is seen from FIG. 5 that both the coumarin derivative and rubrene produced light emissions. The emission spectrum ratio C/R of coumarin derivative (510 nm)/rubrene (560 nm) was 0.65. The half-value width of the emission spectrum (the width at one-half of the peak intensity) was 120 nm, indicating that both the coumarin derivative and rubrene produced light emissions. The lifetime was significantly extended as compared with Example 9. This indicates that the mix layer containing rubrene contributes an extended lifetime.

Comparative Example 7

An organic EL device was fabricated as in Example 17 except that after the hole transporting layer of TPD005 was formed, AlQ3, rubrene, and the coumarin were co-evaporated at a deposition rate of 0.1 nm/sec., 0.0025 nm/sec., and 0.001 nm/sec., respectively, to form an electron transporting/light emitting layer containing 2.5%; by volume of rubrene and 1.0% by volume of the coumarin to a thickness of 40 nm, and an electron injecting and transporting layer of AlQ3 was then formed to a thickness of 50 nm.

Figure 6:
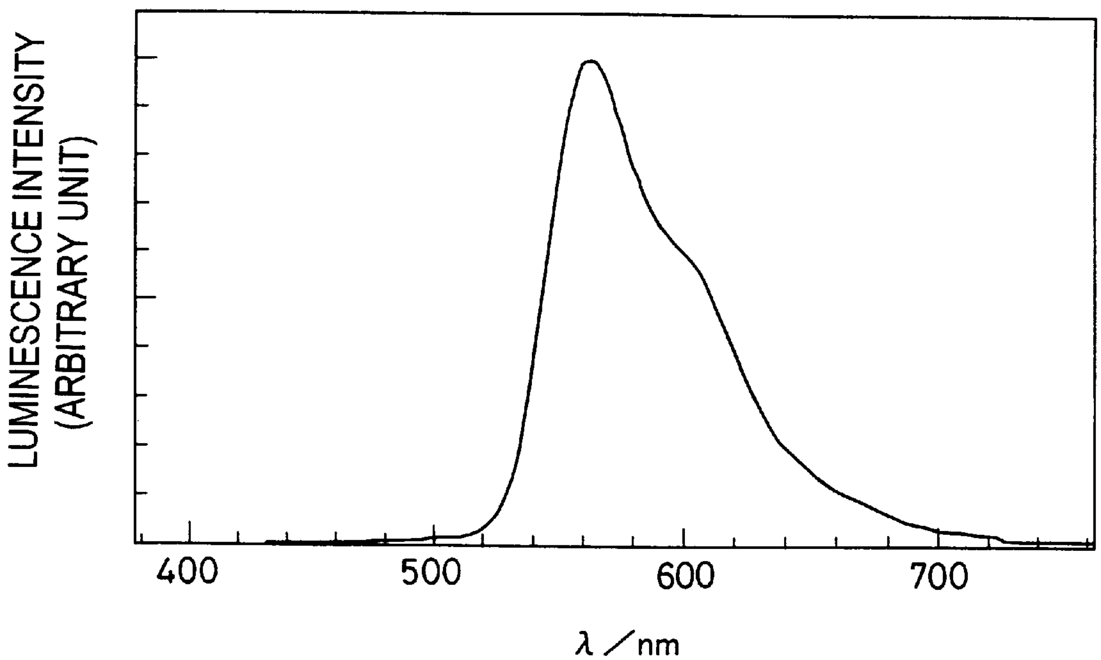
FIG. 6 is a graph showing an emission spectrum of an organic EL device.

FIG. 6 shows an emission spectrum of this device. It is seen from FIG. 6 that only rubrene produced light emission. The C/R was then equal to 0 and the half-value width of the emission spectrum was 70 nm.

Comparative Example 8

An organic EL device was fabricated as in Comparative Example 7 except that TPD005 was used instead of AlQ3 as the host material of the light emitting layer to form a hole transporting/light emitting layer.

Figure 7:
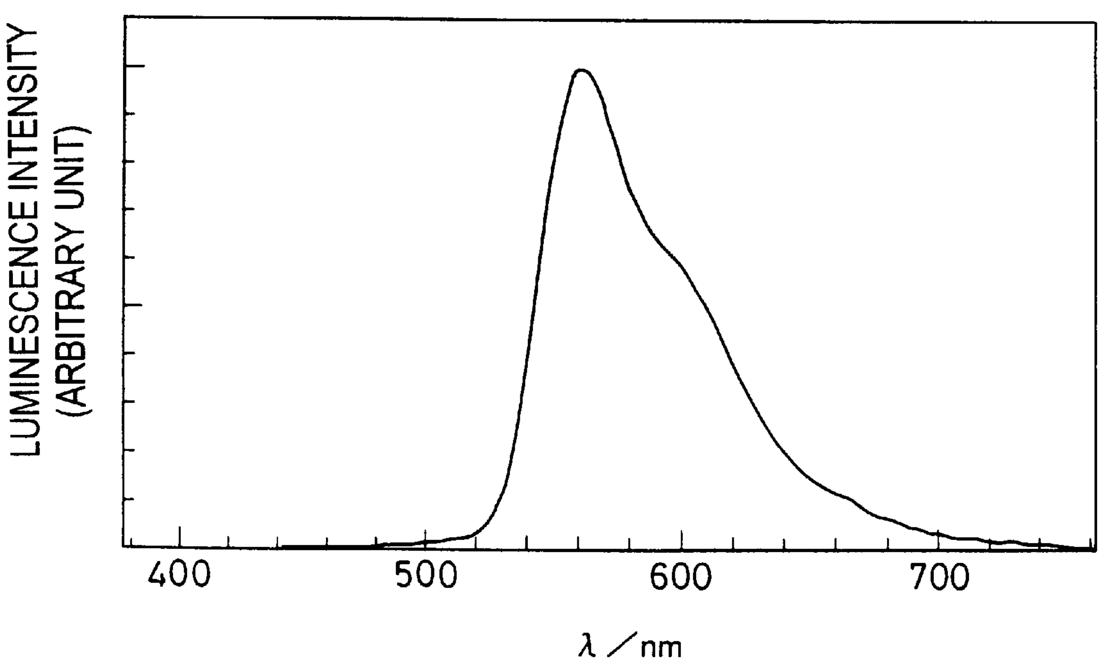
FIG. 7 is a graph showing an emission spectrum of an organic EL device.

FIG. 7 shows an emission spectrum of this device. It is seen from FIG. 7 that only rubrene produced light emission. The C/R was then equal to 0 and the half-value width of the emission spectrum was 70 nm.

Comparative Example 9

An organic EL device was fabricated as in Example 17 except that after the hole transporting layer of TPD005 was formed, AlQ3 and rubrene were co-evaporated at a deposition rate of 0.1 nm/sec. and 0.0025 nm/sec., respectively, to form an electron transporting/light emitting layer containing 2.5% by volume of rubrene to a thickness of 20 nm, AlQ3 and the coumarin derivative were co-evaporated thereon at a deposition rate of 0.1 nm/sec. and 0.001 nm/sec., respectively, to form an electron transporting/light emitting layer containing 1.0% by volume of the coumarin derivative to a thickness of 20 nm, and an electron injecting and transporting layer of AlQ3 was then formed to a thickness of 50 nm.

Figure 8:
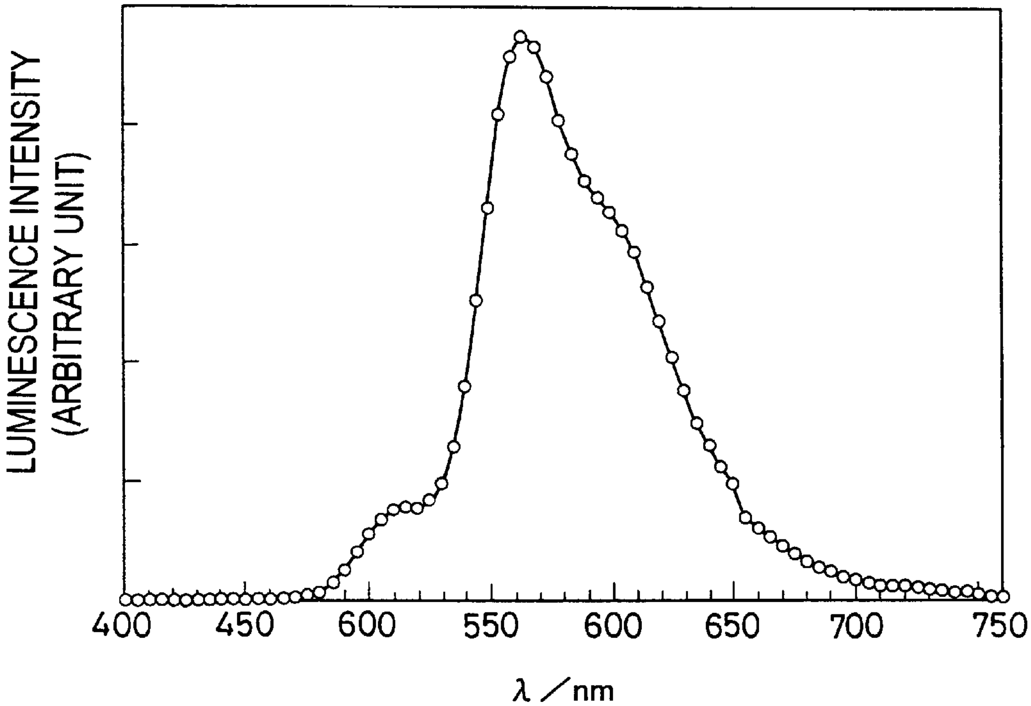
FIG. 8 is a graph showing an emission spectrum of an organic EL device.

FIG. 8 shows an emission spectrum of this device. It is seen from FIG. 8 that only rubrene produced light emission. The C/R was then equal to 0 and the half-value width of the emission spectrum was 70 nm.

Comparative Example 10

An organic EL device was fabricated as in Comparative Example 9 except that TPD005 was used as the host material of a light emitting layer of dual layer construction to form two hole transporting/light emitting layers.

Figure 9:
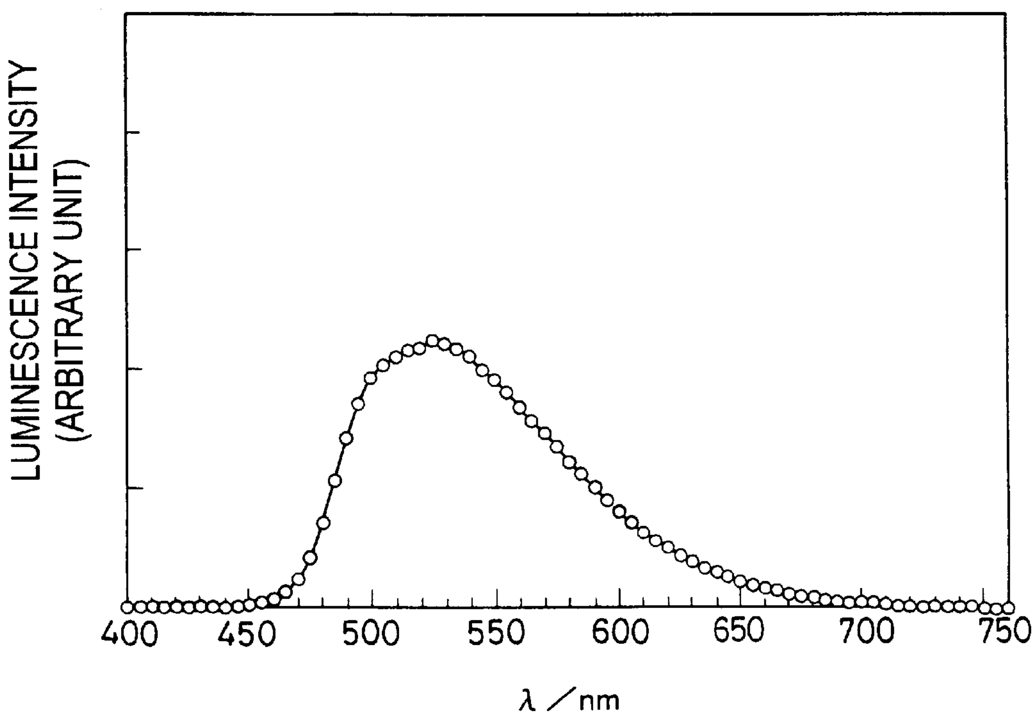
FIG. 9 is a graph showing an emission spectrum of an organic EL device.

FIG. 9 shows an emission spectrum of this device. It is seen from FIG. 9 that the coumarin derivative and AlQ3 produced light emissions. The half-value width of the emission spectrum was 90 nm.

Comparative Example 11

An organic EL device was fabricated as in Example 17 except that after the hole transporting layer of TPD005 was formed, TPD005 and rubrene were co-evaporated at a deposition rate of 0.1 nm/sec. and 0.0025 nm/sec., respectively, to form a hole transporting/light emitting layer containing 2.5% by volume of rubrene to a thickness of 20 nm, AlQ3 and the coumarin derivative were co-evaporated thereon at a deposition rate of 0.1 nm/sec. and 0.001 nm/sec., respectively, to form an electron transporting/light emitting layer containing 1.0% by volume of the coumarin derivative to a thickness of 20 nm, and an electron injecting and transporting layer of AlQ3 was then formed to a thickness of 50 nm.

When current was conducted through the organic EL device under a certain applied voltage, the device was found to emit 4, 500 cd/$m^2$ yellowish green light (emission maximum wavelength λmax=560 nm and 510 nm, chromaticity coordinates x=0.42, y=0.54) at 12 V and 50 mA/$cm^2$. Stable light emission continued over 10 hours in a dry argon atmosphere. No local dark spots appeared or grew. On constant current driving at 10 mA/$cm^2$, the half-life of luminance was 100 hours (initial luminance 1,000 cd/$m^2$, initial drive voltage 6.5 V, drive voltage increase 3.0 V).

Figure 10:
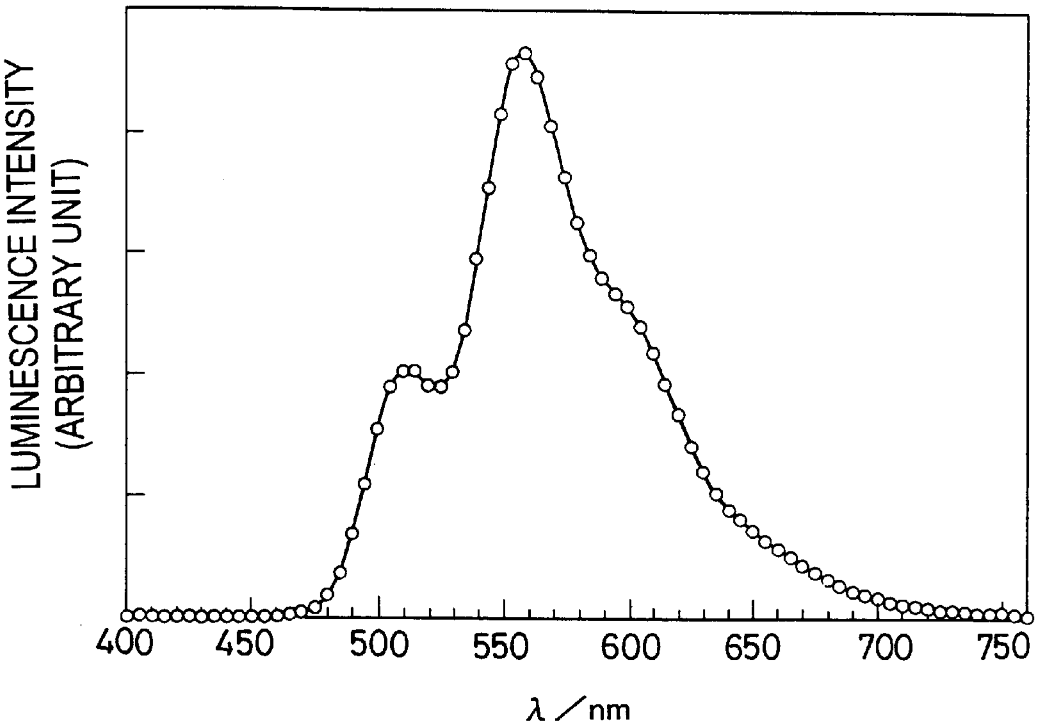
FIG. 10 is a graph showing an emission spectrum of an organic EL device.

FIG. 10 shows an emission spectrum of this device. It is seen from FIG. 10 that both the coumarin derivative and rubrene produced light emissions. The emission spectrum ratio C/R was then equal to 0.5 and the half-value width was 80 nm.

Although the light emissions of the coumarin derivative and rubrene were produced, this device was impractical because of the short emission lifetime.

Example 18

An organic EL device was fabricated as in Example 17 except that after the hole transporting layer of TPD005 was formed, TPD005, AlQ3, and rubrene were co-evaporated at a deposition rate of 0.05 nm/sec., 0.05 nm/sec., and 0.0025 nm/sec., respectively, to form a light emitting layer of the mix layer type containing TPD005 and AlQ3 in a ratio of 1:1 and 2.5% by volume of rubrene to a thickness of 20 nm, AlQ3 and the coumarin derivative were then co-evaporated at a deposition rate of 0.1 nm/sec. and 0.001 nm/sec., respectively, to form an electron transporting/light emitting layer containing 1.0% by volume of the coumarin derivative to a thickness of 20 nm, and an electron injecting and transporting layer of AlQ3 was then formed to a thickness of 50 nm.

When current was conducted through the organic EL device under a certain applied voltage, the device was found to emit 4,000 cd/m$^2$ yellowish green light (emission maximum wavelength λmax=510 nm and 560 nm, chromaticity coordinates x=0.42, y=0.54) at 12 V and 50 mA/cm$^2$. Stable light emission continued over 1,000 hours in a dry argon atmosphere. No local dark spots appeared or grew. On constant current driving at 10 mA/cm$^2$, the half-life of luminance was 40,000 hours (initial luminance 1,000 cd/m$^2$, initial drive voltage 6.9 V, drive voltage increase 3.0 V).

Figure 11:
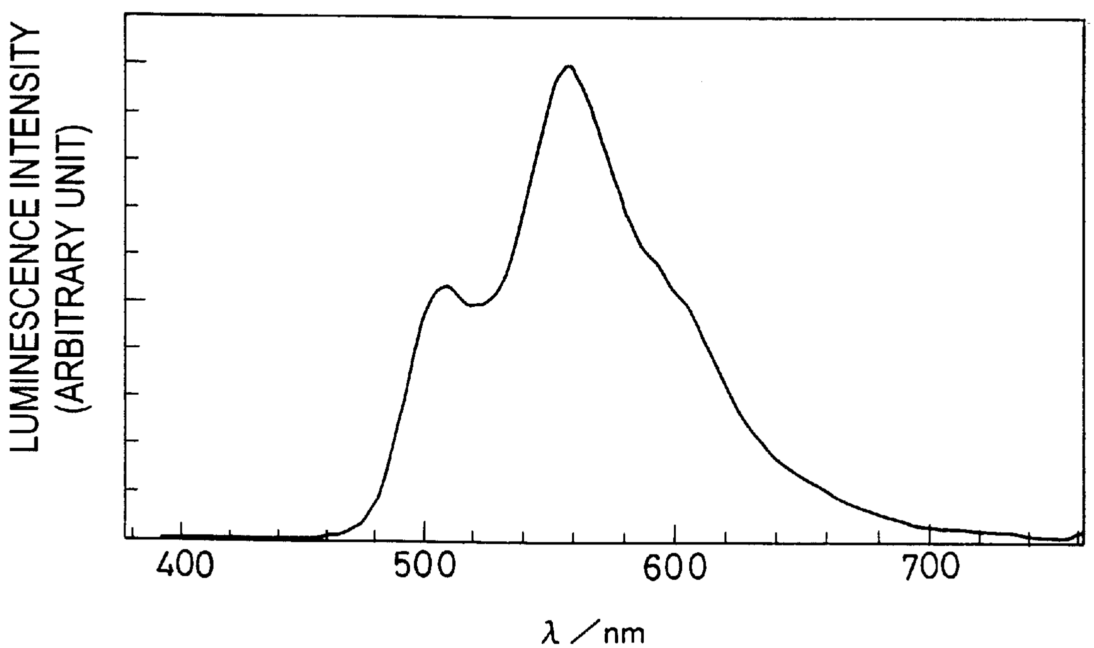
FIG. 11 is a graph showing an emission spectrum of an organic EL device.

FIG. 11 shows an emission spectrum of this device. It is seen from FIG. 11 that both the coumarin derivative and rubrene produced light emissions. The emission spectrum ratio C/R was then equal to 0.42 and the half-value width was 130 nm.

Example 19

An organic EL device was fabricated as in Example 17 except that the amounts of the host materials: TPD005 and AlQ3 of the first and second light emitting layers of the mix layer type were changed so as to give a TPD005/AlQ3 volume ratio of 75/25.

When current was conducted through the organic EL device under a certain applied voltage, the device was found to emit 4, 100 cd/m$^2$ yellowish green light (emission maximum wavelength λmax=510 nm and 560 nm, chromaticity coordinates x=0.32, y=0.58) at 12 V and 50 mA/cm$^2$. Stable light emission continued over 1,000 hours in a dry argon atmosphere. No local dark spots appeared or grew. On constant current driving at 10 MA/cm$^2$, the half-life of luminance was 30,000 hours (initial luminance 900 cd/m$^2$, initial drive voltage 7.2 V, drive voltage increase 2.5 V).

Figure 12:
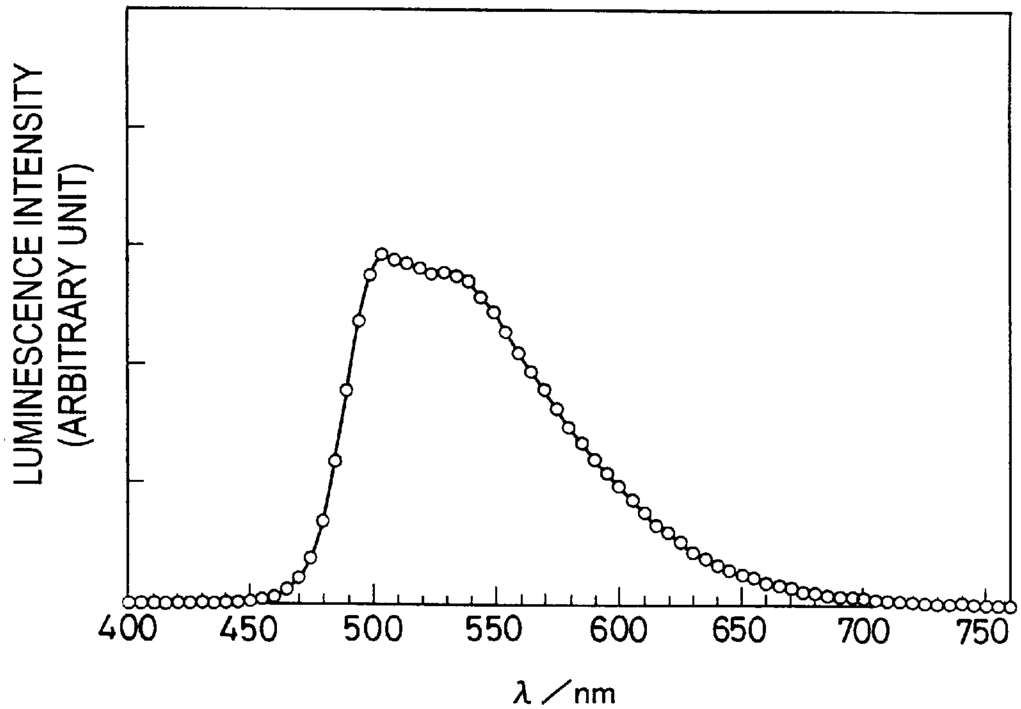
FIG. 12 is a graph showing an emission spectrum of an organic EL device.

FIG. 12 shows an emission spectrum of this device. It is seen from FIG. 12 that both the coumarin derivative and rubrene produced light emissions. The emission spectrum ratio C/R was then equal to 1.4 and the half-value width was 120 nm. It is thus evident that a C/R ratio different from Example 17 is obtained by changing the ratio of host materials in the mix layer.

Example 20

An organic EL device was fabricated as in Example 17 except that. the amounts of the host materials: TPD005 and AlQ3 of the first and second light emitting layers of the mix layer type were changed so as to give a TPD005/AlQ3 volume ratio of 66/33.

When current was conducted through the organic EL device under a certain applied voltage, the device was found to emit 3,500 cd/m$^2$ yellowish green light (emission maximum wavelength λmax=510 nm and 560 nm, chromaticity coordinates x=0.34, y=0.57) at 12 V and 50 mA/cm$^2$. Stable light emission continued over 1,000 hours in a dry argon atmosphere. No local dark spots appeared or grew. On constant current driving at 10 mA/cm$^2$, the half-life of luminance was 20,000 hours (initial luminance 900 cd/m$^2$, initial drive voltage 7.3 V, drive voltage increase 2.5 V).

Figure 13:
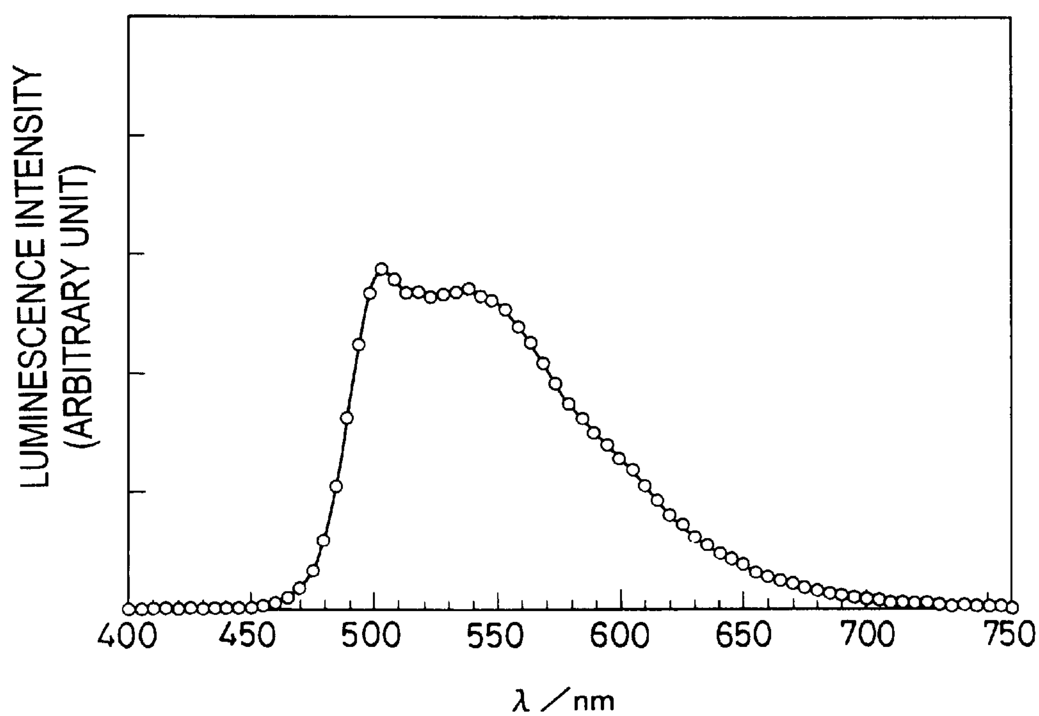
FIG. 13 is a graph showing an emission spectrum of an organic EL device.

FIG. 13 shows an emission spectrum of this device. It is seen from FIG. 13 that both the coumarin derivative and rubrene produced light emissions. The emission spectrum ratio C/R was then equal to 1.4 and the half-value width was 130 nm. It is thus evident that a C/R ratio different from Example 17 is obtained by changing the ratio of host materials in the mix layer.

Example 21

An organic EL device was fabricated as in Example 17 except that the amounts of the host materials: TPD005 and AlQ3 of the first and second light emitting layers of the mix layer type were changed so as to give a TPD005/AlQ3 volume ratio of 25/75.

When current was conducted through the organic EL device under a certain applied voltage, the device was found to emit 4,200 cd/m$^2$ yellowish green light (emission maximum wavelength λmax=510 nm and 560 nm, chromaticity coordinates x=0.47, y=0.51) at 12 V and 50 mA/cm$^2$. Stable light emission continued over 1,000 hours in a dry argon atmosphere. No local dark spots appeared or grew. On constant current driving at 10 mA/cm$^2$, the half-life of luminance was 15,000 hours (initial luminance 900 cd/m$^2$, initial drive voltage 7.5 V, drive voltage increase 2.5 V).

Figure 14:
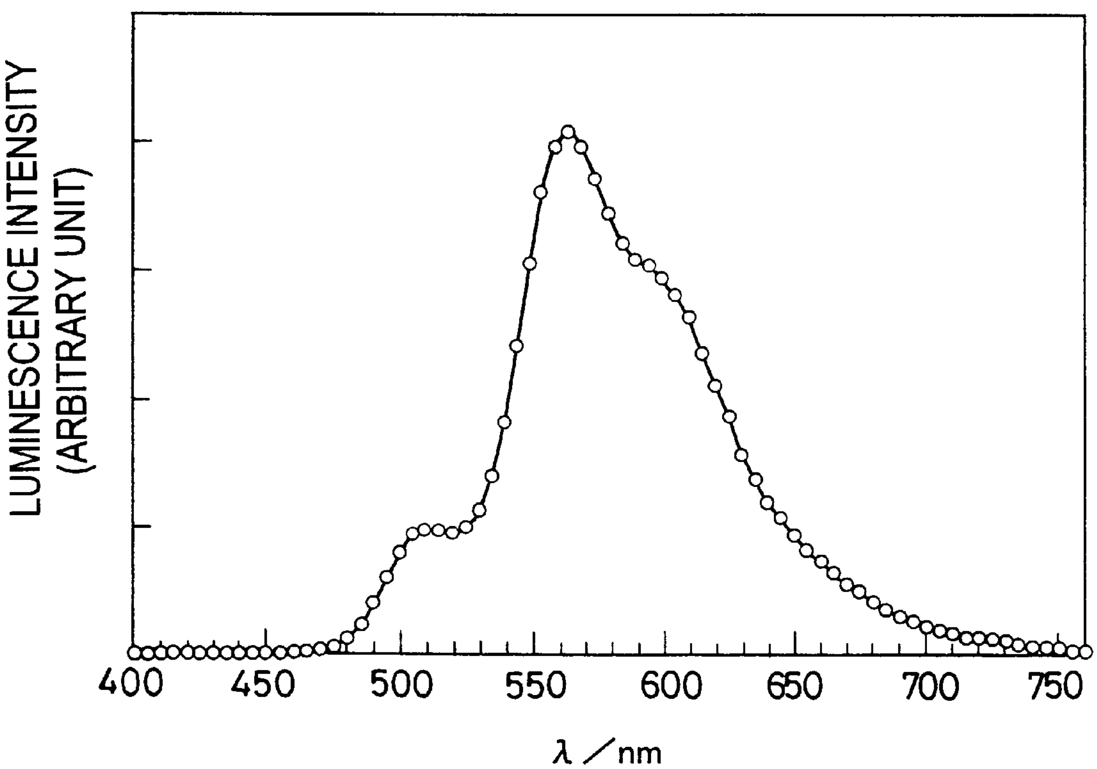
FIG. 14 is a graph showing an emission spectrum of an organic EL device.

FIG. 14 shows an emission spectrum of this device. It is seen from FIG. 14 that both the coumarin derivative and rubrene produced light emissions. The emission spectrum ratio C/R was then equal to 0.25 and the half-value width was 80 nm. It is thus evident that a C/R ratio different from Example 17 is obtained by changing the ratio of host materials in the mix layer.

It is evident from the results of Examples 17 to 21 that light emission characteristics are altered by changing host materials in the light emitting layer.

It is also evident from the results of Examples 17 to 21 combined with the results of Comparative Examples 7 to 11 that multi-color light emission is accomplished by adjusting the carrier transporting characteristics of the host of the light emitting layer so as to fall within the scope of the invention.

It has been demonstrated that light emissions from two or more luminescent species are available above the practical level when the carrier transporting characteristics of light emitting layers to be laminated are selected as defined in the invention (preferably, by providing at least two light emitting layers including a light emitting layer of the mix layer type as bipolar light emitting layers, for example). The possibility of multi-color light emission has thus been demonstrated.

It is also seen that the contribution of each of at least two light emitting layers is altered by changing the mix ratio of host materials in the bipolar mix layer. The mix ratio can be changed independently in the respective layers and an alteration by such a change is also expectable. The bipolar host material is not limited to such a mixture, and a single species bipolar material may be used. The key point of the present invention resides in a choice of the carrier transporting characteristics of light emitting layers to be laminated. The material must be changed before the carrier transporting characteristics can be altered.

INDUSTRIAL APPLICABILITY

It is thus evident that organic EL devices using the compounds according to the invention are capable of light emission at a high luminance and remain reliable due to a minimized drop of luminance and a minimized increase of drive voltage during continuous light emission. The invention permits a plurality of fluorescent materials to produce their own light emission in a stable manner, providing a wide spectrum of light emission and hence, multi-color light emission. The spectrum of multi-color light emission can be designed as desired.

What is claimed is:

1. An organic electroluminescent device comprising a light emitting layer containing a coumarin derivative of the following formula (I), and a hole injecting and/or transporting layer containing a tetraaryldiamine derivative of the following formula (II), (1)

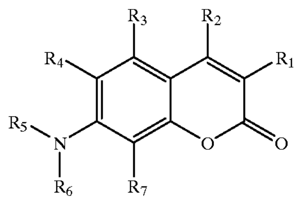

wherein each of $R_1$, $R_2$, and $R_3$, which maybe identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl or aryl group; each of $R_5$ and $R_6$ is an alkyl or aryl group; or $R_4$ and $R_5$, $R_5$ and $R_6$, and $R_6$ and $R_7$, taken together, may form a ring, and (II)

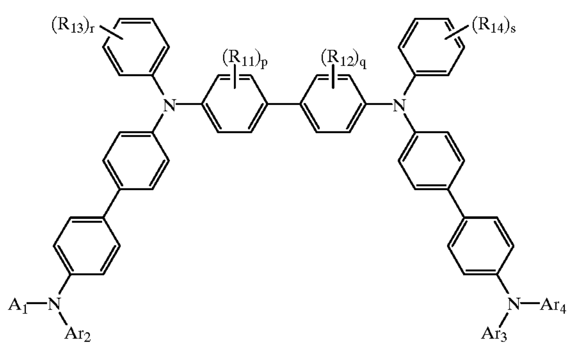

wherein each of $Ar_1$, $Ar_2$, $Ar_3$, and $Ar_4$ is an aryl group, at least one of $Ar_1$ to $Ar_4$ is a polycyclic aryl group derived from a fused ring or ring cluster having at least two benzene rings; each of $R_{11}$ and $R_{12}$ is an alkyl group; each of p and q is 0 or an integer of 1 to 4; each of $R_{13}$ and $R_{14}$ is an aryl group; and each of r and s is 0 or an integer of 1 to 5.

2. The organic electroluminescent device of claim 1 wherein said light emitting layer containing a coumarin derivative is formed of a host material doped with the coumarin derivative as a dopant.

3. The organic electroluminescent device of claim 2 wherein said host material is a quinolinolato metal complex.

4. An organic electroluminescent device comprising a light emitting layer in the form of a mix layer containing a hole injecting and transporting compound and an electron injecting and transporting compound, the mix layer being further doped with a coumarin derivative of the following formula (I), a quinacridone compound of the following formula (III) or a styryl amine compound of the following formula (IV) as a dopant, (1)

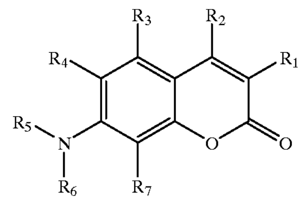

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl or aryl group; each of $R_5$ and $R_6$ is an alkyl or aryl group; or $R_4$ and $R_5$, $R_5$ and $R_6$, and $R_6$ and $R_7$, taken together, may form a ring, (III)

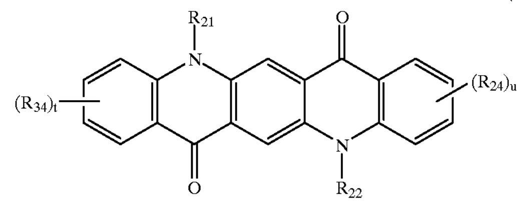

wherein each of $R_{21}$ and $R_{22}$, which may be identical or different, is a hydrogen atom, alkyl or aryl group; each of $R_{23}$ and $R_{24}$ is an alkyl or aryl group; each of t and u is 0 or an integer of 1 to 4; or adjacent $R_{23}$ groups or $R_{24}$ groups, taken together, may form a ring when t or u is at least 2, (IV)

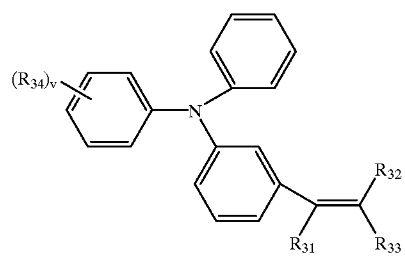

wherein $R_{31}$ is a hydrogen atom or aryl group; each of $R_{32}$ and $R_{33}$, which may be identical or different, is a hydrogen atom, aryl or alkenyl group; $R_{34}$ is an arylamino or arylaminoaryl group; and v is 0 or an integer of 1 to 5 and said hole injecting and transporting compound is an aromatic tertiary amine, and said electron injecting and transporting compound is a compound selected from the group consisting of metal complexes of 8-quinolinol or derivatives thereof, oxadiazol derivatives, perylene derivatives, pyridine derivatives, pyrimidine derivatives, quinoxaline derivatives, diphenylquinone derivatives, and nitro-substituted fluorene derivatives.

5. The organic electroluminescent device of claim 4 wherein said aromatic tertiary amine is a tetraaryldiamine derivative of the following formula (II):

(II)

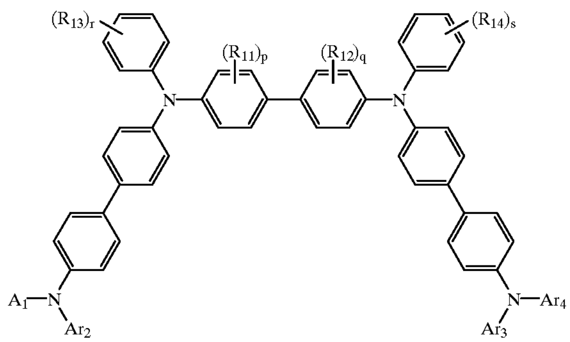

wherein each of $Ar_1$, $Ar_2$, $Ar_3$, and $Ar_4$ is an aryl group, at least one of $Ar_1$ to $Ar_4$ is a polycyclic aryl group derived from a fused ring or ring cluster having at least two benzene rings; each of $R_{11}$ and $R_{12}$ is an alkyl group; each of p and q is 0 or an integer of 1 to 4; each of $R_{13}$ and $R_{14}$ is an aryl group; and each of r and s is 0 or an integer of 1 to 5.

6. The organic electroluminescent device of any one of claim 1 or 4 wherein said light emitting layer is interleaved between at least one hole injecting and/or transporting layer and at least one electron injecting and/or transporting layer.

7. The organic electroluminescent device of claim 1, or wherein said hole injecting and/or transporting layer is further doped with rubrene as a dopant.

8. The organic electroluminescent device of any one of claim 1 or 4 wherein a color filter and/or a fluorescence conversion filter is disposed on a light output side so that light is emitted through the color filter and/or fluorescence conversion filter.

9. An organic electroluminescent device having at least six layers comprising at least two light emitting layers including a bipolar light emitting layer, a hole and/or transporting layer disposed nearer to anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer.

10. The organic electroluminescent device of claim 9 wherein said bipolar light emitting layer is a mix layer containing a hole injecting and transporting compound and an electron injecting and transporting compound.

11. The organic electroluminescent device of claim 10 wherein all said at least two light emitting layers are mix layers as defined above.

12. The organic electroluminescent device of any one of claims 9 to 11 wherein at least one of said at least two light emitting layers is doped with a dopant.

13. The organic electroluminescent device of any one of claims 9–11 where at least two light emitting layers are doped with dopants.

14. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting light emitting layer disposed nearer to the cathode than the bipolar light emitting layer, wherein said at least two emitting layers have different luminescent characteristics, and a light emitting layer having an emission maximum wavelength on a longer wavelength side is disposed near the anode.

15. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant, said dopant being a compound having a naphthacene skeleton.

16. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant, wherein said dopant is a coumarin of the following formula:

(I)

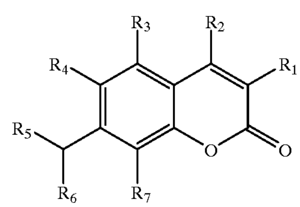

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl, or aryl group; each of $R_5$ and $R_6$ is an alkyl or aryl group; or $R_4$ and $R_5$, $R_5$ and $R_6$, and $R_7$ and $R_6$ and $R_7$, taken together, may form a ring.

17. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein said bipolar light emitting layer is a mixed layer containing a hole injecting and transporting compound and an electron injecting and transporting compound, wherein said hole injecting and transporting compound is an aromatic tertiary amine, and said electron injecting transporting compound is a quinolinolato metal complex.

18. The organic electroluminescent device of claim 6 wherein said hole injecting and/or transporting layer is further doped with rubrene as a dopant.

19. The organic electroluminescent device of claim 6 wherein a color filter and/or a fluorescence conversion filter is disposed on a light output side so that light is emitted through the color filter and/or fluorescence conversion filter.

20. The organic electroluminescent device of claim 7 wherein a color filter and/or a fluorescence conversion filter is disposed on a light output side so that light is emitted through the color filter and/or fluorescence conversion filter.

21. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant and wherein said at least two light emitting layers have different luminescent characteristics, and a light emitting layer having an emission maximum wavelength on a longer wavelength side is disposed near the anode.

22. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein all said at least two light emitting layers are doped with dopants and wherein said at least two light emitting layers have different luminescent characteristics, and a light emitting layer having an emission maximum wavelength on a longer wavelength side is disposed near the anode.

23. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein all said at least two light emitting layers are doped with dopants and wherein said dopant is a compound having a naphthacene skeleton.

24. An organic electroluminescent device comprising at least two light emitting layers including a bipolar light emitting layer. a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant and said dopant is a compound having a naphthacene skeleton and wherein said at least two light emitting layers have different luminescent characteristics, a light emitting layer having an emission maximum wavelength on a longer wavelength side is disposed near the anode.

25. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein all said at least two light emitting layers are doped with dopants and wherein said dopant is a coumarin of the following formula:

(I)

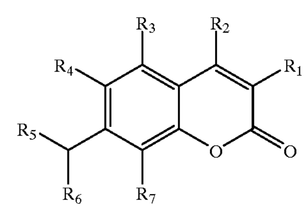

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl, or aryl group; each of $R_5$ and $R_6$ is an alkyl or aryl group; or $R_4$ and $R_5$, $R_5$ and $R_6$, and $R_7$ and $R_6$ and $R_7$, taken together, may form a ring.

26. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein all said at least two light emitting layers is doped with a dopant and wherein said dopant is a coumarin of the following formula:

(I)

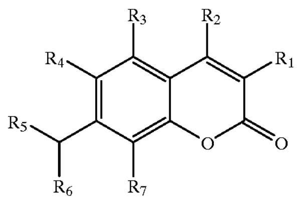

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl, or aryl group; each of $R_5$ and $R_6$ is an alkyl or aryl group; or $R_4$ and $R_5$, $R_5$ and $R_6$, and $R_7$ and $R_6$ and $R_7$, taken together, may form a ring and wherein said at least two light emitting layers have different luminescent characteristics, a light emitting layer having a emission wavelength on a longer wavelength side is disposed near the anode.

27. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein all of said at least two light emitting layers is doped with a dopant and said dopant is a coumarin of the following formula:

(I)

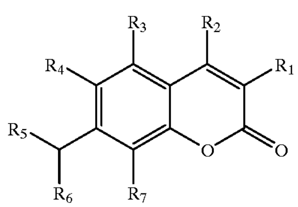

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl, or aryl group; each of $R_5$ and $R_6$ is an alkyl or aryl group; or $R_4$ and $R_5$, $R_5$ and $R_6$, and $R_7$ and $R_6$ and $R_7$, taken together, may form a ring and wherein said at least two light emitting layers have different luminescent characteristics. a light emitting layer having an emission maximum wavelength on a longer wavelength side is disposed near the anode.

28. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant and said hole injecting and transporting compound is an aromatic tertiary amine, and said electron injecting and transporting compound is a quinolinolato metal complex.

29. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein all said at least two light emitting layers is doped with dopants and wherein said hole injecting and transporting compound is an aromatic tertiary amine, and said electron injecting and transporting compound is a quinolinolato metal complex.

30. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein said hole injecting and transporting compound is an aromatic tertiary amine, and said electron injecting and transporting compound is a quinolinolato metal complex and wherein said at least two light emitting layers have different luminescent characteristics, a light emitting layer having an emissions maximum wavelength on a longer wavelength side is disposed near the anode.

31. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant, said dopant is a compound having a naphthacene skeleton and wherein said hole injecting and transporting compound is an aromatic tertiary amine, and said electron injecting and transporting compound is a quinolinolato metal complex.

32. An organic electroluminescent device comprising at least two light emitting layers including a bipolar light emitting layer, a hole injecting and/or transporting layer disposed nearer to an anode than said light emitting layer, and an electron injecting and/or transporting layer disposed nearer to a cathode than said light emitting layer, said at least two light emitting layers being a combination of bipolar light emitting layers or a combination of a bipolar light emitting layer with a hole transporting/light emitting layer disposed nearer to the anode than the bipolar light emitting layer and/or an electron transporting/light emitting layer disposed nearer to the cathode than the bipolar light emitting layer, wherein at least one of said at least two light emitting layers is doped with a dopant and said dopant is a coumarin of the following formula:

(I)

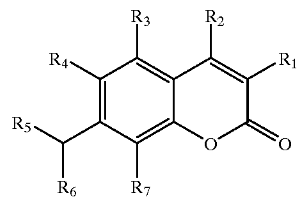

wherein each of $R_1$, $R_2$, and $R_3$, which may be identical or different, is a hydrogen atom, cyano, carboxyl, alkyl, aryl, acyl, ester or heterocyclic group, or $R_1$ to $R_3$, taken together, may form a ring; each of $R_4$ and $R_7$ is a hydrogen atom, alkyl, or aryl group; each of $R_5$ and $R_6$ is an alkyl or aryl group; or $R_4$ and $R_5$, $R_5$ and $R_6$, and $R_6$ and $R_7$, taken together, may form a ring and wherein said hole injecting and transporting compound is an aromatic tertiary amine, and said electron injecting and transporting compound is a quinolinolato metal complex.

* * * * *